(12) United States Patent
Bertin et al.

(10) Patent No.: US 7,567,414 B2
(45) Date of Patent: Jul. 28, 2009

(54) NANOTUBE ESD PROTECTIVE DEVICES AND CORRESPONDING NONVOLATILE AND VOLATILE NANOTUBE SWITCHES

(75) Inventors: Claude L. Bertin, South Burlington, VT (US); Brent M. Segal, Woburn, MA (US); Thomas Rueckes, Portland, OR (US); Jonathan W. Ward, Fairfax, VA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 11/264,935

(22) Filed: Nov. 2, 2005

(65) Prior Publication Data
US 2006/0193093 A1    Aug. 31, 2006

Related U.S. Application Data

(60) Provisional application No. 60/624,428, filed on Nov. 2, 2004, provisional application No. 60/624,297, filed on Nov. 2, 2004.

(51) Int. Cl.
*H02H 9/00* (2006.01)
(52) U.S. Cl. ......................................... 361/56
(58) Field of Classification Search .................. 361/56
See application file for complete search history.

(56) References Cited

U.S. PATENT DOCUMENTS

| 6,057,637 A | 5/2000 | Zettl et al. |
| 6,128,214 A | 10/2000 | Kuekes et al. |

(Continued)

FOREIGN PATENT DOCUMENTS

| GB | 2364933 | 2/2002 |

(Continued)

OTHER PUBLICATIONS

Ajayan, et al. "Nanometre-size tubes of carbon", *Rep. Prog. Phys.*, vol. 60, pp. 1025-1062, 1997.

(Continued)

*Primary Examiner*—Stephen W Jackson
*Assistant Examiner*—Ann T Hoang
(74) *Attorney, Agent, or Firm*—Wilmer Cutler Pickering Hale and Dorr LLP

(57) ABSTRACT

Nanotube ESD protective devices and corresponding nonvolatile and volatile nanotube switches. An electrostatic discharge (ESD) protection circuit for protecting a protected circuit is coupled to an input pad. The ESD circuit includes a nanotube switch electrically having a control. The switch is coupled to the protected circuit and to a discharge path. The nanotube switch is controllable, in response to electrical stimulation of the control, between a de-activated state and an activated state. The activated state creates a current path so that a signal on the input pad flows to the discharge path to cause the signal at the input pad to remain within a predefined operable range for the protected circuit. The nanotube switch, the input pad, and the protected circuit may be on a semiconductor chip. The nanotube switch may be on a chip carrier. The deactivated and activated states may be volatile or nonvolatile depending on the embodiment. The ESD circuit may be repeatedly programmed between the activated and deactivated states so as to repeatedly activate and deactivate ESD protection of the protected circuit. The nanotube switch provides protection based on the magnitude of the signal on the input pad.

29 Claims, 69 Drawing Sheets

U.S. PATENT DOCUMENTS

| | | | |
|---|---|---|---|
| 6,141,245 A | 10/2000 | Bertin et al. | |
| 6,159,620 A | 12/2000 | Heath et al. | |
| 6,198,655 B1 | 3/2001 | Heath et al. | |
| 6,232,706 B1 | 5/2001 | Dai et al. | |
| 6,256,767 B1 | 7/2001 | Kuekes et al. | |
| 6,277,318 B1 | 8/2001 | Bower et al. | |
| 6,314,019 B1 | 11/2001 | Kuekes et al. | |
| 6,329,223 B2 * | 12/2001 | Yu ............................. | 438/123 |
| 6,342,276 B1 | 1/2002 | You et al. | |
| 6,409,567 B1 | 6/2002 | Amey, Jr. et al. | |
| 6,423,583 B1 | 7/2002 | Avouris et al. | |
| 6,445,006 B1 | 9/2002 | Brandes et al. | |
| 6,495,116 B1 | 12/2002 | Herman | |
| 6,495,258 B1 | 12/2002 | Chen et al. | |
| 6,515,339 B2 | 2/2003 | Shin et al. | |
| 6,518,156 B1 | 2/2003 | Chen et al. | |
| 6,528,020 B1 | 3/2003 | Dai et al. | |
| 6,548,841 B2 | 4/2003 | Frazier et al. | |
| 6,559,468 B1 | 5/2003 | Kuekes et al. | |
| 6,574,130 B2 | 6/2003 | Segal et al. | |
| 6,630,772 B1 | 10/2003 | Bower et al. | |
| 6,643,165 B2 | 11/2003 | Segal et al. | |
| 6,645,628 B2 | 11/2003 | Shiffler, Jr. et al. | |
| 6,673,424 B1 | 1/2004 | Lindsay et al. | |
| 6,706,402 B2 | 3/2004 | Rueckes et al. | |
| 6,707,098 B2 | 3/2004 | Hofmann et al. | |
| 6,750,471 B2 | 6/2004 | Bethune et al. | |
| 6,759,693 B2 | 7/2004 | Vogeli et al. | |
| 6,774,052 B2 | 8/2004 | Vogeli et al. | |
| 6,781,166 B2 | 8/2004 | Lieber et al. | |
| 6,784,028 B2 | 8/2004 | Rueckes et al. | |
| 6,803,840 B2 | 10/2004 | Hunt et al. | |
| 6,808,746 B1 | 10/2004 | Dai et al. | |
| 6,809,465 B2 | 10/2004 | Jin | |
| 6,833,558 B2 | 12/2004 | Lee et al. | |
| 6,835,591 B2 | 12/2004 | Rueckes et al. | |
| 6,836,424 B2 | 12/2004 | Segal et al. | |
| 6,858,197 B1 | 2/2005 | Delzeit | |
| 6,863,942 B2 | 3/2005 | Ren et al. | |
| 6,899,945 B2 | 5/2005 | Smalley et al. | |
| 6,911,682 B2 | 6/2005 | Rueckes et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,924,538 B2 | 8/2005 | Jaiprakash et al. | |
| 6,942,921 B2 | 9/2005 | Rueckes et al. | |
| 6,946,410 B2 | 9/2005 | French et al. | |
| 6,979,590 B2 | 12/2005 | Rueckes et al. | |
| 6,990,009 B2 | 1/2006 | Bertin et al. | |
| 7,015,500 B2 | 3/2006 | Choi et al. | |
| 7,056,758 B2 | 6/2006 | Segal et al. | |
| 7,057,402 B2 | 6/2006 | Cole et al. | |
| 7,115,901 B2 | 10/2006 | Bertin et al. | |
| 7,115,960 B2 | 10/2006 | Bertin et al. | |
| 7,161,403 B2 | 1/2007 | Bertin | |
| 2001/0004979 A1 | 6/2001 | Han et al. | |
| 2001/0023986 A1 | 9/2001 | Mancevski | |
| 2002/0130353 A1 | 9/2002 | Lieber et al. | |
| 2002/0160111 A1 | 10/2002 | Sun et al. | |
| 2002/0172963 A1 | 11/2002 | Kelley et al. | |
| 2002/0175390 A1 | 11/2002 | Goldstein et al. | |
| 2002/0179434 A1 | 12/2002 | Dai et al. | |
| 2003/0004058 A1 | 1/2003 | Li et al. | |
| 2003/0122111 A1 | 7/2003 | Glatkowski | |
| 2003/0124837 A1 * | 7/2003 | Rueckes et al. ............. | 438/629 |
| 2003/0165074 A1 | 9/2003 | Segal et al. | |
| 2003/0177450 A1 | 9/2003 | Nugent | |
| 2003/0200521 A1 | 10/2003 | DeHon et al. | |
| 2004/0005723 A1 | 1/2004 | Empedocles et al. | |
| 2004/0007528 A1 | 1/2004 | Bakajin et al. | |
| 2004/0023253 A1 | 2/2004 | Kunwar et al. | |
| 2004/0031975 A1 * | 2/2004 | Kern et al. ................... | 257/213 |
| 2004/0041154 A1 | 3/2004 | Watanabe et al. | |
| 2004/0043527 A1 | 3/2004 | Bradley et al. | |
| 2004/0071949 A1 | 4/2004 | Glatkowski et al. | |
| 2004/0085805 A1 | 5/2004 | Segal et al. | |
| 2004/0099438 A1 | 5/2004 | Arthur et al. | |
| 2004/0104129 A1 | 6/2004 | Gu et al. | |
| 2004/0159833 A1 | 8/2004 | Rueckes et al. | |
| 2004/0164289 A1 | 8/2004 | Rueckes et al. | |
| 2004/0181630 A1 | 9/2004 | Jaiprakash et al. | |
| 2004/0191978 A1 | 9/2004 | Rueckes et al. | |
| 2004/0214366 A1 | 10/2004 | Segal et al. | |
| 2004/0214367 A1 | 10/2004 | Segal et al. | |
| 2004/0222817 A1 * | 11/2004 | Madurawe ................... | 326/39 |
| 2004/0253167 A1 | 12/2004 | Silva et al. | |
| 2004/0265550 A1 | 12/2004 | Glatkowski et al. | |
| 2005/0035344 A1 | 2/2005 | Bertin et al. | |
| 2005/0035367 A1 | 2/2005 | Bertin et al. | |
| 2005/0036365 A1 | 2/2005 | Bertin et al. | |
| 2005/0037547 A1 | 2/2005 | Bertin et al. | |
| 2005/0053525 A1 | 3/2005 | Segal et al. | |
| 2005/0056877 A1 | 3/2005 | Rueckes et al. | |
| 2005/0062035 A1 | 3/2005 | Bertin et al. | |
| 2005/0063210 A1 | 3/2005 | Segal et al. | |
| 2005/0095938 A1 | 5/2005 | Rosenberger et al. | |
| 2005/0275070 A1 * | 12/2005 | Hollingsworth ............. | 257/659 |
| 2005/0280436 A1 | 12/2005 | Bertin | |
| 2005/0282515 A1 | 12/2005 | Bertin | |
| 2005/0282516 A1 | 12/2005 | Bertin | |
| 2006/0044035 A1 | 3/2006 | Bertin | |
| 2006/0061389 A1 | 3/2006 | Bertin | |
| 2006/0255834 A1 | 11/2006 | Bertin | |
| 2007/0004191 A1 | 1/2007 | Gu et al. | |
| 2008/0273280 A1 | 11/2008 | Chen et al. | |

FOREIGN PATENT DOCUMENTS

| | | | |
|---|---|---|---|
| JP | 2000-203821 | | 7/2000 |
| JP | 2001-035362 | | 2/2001 |
| JP | 2004-090208 | | 3/2004 |
| KR | 2004050339 A | * | 6/2004 |
| WO | WO-98/39250 | | 9/1998 |
| WO | WO-99/65821 | | 12/1999 |
| WO | WO-01/03208 A1 | | 1/2001 |
| WO | WO-01/44796 A1 | | 6/2001 |
| WO | WO-02/45113 | | 6/2002 |
| WO | WO-02/48701 | | 6/2002 |
| WO | WO-03/016901 | | 2/2003 |
| WO | WO-03/034142 A1 | | 4/2003 |
| WO | WO-03/091486 | | 11/2003 |
| WO | WO-2004/065655 | | 8/2004 |
| WO | WO-2004/065657 | | 8/2004 |
| WO | WO-2004/065671 | | 8/2004 |

OTHER PUBLICATIONS

Ami, et al., "Logic gates and memory cells based on single $C_{60}$ electromechanical transistors", *Nanotechnology*, vol. 12, pp. 44-52, 2001.

Avouris, "Carbon nanotube electronics", *Chemical Physics*, vol. 281, pp. 429-445, 2002.

Bakoglu, H.B., "Circuits, Interconnections, and Packing for VLSI", Addison-Wesley Publishing Company, pp. 46-51, 1990.

Berhan, et al., "Mechanical properties of nanotube sheets: Alternations in joint morphology and achievable moduli in manufacturable materials", *Journal of Applied Physics*, vol. 95, No. 8, pp. 4335-4345, Apr. 15, 2004.

Bertin, C. et al., "Known Good Die (KGD)", Chapter 4, of reference book "Area Array Interconnection Handbook", editors K. Puttlitz and P. Totta, Kluwer Academic Publishers, pp. 149-151, 2001.

Bertin, C. et al., "Known Good Die (KGD)", Chapter 4, of reference book "Area Array Interconnection Handbook," editors K. Puttlitz and P. Totta, Kluwer Academic Publishers, pp. 162-165, 2001.

Bertin, C. et al., "Known Good Die (KGD)", Chapter 4, of reference book "Area Array Interconnection Handbook", editors K. Puttlitz and P. Totta, Kluwer Academic Publishers, pp. 187-189, 2001.

Cao, et al., "Electromechanical properties of metallic, quasimetallic, and semiconducting carbon nanotubes under stretching", *Physical Review Letters*, vol. 90, No. 15, pp. 157601-1-157601-4, week ending Apr. 18, 2003.

Casavant, et al., "Neat macroscpic membranes of aligned carbon nanotubes", *Journal of Applied Physics*, vol. 93, No. 4, pp. 2153-2156, Feb. 15, 2003.

Cui, et al., "Carbon nanotube memory devices of high charge storage stability", *Applied Physics Letters*, vol. 81, No. 17, pp. 3260-3262, Oct. 21, 2002.

Dehon, "Array-based architecture for FET-based, nanoscale electronics", *IEEE Transactions on Nanotechnology*, vol. 2, No. 1, pp. 23-32, Mar. 2003.

Dequesnes, et al., "Calculation of pull-in voltages for carbon-nanotube-based nanoelectromechanical switches", *Nanotechnology*, vol. 13, pp. 120-131, 2002.

Dequesnes, et al., "Simulation of carbon nanotube-based nanoelectromechanical switches", *Computational Nanoscience and Nanotechnology*, pp. 383-386, 2002.

Dequesnes, M. et al., "Static and Dynamic Analysis of Carbon Nanotube-Based Switches", *Transactions of the ASME*, vol. 126, pp. 230-237, Jul. 2004.

Fan, et al., "Carbon nanotube arrays on silicon substrates and their possible application", *Physica E*, vol. 8, pp. 179-783, 2000.

Farajian, et al., "Electronic transport through bent carbon nanotubes: nanoelectromechanical sensors and switches", *Physical Review B*, vol. 67, pp. 205423-1-205423-6.

Fischer, et al., "Magnetically aligned single wall carbon nanotube films: Preferred orientation and anisotropic transport properties", *Journal of Applied Physics*, vol. 93, No. 4, pp. 2157-2163, Feb. 15, 2003.

Franklin, et al., "Integration of suspended carbon nanotube arrays into electronic devices and electromechanical systems", *Applied Physics Letters*, vol. 81, No. 5, pp. 913-915, Jul. 29, 2002.

Fuhrer, et al., "High-mobility nanotube transistor memory", *Nano Letters*, vol. 2, No. 7, pp. 755-759, 2002.

Homma, et al., "Growth of suspended carbon nanotube networks on 100-nm-scale silicon pillars", *Applied Physics Letters*, vol. 81, No. 12, pp. 2261-2263, Sep. 16, 2002.

Kinaret, et al., "A carbon-nanotube-based nanorelay", *Applied Physics Letters*, vol. 82, No. 8, pp. 1287-1289, Feb. 24, 2003.

Nardelli, et al., "Mechanical properties, defects and electronic behavior of carbon nanotubes", *Carbon*, vol. 38, pp. 1703-1711, 2000.

Poncharal, et al., "Electrostatic deflections and electromechanical resonances of carbon nanotubes", *Science*, vol. 283, pp. 1513-1516, Mar. 5, 1999.

Radosavljevic, et al., "Nonvolatile molecular memory elements based on ambipolar nanotube field effect transistors", *Nano Letters*, vol. 2, No. 7, pp. 761-764, 2002.

Robinson, et al., "Self-aligned electrodes for suspended carbon nanotube structures", *MIcroelectronic Engineering*, vol. 67-68, pp. 615-622, 2003.

Rueckes, et al., "Carbon nanotube-based nonvolatile random access memory for molecular computing", *Science*, vol. 289, pp. 94-97, Jul. 7, 2000.

Ruoff, et al., "Mechanical and thermal properties of carbon nanotubes", *Carbon*, vol. 33, No. 7, pp. 925-930, 1995.

Sapmaz, et al., "Carbon nanotubes as nanoelectromechanical systems", *Physical Review B*, vol. 67, pp. 235414-1-235414-7, 2003.

Soh, et al., "Integrated nanotube circuits: Controlled growth and ohmic contacting of single-walled carbon nanotubes", *Applied Physics Letters*, vol. 75, No. 5, pp. 627-629, Aug. 2, 1999.

Sreekumar, et al., "Single-wall carbon nanotube films", *Chem. Matters*, vol. 15, pp. 175-178, 2003.

Srivastava and Banerjee, "A Comparative Scaling Analysis of Metallic and Carbon Nanotube Interconnections for Nanometer Scale VLSI Technologies", *Proceedings of the 21st International VLSI Multilevel Interconnect Conference (VMIC)*, Sep. 29-Oct. 2, 2004, Waikola, HI, pp. 393-398.

Tans, et al., "Room-temperature transistor based on a single carbon nanotube", *Nature*, vol. 393, pp. 49-52, May 7, 1998.

Tour, et al., "Nanocell electronic memories", *J. Am. Chem. Soc.*, vol. 125, pp. 13279-13283, 2003.

Verissimo-Alves, et al., "Electromechanical effects in carbon nanotubes: *Ab initio* and analytical tight-binding calculations", *Physical Review B*, vol. 67, pp. 161401-1-161401-4, 2003.

U.S. Appl. No. 10/341,005, Ward et al.

Ajayan, P. M. et al., "Applications of Carbon Nanotubes", Carbon Nanotubes, vol. 80, pp. 391-425, 2001.

Bachtold, A. et al., "Logic Circuits with Carbon Nanotube Transistors", *Science*, Nov. 9, 2001, vol. 294, pp. 1317-1320.

Boanard, J. M. et al., "Monodisperse Multiwall Carbon Nanotubes Obtained with Ferritin as Catalyst", Nano Letters, vol. 2, No. 6, pp. 665-667, 2002.

Cassell, A. M. et al., "Large Scale CVD Synthesis of Single-Walled Carbon Nanotubes". J. Phys. Chem. B, pp. 6484-6492, 1999.

Chen, B. et al., "Heterogeneous Single-Walled Carbon Nanotube Catalyst Discovery and Optimization", Chem. Mater., vol. 14, pp. 1891-1896, 2002.

Chen, J. et al., "Self-aligned carbon nanotube transistors with charge transfer doping", *Applied Physics Letters*, vol. 86, pp. 123108-1-123108-3, 2005 .

Chen, J. et al., "Self-aligned Carbon Nanotube Transistors with Novel Chemical Doping", *IEDM*, pp. 29.4.1-29.4.4, 2004.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Dai, H. et al., "Controlled Chemical Routes to Nanotube Architectures, Physics, and Devices", J. Phys. Chem. B, vol. 103, pp. 1126-11255, 1999.

Derycke, V. et al., "Controlling doping and carrier injection in carbon nanotube transistors", *Applied Physics Letters*, vol. 80, No. 15, pp. 2773-2775, Apr. 15, 2002.

Derycke, V., et al., "Carbon Nanotube Inter- and Intramolecular Logic Gates," *Nano Letters*, Sep. 2001, vol. 1, No. 9, pp. 453-456.

Desai et al., "Freestanding Carbon Nanotube Specific Fabricaton", *Proc. of 2005, 5th IEEE Conf., Nanotech*, Nagoya, Japan, pp. 1-4, Jul. 2005.

Duan, X. et al., "Nonvolatile Memory and Programmable Logic from Molecule-Gated Nanowires", *Nano Letters*, vol. 0, No. 0, pp. A-D, 2002.

Franklin, N. R. et al., "Enhanced CVD Approach to Extensive Nanotube Networks with Directionality", Advanced Materials, 5 pages, 2000.

Hafner, J. H. et al., "Catalytic growth of single-wall carbon nanotubes from metal particles", Chemical Physics Letters, vol. 296, pp. 195-202, Oct. 30, 1998.

Heinze, S. et al., "Carbon Nanotubes as Schottky Barrier Transistors", *Physcical Review Letters*, vol. 89, No. 10, pp. 16801-1-106801-4, 2002.

Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-91, 2002.

Huang, Y., et al., "Logic Gates and Computation from Assembled Nanowire Building Blocks," *Science*, Nov. 9, 2001, vol. 294, pp. 1313-1316.

Javey, A. et al., "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "High-k dielectrics for advanced carbon-nanotube transistors and logic gates", *Nature Materials*, vol. 1, pp. 241-246, Dec. 2002.

Javey, A. et al., "Carbon Nanotube Transistor Arrays for Multistage Complementary Logic and Ring Oscillators," *Nano Letters*, 2002, vol. 2, No. 9, pp. 929-932.

Joselevich, E., "Vectorial Growth of Metallic and Semiconducting Single-Wall Carbon Nanotubes", Nano Letters, vol. 0, No. 0, A-E, 2002.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors," Science, 2000, vol. 287 pp. 622-625.

Li, J. et al., "Carbon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y. et al., "Preparation of Monodispersed Fe-Mo Nanoparticles as the Catalyst for CVD Synthesis of Carbon Nanotubes", Chem. Mater., vol. 13, pp. 1008-1014, 2001.

Lin, Y.M. et al., "Novel Carbon Nanotube FET Design with Tunable Polarity", *IEDM*, pp. 29.2.1-29.2.4, 2004.

Martel, R., et al., "Carbon Nanotube Field-Effect Transistors and Logic Circuits," *DAC 2002*, Jun. 10-12, 2002, vol. 7.4, pp. 94-98.

Nerushev, O. A., et al., "Carbon nanotube films obtained by thermal chemical vapour deposition", J. Mater. Chem., vol. 11, pp. 1122-1132, 2001.

Onoa et al., "Bulk Production of singly dispersed carbon nanotubes with prescriped lengths", *Nanotechnology*, vol. 16, pp. 2799-2803, 2005.

Parikh, K. et al., "Flexible vapour sensors using single walled carbon nanotubes", Sensors and Actuators B, vol. 113, pp. 55-63, 2006.

Peigney, M. et al., "A Study of the Formation of Single- and Double-Walled Carbon Nanotubes by a CVD Method", J. Phys. Chem. B., vol. 105, pp. 9699-9710, 2001.

Qi, P. et al., "Toward Large Arrays of Multiplex Functionalization Carbon Nanotube Sensors for Highly Sensitive and Selective Molecular Detection," *Nano Lett.* 2003, vol. 3(3), pp. 347-351.

Sotiropoulou, S. et al., "Carbon nanotube array-based biosensor", Anal. Bioanal. Chem, vol. 375, pp. 103-105, 2003.

Valentini, L. et al., "Sensors for sub-ppm NO2 gas detection based on carbon nanotube thin films", Applied Physics Letters, vol. 82, No. 6, pp. 961-963, Feb. 10, 2003.

Wind, S. J. et al., "Fabrication and Electrical Characterization of Top Gate Single-Wall Carbon Nanotube Field-Effect Transistors", 14 pages.

Wind, S. J. et al., "Vertical scaling of carbon nanotube field-effect transistors using top gate electrodes", *Applied Physics Letters*, vol. 80, No. 20, pp. 3817-3819, May 20, 2002.

Zhang et al., "Formation of metal nanowires on suspened signal-walled carbon nanotubes", *Appl. Phys. Lett.*, vol. 77, p. 3015, Nov. 2000.

Zhang, Y. et al., "Metal coating on suspended carbon nanotubes and its implication to metal-tube interaction", Chemical Physics Letters, vol. 331, pp. 35-41, 2000.

Zhang, Z. et al., "Select Pathways to Carbon Nanotube Film Growth", Advanced Materials, 4 pages, Jun. 19, 2001.

Zhao, Y. P. et al, Frequency-dependent electrical transport in carbon nanotubes', Physical Review B., vol. 64, pp. 201402-1 to 201402-4, 2001.

Ago, Hiroki et al. "Workfunction of Purified and Oxidised Carbon Nanotubes," Synthentic Metals 103 (1999) 2494-2495.

Banerjee, Sarbajit and Stanislaus S. Wong. "Functionalization of Carbon Nanotubes with a Metal-Containing Molecular Complex." Nano Letters (2001); 0, A-E.

Chiang, et al., Purification and Characterization of Single-Wall Carbon Nanotubes (SWNTs) Obtained from the Gas-Phase Decomposition of CO (HiPco Process), J. Phys. Chem. B, vol. 105, pp. 8297-8301, 2001.

Delzeit, L., et al., "Multilayered Metal Catalysts for Controlling the Density of Single-walled Carbon Nanotube Growth." Chemical Physics Letters, 348, 368, 2001.

Haddon, R. C. "Purification and Separation of Carbon Nanotubes," MRS Bulletin, Apr. 2004, 8 pages.

International Search Report, Nantero, Inc., International Application No. PCT/US05/45316, Sep. 6, 2006. 2 pages.

Jeong, Tak, et al., "A new purification method of single-wall carbon nanotubes using H2S and O2 mixture gas" Chemical Physics Letters (2001) 344: 18-22.

Kahn, Michael G. C., et al. "Solubilization of Oxidized Single-Walled Carbon Nanotubes in Organic and Aqueous Solvents through Organic Derivation" (2002) 2(11) 1215-1218.

Shelimov, Konstantin B., et al., "Purification of single-wall carbon nanotubes by ultrasonically assisted filtration" Chemical Physics Letters (1998) 282: 429-434.

Internatiional Search Report and Written Opinion, Nantero, Inc., International Application No. PCT/US05/18467, Oct. 1, 2007, 5 pages.

International Search Report and Written Opinion, Nantero, Inc., International Application No. PCT/US05/18539, Sep. 18, 2006, 4 pages.

Niu, Chunming, "High Power Electrochemical Capacitors Based on Carbon Nanotube Electrodes," Appl. Phys. Lett. 70(11), Mar. 17, 1997, 3 pages.

* cited by examiner

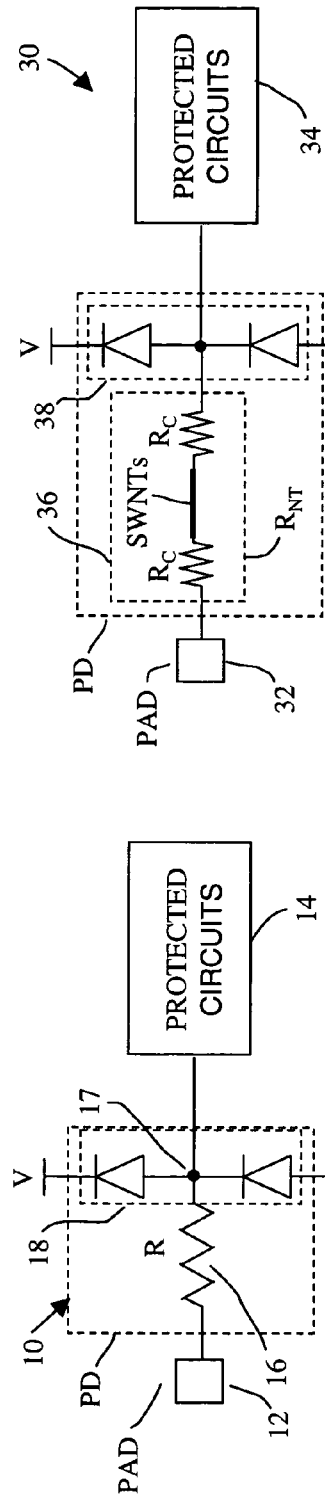
Figure 1: PRIOR ART
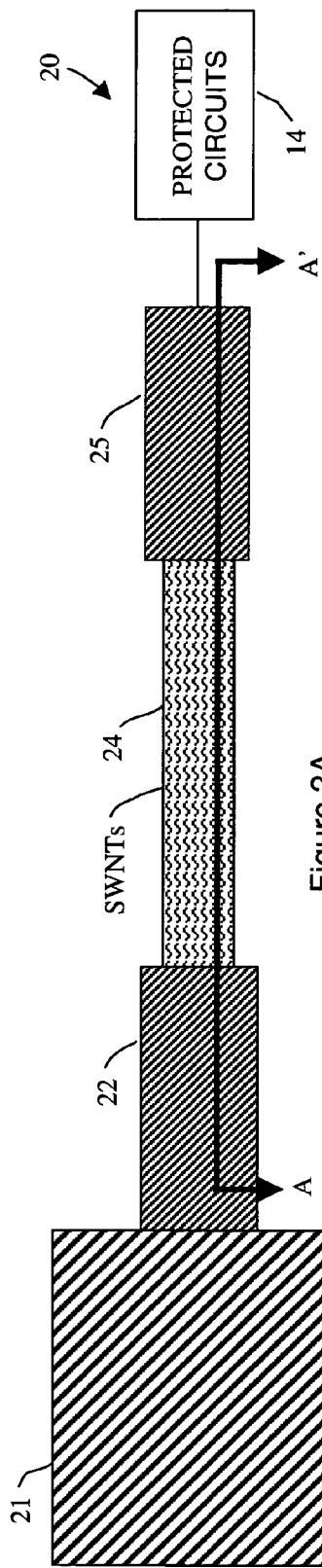
Figure 2A
Figure 2B
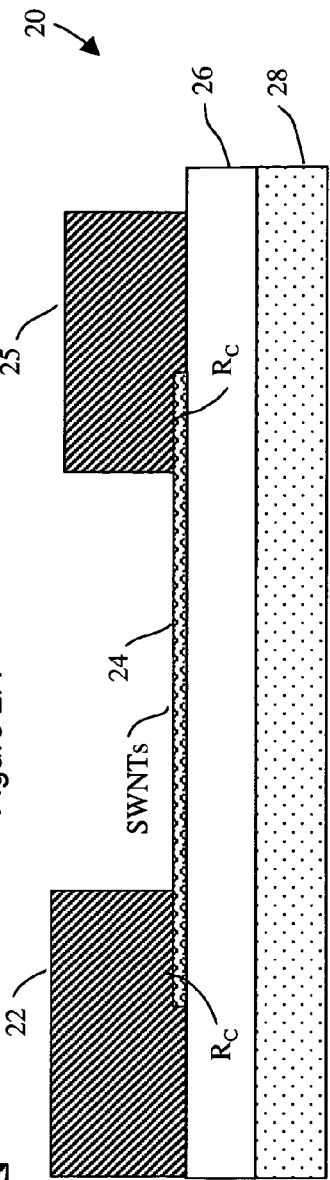
Figure 2C

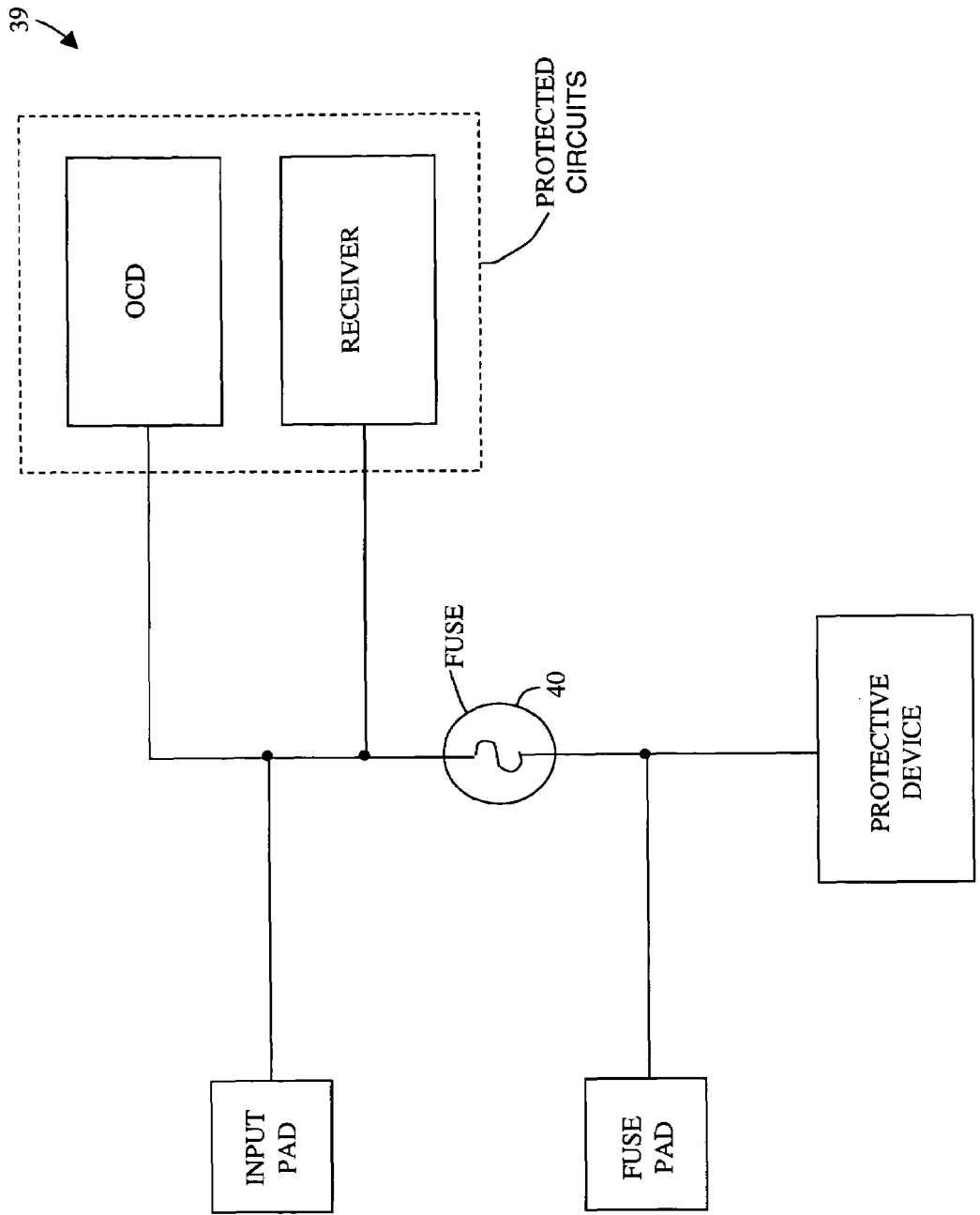
Figure 3: PRIOR ART

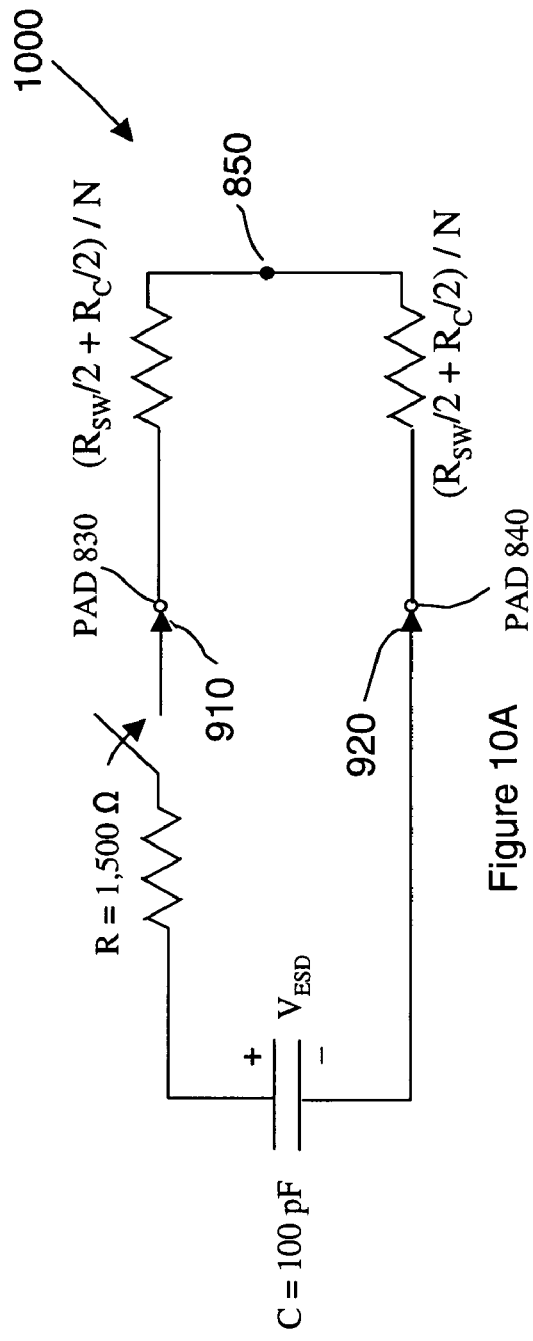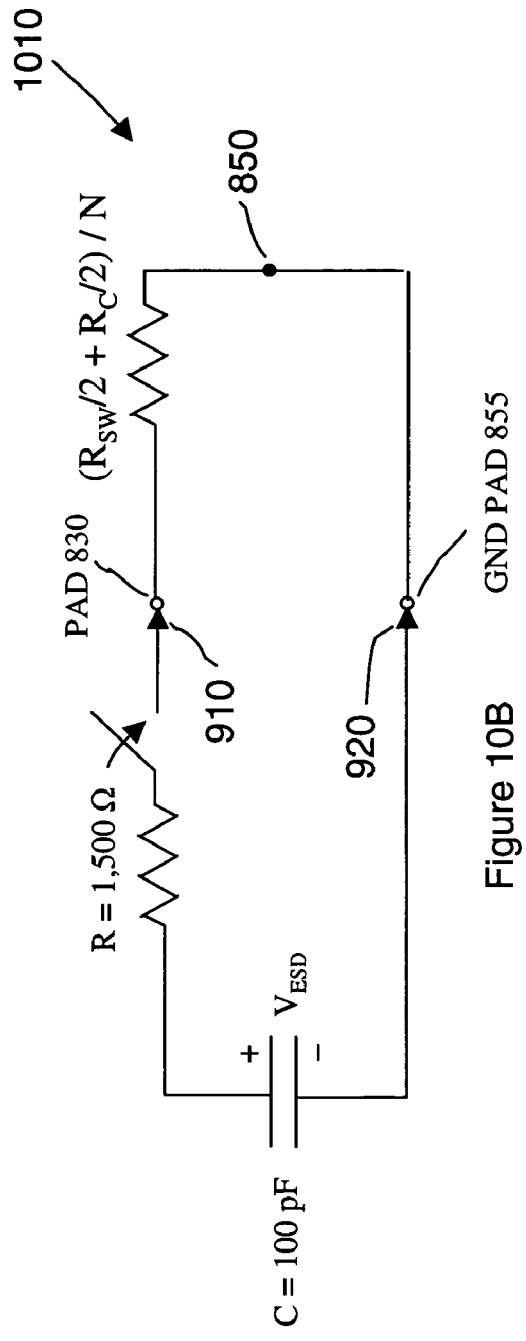
Figure 10A
Figure 10B

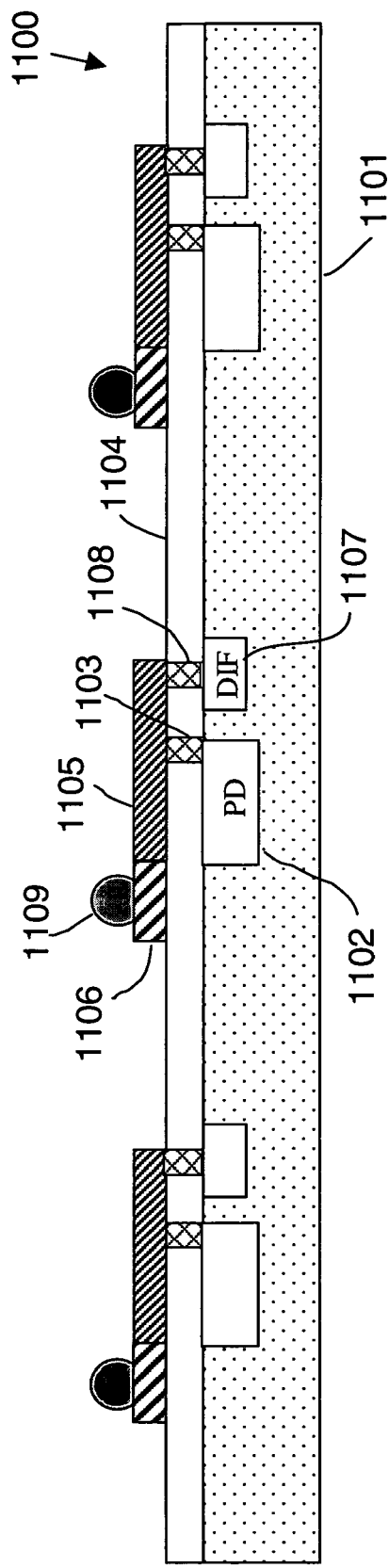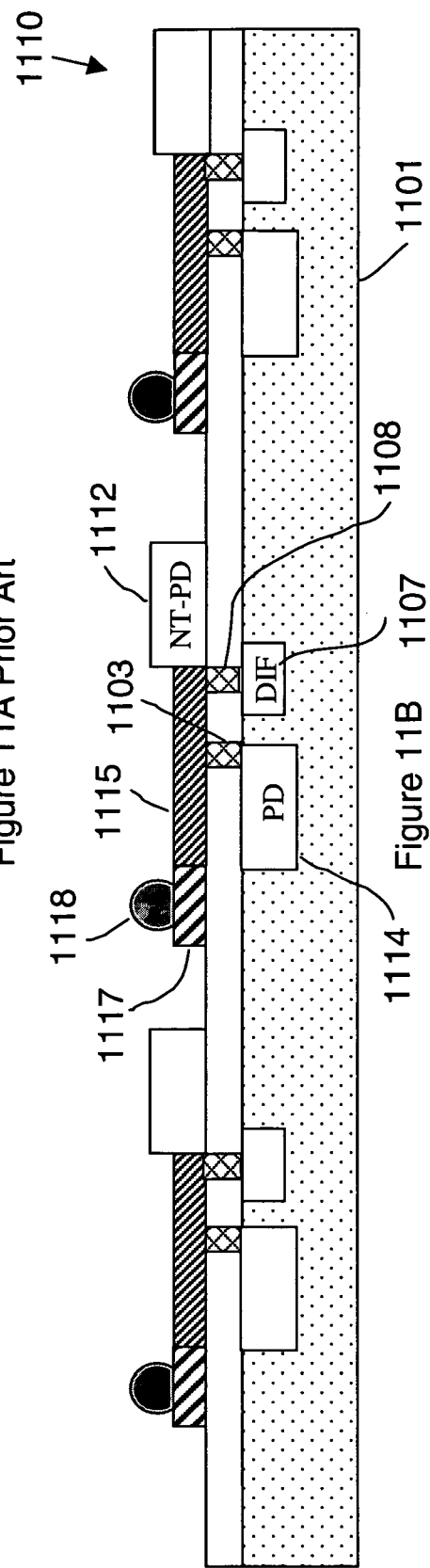
Figure 11A Prior Art
Figure 11B

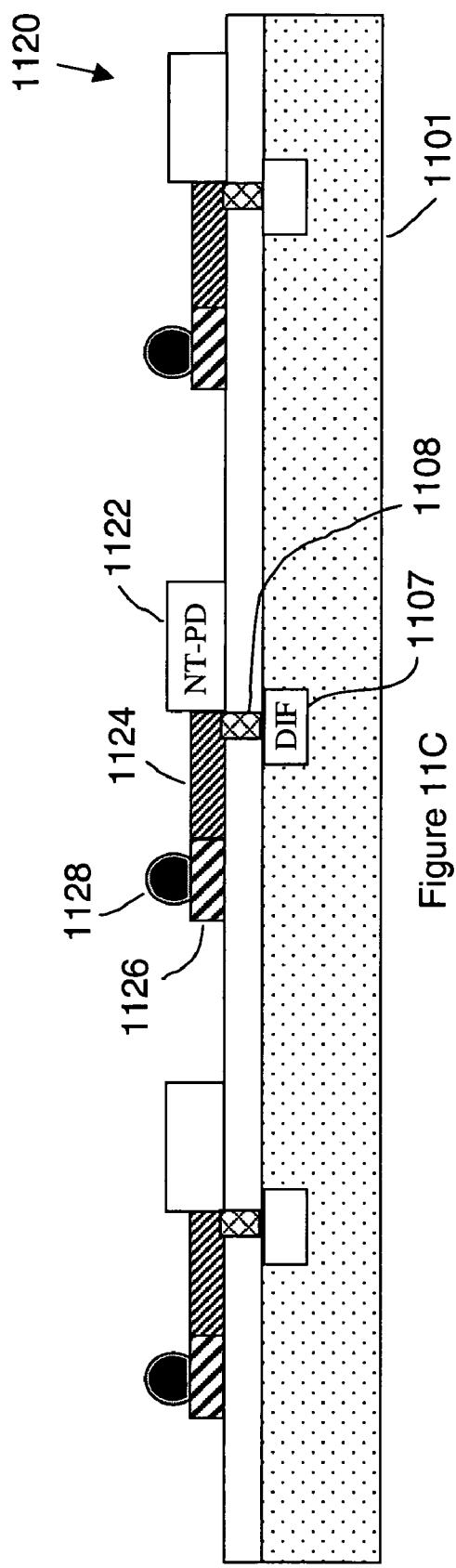
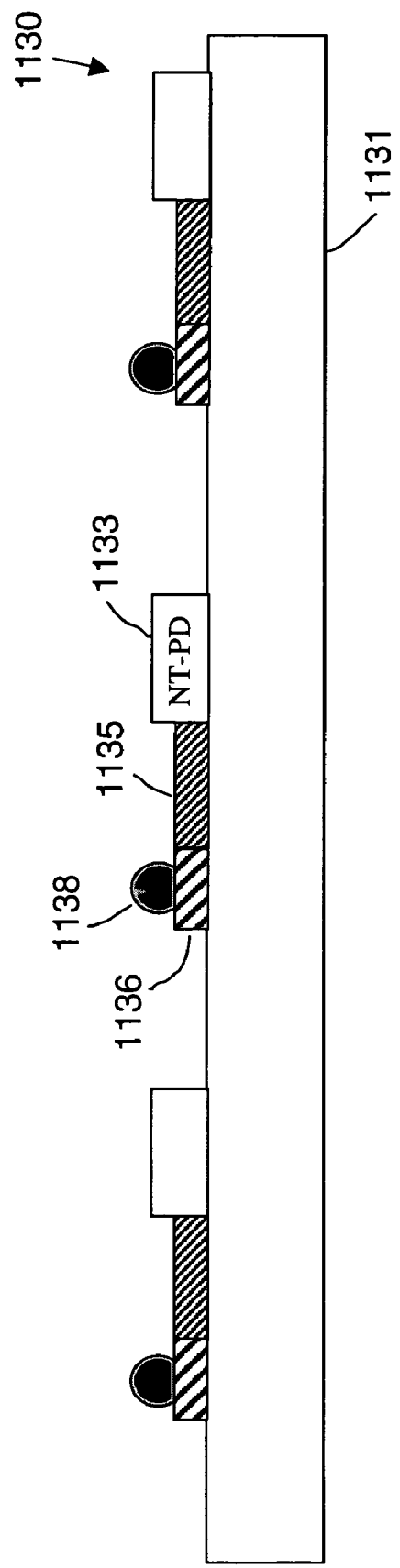
Figure 11C
Figure 11D

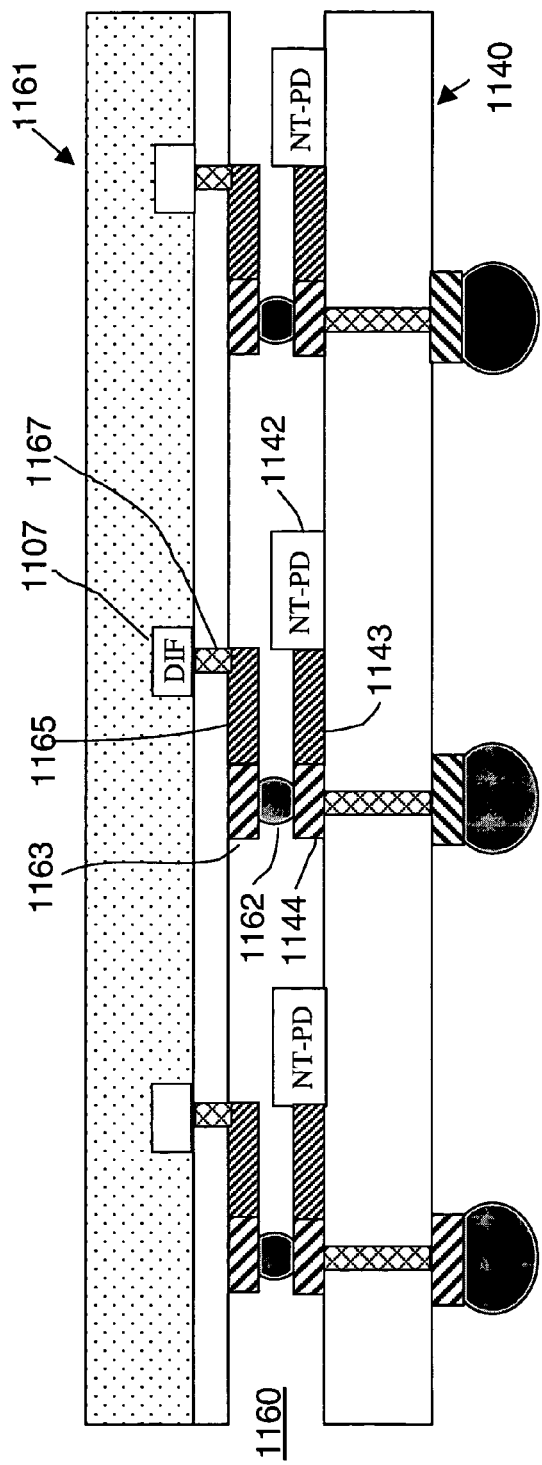
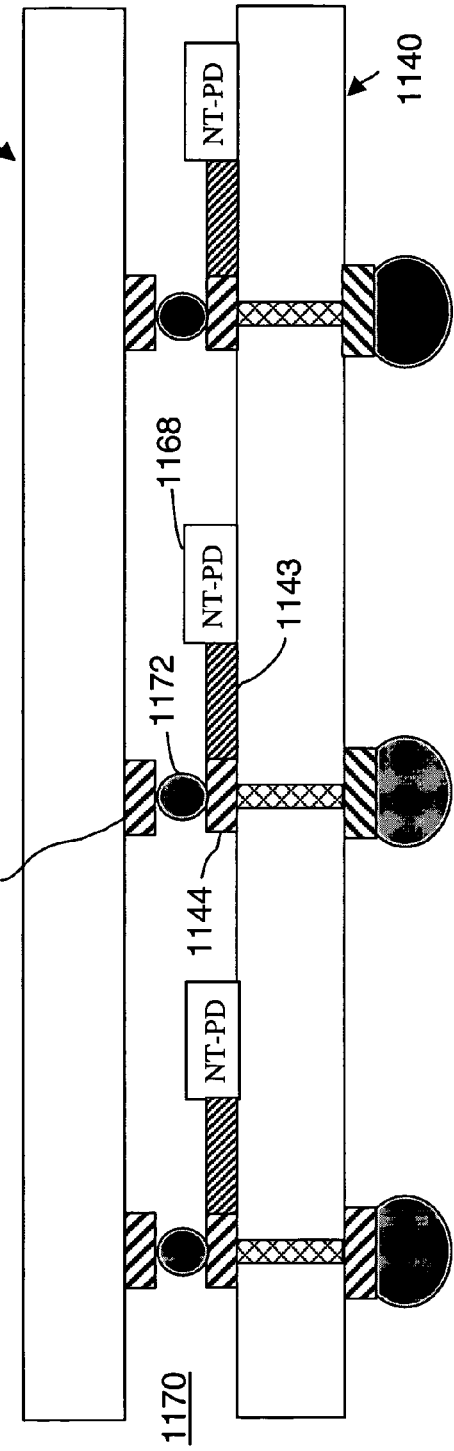
Figure 11G
Figure 11H

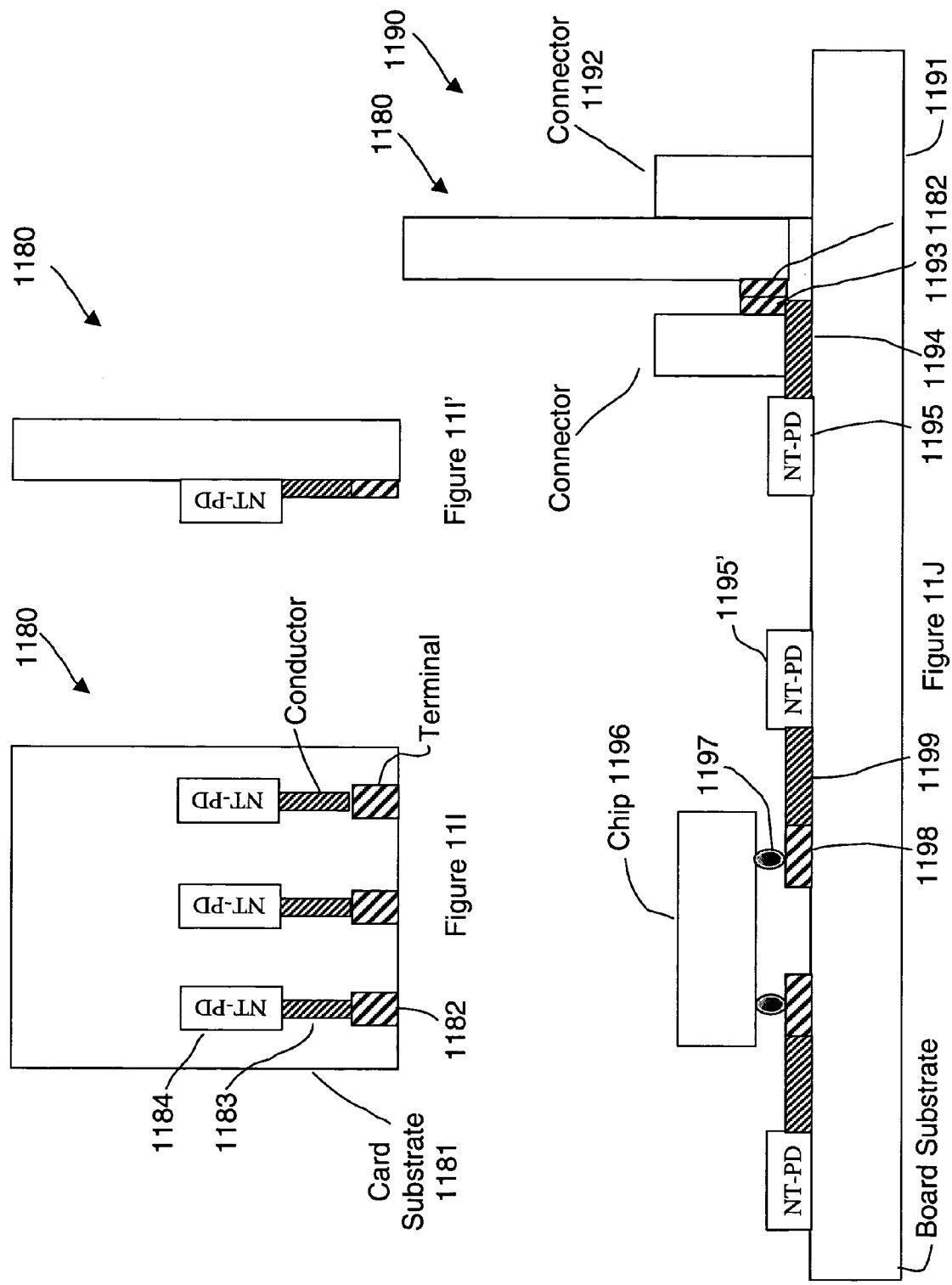

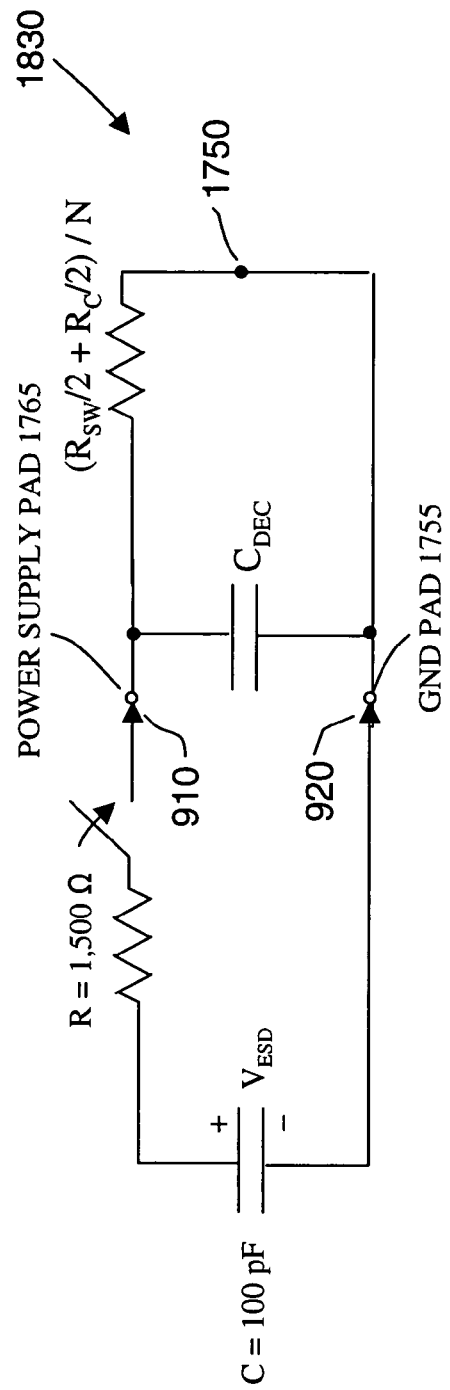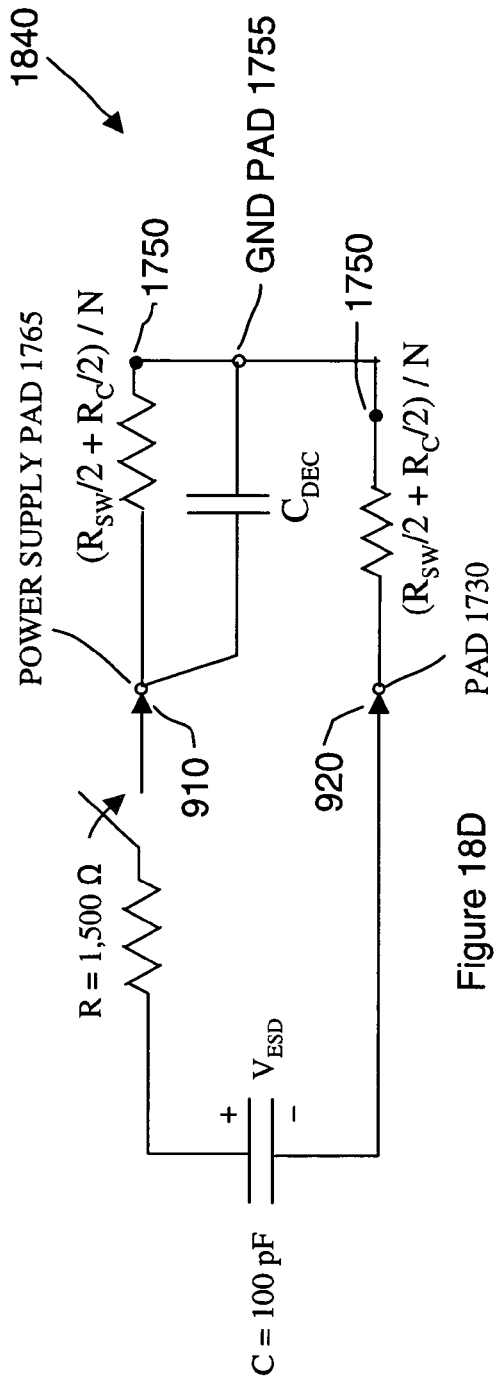
Figure 18C
Figure 18D

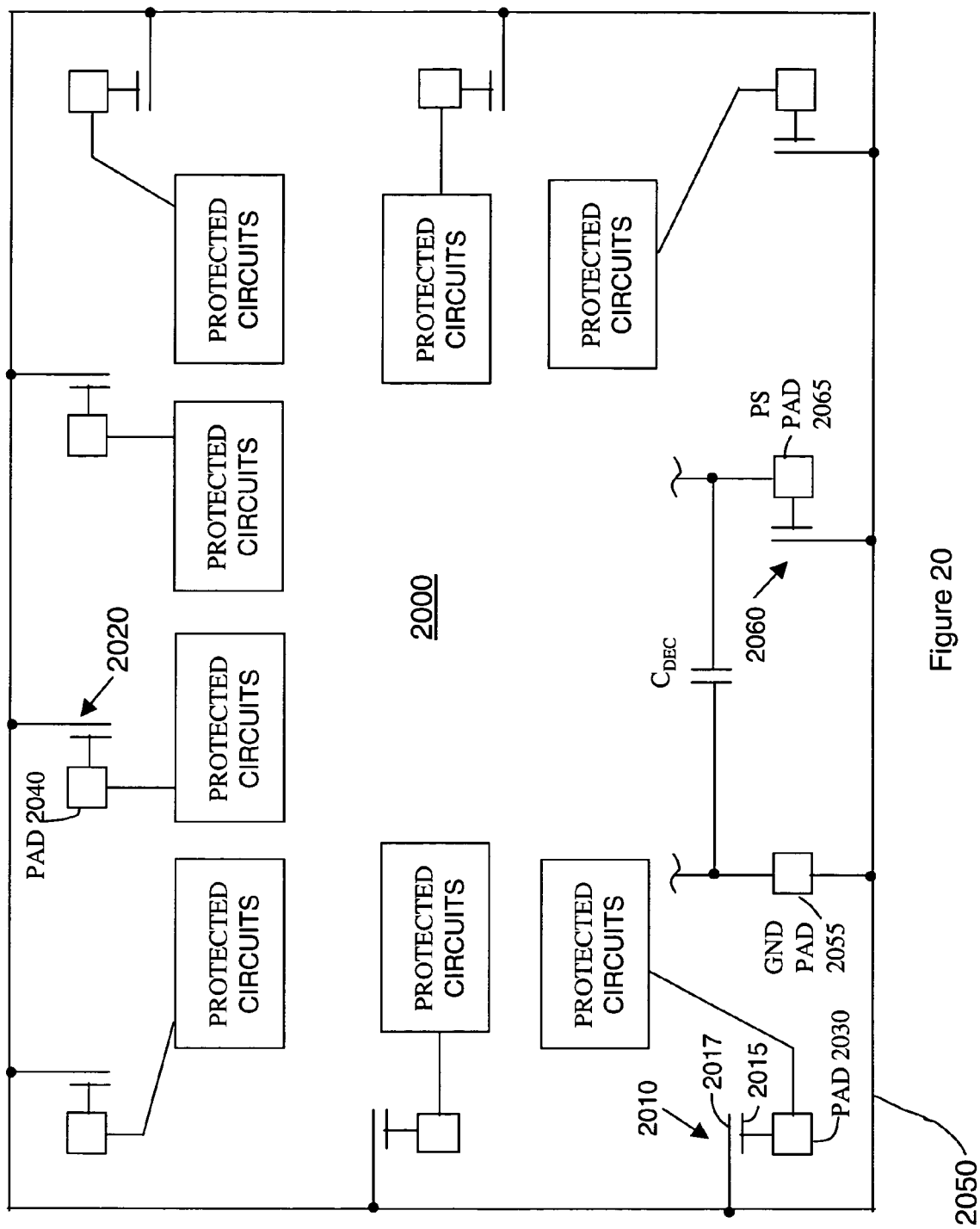

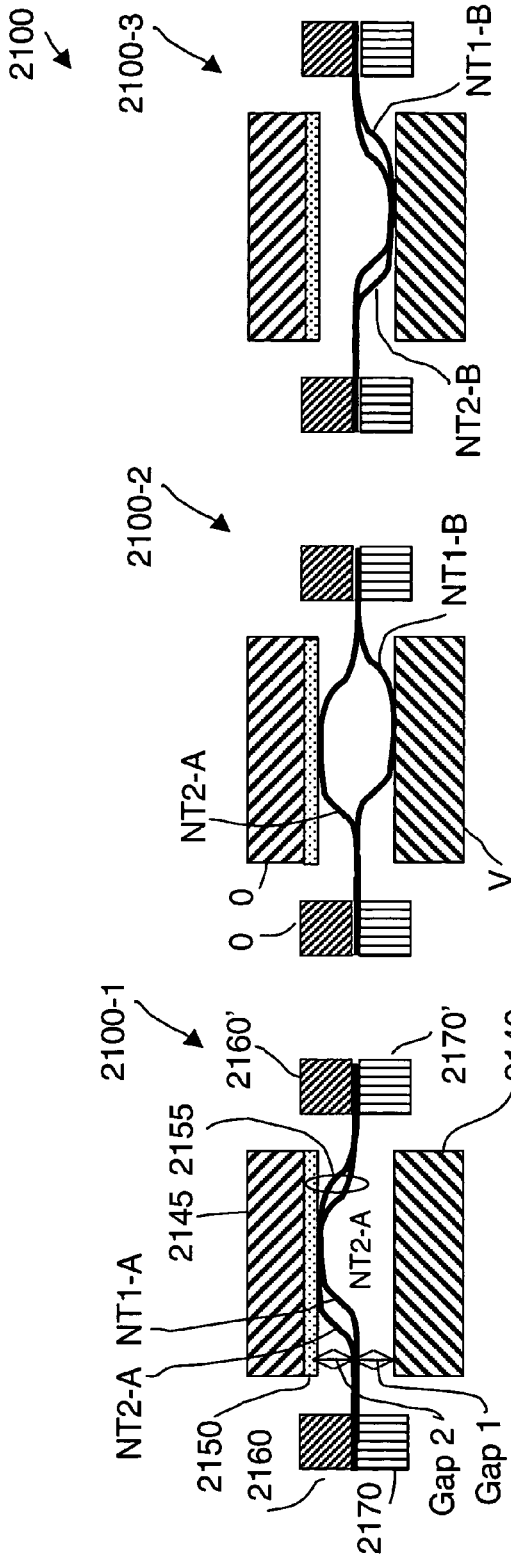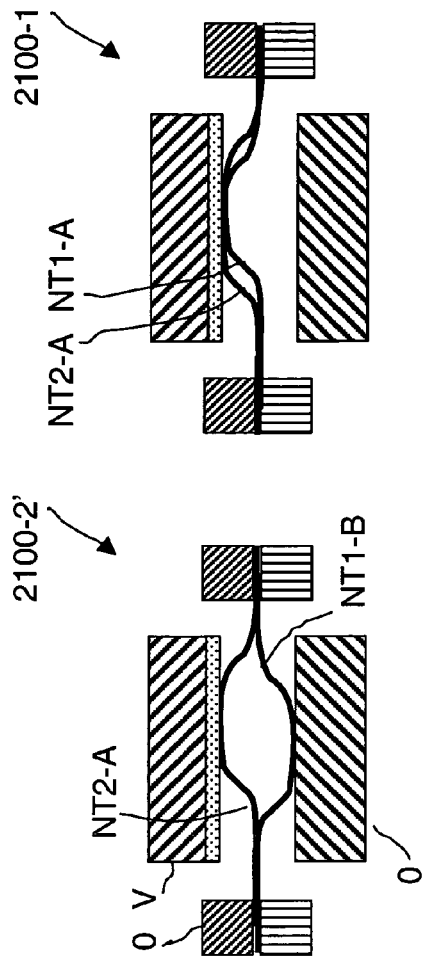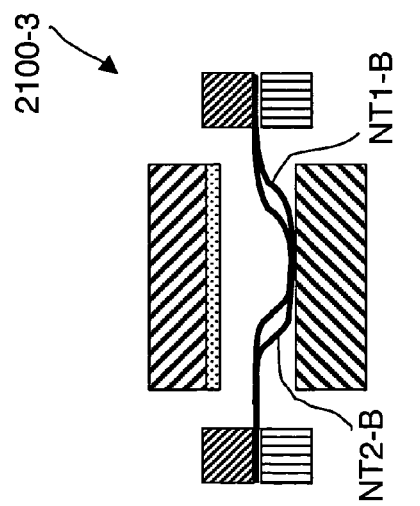
Figure 21A Prior Art
Figure 21B Prior Art
Figure 21C Prior Art
Figure 21D Prior Art
Figure 21E Prior Art
Figure 21F Prior Art

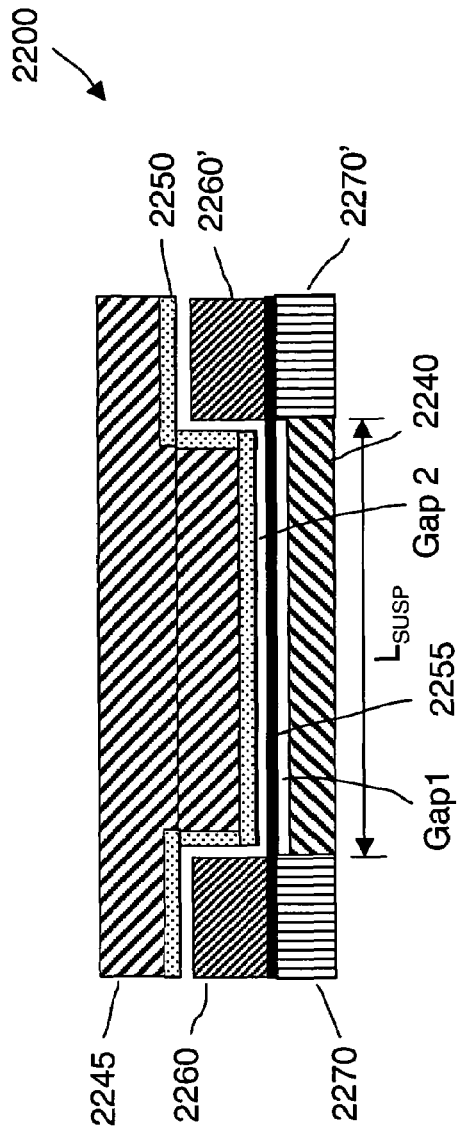
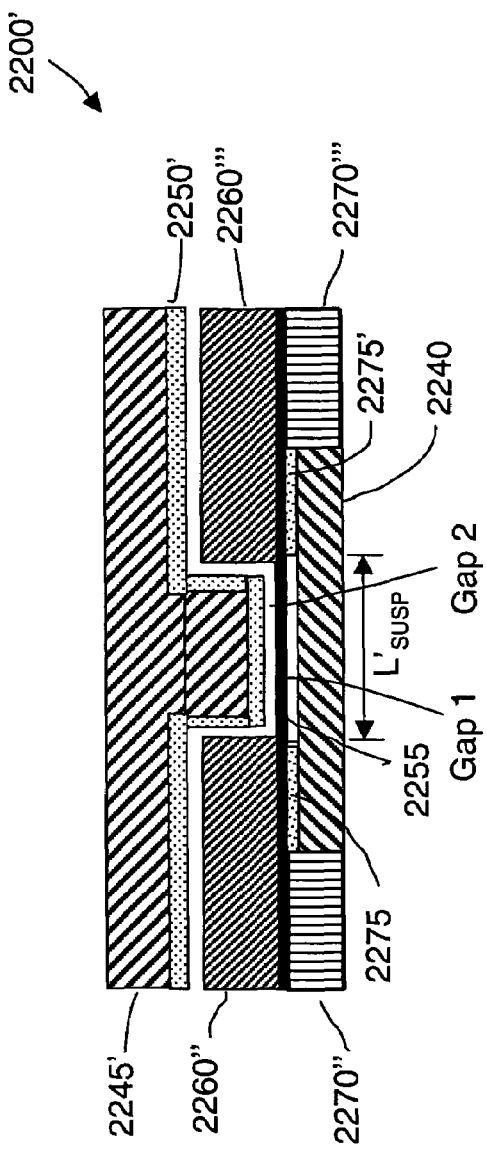
Figure 22A Prior Art
Figure 22B Prior Art

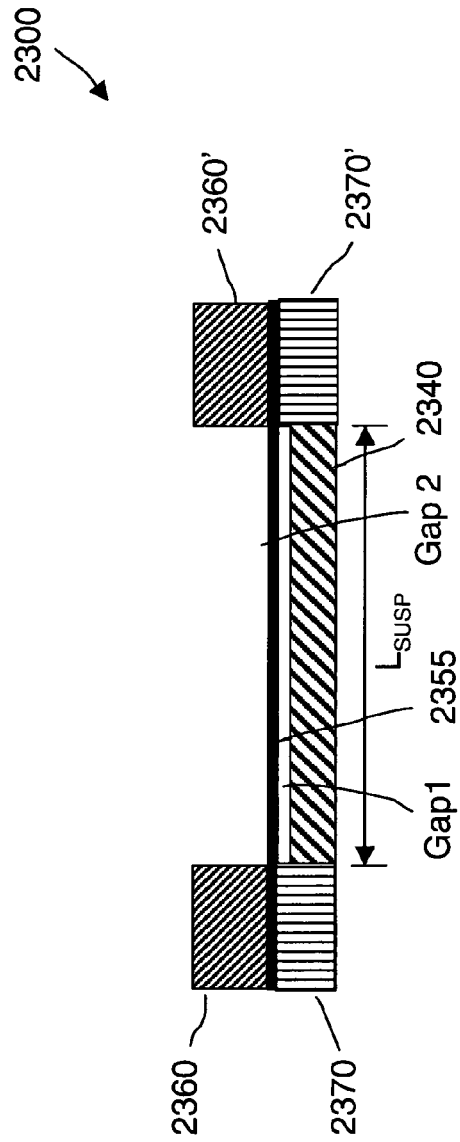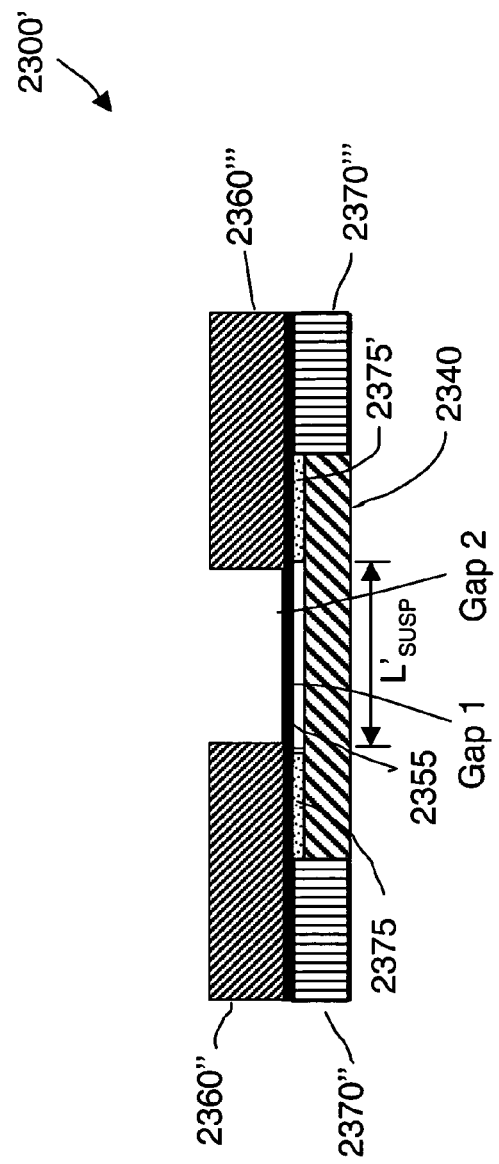
Figure 23A
Figure 23B

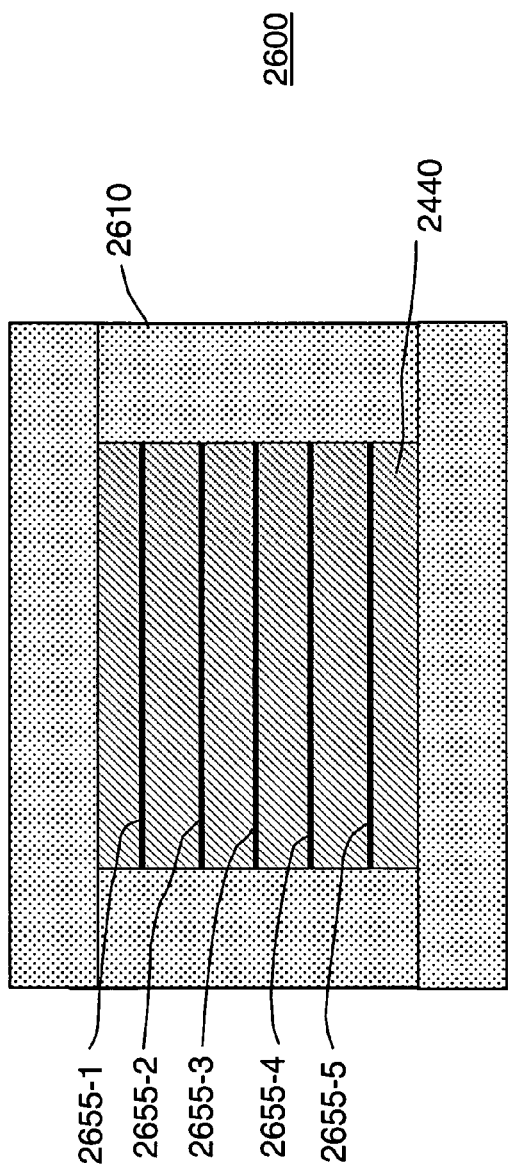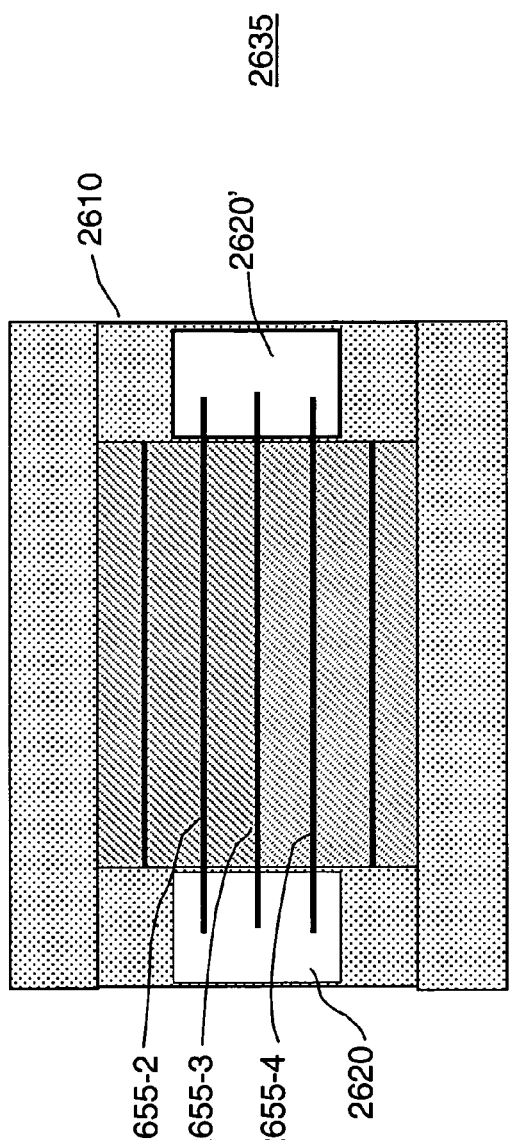
Figure 26A Prior Art
Figure 26B Prior Art

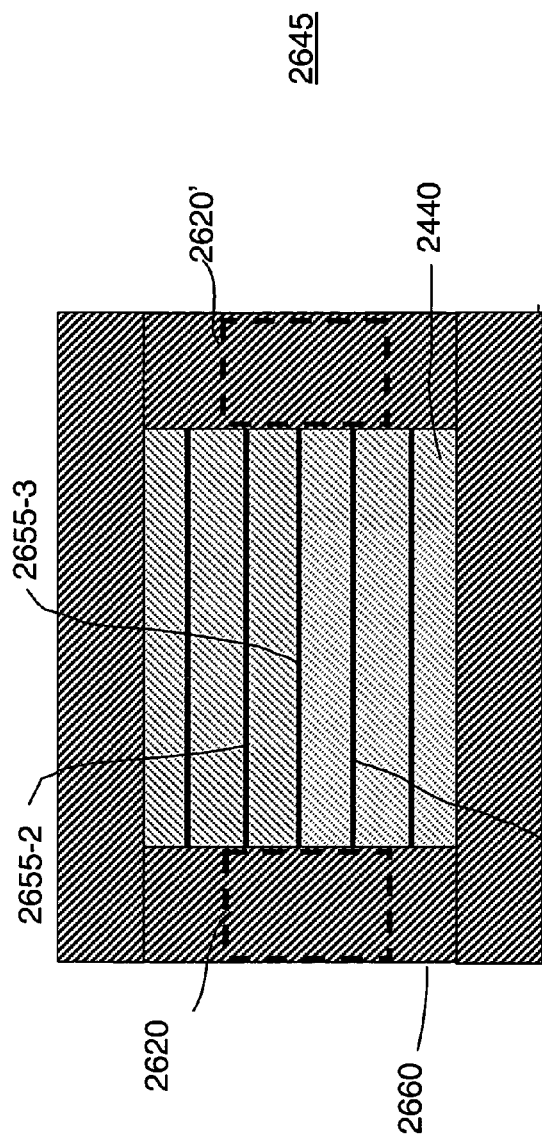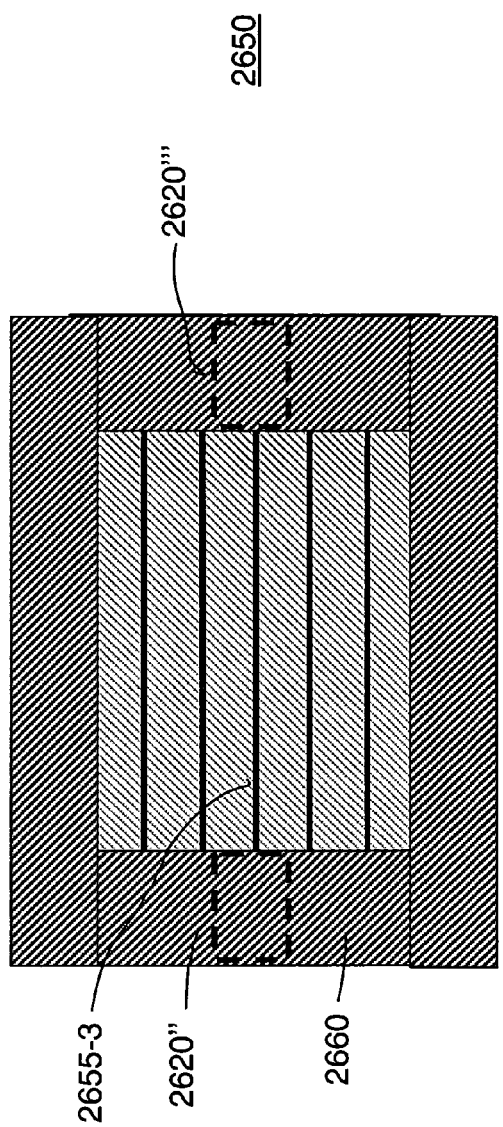
Figure 26C Prior Art
Figure 26D Prior Art

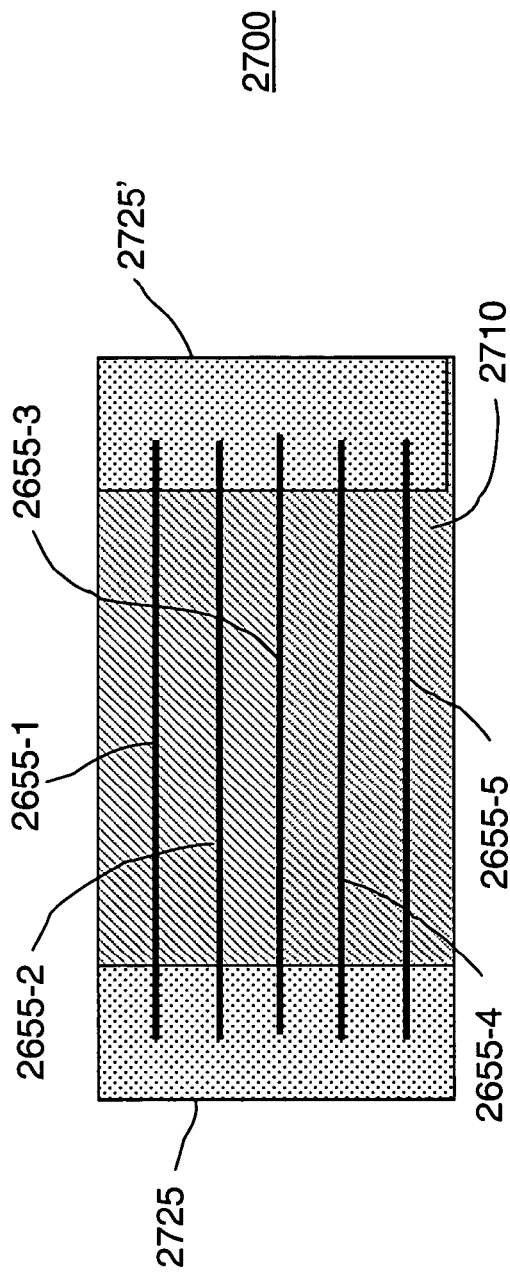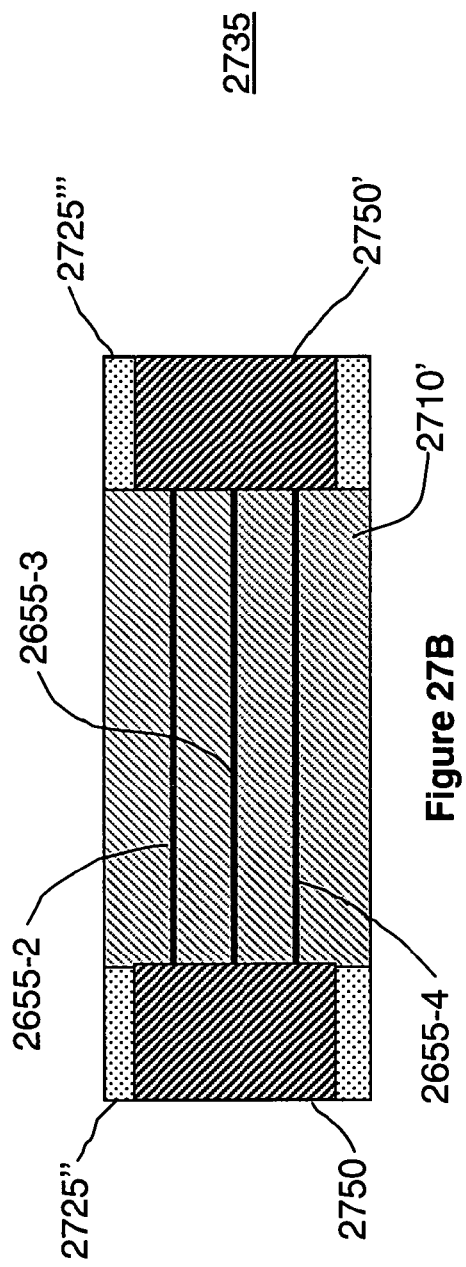
Figure 27A
Figure 27B

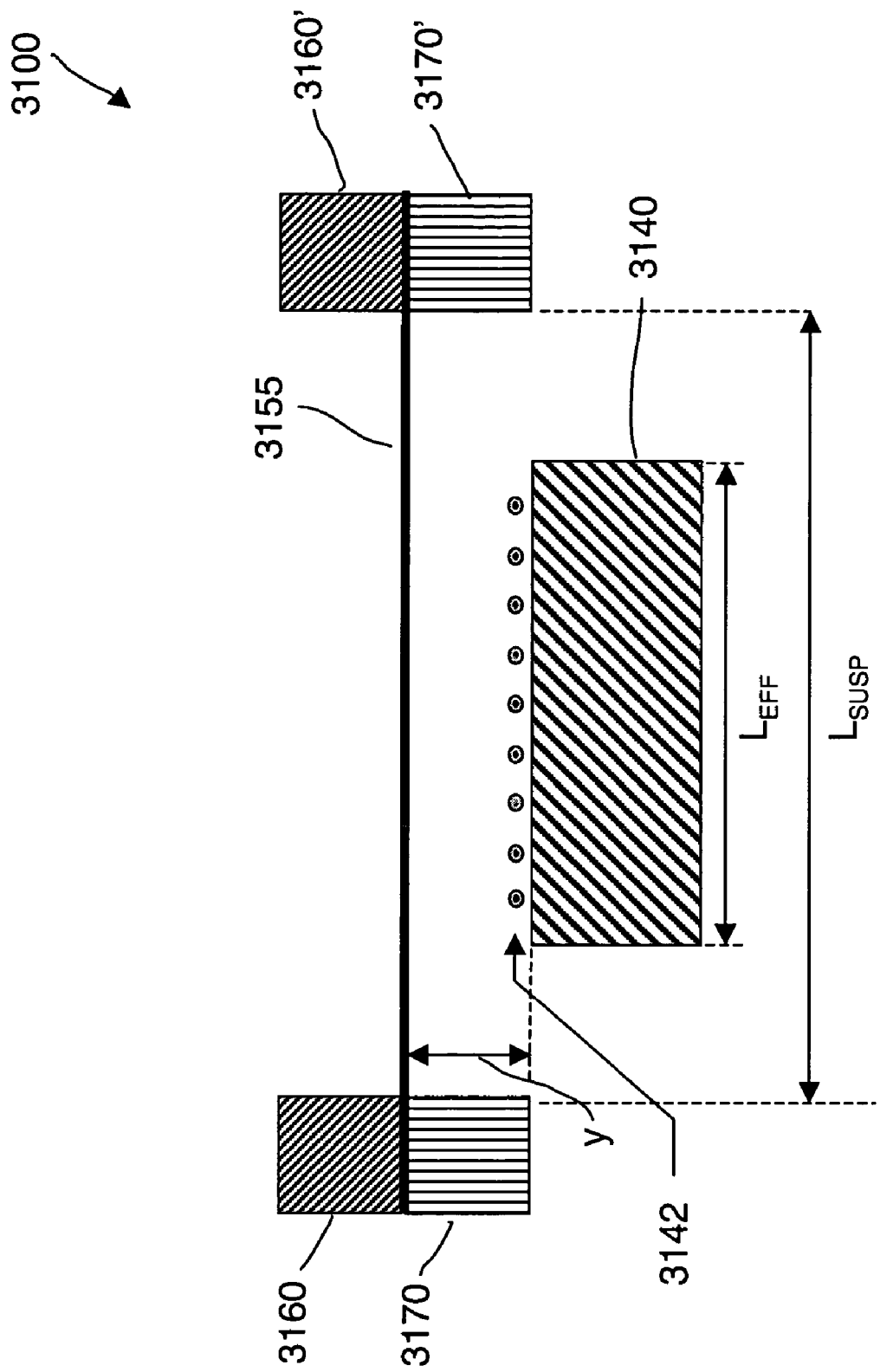

NANOTUBE ESD PROTECTIVE DEVICES AND CORRESPONDING NONVOLATILE AND VOLATILE NANOTUBE SWITCHES

CROSS-REFERENCE TO RELATED APPLICATION

This application claims priority under 35 U.S.C. § 19(e) to the following applications, the contents of which are incorporated herein in their entirety by reference:

U.S. Provisional Patent Application No. 60/624,428, filed on Nov. 2, 2004, entitled Nonvolatile Carbon Nanotube Protective Devices (NV-NT-PDs); and U.S. Provisional Patent Application No. 60/624,297, filed on Nov. 2, 2004, entitled Enhanced CNT Switching Operation.

BACKGROUND

1. Technical Field

The present application generally relates to ESD protections and, more specifically, to the use of nanotube switching elements in the formation of circuits for enhanced electrostatic discharge (EDS) protection of semiconductor, hybrid semiconductor and nanotube, and nanotube-only circuits.

2. Discussion of Related Art

Electrical overstress resulting from electrostatic discharge (ESD) is a major problem in every generation of electronic devices, resulting in oxide and junction failures such as series resistor rupture, open circuits and short circuits, for example. Nanotube resistors may be used to replace presently used series resistors such as polysilicon, for example, and improve protective device resistance to ESD-induced failure.

FIG. 1 illustrates a prior art protective device (PD) schematic 10 that includes a series resistor 16 and semiconductor diodes 18. An ESD pulse applied to the input pad 12 is attenuated by resistor 16 and semiconductor diodes 18, reducing the ESD voltage applied to node 17, thereby preventing damage to protected circuits 14 as described in the referenced book H. B. Bakoglu, "Circuits, Interconnections, and Packaging for VLSI," Addison-Wesley Publishing Company, 1990, pages 46-51. For some input or output pads there is no series resistance 16, and only semiconductor diodes 18 are used. Resistor 16 may be fabricated using polysilicon or diffusion layers, for example, or other suitable resistive material, and may be in the range of 10 to 100,000 ohms, for example. Conventional resistors fabricated using polysilicon or diffusion layers, for example, can fail in the presence of an ESD pulse, with the resistor becoming an open circuit, for example, due to a combination of current density and temperature.

Prior art protective device structures 10 such as those illustrated schematically in FIG. 1 have high relative capacitance values, 1.5 pF, for example, as described in Bertin et. al. U.S. Pat. No. 6,141,245. If an output driver drives eight chips in parallel as in a memory address line, for example, then the protective device contribution to the capacitive loading is 12 pF. FIG. 3 illustrates prior art structure 39 illustrated in U.S. Pat. No. 6,141,245 in which a fuse 40 is added in series with prior art protective devices, along with a fuse pad, such that current can be forced between the input pad and the fuse pad. After the component is installed in a system, current is forced through the fuse until it open-circuits disconnecting the protective device from the protected circuits to reduce capacitance loading, as described in U.S. Pat. No. 6,141,245. The component cannot be removed and handled again without a high risk of ESD damage because the fuse blow operation is irreversible.

Carbon nanotubes can tolerate current densities in excess of 100 times the current densities of copper, exhibit high thermal conductivity, and do not fail due to overheating as described in the reference Srivastava and Banerjee, "A Comparative Scaling Analysis of Metallic and Carbon Nanotube Interconnections for Nanometer Scale VLSI Technologies," Proceedings of the 21$^{st}$ International VLSI Multilevel Interconnect Conference (VMIC), September. 39-October 2, Waikoloa, Hi., pp. 393-398, 2004. These, and other properties of carbon nanotubes are described in Nantero carbon nanotube patents, patent publications, dockets, etc. herein incorporated.

SUMMARY

The invention provides nanotube ESD protective devices and corresponding nonvolatile and volatile nanotube switches.

Under one aspect of the invention, an electrostatic discharge (ESD) protection circuit for protecting a protected circuit is coupled to an input pad. The ESD circuit includes a nanotube switch electrically having a control. The switch is coupled to the protected circuit and to a discharge path. The nanotube switch is controllable, in response to electrical stimulation of the control, between a de-activated state and an activated state. The activated state creates a current path so that a signal on the input pad flows to the discharge path to cause the signal at the input pad to remain within a predefined operable range for the protected circuit.

Under another aspect of the invention, the nanotube switch, the input pad, and the protected circuit are on a semiconductor chip.

Under another aspect of the invention, the nanotube switch is on a chip carrier.

Under another aspect of the invention, the deactivated and activated states are non-volatile states.

Under another aspect of the invention, the deactivated and activated states are volatile states.

Under another aspect of the invention, the ESD circuit may be repeatedly programmed between the activated and deactivated states so as to repeatedly activate and deactivate ESD protection of the protected circuit.

Under another aspect of the invention, the nanotube switch provides protection based on the magnitude of the signal on the input pad.

Under another aspect of the invention, an electrostatic discharge (ESD) protection circuit is coupled to an input pad for protecting a protected circuit that is also coupled to the input pad. The ESD protection circuit includes a nanotube switch having at least two terminals and at least one control. A first of the two terminals is electrically coupled to the input pad and protected circuit and a second of the two terminals is coupled to a discharge path. The nanotube switch is controllable, in response to electrical stimulation of the control, between a de-activated state and an activated state. The de-activated state presents a relatively high impedance between the first and second terminals of the nanotube switch so that a signal on the input pad passes to the protected circuit substantially unaltered. The activated state presents a relatively low impedance between the first and second terminals of the nanotube switch so that a signal on the input pad flows to the discharge path coupled to the second terminal. The nanotube switch includes a nanotube element having a plurality of nanotubes. The nanotube is sized to produce the relatively low impedance of the nanotube switch in the activated state. The relatively low impedance is sufficient to cause the signal at the input pad to remain within a predefined operable range for the protected circuit.

BRIEF DESCRIPTION OF THE DRAWINGS

In the Drawing,

FIG. 1 shows a schematic representation of a prior art conventional protective device;

FIGS. 2A and 2B illustrate a cross section and plan view of a carbon nanotube resistor that may be used to replace a conventional series resistor;

FIG. 2C shows a schematic representation of a conventional protective device with a series carbon nanotube resistor;

FIG. 3 shows a schematic representation of a prior art integrated protective device scheme that includes a fuse that may be opened once to isolate the protective device from chip circuits in a semiconductor chip;

FIG. 8B' shows the schematic of FIG. 8B with modified power supply and mode pad protection;

FIG. 10A shows an equivalent circuit schematic of an ESD source connected between two pads (terminals) of an activated nonvolatile nanotube protective device, typically input, output, or input/output signal pads (terminals);

FIG. 10B shows an equivalent circuit schematic of an ESD source connected between a pads (signal pad, for example) and a ground pad of an activated nonvolatile nanotube protective device;

FIG. 11A illustrates a simplified cross section of a prior art semiconductor chip with conventional protective devices;

FIG. 11B illustrates a cross section of FIG. 11A with the addition of nonvolatile nanotube protective devices;

FIG. 11C illustrates a cross section of FIG. 11B with ESD protection using only nonvolatile nanotube protective devices;

FIG. 11D illustrates a simplified cross section of a nanotube-only chip using only nonvolatile nanotube protective devices;

FIG. 11G illustrates a simplified cross section of a semiconductor chip without conventional chip level protective device protection, with nonvolatile nanotube device protection only at the chip carrier level;

FIG. 11H illustrates a simplified cross section of a nanotube-only chip without nonvolatile nanotube protective device protection at the chip level, with nonvolatile nanotube device protection only at the chip carrier level;

FIGS. 11I and 11I' illustrate a simplified cross section of a card substrate with nonvolatile nanotube protective device added to the card terminals;

FIG. 11J illustrates a simplified cross section of a board substrate with nonvolatile nanotube protective device added to board chip-attach terminals and connector terminals;

FIG. 18C shows an equivalent circuit schematic of an ESD source connected between a power supply pad and a ground pad of an activated volatile nanotube protective device;

FIG. 18D shows an equivalent circuit schematic of an ESD source connected between a power supply pad and a pad (signal pad, for example of an activated volatile nanotube protective device);

FIG. 20 shows a schematic of simplified volatile nanotube protective devices integrated into a chip or package;

FIGS. 21A-F show a simplified cross sectional representation of a prior art nonvolatile nanotube switch switching between ON and OFF states;

FIGS. 22A-B show prior art cross sections of three terminal nonvolatile devices with varying nanotube suspended lengths;

FIGS. 23A-B show three terminal volatile devices with varying nanotube suspended lengths;

FIGS. 26A-D show a modified prior art picture frame device structure that reduces the suspended length variation of selected essentially parallel individual SWNTs in a nanotube element;

FIGS. 27A-B show a device structure that reduces the suspended length variation of selected essentially parallel individual SWNTs in a nanotube element;

FIGS. 31A-B show a first volatile nanotube switch structure in OFF and ON states, with the addition of essentially parallel SWNTs on a control electrode such that atomic-level Lennard-Jones forces are determined independently of the control electrode material;

DETAILED DESCRIPTION

Figure 4A:
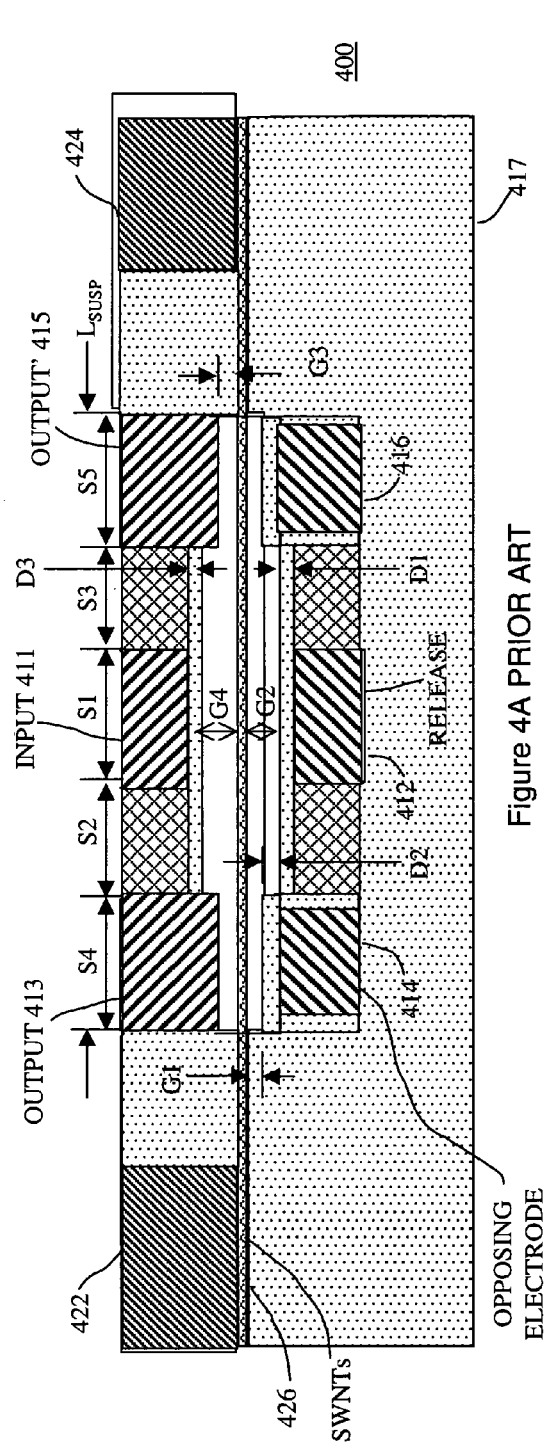
FIGS. 4A and 4B illustrate a cross section and a plan view of a nonvolatile nanotube protective device structure.

Non-volatile carbon nanotube protective devices offer an opportunity to enhance present electronic device protection by adding non-volatile carbon nanotube protective devices to prior art protective devices that require protective diodes as part of their structures. Nonvolatile nanotube protective device structures have much lower accompanying capacitance values than presently used protective devices, so that adding nonvolatile nanotube protective devices to existing electronic protective devices will not measurably increase capacitive loading. Capacitive loading by present protective devices introduces performance limitations, so that replacing these devices with non-volatile carbon nanotube protective devices reduces capacitive loading of inputs and outputs facilitating higher operating speeds. Carbon nanotube protective devices may be used on any substrate, such as silicon, ceramic, organic, etc. and may therefore be added at any level of assembly such as chip, substrate, card, and board, and may be present on one or more levels of assembly for additional electrostatic protection.

In the case of nanotube-only logic or memory, where there are no semiconductor structures such as semiconductor diodes used in prior art protective device structures, nonvolatile nanotube protective devices may be used instead to provide electrostatic discharge (ESD) protection. In operation, chips and/or substrates and/or cards and/or boards may be set in an activated non-volatile ESD protect mode that remains in place for component handling purposes, then the ESD protect mode may be de-activated when the system is powered up. If a component is to be removed, and subjected to further handling, the non-volatile protect mode may be activated prior to removal from the system. Non-volatile nanotube protective devices may also be used to protect systems from system power-up problems by first activating nonvolatile nanotube protective devices, then powering up the system power supply, then de-activating nonvolatile nanotube protective devices for system operation at any level of assembly (chip, substrate, card, board) or on more than one level.

Alternatively, in the case of nanotube-only logic or memory, where there are no semiconductor structures such as semiconductor diodes used in prior art protective device structures, volatile nanotube protective devices may be used instead to provide electrostatic discharge protection. In operation, chips and/or substrates and/or cards and/or boards may be protected with volatile nanotube protective devices that are normally de-activated (OFF) and are activated (turned-on) by ESD-induced voltage.

Electronic assemblies may be protected by combinations of volatile and nonvolatile nanotube protective devices.

SWNT Resistors for Better ESD Protection Using Current Protective Device Approaches FIG. 2A illustrates a plan view, and FIG. 2B illustrates cross-section AA', of a protective device structure 20 in which conventional series resistor 16 in protective device 10 has been replaced by carbon nanotube resistor 24. Carbon nanotube resistors are described in U.S. Prov. Pat. Appln. 60/611,765, entitled Resistive Elements using Carbon Nanotubes, filed Sep. 21, 2004, which is hereby incorporated by reference in its entirety. Pad 21, corresponding to pad 12 in FIG. 1 is connected to conductor 22, which in turn is connected to carbon nanotube resistor 24, with the opposite end of the carbon nanotube resistor 24 connected by another conductor 25 to the protected circuit 14 as illustrated in FIGS. 2A and 2B. FIG. 2C illustrates a schematic 30 of a protective device structure that uses a series carbon nanotube resistor 36. Carbon nanotube resistor 36, corresponding to carbon nanotube resistor 24 shown in FIGS. 2A and 2B is formed using carbon nanotube non-woven fabric as described in referenced Nantero carbon nanotube patents, patent publications, dockets, etc. Nanotube fabrics have negligible resistance compared to the contact resistance $R_C$ between the conductor layer and the nanotube fabric. Conductors may have a thickness in the range of 5 to 500 nm, with well controlled thickness using known preferred conductor deposition methods, and may be composed of metals such as Ru, Ti, Cr, Al, Au, Pd, Ni, W, Cu, Mo, Ag, In, Ir, Pb, Sn, as well as other suitable metals, and combinations of these. Metal alloys such TiAu, TiCu, TiPd, PbIn, TiW, and other suitable conductors, including CNTs themselves (singled walled, multiwalled, including double walled) for example, or conductive nitrides, oxides, or silicides such, or conductive nitrides, oxides, or silicides such as RuN, RuO, TiN, TaN, $CoSi_x$ and $TiSi_x$ may be used. Other kinds of conductor, or semiconductor, materials can also be used. Preferred methods of patterning conductors may use well known photolithographic techniques and well known etching techniques, such as wet etch and reactive ion etching (RIE).

Typical values of conductor to an individual SWNT contact resistance $R_C$ is approximately 10,000 ohms, for example. Since there are two contacts in series, and an individual SWNT resistance is negligible compared to $R_C$, SWNT resistance is $2 R_C$ for individual SWNTs. The nanotube resistor value is $2R_C/N$, where N is the number of parallel individual SWNTs forming the nanotube resistor. If the required series resistance is 2,000 ohms, for example, then 10 parallel nanotube filaments are required (N=10).

Nanotube-only Nonvolatile Nanotube Protective Devices

A preferred solution to the addition of nanotube resistor 36 as shown in FIG. 2C, or fuses such as fuse 40 shown in FIG. 3, is to introduce a nanotube-only protective device of much lower capacitive loading, approximately 60 fF (0.060 pF), for example, as illustrated further below with respect to FIG. 7, which is much lower in capacitance than that of conventional protective devices with capacitance of 1.5 pF, for example, as described in US patent Bertin et al., U.S. Pat. No. 6,141,245. This new protective device is a nonvolatile nanotube protective device corresponding to nanotube switching elements whose operation and use in nonvolatile nanotube logic circuits is described in U.S. patent application Ser. No. 10/918,085, entitled "Nanotube-Based Switching Elements with Multiple Controls," filed Aug. 13, 2004, and whose fabrication is described in U.S. patent application Ser. No. 10/918,181, entitled "Nanotube Device Structure and Methods of Fabrication," filed Aug. 13, 2004. Unlike previous protective devices that require a semiconductor substrate for semiconductor diodes as described with respect to FIG. 1, nonvolatile nanotube protective devices do not require a semiconductor substrate. Therefore, nonvolatile nanotube protective devices may be integrated with semiconductor substrates and insulating (non-semiconducting) ceramic, glass, and organic substrates, for example, a well as rigid and flexible substrates, for example, as illustrated further below. Nonvolatile nanotube protective devices may be added at one or more levels of assembly such as at chip level; and/or substrate level; and/or card level; and/or board level as illustrated further below with respect to FIG. 11. Nonvolatile nanotube protective devices may be used to protect conventional bipolar, CMOS, SiGe, GaN, GaAs and other compound semiconductor devices and circuits. Also, nonvolatile nanotube protective devices may also be used to protect various nanotube-only (no semiconductor devices/circuit) logic chips such as Complimentary Carbon Nanotube Logic (CCNT Logic), or hybrid CMOS/nanotube logic chips as described in U.S. patent application Ser. No. 10/917,794, entitled "Nanotube-Based Switching Elements," filed Aug. 13, 2004, U.S. patent application Ser. No. 10/918,085, entitled "Nanotube-Based Switching Elements with Multiple Controls," filed Aug. 13, 2004 and U.S. patent application Ser. No. 10/917,794, entitled Nonvolatile Carbon Nanotube Logic (NLOGIC) Tristate Circuit," filed Jan. 10, 2005, all of which are hereby incorporated in their entirety.

A proposed nonvolatile nanotube protective device structure 400 is illustrated in cross section 400 in FIG. 4A, and in plan view in FIG. 4B, with input (control) electrode and output electrodes above a nanotube channel element, and release electrode and opposing electrode below a nanotube channel element, as described further below. The method of fabrication of structure 400 is described in U.S. patent application Ser. No. 10/918,181, entitled "Nanotube Device Structure and Methods of Fabrication," filed Aug. 13, 2004. The operation of device 400 is further described in U.S. patent application Ser. No. 10/918,085, entitled "Nanotube-Based Switching Elements with Multiple Controls," filed Aug. 13, 2004. Note that in U.S. patent application Ser. No. 10/918,085, entitled "Nanotube-Based Switching Elements with Multiple Controls," filed Aug. 13, 2004, electrode position relative to a nanotube channel element have changed such that input electrode and output electrodes are below the nanotube channel element, and release electrode and opposing electrodes are above the nanotube channel element. The relative position of the electrodes with respect to the nanotube channel element does not effect device operation. Device structural features and operation are summarized from descriptions in U.S. patent application Ser. No. 10/918,181, entitled "Nanotube Device Structure and Methods of Fabrication," filed Aug. 13, 2004 and in U.S. patent application Ser. No. 10/918,085, entitled "Nanotube-Based Switching Elements with Multiple Controls," filed Aug. 13, 2004.

The nonvolatile nanotube protective device structure 400 described herein is applicable to a wide range of dimensions and operating voltages. By way of example, a 130 nm technology node was assumed, along with a suspended length $L_{NT}$ is of 325 nm. The switching width $W_{NT}$ is designed to ensure that a sufficient number of conductive carbon nanotubes span the suspended length $L_{SUSP}$ to achieve a desired resistance value. $W_{NT}$ may be 325 nm, for example. However, nonvolatile nanotube protective device structure 400 may be scaled to a suspended length of 20 nm, for example.

Figure 4B:
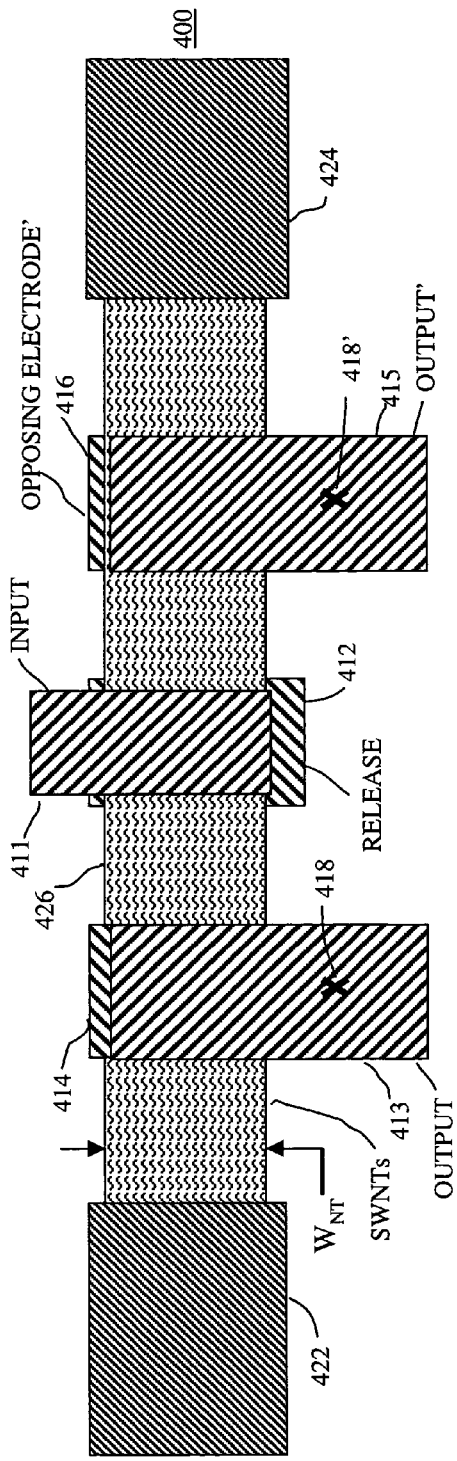

FIGS. 4A and 4B illustrate a cross section of a nonvolatile nanotube protective device structure 400 and corresponding plan view The lower portion of NT device structure 400 consists of release electrode (plate) 412 and opposing electrodes (plates) 414 and 416, embedded in an insulating layer 417. Release electrode 412 is separated from nanotube channel element 426 by an insulating layer (film) of thickness D1 and a gap region G2 in the switching region. Electrodes 414 and 416 are separated from nanotube channel element 426 by an insulating layer of thickness D2 and a gap region G1. The upper portion of the NT device structure 400 consists of input (control) electrode (plate) 411, output electrodes (plates) 413 and 415 in the switching region. Output electrodes 413 and 415 are separated by gap G3 from the surface of nanotube channel element 426. Input electrode 411 has a lower surface insulator of thickness D3, which is separated from the surface of nanotube channel element 426 by gap G4. Nanotube channel element 426 is typically less than 2 nm in thickness, which is much thinner than other conductor, insulator, and gap dimensions. Nanotube channel element 426 is electrically connected to signal electrodes (terminals) 422 and 424. Signal electrodes 422 and 424 are at the same voltage. Only one of the two terminals 422 or 424 is required for device operation. Output electrodes 413 and 415 are connected to corresponding output opposing electrodes 414 and 416, respectively, by contacts 418 and 418'. In this example, both outputs are also electrically connected (not shown) to form a single output.

Figure 4C:
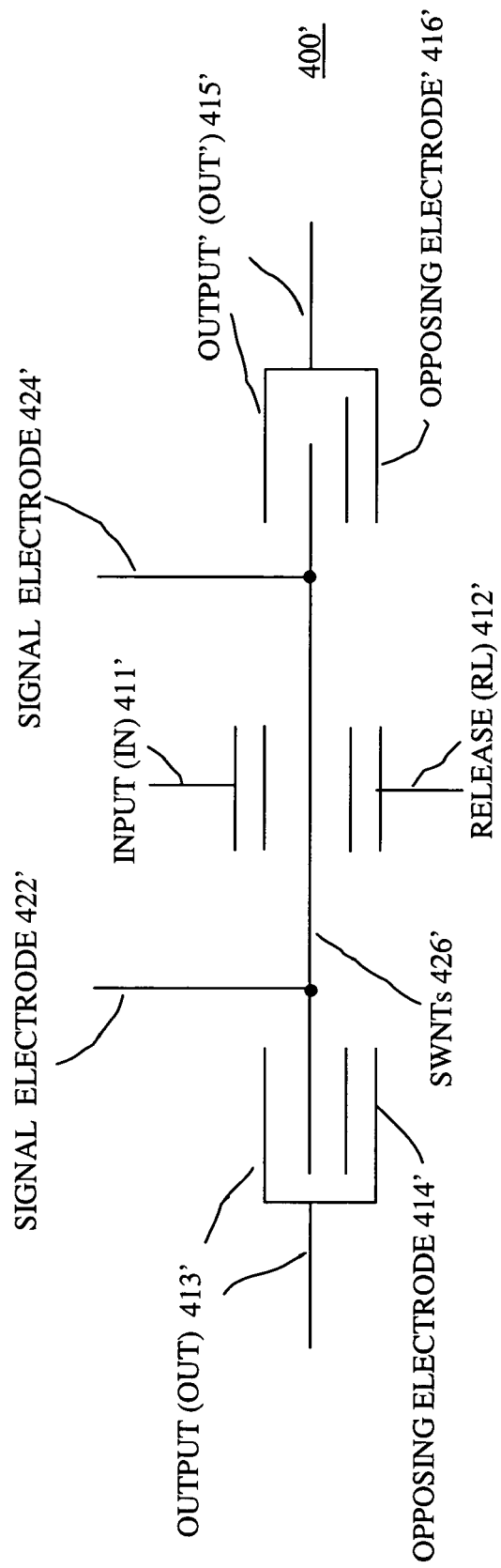
FIG. 4C shows a schematic representation of the nonvolatile nanotube protective device in FIGS. 4A and 4B.

FIG. 4C is a schematic 400' representation of nonvolatile nanotube protective device 400.

Schematic input electrode 411' and associated insulator corresponds to nonvolatile nanotube protective device 400 input 411 and associated insulator D3; schematic release electrode 412' with associated insulator corresponds to nonvolatile nanotube protective device 400 release electrode 412 and associated insulator D1; schematic output electrodes 413' and 415' correspond to nonvolatile nanotube protective device 400 corresponding output electrodes 413 and 415, respectively; schematic nanotube channel element 426' corresponds to nonvolatile nanotube protective device 400 nanotube channel element 426; schematic signal electrodes 422' and 424' correspond to nonvolatile nanotube protective device 400 signal electrodes 422 and 424, respectively; and schematic opposing electrodes 414' and 416' and associated insulator corresponds to nonvolatile nanotube protective device 400 opposing electrodes 414 and 416, respectively, and associated insulator D2.

Referring to device structure 400 illustrated in FIG. 4, dimensionally, insulators D1, D2, and D3 may range in thickness from 2 to 50 nm, for example. Gap regions G1, G2, G3 and G4 may range in thickness from 2 to 50 nm, for example.

Referring to device structure 400 illustrated in FIG. 4, length dimensions of segments S1, S2, S3, S4 and S5 along nanotube channel element 426 may range in length from 4 to 100 nm, for example, for a total suspended length $L_{SUSP}$ ranging from 20 to 500 nm, for example, as described further below.

Referring to device structure 400 illustrated in FIG. 4, nanotube channel element 426 width $W_{NT}$ depends on the number and spacing (SWNT fabric density) of SWNTs. SWNT fabric density varies as a function of the number of individual SWNTs (density of SWNTs) in solution, the number of coatings applied, and other factors described in incorporated references In this example, a density of 10 individual nanotubes per 200×200 nm area is assumed. Referring to a similar device structure in U.S. patent application Ser. No. 10/918,085, entitled "Nanotube-Based Switching Elements with Multiple Controls," filed Aug. 13, 2004 and in U.S. patent application Ser. No. 11/033,216, entitled "Nonvolatile Carbon Nanotube Logic (NLOGIC) Off Chip Driver," filed Jan. 10, 2005, using a similar SWNT fabric density, $W_{NT}$=325 nm for a nanotube channel element 426 having 15 individual nanotubes.

FIG. 4A shows nonvolatile nanotube protective device 400 dimensions S4 and S5 associated with output electrodes 413 and 415, and opposing electrodes 414 and 416, respectively, where in a symmetrical device, S4=S5 and S3=S2. Dimension S1 is associated with input electrode 411 and release electrode 412; dimensions S2 and S3 are associated with an insulators separating input electrode 411 from output electrodes 413 and 415, respectively, and dimensions S2 and S3 of device 400 are associated with an insulators separating release electrode 412 from opposing electrodes 414 and 416, respectively. By way of example, the nanotube channel element suspended length $L_{SUSP}$=S1+S2+S3+S4+S5, and if S1=S2=S3=S4=S5, then $L_{SUSP}$=5 S1. The suspended nanotube switching length $L_{SUSP}$ is limited by the length of individual SWNTs in the nanotube channel element such that conductive individual SWNTs may span the length $L_{SUSP}$ of the switching region. For currently available SWNTs, the preferred longest value of $L_{SUSP}$ is 300 to 350 nm. $L_{SUSP}$=325 nm is chosen for this example, therefore S1=65 nm, and S1=S2=S3=S4=S5=65 nm. In order to maintain a suspended length to gap ratio of approximately 10/1, for example, then gaps G2 and G4 are approximately 30 nm. However, it is possible to scale nonvolatile nanotube protective device 400 to use a nanotube channel element suspended length $L_{SUSP}$=20 nm, in which case S1=S2=S3=S4=S5=4 nm, and gaps G2 and G4 are approximately 2 nm, for example. Dimensions S1–S5 may be achieved using side wall spacer methods independent of the particular photolithographic operating point, as explained in U.S. patent application Ser. No. 10/918,181, entitled "Nanotube Device Structure and Methods of Fabrication," filed Aug. 13, 2004.

Figure 5A:
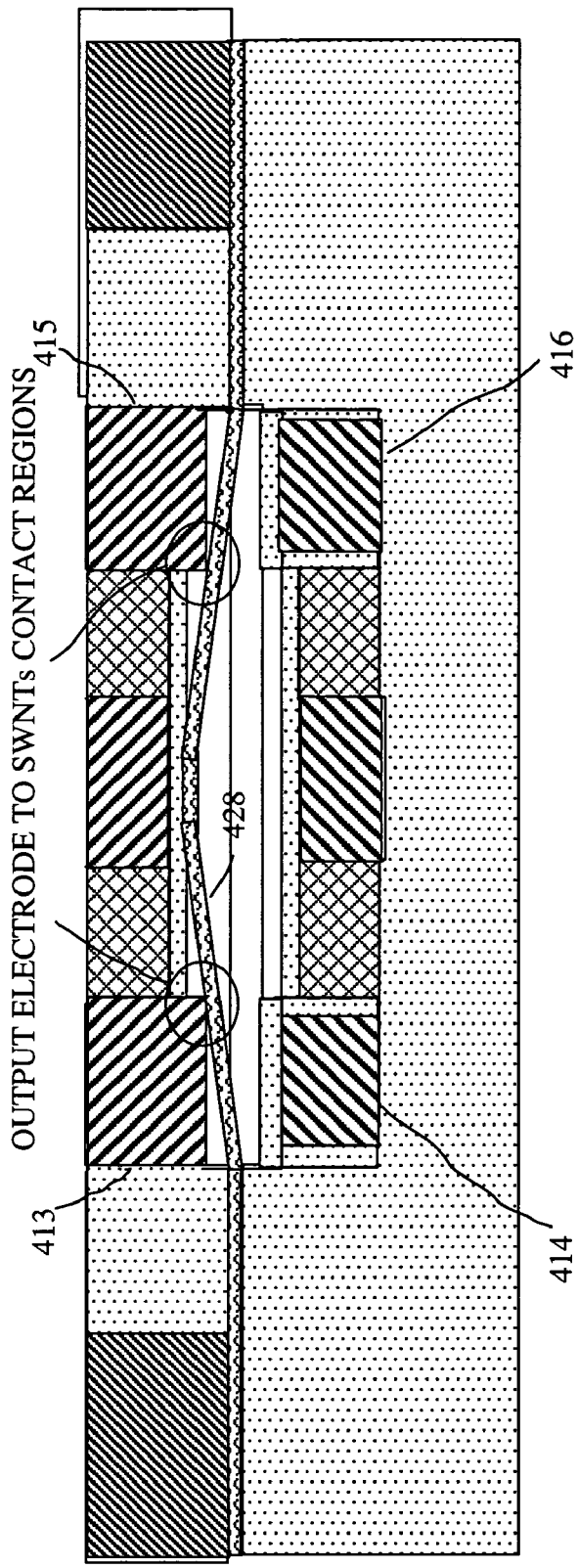
FIG. 5A illustrates a cross section of the nonvolatile nanotube protective device illustrated in FIGS. 4A and 4B in an activated (ON) state.

In operation, nonvolatile nanotube protective device 400 illustrated in FIGS. 4A and 4B is in an activated (ON) state when nanotube channel element 426 is in nanotube channel element position 428 as illustrated in FIG. 5A, in contact with an insulating layer on input electrode 411 and in contact with output terminals 413 and 415.

Figure 5B:
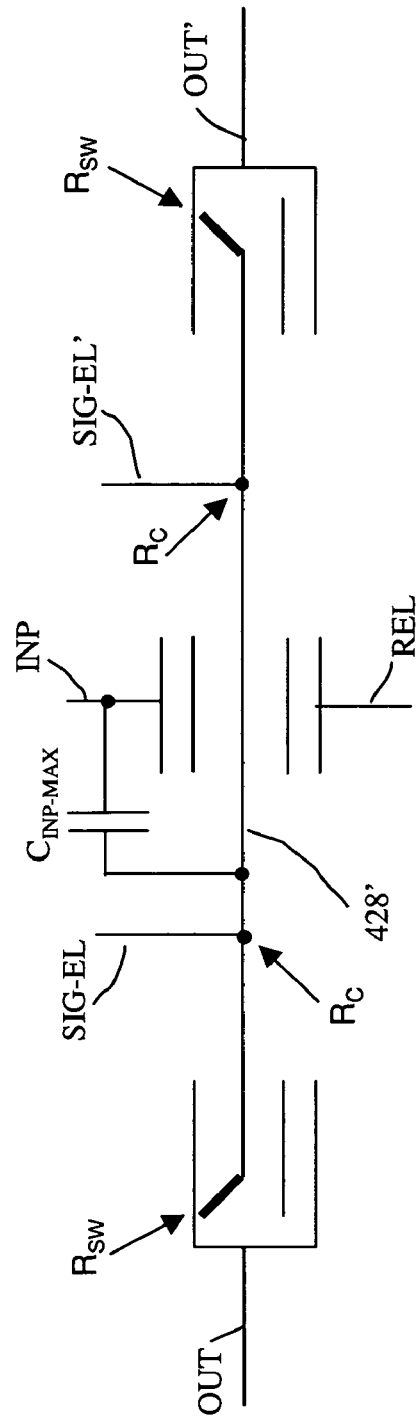
FIG. 5B shows a schematic representation of the activated (ON) nonvolatile nanotube protective device illustrated in FIG. 5A.

FIG. 5B illustrates schematic nonvolatile nanotube protective device 400' in the activated (ON) state corresponding to nonvolatile nanotube protective device 400 in the activated (ON) state as illustrated in FIG. 5A. FIG. 5B is a modification of schematic 400' in FIG. 4C in which schematic nanotube channel element 426' shown in activated (ON) nanotube channel element position 428', corresponding to nanotube channel element 426 in nanotube channel element position 428 in as illustrated in FIG. 5A. Schematic nanotube channel element 426' in schematic nanotube channel element position 428' shows a schematic representation of conductor-to-nanotube contact resistance $R_{SW}$ between nanotube channel element 428 and output electrode 413 and 415 in FIG. 5A.

Figure 6A:
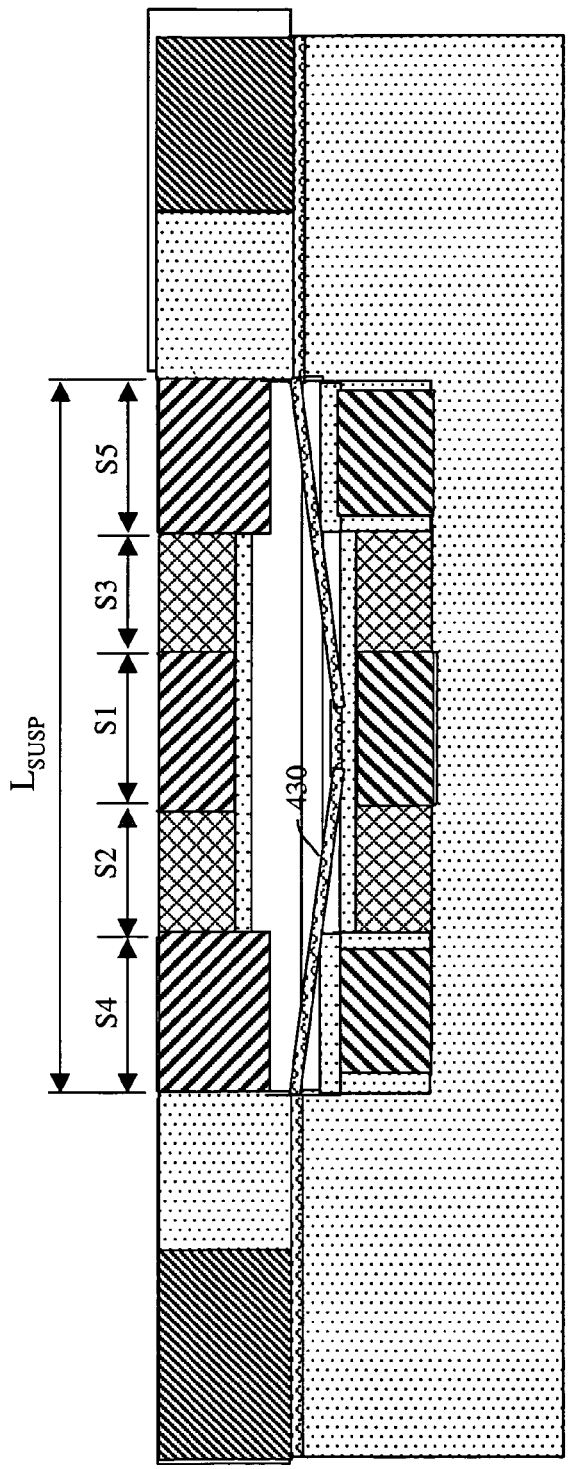
FIG. 6A illustrates a cross section of the nonvolatile nanotube protective device illustrated in FIGS. 4A and 4B in a de-activated (OFF) state.

In operation, nonvolatile nanotube protective device 400 illustrated in FIGS. 4A and 4B is in a de-activated (OFF) state when nanotube channel element 426 is in nanotube channel element position 430 as illustrated in FIG. 6A, in contact with an insulating layer on release electrode 412 and in contact with an insulating layer on insulated opposing electrodes 414 and 416.

Alternatively, schematic nanotube channel element 426 may not be in contact with underlying terminals, as illustrated in FIG. 4A, and still be in a de-activated (OFF) state, because nanotube channel element 426 is not in contact with output terminals 413 and 415.

Figure 6B:
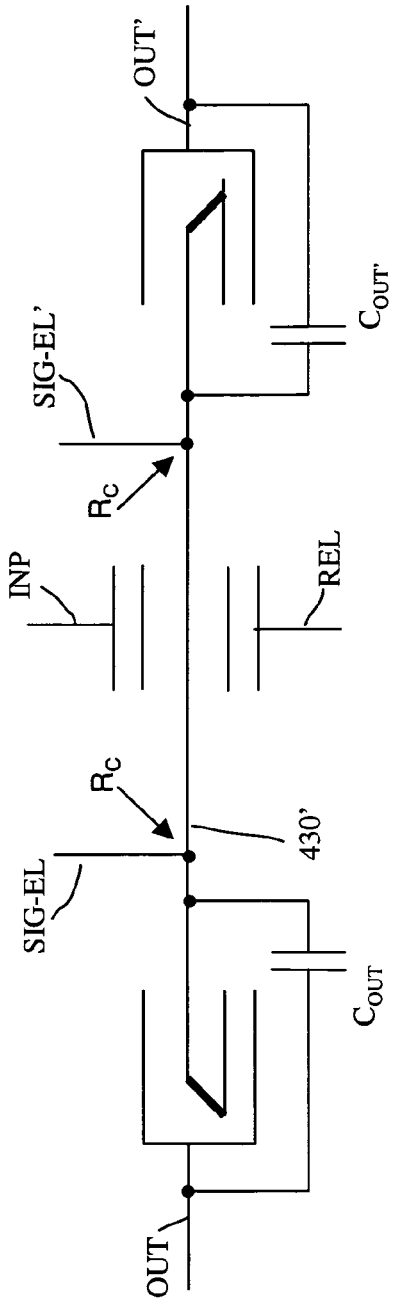
FIG. 6B shows a schematic representation of the de-activated (OFF) nonvolatile nanotube protective device illustrated in FIG. 6A.

FIG. 6B illustrates schematic nonvolatile nanotube protective device 400' in a de-activated (OFF) state corresponding to nonvolatile nanotube protective device 400 in a de-activated (OFF) state as illustrated in FIG. 6A. FIG. 6B is a modification of schematic 400' in FIG. 4C in which schematic nanotube channel element 426' shown in de-activated (OFF) nanotube channel element position 430', corresponding to nanotube channel element 426 in nanotube channel element position 430 in as illustrated in FIG. 6A. Schematic nanotube channel element 426' in schematic nanotube channel element position 430' shows a schematic representation of an open circuit insulator-to-nanotube contact.

Integrating Nanotube-only Nonvolatile Nanotube Protective Devices in Conventional Semiconductor, Hybrid Semiconductor/Nanotube, or Nanotube-only Chip Designs Multiple nonvolatile protective device structures 400, illustrated in FIGS. 4A and 4B, may be used to provide electrostatic discharge (ESD) discharge protection to devices and circuits in electronic assemblies. Nonvolatile protective device structures 400 may be added at the chip, and/or substrate, and/or card, and/or board level of assembly as described further below. Nonvolatile nanotube protective devices are activated and de-activated prior to ESD-induced voltages and current as described further below. An output electrode structure comprising output electrodes 413 and 415, and insulated opposing electrodes 414 and 416, form an output node that is electrically connected to pads to be ESD-protected. Signal electrodes, release electrodes, and input electrode are connected to ground, power supply, and a mode select pad, respectively. The output electrode structure (output node) constructed and arranged so that channel formation is substantially unaffected by the state of the output node and prevents ESD-induced voltage, or operating voltage, from disturbing the state of nonvolatile nanotube protective devices as described in U.S. patent application Ser. No. 10/917,606, entitled "Isolation Structure for Deflectable Nanotube Elements," filed Aug. 13, 2004.

Figure 7A:
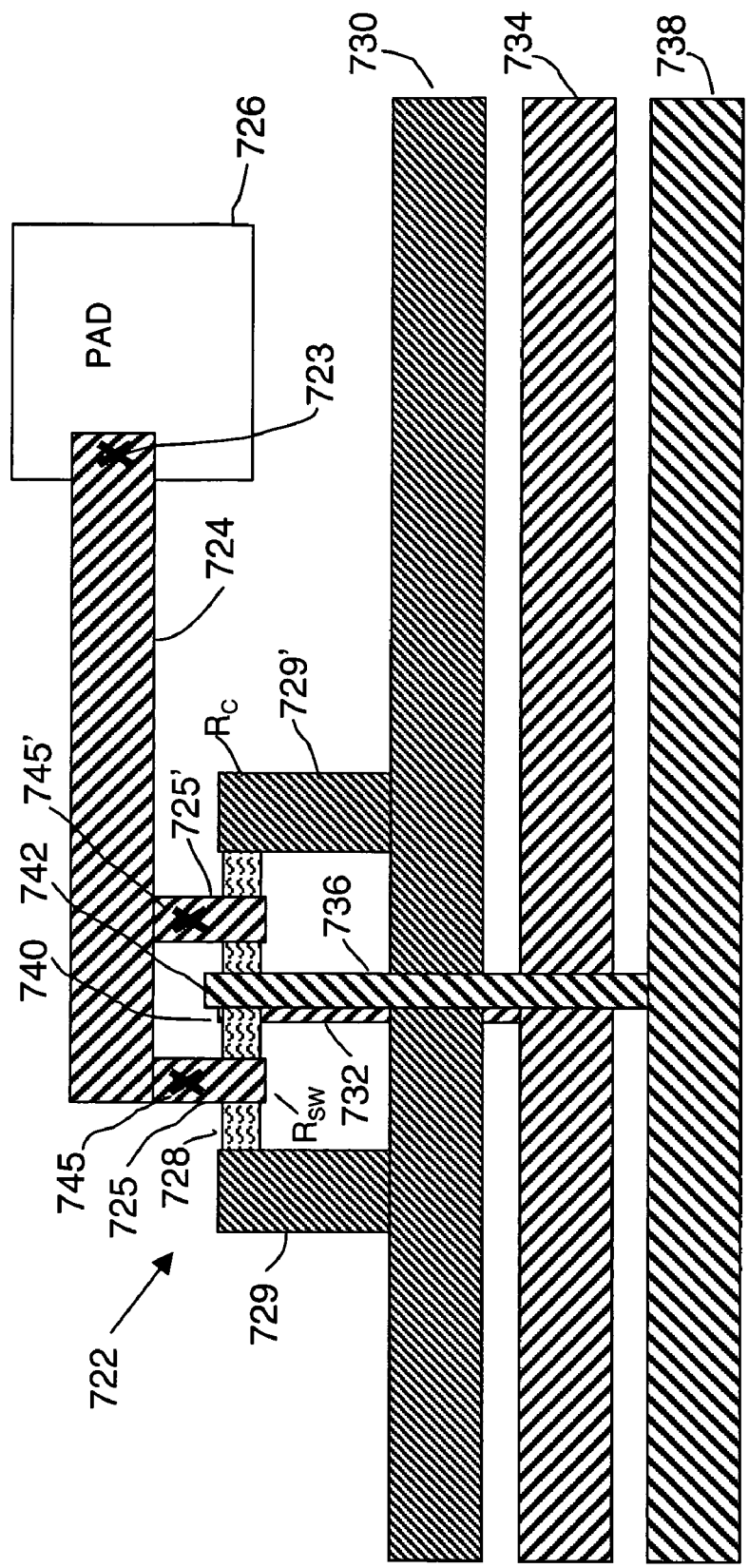
FIG. 7A illustrates a plan view of the nonvolatile nanotube protective device illustrated in FIGS. 4A and 4B integrated into an electronic assembly, contacting a pad and common electrodes.

FIG. 7A illustrates nonvolatile nanotube protective device 722 illustrated in FIGS. 4A and 4B integrated into an electronic assembly at the chip, substrate, card, or board level, connected to pad 726 and shared conductors 730, 734, and 738. Pad 726, shared conductors 730, 734, 738, all other conductors used for interconnections, conductors used as electrodes in nonvolatile nanotube protective device 400 may have a thickness in the range of 5 to 500 nm, with well controlled thickness using known preferred conductor deposition methods, and may be composed of metals such as Ru, Ti, Cr, Al, Au, Pd, Ni, W, Cu, Mo, Ag, In, Ir, Pb, Sn, as well as other suitable metals, and combinations of these. Metal alloys such TiAu, TiCu, TiPd, PbIn, TiW, other suitable conductors, including CNTs themselves (singled walled, multiwalled, and/or double walled, for example) or conductive nitrides, oxides, or silicides such as RuN, RuO, TiN, TaN, $CoSi_x$ and $TiSi_x$ may be used. Other kinds of conductor, or semiconductor, materials can also be used. Preferred methods of patterning conductors may use well known photolithographic techniques and well known etching techniques, such as wet etch and reactive ion etching (RIE).

Nonvolatile nanotube protective device 722 output electrodes 725 and 725', corresponding to nonvolatile nanotube protective device 400 (FIG. 4) output electrodes 413 and 415, respectively, are connected in parallel using conductor 724. Contacts 745 and 745' electrically connect outputs electrodes 725 and 725', respectively, to their corresponding opposing electrodes (not shown), which in turn correspond to opposing electrodes 414 and 416 illustrated in FIGS. 4A and 4B. Output electrodes 725 and 725' are connected in parallel and to pad (terminal) 726 by conductor 724 and contact 723. If nonvolatile nanotube protective device 722 is in the activated (ON) state illustrated in FIG. 5, then output electrodes 725 and 725' are in electrical contact with nanotube channel element 728, which corresponds to nanotube channel element 426 in FIGS. 4A and 4B. Contact resistance $R_{SW}$ between control electrode 725 or 725' and an individual nanotube in nanotube channel element 728 is typically 10,000 Ohms. Nanotube channel element 728 is formed using multiple individual nanotubes in parallel. If nonvolatile nanotube protective device 722 is in the OPEN (OFF) state, then there is no electrical connection between output electrodes 725 or 725' and nanotube channel element 728.

Nonvolatile nanotube protective device 722 signal electrode 729, corresponding to signal electrode 422, is extended to contact shared conductor 730, typically connected to a common ground pad. Signal electrode 729', corresponding to signal electrode 424, is also extended to contact shared conductor 730. Thus, both signal electrodes 729 and 729' are in parallel. Signal electrodes 729 and 729' are in physical and electrical contact with nanotube channel element 728, corresponding to nanotube channel element 426 in FIGS. 4A and 4B, with a contact resistance $R_C$, where $R_C$ is typically 10,000 Ohms for each conductor to individual SWNT contact. Nanotube channel element 728 illustrated in FIG. 5 is typically formed using multiple individual SWNTs.

If nonvolatile protective device 722 is in the activated (ON) state, then pad 726 has a conductive path to common ground conductor 730 by way of contact 723, conductor 724, output electrodes 725 and 725', nanotube channel element 728, and conductors 729 and 729' to common conductor 730 and devices or circuits connected to pad 726 or conductor 724 will be protected from ESD-induced voltage/current surges. There is no conductive path if nonvolatile nanotube protective device 722 is in the de-activated (OFF) state so that ESD protection has been removed.

Common conductors 734 and 738 are connected to nonvolatile nanotube protective device 722 release and input electrodes by conductors 732 and 736, respectively, and are used to control the state of device 722. Conductor 732 may be an extension of release electrode 740, which corresponds to release electrode 412 shown in FIGS. 4A and 4B, and conductor 736 may be an extension of input electrode 742, which corresponds to input electrode 411 in FIGS. 4A and 4B. Common conductor 734 may be a power supply connection such as $V_{DD}$, for example. Common conductor 738 may be connected to a mode pad (or mode terminal) that determines if nonvolatile nanotube protective device 722 is in an OPEN (OFF) state or a CLOSED (ON) state. The ESD-induced voltage applied to pad 726 cannot affect the state of nonvolatile protective device 722 because the structure of output electrodes 725 and 725' and corresponding opposing electrodes prevents disturbance by design, see U.S. patent application Ser. No. 10/917,794, entitled "Nanotube-Based Switching Elements," filed Aug. 13, 2004, U.S. patent application Ser. No. 10/918,085, entitled "Nanotube-Based Switching Elements with Multiple Controls," filed Aug. 13, 2004 and U.S. patent application Ser. No. 10/918,181, entitled "Nanotube Device Structure and Methods of Fabrication," filed Aug. 13, 2004. The mode pad may be a separate pad, or may be shared with another pad.

Figure 7B:
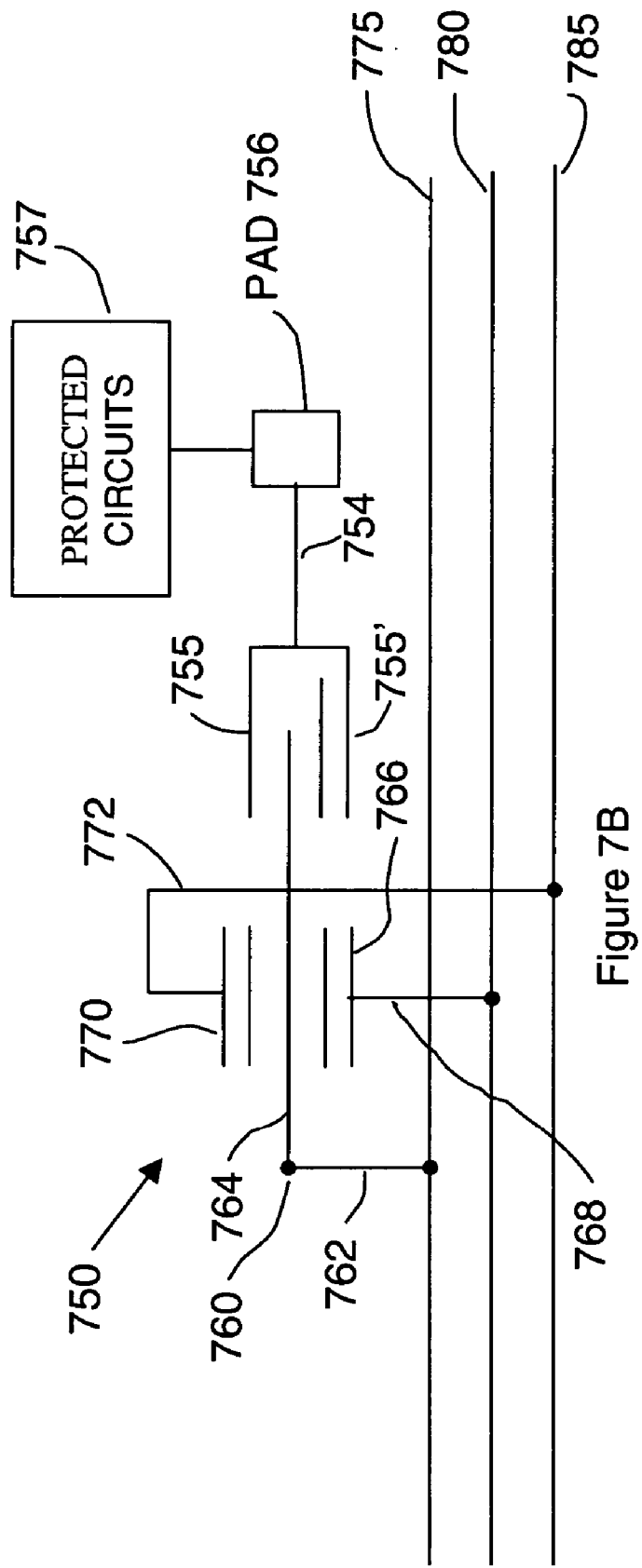
FIG. 7B shows a schematic representation of FIG. 7A.

FIG. 7B is a schematic representation of nonvolatile nanotube protective device 722, including connections to pad and common conductors, corresponding to nonvolatile nanotube protective device 722 and connections illustrated in FIG. 7A. Nonvolatile nanotube protective device 722 illustrated in FIG. 7A corresponds to nonvolatile nanotube protective device 400 illustrated in FIG. 4A and nonvolatile nanotube protective device 750 in schematic form illustrated in FIG. 7B. Output electrode 755 electrically connected to opposing electrode 755' illustrated in FIG. 7B corresponds to the parallel combination of output electrodes 725 and 725' and associated opposing electrodes (not shown) illustrated in FIG. 7A; signal electrode 760 corresponds to the parallel combination of two parallel signal electrodes 729 and 729'; insulated input electrode 770 corresponds to insulated input electrode 742; insulated release electrode 766 corresponds to insulated release electrode 740. Output electrode 755 is connected to pad 756 by connection 754, which corresponds to conductor 724 and contact 723. Protected circuits 757 are connected to pad 756 and output 755 of nonvolatile nanotube protective device 750 illustrated in schematic form in FIG. 7B.

Signal electrode 760 is connected to common connection 775 by connection 762 as shown in FIG. 7B, where signal electrode 760 corresponds to signal electrodes 729 and 729' in parallel, connection 762 corresponds to extensions of signal electrodes 729 and 729', and common connection 775 corresponds to common conductor 730 illustrated in FIG. 7A. The term conductor refers to conductive structures shown in cross section and plan view illustrations, while the term connector refers to wired interconnections shown in schematic drawings that correspond to conductors.

Common connector 780 is connected to insulated release electrode 766 by connector 768 as shown by nonvolatile nanotube protective device schematic 750, where common connector 780 corresponds to common conductor 734 and connector 768 corresponds to conductor 732. Common connector 785 is connected to insulated input electrode 770 by connector 772 as shown by nonvolatile nanotube protective device schematic 750, where common connector 785 corresponds to common conductor 738 and connector 772 corresponds to conductor 736.

Figure 7C:
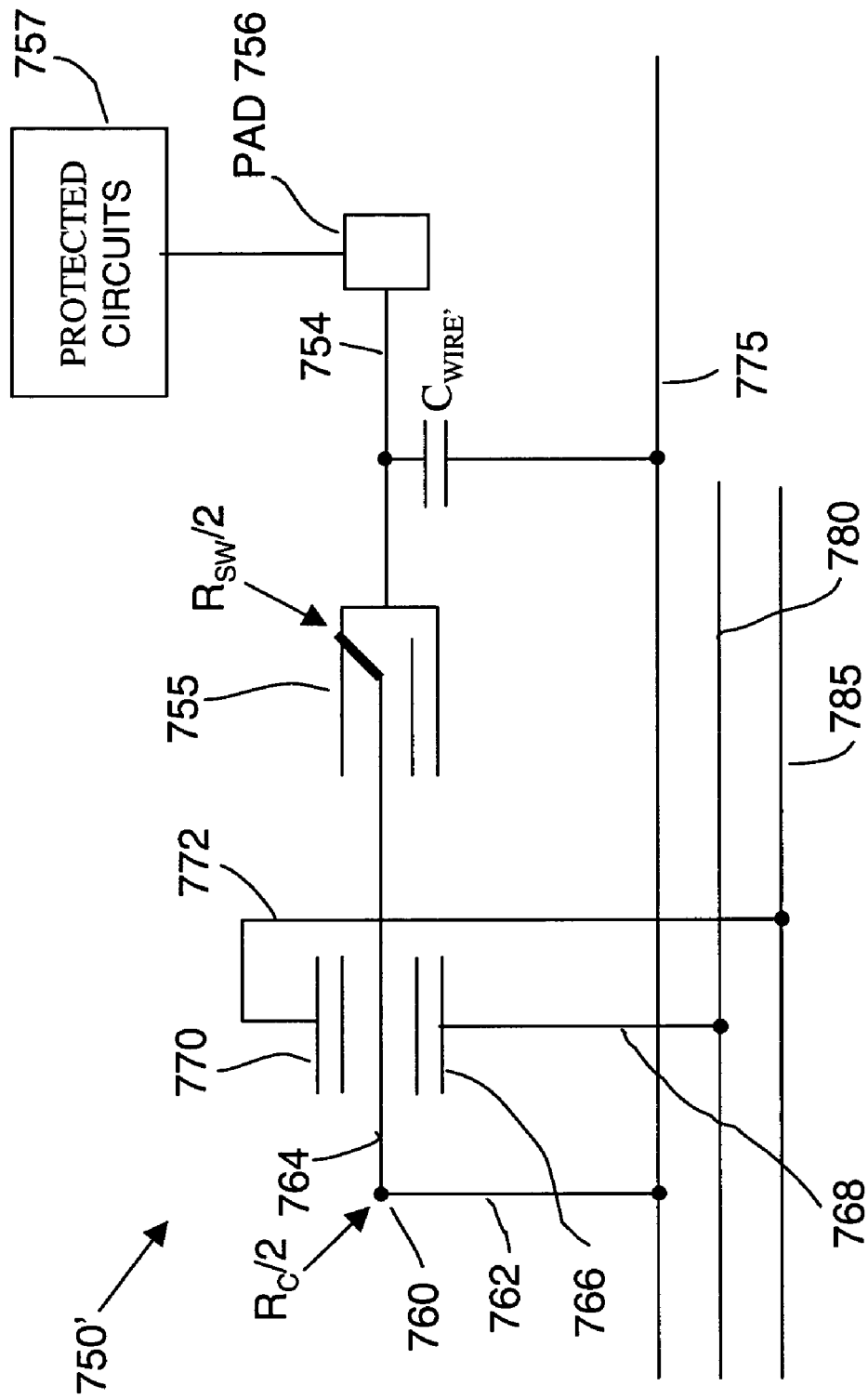
FIG. 7C shows a schematic representation of FIG. 7B in the activated (ON) state.

FIG. 7C illustrates an activated (ON) nonvolatile nanotube protective device 750' in schematic form, with ESD protection activated (ON), such that nanotube channel element 764 is in electrical contact with output electrode 755 and with common electrode 775. If electrostatic charge is applied to pad 756, the activated (ON) nonvolatile nanotube protective device 750' conducts electrostatic charge through nanotube channel element 764 to common connection 775, thereby limiting the voltage induced on pad 756, thus protecting circuits 757. Nonvolatile nanotube protective device 750 may be activated (turned ON) by applying a voltage (positive or negative) to common connector 785 relative to common connectors 775 and 780, with common connectors 775 and 780 at zero (ground) voltage, for example.

Figure 7D:
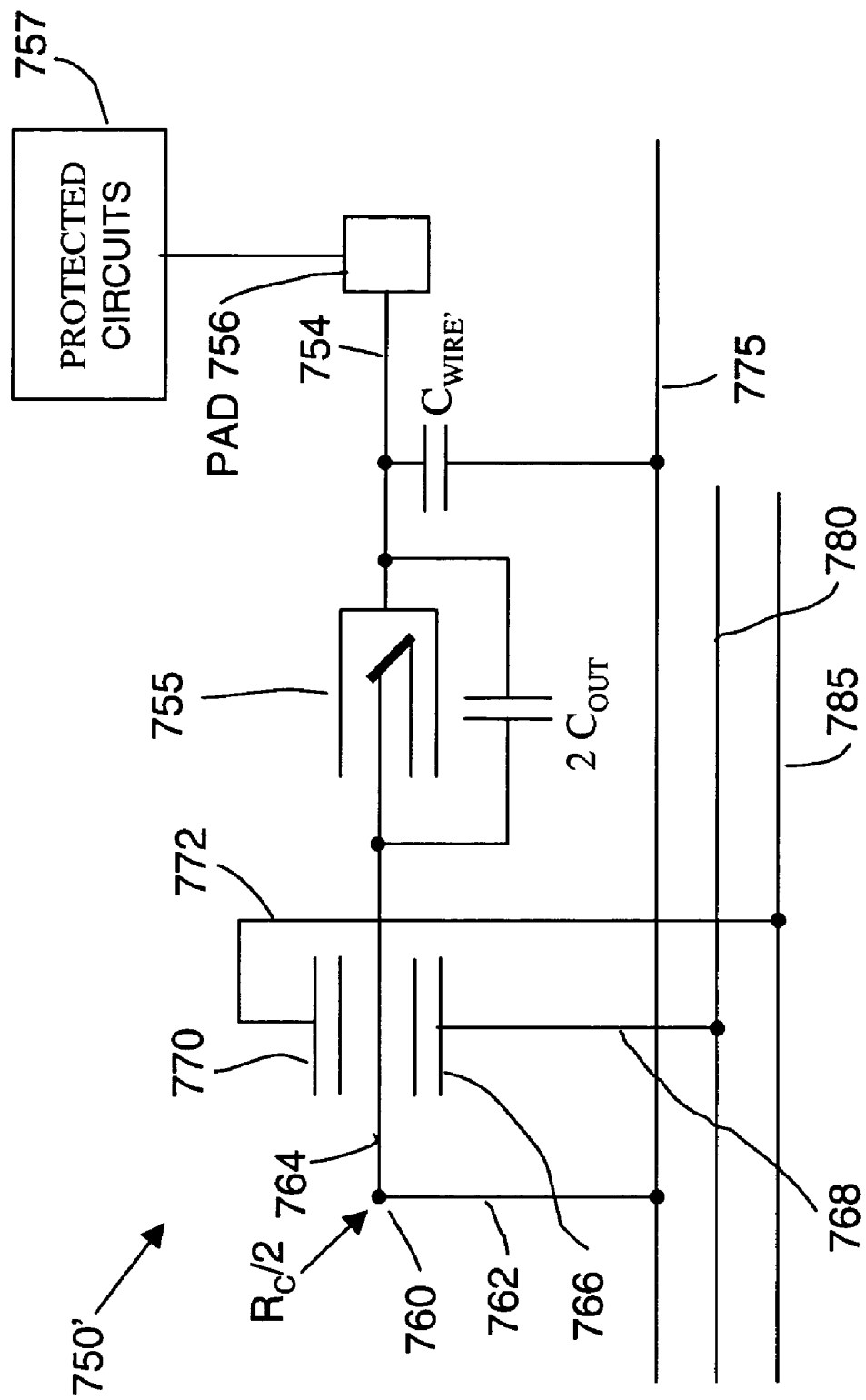
FIG. 7D shows a schematic representation of FIG. 7B in the de-activated (OFF) state.

During operation of the protected circuits, nonvolatile nanotube protective device 750 must be in the de-activated (OFF) state. FIG. 7D illustrates de-activated (OFF) nonvolatile nanotube protective device 750' in schematic form, with ESD protection de-activated (OFF). De-activated (OFF) nonvolatile nanotube protective device 750'' adds capacitance loading $C_{WIRE}+2C_{OUT}$ to pad 756 during chip operation. This additional capacitance is much smaller than typical circuit capacitance as described further below.

In order to calculate capacitances $C_{WIRE}$, layout dimensions for conductor 724 is needed. If conductor 724 shown in FIG. 7A, corresponding to schematic interconnection 754 in FIG. 7D, is 200 nm wide, for example, and if the distance between pad 726 and nonvolatile nanotube protective device 722 is 10 squares, then the length of conductor 724 for purpose of capacitance calculation is 2 um. Wiring capacitance is typically is typically approximately 1 pF/cm or 0.1 fF/um, therefore $C_{WIRE}$ is approximately 0.2 fF. Note that the terminology 10 squares is commonly used in the electronics industry to mean ten squares in series, and in the case of this example, each side of the square is 200 nm.

Figure 7E:
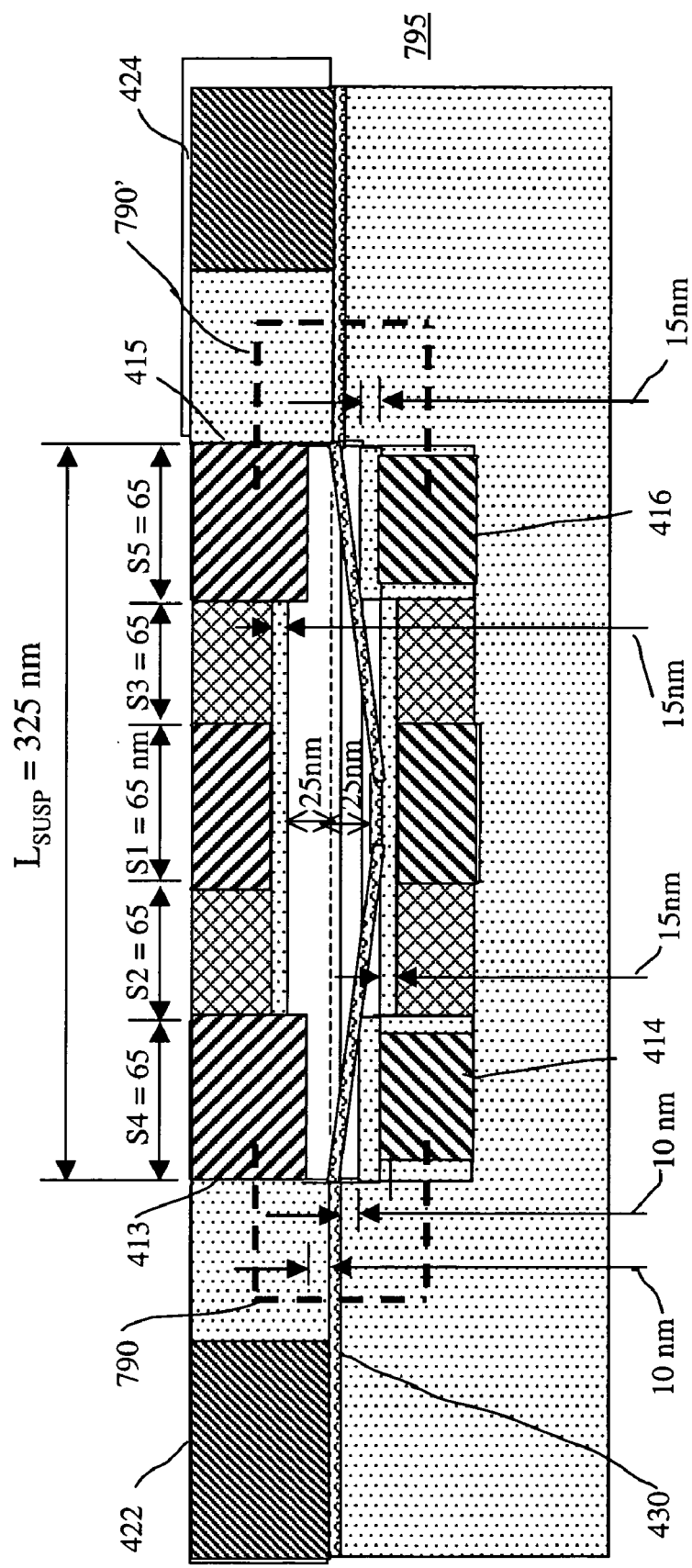
FIG. 7E illustrates a cross section of de-activated (OFF) nonvolatile nanotube protective device 6A with exemplary dimensions used to estimate nonvolatile nanotube protective device capacitive load during circuit operation.

In order to calculate capacitance $C_{OUT}$, nanotube device dimensions are needed. FIG. 7E, corresponding to FIG. 4A illustrating nonvolatile nanotube protective device structure 400, illustrates nonvolatile nanotube protective device structure 795 in which insulator regions D1, D2, and D3 are selected as 15 nm, for example. Also, gap regions G1 and G3 are selected as 10 nm, and gap regions G2 and G4 are selected as 25 nm. Dotted line 790 indicates that output electrode 413 and opposing electrode 414 are electrically interconnected, as illustrated by contact 418 in FIG. 4B. Dotted line 790' indicates that output electrode 415 and 416 are electrically interconnected, as illustrated by contact 418' in FIG. 4B. Individual SWNTs are typically 1 nm in diameter, and SWNT fabric thickness is typically less than 2 nm. The length of each of the segments S1-S5, also illustrated in FIG. 4A is 65 nm. The value of the capacitance $C_{OUT}$ for a nonvolatile nanotube device similar to nonvolatile nanotube protective device 795 has been calculated in U.S. Prov. Pat. Appln. No. 60/581,074, entitled "Nonvolatile Carbon Nanotube Logic (NLOGIC) Off Chip Driver," filed Jun. 18, 2004. $C_{OUT}$ is approximately 0.030 fF (or 30 aF) for a device fabricated having nanotube channel element 428 with 15 individual SWNTs, where nanotube fabric density is approximately 10 individual SWNTs per 200×200 mm area, and 15 individual SWNTs correspond to a device width $W_{NT}$ (shown in FIG. 4B) of 325 nm. In order to determine the value of $C_{OUT}$ for nonvolatile nanotube protective device 722, shown schematically as 750, the number of individual SWNTs required for electrostatic discharge (ESD) protection needs to be calculated. The capacitance $C_{OUT}$ may then be calculated by scaling from $C_{OUT}$=0.030 fF for a 15 individual SWNT device.

In order to calculate the number of individual SWNTs needed for ESD protection, the placement of nonvolatile nanotube protective devices 750 on a chip or package needs to be defined and a model of an ESD source is required as described further below.

Figure 8A:
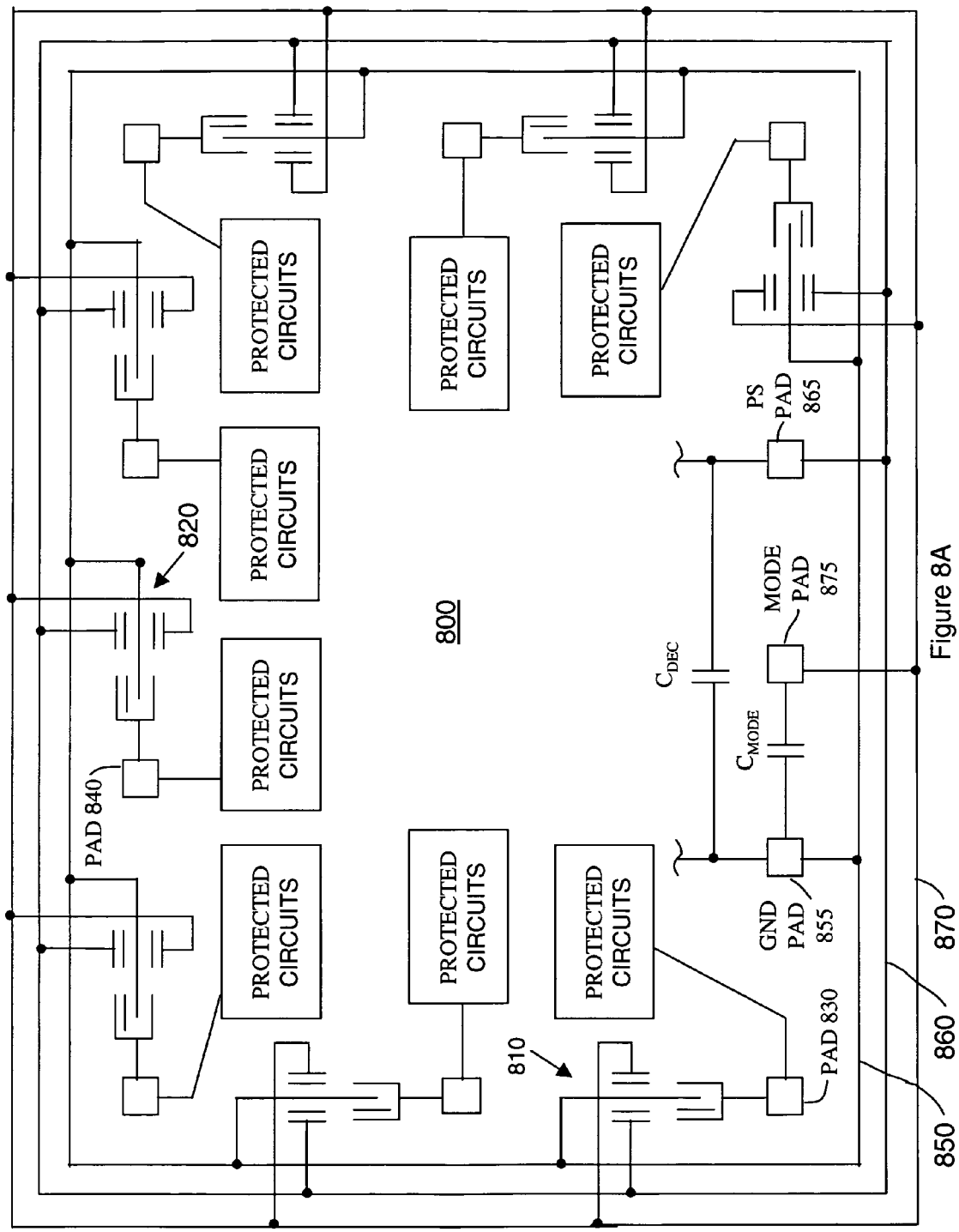
FIG. 8A shows a schematic of nonvolatile nanotube protective devices integrated into a chip or package as well as a power supply and mode pad protection approach.

FIG. 8A illustrates chip 800 with peripheral pads, although area array pads may also be used. Chip 800 may be a semiconductor chip, or a hybrid chip with semiconductor and nanotube devices, or a nanotube-only chip. The term pad means signal pad unless otherwise indicated, for example representative pads 830 and 840, may be input pads, output pads, or both input/output pads. Each individual pad has a nonvolatile protective device. For example, pad 830 is ESD-protected by representative nonvolatile nanotube protective device 810 and pad 840 is ESD-protected by representative nonvolatile nanotube protective device 820. Nonvolatile nanotube protective devices 810 and 820 correspond to protective device 750 illustrated in FIG. 7B. Each pad is connected to nonvolatile nanotube protective device terminal formed using an electrode and opposing electrode as illustrated in FIGS. 7B and 4A and 4B, such that the pad voltage cannot disturb the state of the device. The operation of electrode and opposing electrode output nodes is described in U.S. patent application Ser. No. 10/917,794, entitled "Nanotube-Based Switching Elements," filed Aug. 13, 2004, U.S. patent application Ser. No. 10/918,085, entitled "Nanotube-Based Switching Elements with Multiple Controls," filed Aug. 13, 2004 and in U.S. patent application Ser. No. 10/918,181, entitled "Nanotube Device Structure and Methods of Fabrication," filed Aug. 13, 2004. Power supply and mode pads use other structures for ESD protection as illustrated further below.

Figure 8B:
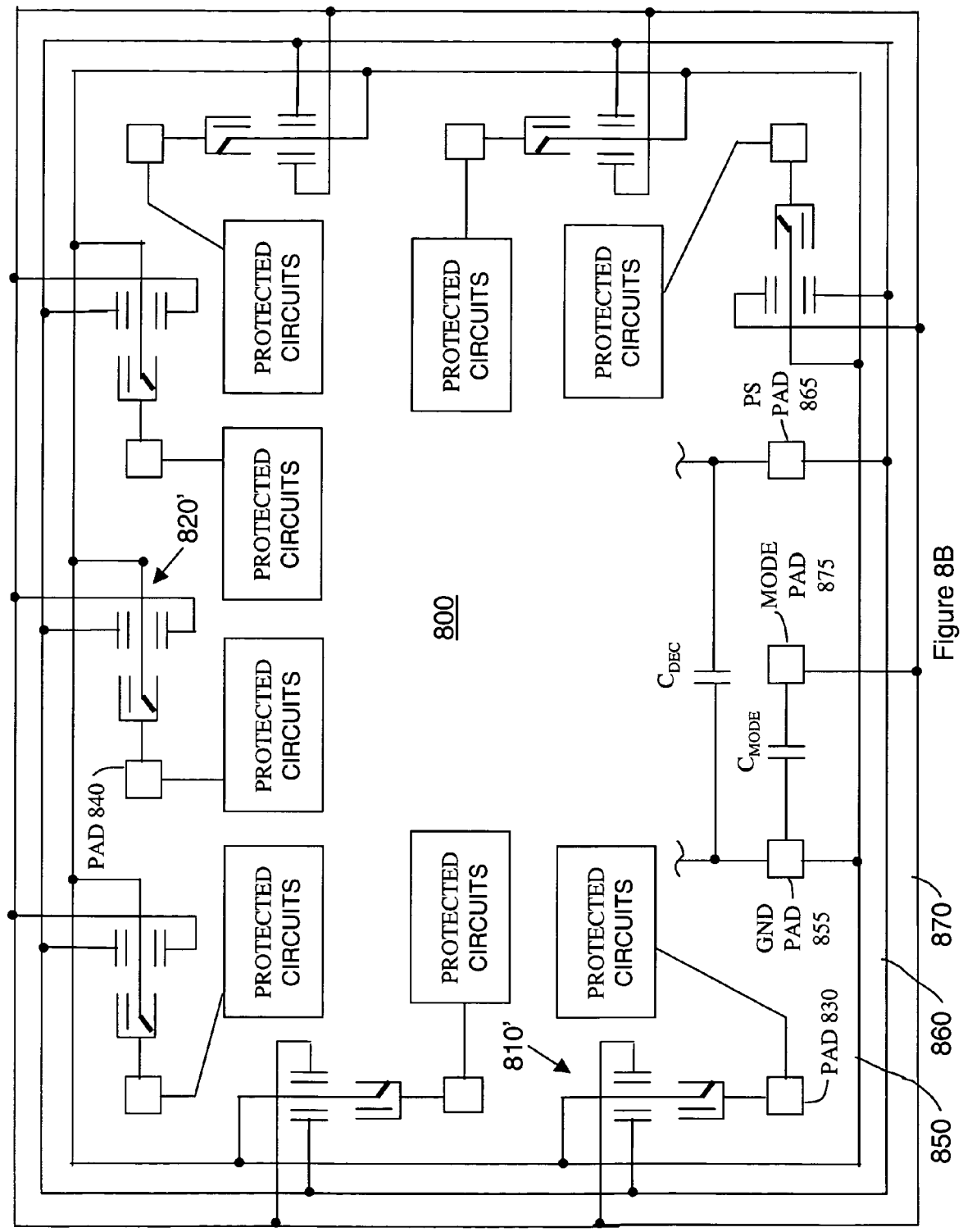
FIG. 8B shows a schematic of nonvolatile nanotube protective devices in FIG. 8A in an activated (ON) state.
Figure 8B:
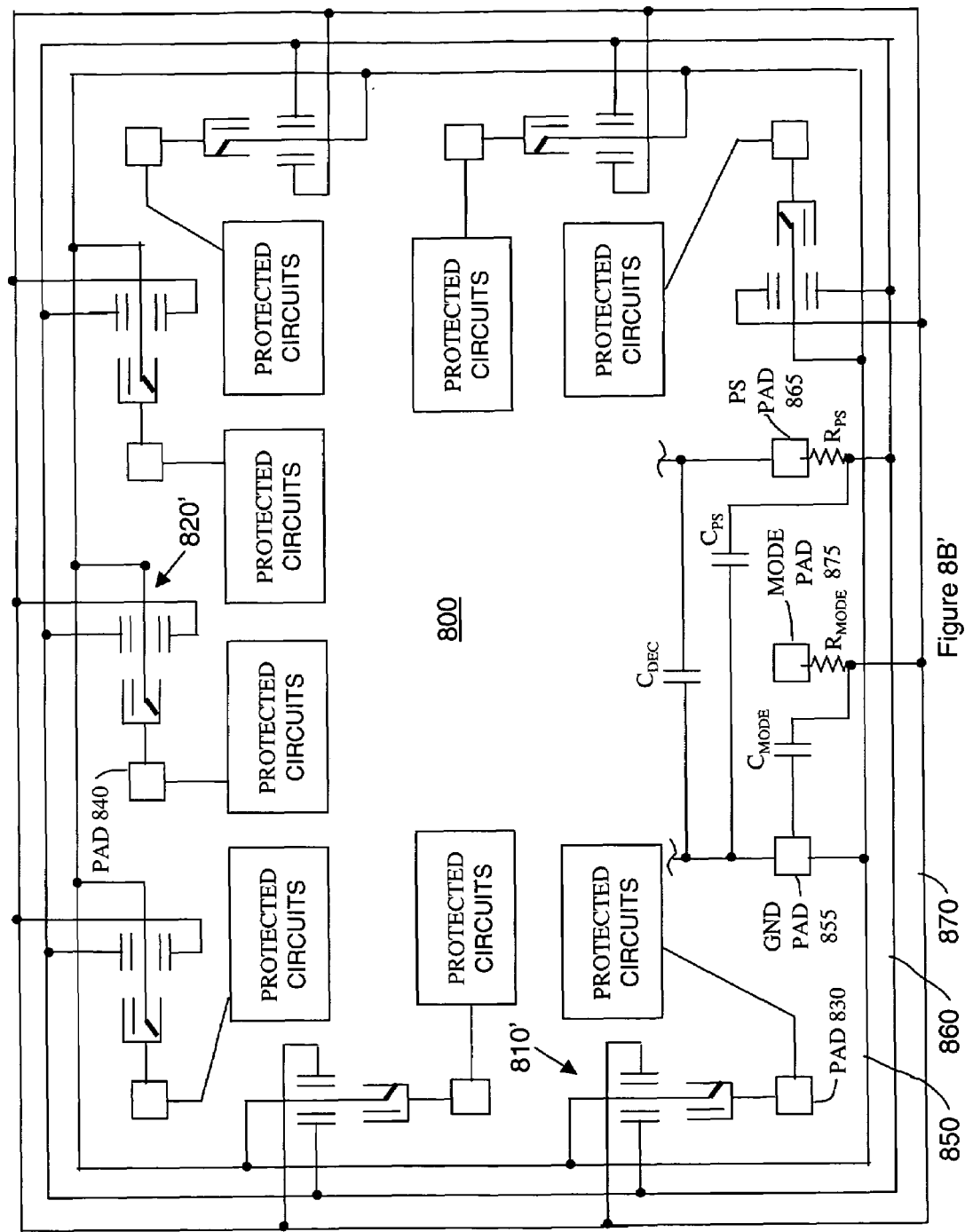

Power supply pad 865 connects to numerous on-chip circuits (not shown) and is also connected to common connector 860 either directly, or through a resistor in the manner indicated in FIGS. 8B and 8B', respectively, which corresponds to common connector 780 in FIG. 7B, connecting to insulated release plates of all nonvolatile nanotube protective devices such devices 810 and 820. Power supply pad 865 forms part of a first plate of a large $C_{DEC}$ capacitor coupled to ground, part of chip circuit design requirements.

Ground pad 855 connects to numerous on-chip circuits (not shown) and is also connected to common connector 850, which corresponds to common connector 775 in FIG. 7, connecting to insulated nanotube channel element signal electrodes of all nonvolatile nanotube protective devices such as devices 810 and 820. Ground pad 855 forms part of a second plate of a large $C_{DEC}$ capacitor coupled to power supply.

Mode control pad 875 is connected to common connector 870 either directly or through a resistor, as illustrated in FIGS. 8B and 8B', respectively, which corresponds to common connector 785 in FIG. 7, connecting to insulated input plates of all nonvolatile nanotube protective devices such as devices 810 and 820. Mode control pad 875 forms part of a first plate of a large $C_{MODE}$ capacitor coupled to a second plate connected to ground. Mode control pad 875 may also be shared with another pad (not shown) instead of using dedicated mode control pad 875.

FIGS. 8B and 8B' illustrate activated (ON) nonvolatile nanotube protective devices in schematic form, including activated (ON) nonvolatile nanotube protective devices 810' and 820', with ESD protection activated (ON), such that nanotube channel elements are in electrical contact with output electrodes connected to pads 830 and 840, respectively, and also with common electrode 850. If electrostatic charge is applied to any pad, such as pads 830 and 840, for example, then activated (ON) nonvolatile nanotube protective devices 810' and 820', for example, conduct electrostatic charge through activated nanotube channel elements to common connector 850, thereby limiting the voltage induced on pads 830 and 840, thus protecting the internal protected circuits. Nonvolatile nanotube protective devices may be turned ON (activated) by applying a voltage (positive or negative) to common connector 870 relative to common connectors 850 and 860, with common connectors 850 and 860 at zero (ground) voltage, for example.

Figure 8C:
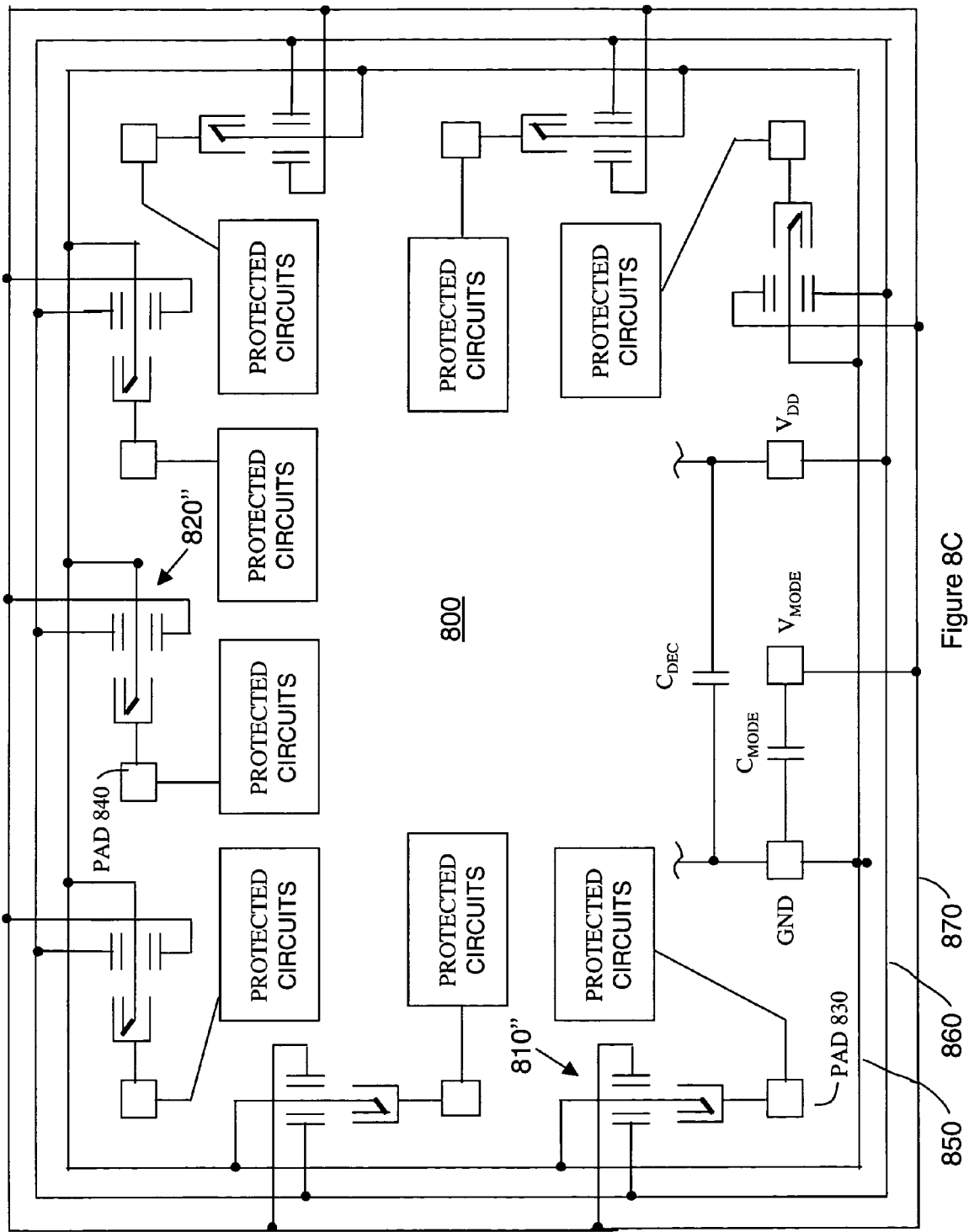
FIG. 8C shows a schematic of FIG. 8A with nonvolatile nanotube protective devices in a de-activated (OFF) state.

During operation of the protected circuits, nonvolatile nanotube protective devices such as nonvolatile nanotube protective devices 810 and 820 must be in the de-activated (OFF) state. FIG. 8C illustrates de-activated (OFF) nonvolatile nanotube protective device in schematic form, including de-activated (OFF) nonvolatile nanotube protective devices 810" and 820", with ESD protection de-activated (OFF). De-activated (OFF) nonvolatile nanotube protective devices add capacitance loading $C_{WIRE}+2C_{OUT}$ (FIG. 7D) to pads, such as pads 830 and 840, during chip operation. This additional capacitance is much smaller than typical circuit capacitance as described further below. Nonvolatile nanotube protective devices may be de-activated (turned-OFF) by applying a voltage (positive or negative) to common connector 860 relative to common connectors 850 and 870, with common connectors 850 and 870 at zero (ground) voltage, for example.

Electrostatic Discharge (ESD) Source

Figure 9A:
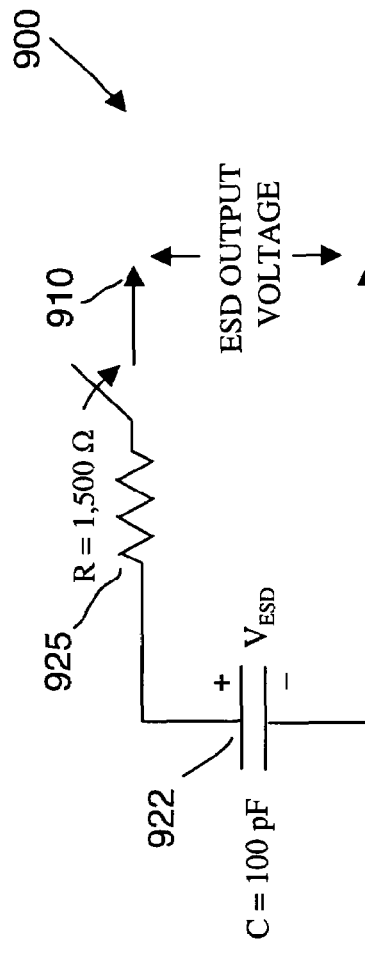
FIGS. 9A and 9B show a schematic of a prior art NASA ESD model and associated ESD-induced current flow as a function of time.

FIG. 9A illustrates prior art equivalent circuit 900 of the human body model (HBM) proposed by NASA for example (reference: http://eed.gsfc.nasa.gov/562/ESD_Purpose.htm) for calculating the strength of electrostatic discharges. A voltage $V_{ESD}$ appears across 100 pF capacitor 922, and is applied through resistor 925 of 1,500 Ohms to terminals 910 and 920. Terminals 910 and 920 come in contact with chip pads (may be through pins in a packaged chip, for example). A discharge current 930 flows from circuit 900 as provided by the NASA HBM illustrated in FIG. 9B. Discharge current 930 reaches a peak current of 1 Ampere in 10 ns, drops to 0.5 Amperes in 115 ns, then to 0.37 Amperes (37% of the peak current value) after 180 ns, and then discharges to zero current.

Nonvolatile Nanotube Protective Device
Characteristics Required to Handle Discharge
Currents Based on a NASA ESD Model FIGS. 8B and 8B' illustrate a schematic representation of a chip 800 in which activated nonvolatile nanotube protective devices, such as activated nonvolatile nanotube protective devices 810' and 820', are in ON (activated) state, corresponding to activated nonvolatile nanotube protective devices 750' in FIG. 7C. In this example, the voltage induced by ESD on pad 756 and applied to protected circuits 757 is assumed to be a limited by nonvolatile nanotube protective devices to a maximum allowed voltage of 5 volts. The ESD current path is from pad 756, through conductor (wire) 754, through output electrode 755, through nanotube channel element 764, through conductor (wire) 762, to common conductor 775. The path resistance of individual SWNTs is primarily conductor-to-SWNT contact resistance $R_{SW}/2$ in series with conductor-to-SWNT contact resistance $R_C/2$, because the resistance of other contacts are much smaller, milliohms for example, and the resistance of individual SWNTs are also small compared with the contact resistance $R_{SW}$ and $R_C$ between conductors and SWNTs. Activated (ON) nonvolatile nanotube protective device resistance is a function of the number N of individual SWNTs in parallel and may be expressed as $(R_{SW}/2+R_C/2)/N$.

ESD pulses may be applied to chips in a variety of ways. For example, pad-to-pad, pad-to-ground, and other ways described further below. An ESD-induced voltage occurs when an ESD pulse is applied between two pads, pads 830 and 840 illustrated schematically in FIGS. 8B and 8B', for example, because current flows through two activated nonvolatile nanotube protective devices, such as protective devices 810' and 820' in series. Thus, the total resistance between pads 830 and 840 is $2\times(R_{SW}/2+R/2)/N$ or $(R_{SW}+R_C)/N$ as illustrated schematically by equivalent circuit 1000 in FIG. 10A, while the total resistance between either pad 830 or 840 to common connector 850, for example, is $(R_{SW}/2+R_C/2)/N$. Since common connector 850 is connected to a large capacitor $C_{DEC}$ that can divert ESD current flow, the maximum induced pad voltage may be less than the estimated maximum voltage. Equivalent circuit 1000 shown in FIG. 10A corresponds to ESD electrostatic discharge (ESD) equivalent circuit source 900 applied between two pads (padto-pad) as described further above. ESD equivalent circuit source 900 outputs 910 and 920 are connected to pad 830 and pad 840, respectively, as represented schematically in FIGS. 8B, 8B', and 10A.

The number of individual SWNTs N required in nanotube channel element 764 in FIG. 7C, corresponding to nanotube channel elements in activated nonvolatile nanotube protective devices 810' and 820' in FIG. 8B, is dependent on contact resistances $R_{SW}$ and $R_C$ between conductors and the manner in which ESD voltages are applied. Examples of the number of individual SWNTs N needed to limit an ESD-induced pad-to-pad applied voltage to 5 volts is a function of contact resistances $R_{SW}$ and $R_C$ as described further below. The maximum pad voltage is $I_{MAX}$ ($R_{SW}$+$R_C$)/N=5 Volts, where the discharge current 930 (FIG. 9B) maximum $I_{MAX}$=1 Ampere, the conductor-to-nanotube contact resistances for individual SWNTs are $R_{SW}$ and $R_C$, the number of parallel individual SWNTs is N, and the maximum allowed voltage is 5 Volts. The value of ($R_{SW}$+$R_C$)/N is adjusted to 5 ohms so that at $I_{MAX}$=1 Ampere, ESD-induced voltage does not exceed 5 volts. If for example, $R_{SW}$=$R_C$=10,000 Ohms, then N=4,000 individual SWNTs; if $R_{SW}$=$R_C$=20,000 Ohms, then N=8,000 individual SWNTs; and if $R_{SW}$=$R_C$=30,000 Ohms, then N=12,000 individual SWNTs. For a technology node of 130 nm, and a nanotube density of 10 individual nanotubes in a 200×200 mm area, nanotube channel element width $W_{NT}$=0.325 um for 15 individual SWNTs; $W_{NT}$=87 um for 4,000 individual SWNTs and $W_{NT}$=174 um for 8,000 individual SWNTs. Nonvolatile nanotube protective devices are relatively large devices that are placed adjacent to pads and over circuits such as off-chip-drivers (OCDs).

The ESD-induced voltage of 5 volts may be too high for some applications. It is possible to reduce ESD-induced voltage to less than 1 volt using devices of approximately the same size by using nanotube fabrics of greater density. Nanotube fabric density approximately 5× higher than the 10 individual SWNTs in a 200×200 nm area described further above have been deposited and may be used. For example, a nonvolatile nanotube protective device of approximately $W_{NT}$=100 um with $R_{SW}$ and $R_C$ of 10,000 ohms, and N=25,000 individual SWNTs at 5× the density, which results in a maximum ESD-induced voltage of 0.8 volts. This estimated ESD-induced voltage is made using equivalent circuit 1000 in FIG. 10A, where an ESD-induced current 930 (FIG. 9B) of $I_{MAX}$=1 Ampere passes through two activated nonvolatile nanotube protective device resistors in series having a resistance of ($R_{SW}$+$R_C$)/N=20,000/25,000=0.8 ohms for a maximum ESD-induced voltage of 0.8 volt. While maximum ESD-induced voltage of 5 volts at maximum ESD-induced current of 1 Ampere is used when describing equivalent circuit performance with respect to FIG. 8 and FIG. 10, it is understood that the option of using higher density nanotube fabrics to limit maximum ESD-induced voltage to 0.8 volts may be used instead. Alternatively, nonvolatile nanotube protective devices that are 5× wider may also be used at the lower nanotube fabric density to achieve a maximum ESD-induced voltage of 0.8 volts.

Alternatively, a 5× nanotube fabric density may be used to reduce the size of nonvolatile nanotube protective devices with maximum ESD-induced voltage protection remaining at 5 volts. A device of width $W_{NT}$=87 um using 4,000 individual SWNTs described above may be reduced to may be reduced to a width of 18 um, also with 4,000 individual SWNTs, if a 5× nanotube fabric density is used.

Equivalent circuit 1010 shown in FIG. 10B corresponds to ESD equivalent circuit source 900 output terminals 910 and 920 connected to pad 830 and ground pad 855 resulting in discharge current 930. Discharge current 930 flows through activated nonvolatile nanotube protective device 810' represented by resistance ($R_{SW}$/2+$R_C$/2)/N located between pad 830 and common conductor 850, which is connected to ground pad 855 as also shown in FIG. 8B. The maximum ESD-induced voltage on pad 830 with respect to ground pad 855 is 2.5 volts, half the pad-to-pad maximum voltage of equivalent circuit 1000.

Figure 9B:
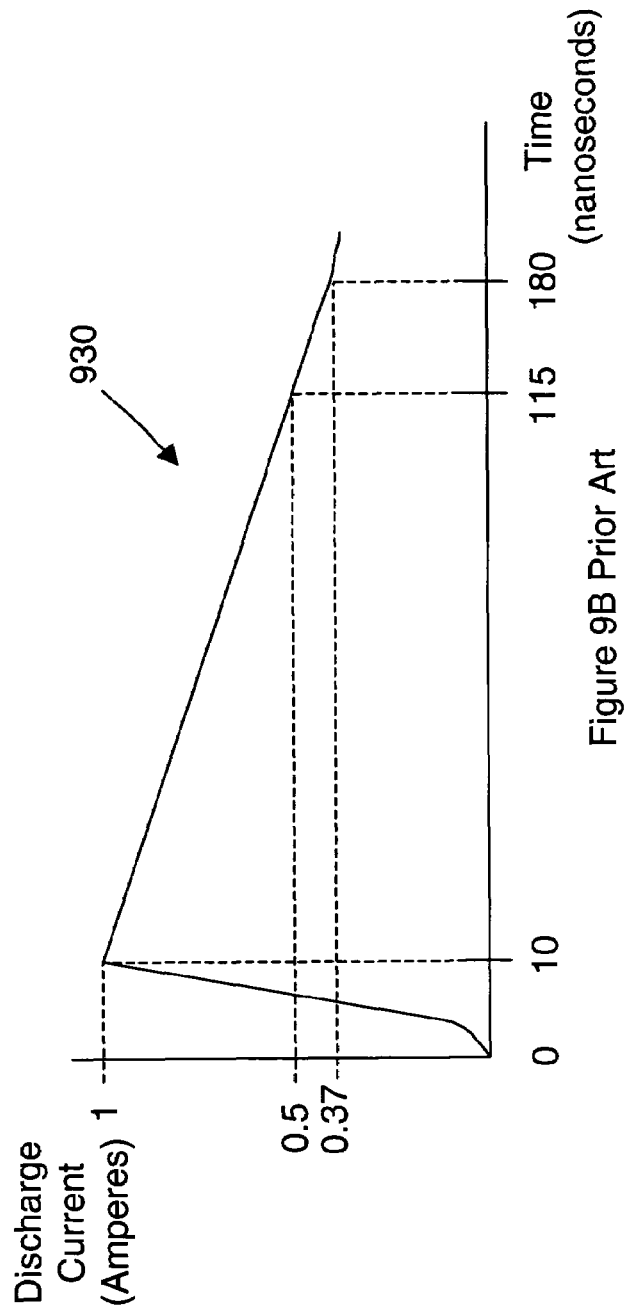
Figure 10C:
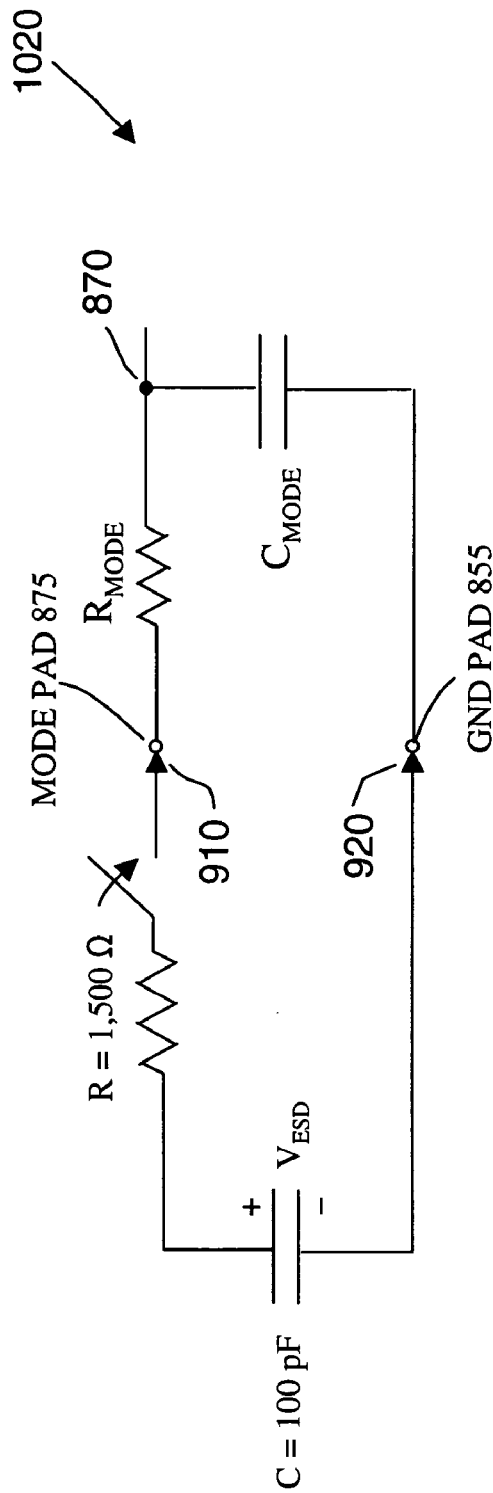
FIG. 10C shows an equivalent circuit schematic of an ESD source connected between a mode pad and a ground pad of an activated nonvolatile nanotube protective device.

Equivalent circuit 1020 illustrated in FIG. 10C corresponds to ESD equivalent circuit source 900 output terminals 910 and 920 connected to mode pad 875 and ground pad 855 resulting in discharge current 930 illustrated in FIG. 9B flowing through common connector 870, which is connected to activated nonvolatile nanotube protective device insulated input terminals, as illustrated by representative protective devices 810' and 820' shown in FIGS. 8B and 8B'. In order to limit ESD-induced voltage buildup on common connector 870, several methods may be used. In a first method, a capacitor-only approach is used in which capacitor $C_{MODE}$ is added between mode pad 875 and ground pad 855, as illustrated in FIG. 8B and in FIG. 10C, with no series resistance ($R_{MODE}$=0 in FIG. 10C). In a second method, a series resistor $R_{MODE}$ is added between mode pad 875 and common connector 870, and parallel capacitor $C_{MODE}$ are added between common connector 870 and ground pad 855 as illustrated in FIG. 8B' and FIG. 10C.

The first method where a parallel capacitor $C_{MODE}$ is added between mode pad 875 and ground pad 855 as illustrated in FIG. 8B, the size of $C_{MODE}$ capacitance required to limit ESD voltage buildup to 5 volts may be estimated as follows. The well known current-voltage relationship for capacitors I=C ΔV/ΔT may be restated as $C_{MODE}$=$I_{MAX}$ ΔT/ΔV, where $I_{MAX}$=1 Ampere is the maximum value of ESD current 930 illustrated in FIG. 9B, ΔT=10 ns is the rise time to maximum current value $I_{MAX}$, and ΔV=5 volts is the maximum allowed ESD-induced voltage on common conductor 870. The required size of $C_{MODE}$=2,000 pF, a capacitance value that may be added to chip 800 as illustrated in FIG. 8B.

The second method where series resistor $R_{MODE}$ is added between mode pad 875 and common connector 870, and a capacitor $C_{MODE}$ is added between common connector 870 and ground pad 855 as illustrated by equivalent circuit 1020 in FIG. 10C and FIG. 8B', values of $R_{MODE}$ and $C_{MODE}$ may be determined as follows. Series resistor $R_{MODE}$ reduces the maximum value $I_{MAX}$ of discharge current 930. If $R_{MODE}$ is 15,000 Ohms, for example, $I_{MAX}$ is reduced by approximately 10×. For a maximum ESD-induced voltage of 5 volts between common connector 870 and ground pad 855, capacitor $C_{MODE}$=2,000 pF illustrated in FIG. 8B may be reduced by approximately 10× to $C_{MODE}$=200 pF when used with series resistor $R_{MODE}$ as illustrated in FIG. 8B'.

Figure 10D:
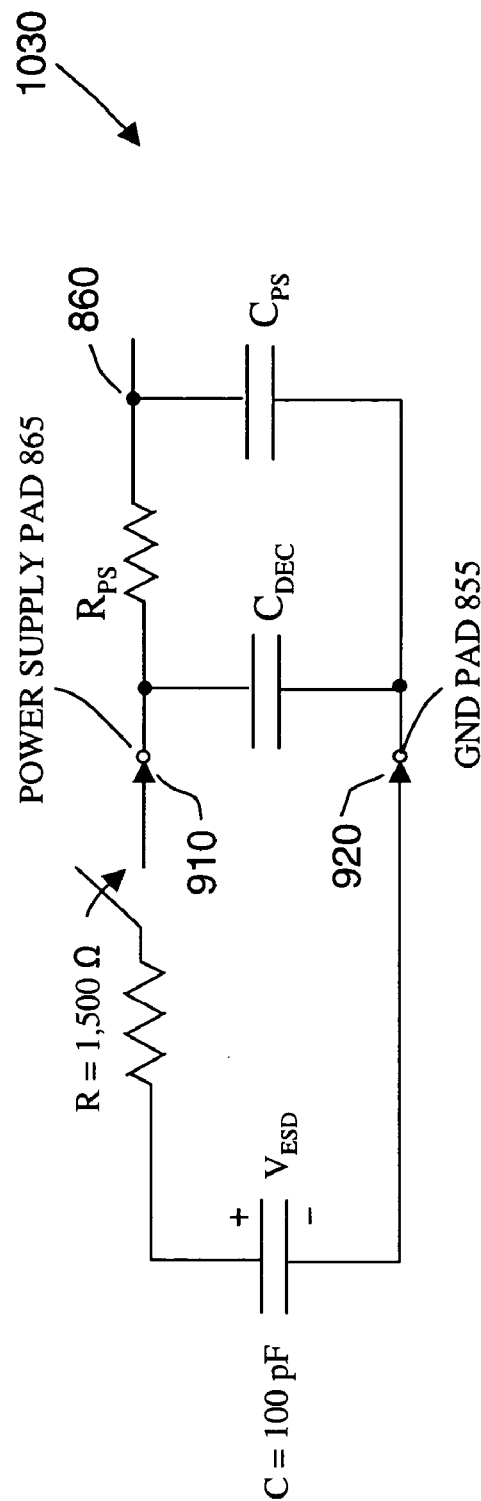
FIG. 10D shows an equivalent circuit schematic of an ESD source connected between a power supply pad and a ground pad of an activated nonvolatile nanotube protective device.

Equivalent circuit 1030 illustrated in FIG. 10D corresponds to ESD equivalent circuit source 900 output terminals 910 and 920 connected to power supply pad 865 and ground pad 855 resulting in discharge current 930 illustrated in FIG. 9B flowing through common connector 860, which is connected to activated nonvolatile nanotube protective device insulated input terminals, as illustrated by representative protective devices 810' and 820' shown in FIG. 8B. In order to limit ESD-induced voltage buildup on common connector 860, several methods may be used. In a first method, a capacitor-only approach uses existing (required for circuit operation) power supply-to-ground decoupling capacitor $C_{DEC}$ between power supply pad 865 and ground pad 855, as illustrated in FIG. 8B and in FIG. 10D, with no series resistance ($R_{PS}$=0 in FIG. 10D). In a second method, a series resistor $R_{PS}$ is added between power supply pad 865 and common connector 860, and parallel capacitor $C_{PS}$ is added between common connector 860 and ground pad 855 as illustrated in FIG. 8B' and FIG. 10D.

In a first method, the existing decoupling capacitor $C_{DEC}$ between power supply and ground may be used as illustrated in FIG. 8B, and FIG. 10D with no series resistor ($R_{PS}$=0 in Figure D) used and no additional capacitance $C_{PS}$ ($C_{PS}$ is open in FIG. 10D) is added. The value of $C_{DEC}$ needed to limit ESD-induced voltage to 5 volts is $C_{DEC}$=2,000 pF, the same as the calculation of the required value of $C_{MODE}$ illustrated above with respect to FIG. 10C. Since a decoupling capacitor of at least this magnitude is commonly used in chip, no additional capacitance is required.

In a second method, a series resistor $R_{PS}$ is added between power supply pad 865 and common connector 860, and a capacitor $C_{PS}$ is added between common connector 860 and ground pad 855 as illustrated by equivalent circuit 1030 in FIG. 10D and FIG. 8B'. Series resistor $R_{PS}$ reduces the maximum value of $I_{MAX}$ discharge current 930. If $R_{PS}$ is 15,000 Ohms, for example, $I_{MAX}$ is reduced by approximately 10×. For a maximum ESD-induced voltage of 5 volts between common connector 860 and ground pad 855, $C_{PS}$ is estimated as $C_{PS}$=200 pF, using the same approach used to estimate $C_{MODE}$ with respect to FIG. 10C. Since $C_{DEC}$ is present between power supply pad 865 and ground pad 855 (circuit design requirement), the maximum ESD-induced voltage will be less than 5 volts.

Figure 10E:
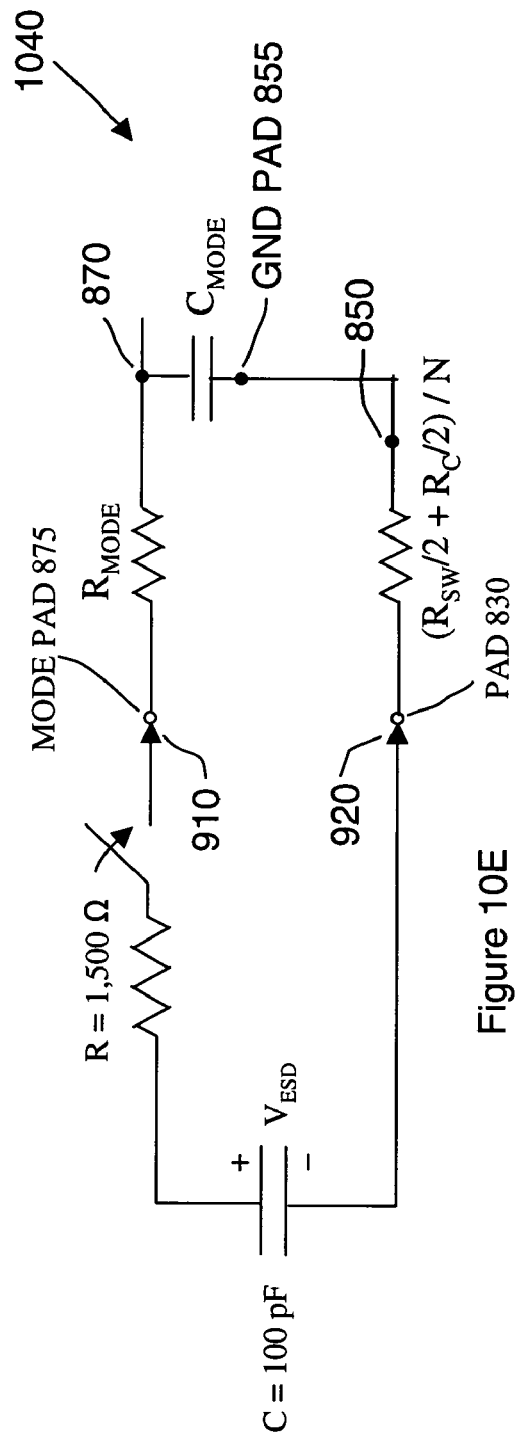
FIG. 10E shows an equivalent circuit schematic of an ESD source connected between a mode pad and a pad (signal pad, for example) of an activated nonvolatile nanotube protective device.

Equivalent circuit 1040 shown in FIG. 10E corresponds to ESD equivalent circuit source 900 output terminals 910 and 920 connected to mode pad 875 and pad 830 resulting in discharge current 930. Discharge current 930 flows through $R_{MODE}$, where $R_{MODE}$=15,000 Ohms, for example, and reduces the maximum current by 10× to 0.1 Amperes as described with respect to equivalent circuit 1020 in FIG. 10C. $C_{MODE}$=200 pF as described with respect to equivalent circuit 1020 in FIG. 10C. Activated (ON) nonvolatile nanotube protective device 810' has a resistance $(R_{SW}/2+R_C/2)/N$=2.5 ohms, and with a reduced maximum current of 0.1 Amperes, the maximum voltage drop across the resistor is negligible at 0.25 Volts such that ground pad 855 remains at approximately zero volts. Therefore, the maximum ESD-induced voltage on common connector 870 meets ESD-induced voltage requirements at a maximum of 5 volts, the same as calculated for equivalent circuit 1020, FIG. 10C.

Figure 10F:
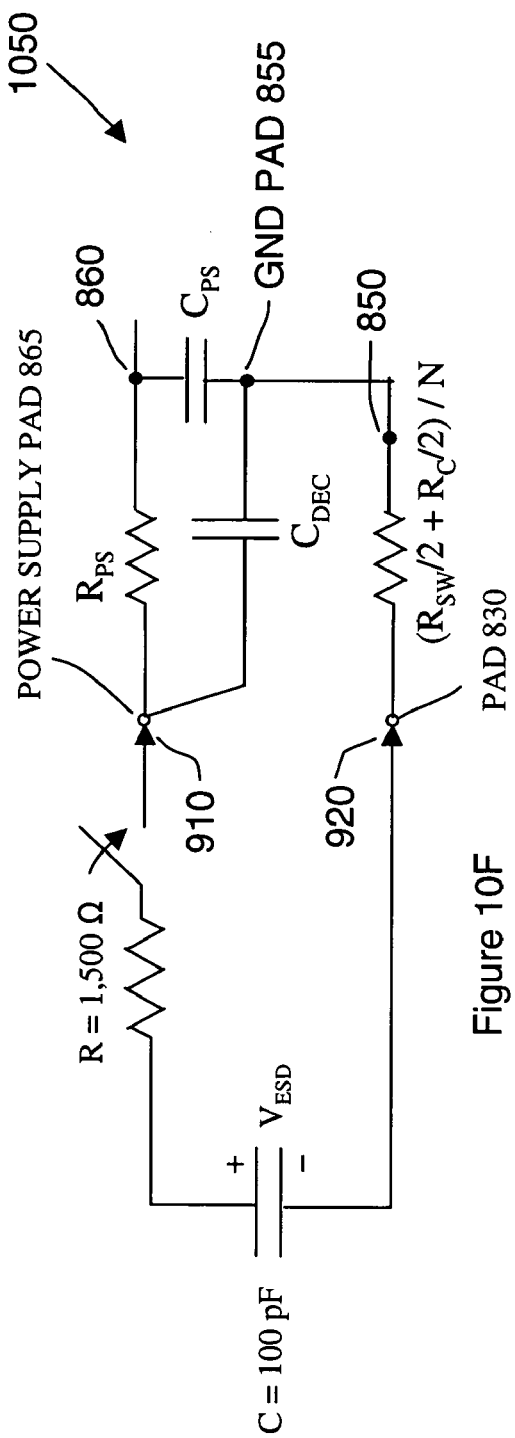
FIG. 10F shows an equivalent circuit schematic of an ESD source connected between a power supply pad and a pad (signal pad, for example of an activated nonvolatile nanotube protective device)

Equivalent circuit 1050 shown in FIG. 10F corresponds to ESD equivalent circuit source 900 output terminals 910 and 920 connected to power supply pad 865 and pad 830 resulting in discharge current 930. Discharge current 930 flows through $R_{PS}$, where $R_{PS}$=15,000 Ohms, for example, and reduces the maximum current by 10× to 0.1 Amperes as described with respect to equivalent circuit 1030 in FIG. 10D. $C_{PS}$=200 pF as described with respect to equivalent circuit 1030 in FIG. 10D Activated (ON) nonvolatile nanotube protective device 810' has a resistance $(R_{SW}/2+R_C/2)/N$=2.5 ohms, and with a reduced maximum current of 0.1 Amperes, the maximum voltage drop across the resistor is negligible at 0.25 Volts such that ground pad 855 remains at approximately at zero volts. Therefore, the maximum ESD-induced voltage on common connector 860 meets ESD-induced voltage requirements at a maximum of 5 volts, the same as calculated for equivalent circuit 1030, FIG. 10D. Decoupling capacitor $C_{DEC}$, which is typically at least 2,000 pF carries a portion of discharge current 930 away from common connector 860, such that the ESD induced maximum voltage common connector 860 is reduced below 5 Volts. Also, power supply pad 865 with respect to ground pad 855 is less than the 5 volts pad-to-ground maximum voltage as described with respect to equivalent circuit 1030 in FIG. 10D.

Figure 10G:
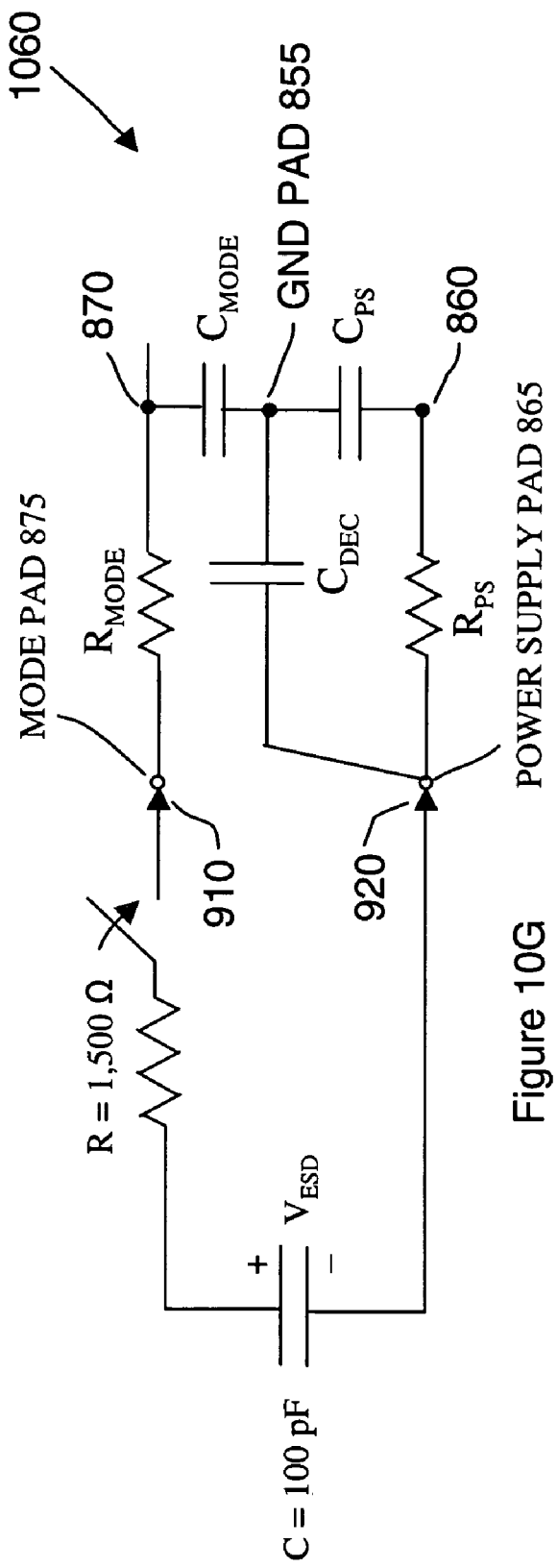
FIG. 10G shows an equivalent circuit schematic of an ESD source connected between a power supply pad and a mode pad of an activated nonvolatile nanotube protective device.

Equivalent circuit 1060 shown in FIG. 10G corresponds to ESD equivalent circuit source 900 output terminals 910 and 920 connected to mode pad 875 and power supply pad 865 resulting in discharge current 930. Discharge current 930 flows through resistors $R_{MODE}$=15,000 Ohms and $R_{PS}$=15,000 Ohms, such that the maximum current flow is reduced by 20× from 1 Ampere to 0.05 Amperes and the ESD-induced voltage between mode pad 875 and power supply pad 865 does not exceed 5 volts. Because $C_{DEC}$ connects ground pad 855 and power pad 865 and provides an additional current flow path, the maximum ESD-induced voltage will be less than 5 volts.

Nonvolatile Nanotube Protective Device Capacitance During Chip Operation

During chip operation, nonvolatile nanotube protective devices are de-activated as illustrated by de-activated nonvolatile nanotube protective devices 810" and 820" in FIG. 8C. De-activated nanotube protective devices correspond to de-activated nonvolatile nanotube protective devices 750" illustrated schematically in FIG. 7D and corresponding de-activated (OFF) nonvolatile nanotube protective device 795 shown in cross section in FIG. 7E. The value of the capacitance $C_{OUT}$ for a nonvolatile nanotube device similar to nonvolatile nanotube protective device 795 may be scaled from a similar device described in U.S. Prov. Pat. Appln. No. 60/581,074, entitled "Nonvolatile Carbon Nanotube Logic (NLOGIC) Off Chip Driver," filed Jun. 18, 2004, in which $C_{OUT}$ is approximately 0.030 fF (or 30 aF) for a device fabricated having nanotube channel element 426 (FIGS. 4A and B) in nanotube channel element position 430 (FIG. 6A) with 15 individual SWNTs, where nanotube fabric density is approximately 10 individual SWNTs per 200×200 mm area. Having determined the number of individual SWNTs N required for ESD protection as described further above, de-activated nonvolatile nanotube protective device capacitance values may be scaled accordingly. If N=4,000 individual SWNTs, then the $2C_{OUT}$=16 fF (2×0.030×4000/15); if N=8000 individual SWNTs, then $2C_{OUT}$=32 fF; and if N=12,000 individual SWNTs, then $2C_{OUT}$=48 fF. $C_{WIRE}$ was estimated further above as 0.2 fF, which may be neglected compared to the values of $2C_{OUT}$.

Nonvolatile nanotube protective devices add less than 50 fF to the capacitance load of the circuits they protect. By contrast, conventional protective diodes may add 1.5 pF, or 1,500 fF as described in Bertin et al. U.S. Pat. No. 6,141,245. Nonvolatile nanotube protective devices do not use semiconductor diodes (or transistors) and may therefore be place on any level of electronic assembly such as chip, chip carrier, card, or board. Several nonvolatile nanotube protective devices may be used in parallel on one input of an electronic assembly because they add less that 1/10 the capacitance of conventional protective devices, thereby increasing ESD protection of electronic assemblies.

Integrating Nanotube-only Nonvolatile Nanotube Protective Devices at Various Levels of Electronic Assembly Nonvolatile carbon nanotube protective devices 722 illustrated in FIG. 7A can be placed at any level of assembly, such as chip, module, card, or board-level substrates. Prior art FIG. 11A illustrates a simplified representation of a cross section of semiconductor chip 1100 with conventional protective devices (PDs) 1102, corresponding to protective device 10 illustrated schematically in FIG. 1, in a semiconductor substrate 1101. Protective device 1102 is connected to a pad 1106 by conductive stud 1103 in insulator 1104 and conductor 1105 on the surface of insulator 1104, which has been deposited on the surface of semiconductor substrate 1101. Diffusion 1107, which may be N or P type, forms a portion of protected circuits 14 illustrated schematically in FIG. 1. Diffusion 1107 is connected to protective device 1102 by conductive stud contact 1108 and conductor 1105. Pads 1106 may be arranged around the periphery or may be in an area array configuration on semiconductor chip 1100. Connections between pads 1106 and other levels of assembly may use wire bonds directly to pads 1106 (not shown) or conductive bumps 1109 on pads 1106 (solder, for example) as illustrated in FIG. 11A and as described in the reference C. Bertin et al., "Known Good Die (KGD)," Chapter 4, of reference book "Area Array Interconnection Handbook," editors K. Puttlitz and P. Totta, Kluwer Academic Publishers, 2001, pp. 149-151.

FIG. 11B illustrates a simplified representation of a cross section of a semiconductor (or a hybrid semiconductor/nanotube) chip 1110, where nonvolatile nanotube protective devices 1112 have been added to semiconductor chip 1110 for additional ESD protection for diffusion 1107. Semiconductor chips are well known in the semiconductor industry. Hybrid semiconductor/nanotube chip examples may be found in U.S. patent application Ser. No. 11/033,089, entitled "Nonvolatile Carbon Nanotube Logic (NLOGIC) and CMOS Inverter," filed Jun. 10, 2005 and U.S. patent application Ser. No. 11/033,213, entitled "Combined NLOGIC & CMOS Dual-Rail Nonvolatile Receiver Circuit," filed Jun. 10, 2005, both of which are hereby incorporated by reference in their entirety. Nonvolatile nanotube protective devices 1112 correspond to protective device 722 illustrated in FIG. 7A. Nonvolatile nanotube protective device 1112 is connected to diffusion node 1107 by conductor 1115 and stud contact 1108, and to pad 1117 by conductor 1115. Connections between pads 1117 and other levels of assembly may use wire bonds directly to pads 1117 (not shown) or conductive bumps 1118 on pads 1117 (solder, for example) as illustrated in FIG. 11B. Device 1114 is a conventional prior art protective device (PD) analogous to PD 10 in FIG. 1.

FIG. 11C illustrates a simplified representation of a semiconductor (or a hybrid semiconductor/nanotube) chip 1120 in which prior art protective devices 10 are no longer used to protect diffusion 1107, so that diffusion 1107 is instead protected from ESD by nonvolatile nanotube protective devices 1122. Nonvolatile nanotube protective devices 1122 correspond to protective device 722 illustrated in FIG. 7A. Nonvolatile nanotube protective device 1122 is connected to diffusion node 1107 by conductor 1124 and stud contact 1108, and to pad 1126 by conductor 1124. Connections between pads 1126 and other levels of assembly may use wire bonds directly to pads 1126 (not shown) or conductive bumps 1128 on pads 1126 (solder, for example) as illustrated in FIG. 11C.

FIG. 11D illustrates a represents a cross section of a nanotube-only chip 1130, which contains nanotube-only devices, circuits, and storage elements (not shown) on insulating substrate 1131. Insulator substrate 1131 may be ceramic, glass ceramic, or organic. Examples of nanotube-only devices and functions may be found in U.S. patent application Ser. No. 10/917,794, entitled "Nanotube-Based Switching Elements," filed Aug. 13, 2004, U.S. patent application Ser. No. 10/918, 085, entitled "Nanotube-Based Switching Elements with Multiple Controls," filed Aug. 13, 2004, U.S. patent application Ser. No. 11/033,215, entitled "Nonvolatile Carbon Nanotube Logic (NLOGIC) Receiver Circuit," filed Jan. 10, 2005, and in U.S. patent application Ser. No. 11/033,216, entitled "Nonvolatile Carbon Nanotube Logic (NLOGIC) Off Chip Driver," filed Jan. 10, 2005. Because insulator substrate 1131 is not a semiconductor substrate, conventional protective devices such as device 10 in FIG. 1 that require semiconductor diodes cannot be used. Instead, protective devices that do not require diodes are needed, such as nonvolatile nanotube protective devices 1133 which corresponds to protective device 722 illustrated in FIG. 7A. Nonvolatile nanotube protective device 1133 is connected to pad 1136 by conductor 1135. Nonvolatile protective device 1133 is also connected to nanotube devices and circuits (not shown) to provide ESD protection as described further below.

Figure 11E:
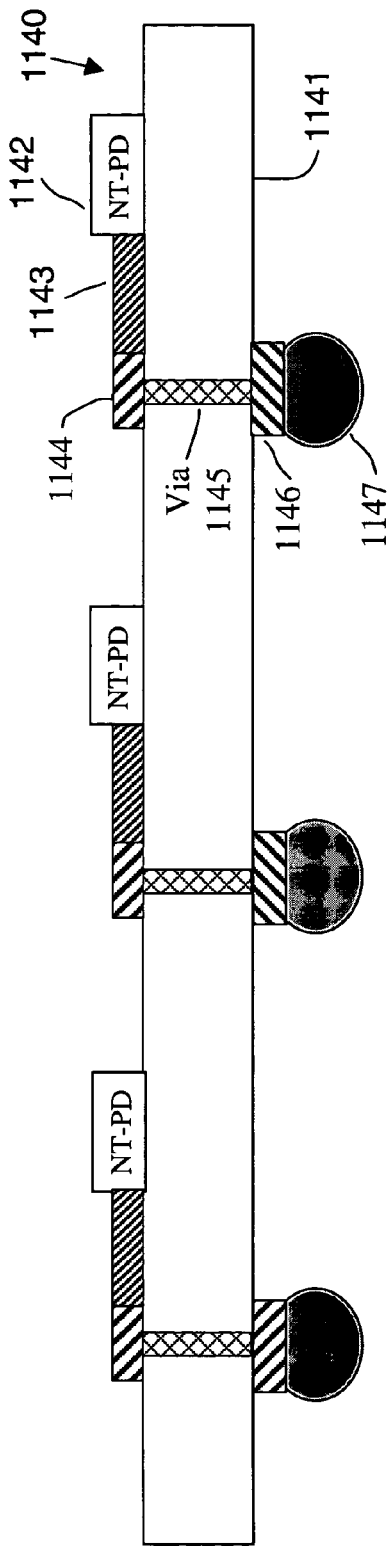
FIG. 11E illustrates a simplified cross section of a chip carrier with nonvolatile nanotube protective devices.

FIG. 11E illustrates a cross section of chip carrier 1140 to which one or more chips may be physically and electrically attached. Substrate 1141 includes surface conductors such as 1143, 1144, and 1146, internal wiring (not shown), conductor-filled via holes 1145 connecting conductors on one side with those on another side. Nonvolatile nanotube protective device 1142, corresponding to nanotube protective device 722 shown in FIG. 7A, is connected to pad 1144 by conductor 1143. Nonvolatile nanotube protective device 1142 protects chip carrier 1140 from ESD damage during handling and also provides additional protection to chips attached to chip carrier 1140. Pad 1144 is connected to terminal pad 1146 by conductor-filled via hole 1145. Conductive bump 1147 is connected to terminal pad 1146 and to a conductor on another level of assembly (not shown). An explanation of conductive bumps used at the chip level and chip carrier level may be found in the reference C. Bertin et al., "Known Good Die (KGD)," Chapter 4, of reference book "Area Array Interconnection Handbook," editors K. Puttlitz and P. Totta, Kluwer Academic Publishers, 2001, pp. 162-165.

Figure 11F:
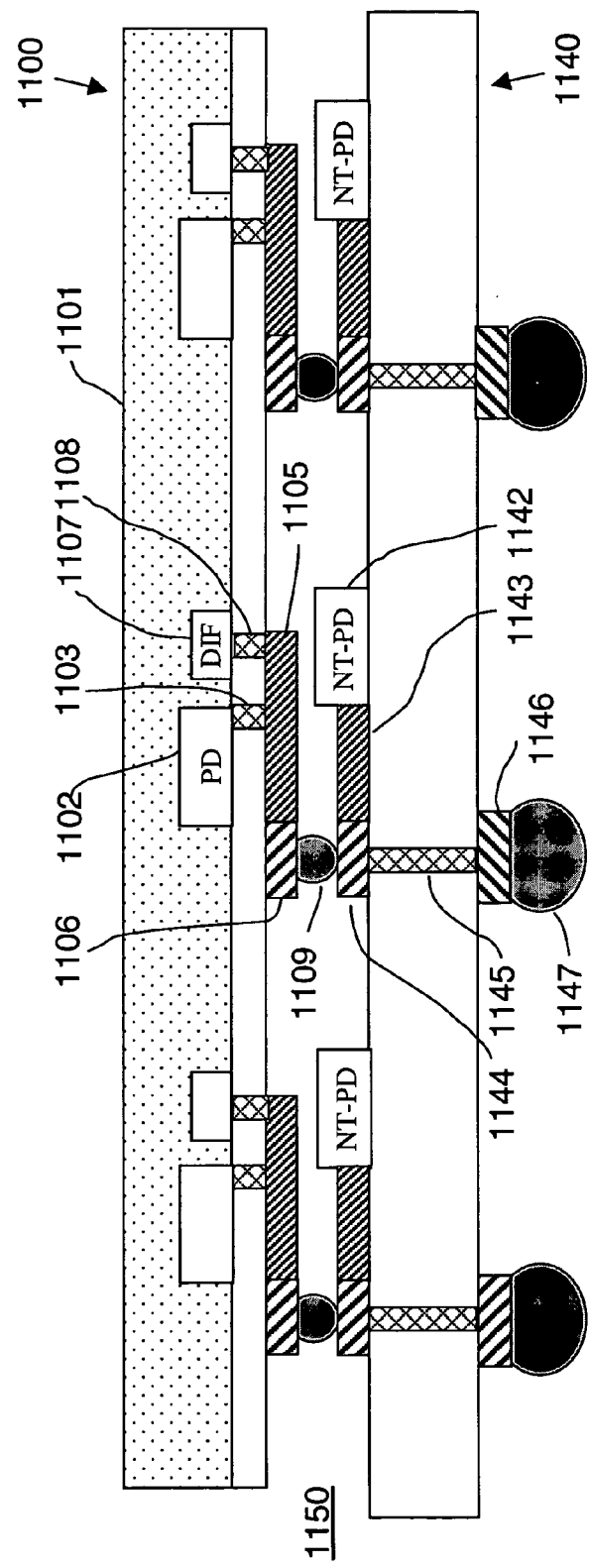
FIG. 11F illustrates a simplified cross section of a semiconductor chip with conventional protective device protection in parallel with nonvolatile nanotube device protection at the chip carrier level.

FIG. 11F illustrates semiconductor chip 1100 illustrated in FIG. 11A flip chip attached to chip carrier 1140 illustrated in FIG. 11E to form electronic assembly 1150. In addition to a chip packaging function, electronic assembly 1150 has increased the ESD protection of diffusion 1107 in semiconductor chip 1100 by connecting nonvolatile nanotube protective device 1142 in chip carrier 1140 to diffusion 1107 through conductor 1143, pad 1144, conductive bump 1109, pad 1106, conductor 1105 and stud contact 1108. This offers additional ESD protection to diffusion 1107 in semiconductor chip 1100 at the packaged chip level, comparable to semiconductor chip 1110 in FIG. 11B, but without having to add nonvolatile nanotube protective device 1112 to semiconductor chip 1100.

Conventional protective devices, such as protective device 10 in FIG. 1, can add sufficient additional capacitance loading to limit chip performance. There are performance advantages to eliminating protective devices 10 if ESD protection can be achieve by other means. FIG. 11G electronic assembly 1160, comprising semiconductor chip 1161 and chip carrier 1140 in which ESD protection of diffusion 1107 is realized using lower capacitance nonvolatile nanotube protective device 1142 in chip carrier 1140. Electronic assembly 1160 corresponds to electronic assembly 1150, except that semiconductor chip 1100 with a conventional protective device 1102 is replaced with semiconductor chip 1161 with lower pad capacitance because on-chip ESD protection is eliminated. Special ESD handling precautions are needed when handling semiconductor chip 1161 prior to attaching to chip carrier 1140. ESD protection of diffusion 1107 is provided by nonvolatile nanotube protective device 1142 on chip carrier 1140. Nanotube protective device 1142 is connected to diffusion 1107 by conductor 1143, pad 1144, conductive bump 1162, pad 1163, conductor 1165, and stud contact 1167. Connection of electronic assembly 1160 to other levels of assembly are as described with respect to electronic assembly 1150.

FIG. 11H electronic assembly 1170, comprising nanotube-only chip 1171 and chip carrier 1140, in which ESD protection of nanotube devices and circuits (not shown) connected to pad 1166 is realized using lower capacitance nonvolatile nanotube protective device 1168 in chip carrier 1140. Nanotube-only chip 1171 is similar to nanotube-only chip 1130 illustrated in FIG. 11D, except that nonvolatile nanotube protective device 1133 and conductor 1135 have been eliminated. Special ESD handling precautions are needed when handling nanotube-only chip 1171 prior to attaching to chip carrier 1140. ESD protection of nanotube devices and circuits (not shown) connected to pad 1166 is provided by nonvolatile nanotube protective device 1168 on chip carrier 1140. Nanotube protective device 1168 is connected to pad 1166 by conductor 1143, pad 1144, and conductive bump 1172. Connection of electronic assembly 1170 to other levels of assembly are as described with respect to electronic assembly 1150.

Nonvolatile nanotube protective devices may be used in higher levels of assembly than chip carriers, such as cards and boards, for example. Card-level electronic assembly 1180 typically includes a ceramic or organic substrate, pads to attach components (not shown), wiring, and terminals. FIG. 11I illustrates a plan view, and FIG. 11I' illustrates a cross section, of nonvolatile nanotube protective device protected card-level electronic assembly 1180. Terminals 1182 on card substrate 1181 are used to connect to the next level of assembly and are exposed to ESD when handling. Nonvolatile nanotube protective devices 1184 are connected to terminals 1182 by conductors 1183 to increase protection from ESD. Nonvolatile nanotube protective devices 1184 correspond to nonvolatile nanotube protective devices 722 in FIG. 7A.

FIG. 11J illustrates a board-level electronic assembly 1190 made of ceramic or organic material designed to support direct mounting of chips and connectors to support pluggable card substrates as described further in the reference C. Bertin et al., "Known Good Die (KGD)," Chapter 4, of reference book "Area Array Interconnection Handbook," editors K. Puttlitz and P. Totta, Kluwer Academic Publishers, 2001, pp. 187-189. Contact pads 1193 of connector 1192 mounted on board substrate 1191 that connect to pluggable card-level electronic assembly 1180 terminals 1182 are exposed to ESD during handling. Also, contact pads 1198 that connect to chip 1196 using conductive bumps 1197 are exposed to ESD during handling. In order to increase protection from ESD, nonvolatile nanotube protective device 1195 is connected to contact pad 1193 by conductor 1194, and nonvolatile nanotube protective device 1195' is connected to contact pad 1198 by conductor 1199. Nonvolatile nanotube protective devices 1195 and 1195' correspond to nonvolatile nanotube protective devices 722 in FIG. 7A. Chip 1196, for example, may be a semiconductor chip such as semiconductor chip 1100, or a hybrid semiconductor/nanotube chip such as hybrid semiconductor/nanotube chip 1120, or a nanotube-only chip such as nanotube-only chip 1130.

As discussed above with respect to FIG. 11, nonvolatile nanotube protective devices, such as nonvolatile nanotube protective device 722 shown in FIG. 7A, may be used at any level and all levels of electronic assembly. This includes chip level, carrier level, card level, and board level. These electronic assemblies may contain single or multiple chips.

Activating and De-Activating Nonvolatile Nanotube Protective Devices

FIGS. 8B and 8B' illustrate chip 800 in an ESD-protected state with nonvolatile nanotube protective devices in an activated (ON) state, such as activated nonvolatile nanotube protective devices 810' and 820'. Chips may be put in an ESD-protected state by a tester prior to chip or package removal, or by a system prior to chip or package removal from an electronic assembly. Activated nonvolatile nanotube protective devices may be on one or several levels of an electronic assembly. Chip 800 has all pads connected to a common connector 850 through activated nonvolatile nanotube protective devices such as devices 810' and 820' illustrated in FIGS. 8B and 8B'. Connection details are illustrated in FIG. 7C. Power supply pad 865 and mode pad 875 are protected by parallel capacitors, or resistors and parallel capacitors as illustrated in FIGS. 8B and 8B'. Equivalent circuits to calculate ESD-induced voltages for various pads, power supply pads, mode pads, and ground pads are illustrated in FIG. 10. Note that the mode pad may be shared with other pads (not shown).

Figure 12:
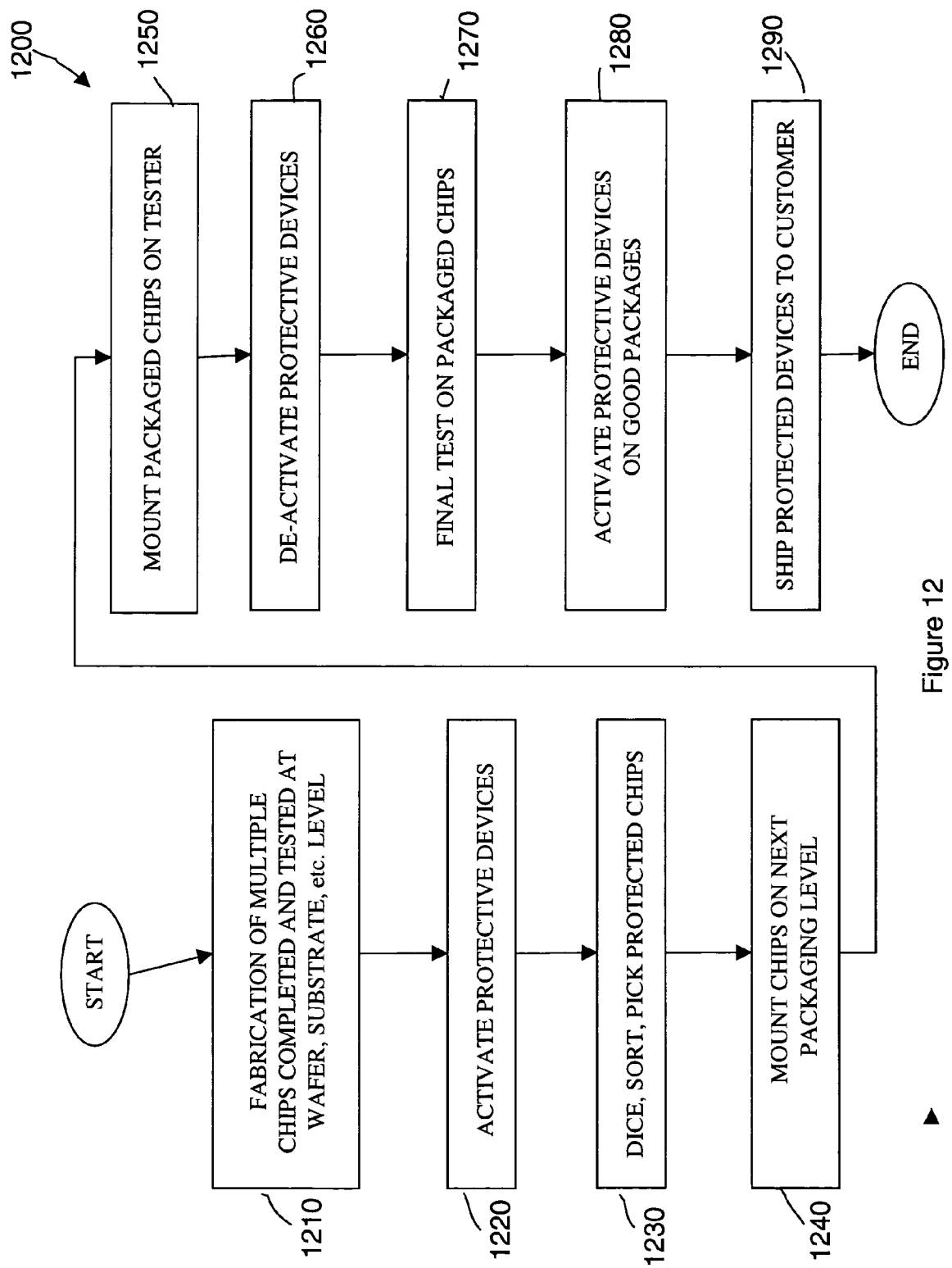
FIG. 12 shows preferred methods of activating and de-activating nonvolatile nanotube protective devices associated with an electronic assembly such as a chip or package.

Some chips are lost during the process of fabrication due to ESD-induced voltage and current stress. FIG. 12 illustrates method 1200 of using nonvolatile nanotube protective devices during fabrication to reduce ESD-related fallout during the fabrication process.

Preferred method step 1210 fabricates multiple chips on a common substrate. The common substrate may be silicon, ceramic, or organic material, for example. Semiconductor chips are fabricated using known semiconductor techniques and include conventional protective devices that include semiconductor diodes. ESD protection of semiconductor chips can be enhanced by adding nonvolatile nanotube protective devices at one or more levels of electronic assembly as illustrated in FIG. 11 without significantly increasing overall capacitive load because nanotube protective devices have less than $\frac{1}{10}^{th}$ the capacitance of conventional protective devices as described further above.

Nanotube-only logic functions are fabricated as described in U.S. patent application Ser. No. 10/918,181. Nanotube-only logic functions include receiver and output driver circuits described in U.S. patent application Ser. Nos. 11/033, 215 and 11/033,216, respectively, connected to pads, and protected from ESD voltages using activated nonvolatile nanotube protective devices. Since nanotube-only functions may be fabricated on insulated substrates, for example, conventional protective devices are not available and nonvolatile nanotube protective devices that do not require semiconductor diodes may be used instead.

Hybrid chips with mixed semiconducting and nanotube functions may also use nonvolatile nanotube protective devices as well. Nonvolatile nanotube protective devices have much lower capacitance (less than $\frac{1}{10}^{th}$) than conventional protective devices and are suitable for high speed operating circuits where capacitive loading is a problem.

Next, preferred method step 1220 activates nonvolatile nanotube protective device ESD protection using a tester by switching the protective devices to the active (ON) state as illustrated in FIGS. 8B, 8B', and 7C while chips are still on the common carrier such as a wafer, substrate, etc. Nonvolatile nanotube protective devices may be activated in the following way. All pads, including ground pad, power supply pad, and mode pad are at ground. The mode pad is ramped or pulsed (one or more pulses may be used) to a positive voltage such as power supply $V_{DD}$. All nonvolatile nanotube protective devices are activated (ON) state as illustrated in FIGS. 8B and 8B'. Nonvolatile nanotube protective devices are not used between mode pad and ground pad as indicated in FIGS. 8B and 8B' Instead, current flow may be minimized by using combinations of parallel capacitors and series resistors as shown in FIGS. 8B and 8B'.

Next, preferred method step 1230 dices, sorts, and picks ESD-protected individual chips using known industry techniques.

Next, preferred method step 1240 mounts chips on a next level package using conventional interconnect means.

Next, preferred method step 1250 mounts packaged chips on a tester for final module (packaged chip) test using conventional test means.

Figure 13:
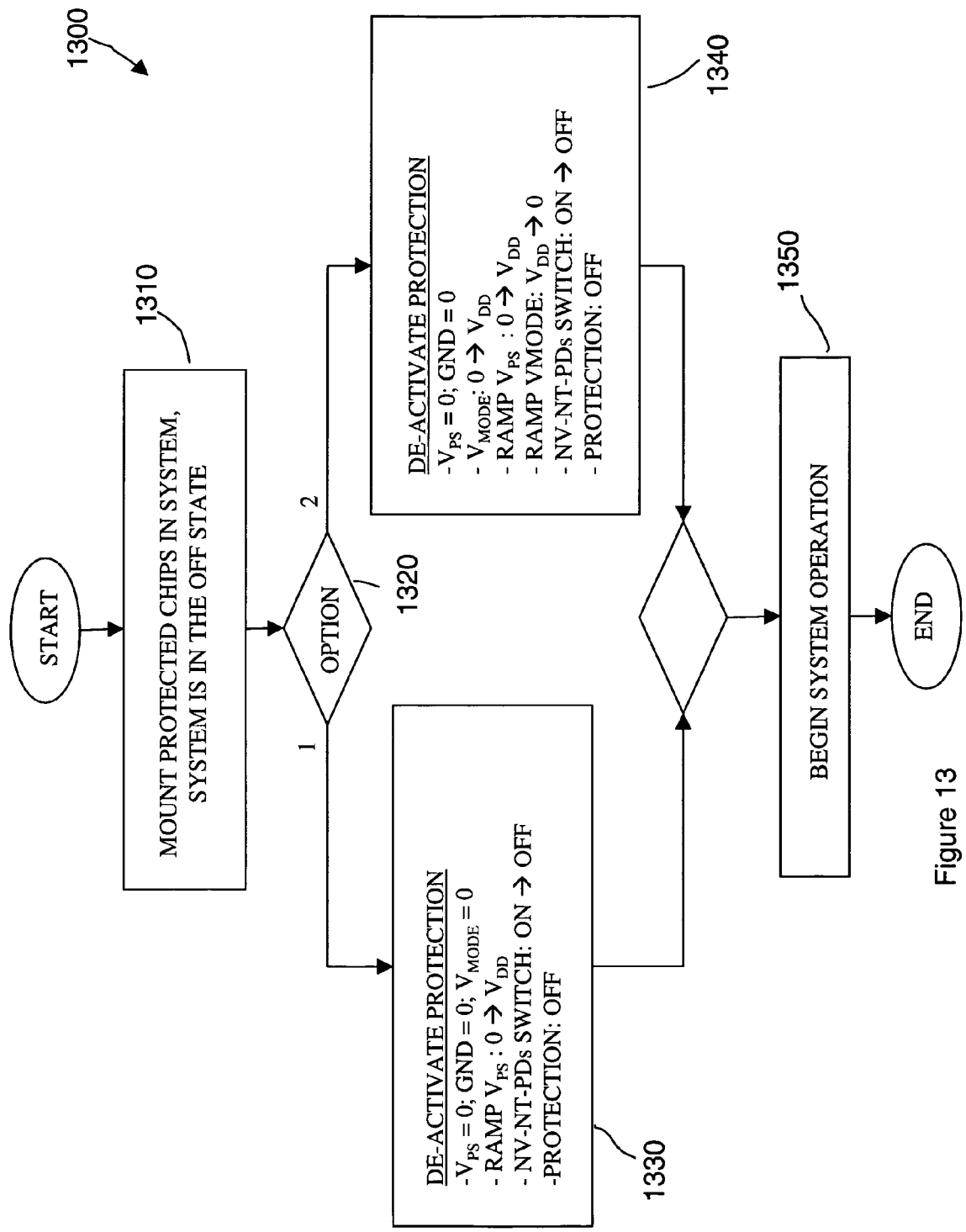
FIG. 13 shows preferred methods placing a chip (or package) with activated nonvolatile nanotube protective devices in a system, and of de-activating nonvolatile nanotube protective devices to enable system operation.

Next, preferred method step 1260 de-activates nonvolatile nanotube protective devices to enable chip operation. Preferred step 1260 uses preferred method step 1300 to de-activate nonvolatile nanotube protective devices as illustrated in FIG. 13 and described further below.

Then, preferred method step 1270 performs final test on the packaged chips.

Next, preferred method step 1280 activates nonvolatile nanotube protective device ESD protection devices on good packages (those that pass final test) using method 1220. Tester may activate the protection devices using one pulse, several pulses, or many pulses. The tester may test the signal-pad to ground path to confirm that the device protective device is in the activated (ON) state, and repeat the activation sequence as necessary until all protective devices are activated.

Next, preferred method step 1290 ships ESD-protected devices to customers using known industry practices.

FIG. 13 illustrates method 1300 of using activated nonvolatile nanotube protective devices ESD-protected bare chips or packaged chips in a system to reduce ESD-related fallout during mounting components in a system. Nonvolatile nanotube protective devices are then de-activated by the system after mounting.

Preferred methods steps 1310 mount ESD-protected chips in a system while the system is in the OFF state.

Next, ESD protective devices are de-activated to enable system operation using preferred method option 1 or option 2 steps 1320.

If option 1 is selected, then next preferred methods steps 1330 place ground, power supply, and mode voltages to zero volts. Power supply voltage $V_{PS}$ is ramped from 0 to $V_{DD}$ which causes nonvolatile nanotube protective devices to switch from activated (ON) to de-activated (OFF) and protection is removed.

Next, preferred method step 1350 begins system operation.

Alternatively, if option 2 is selected, then preferred method step 1340 places power supply and ground voltages at zero volts, mode voltage $V_{MODE}$ is ramped from 0 to $V_{DD}$, thus holding nonvolatile nanotube protective devices in the activated (ON) state. Next, power supply voltage $V_{PS}$ is ramped from 0 to $V_{DD}$, then $V_{MODE}$ voltage is ramped from $V_{DD}$ to 0 causing nonvolatile nanotube protective devices to switch from activated (ON) to de-activated (OFF) state.

Next, preferred method step 1350 begins system operation.

Figure 14:
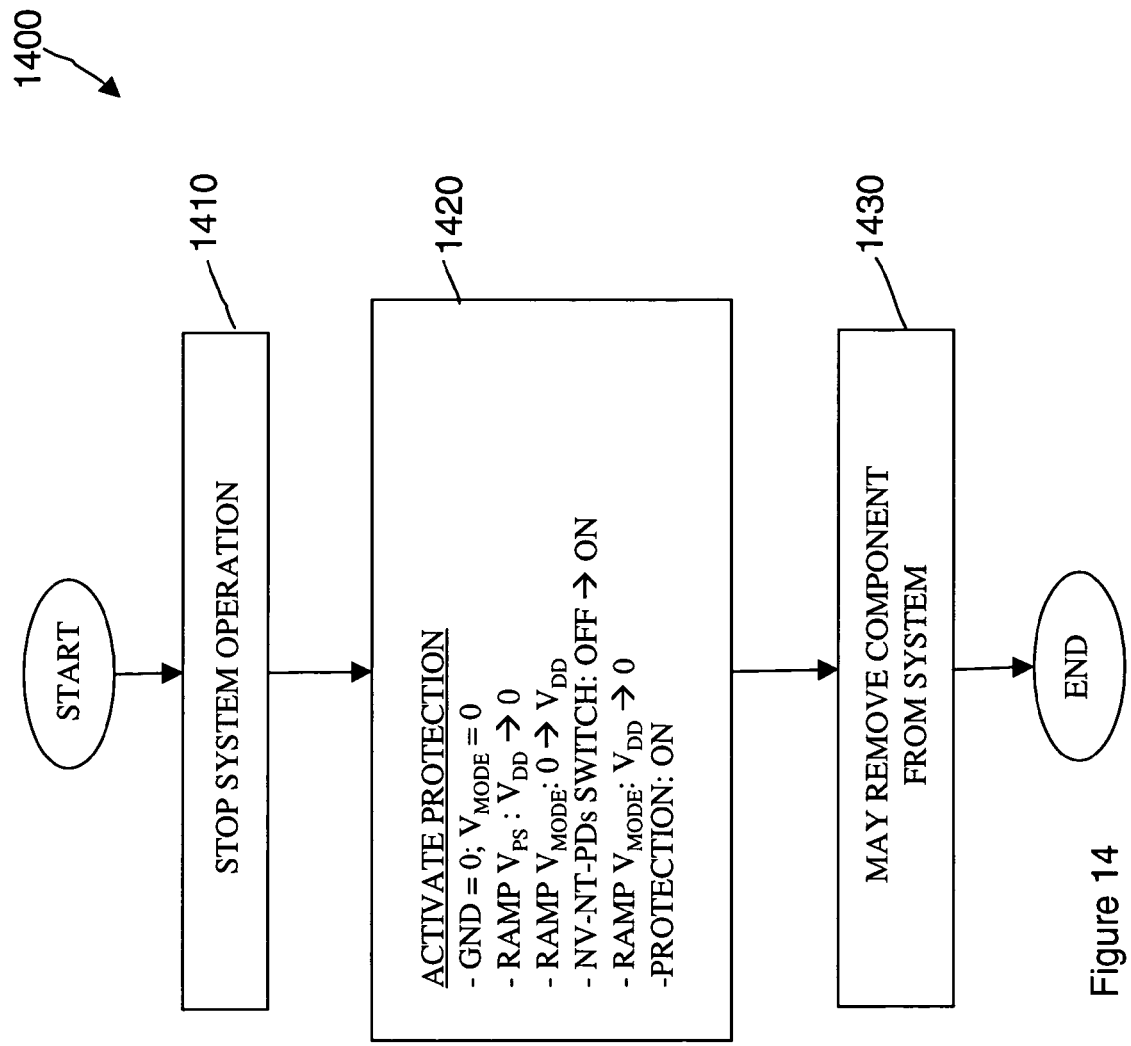
FIG. 14 shows preferred methods of activating (turning-ON) nonvolatile nanotube protective devices in a system environment.

FIG. 14 illustrates method 1400 of using nonvolatile nanotube protective devices in ESD protected packaged chips in a system to reduce ESD-related fallout during removal of components from a system.

Preferred method step 1410 stops system operation (puts the system in the OFF state).

Next, preferred method step 1420 activates ESD protection for selected chips. That is, selected chips will be altered from an operational state during system operation, to an ESD-protected non-operational state for removal from the system and subsequent handling. Alternatively, chips may be switched to a non-operational protected state to protect the chips from radiation fields, system operational problems, etc. and left in place in the system for a period of time, and then switched back to an operating state when system operation resumes. ESD protection is activated when $V_{MODE}=0$, and power supply voltage $V_{PS}$ is ramped from $V_{DD}$ to zero. Next, $V_{MODE}$ is ramped from 0 to $V_{DD}$ and nonvolatile nanotube protective devices switch from de-activated (OFF) to activated (ON) state. $V_{MODE}$ is then ramped from $V_{DD}$ to zero and the chip (or electronic assembly) remains ESD-protected. Note that nonvolatile nanotube protective devices may be integrated in the chip design (not shown) to protect particularly sensitive internal circuits. These nonvolatile nanotube protective devices are activated and de-activated using internal circuitry (not shown) that implement methods 1200, 1300, and 1400.

Next, preferred method step 1430 removes protected chips or electronic assemblies from the system.

Nanotube-only Volatile Nanotube Protective Devices

Figure 15A:
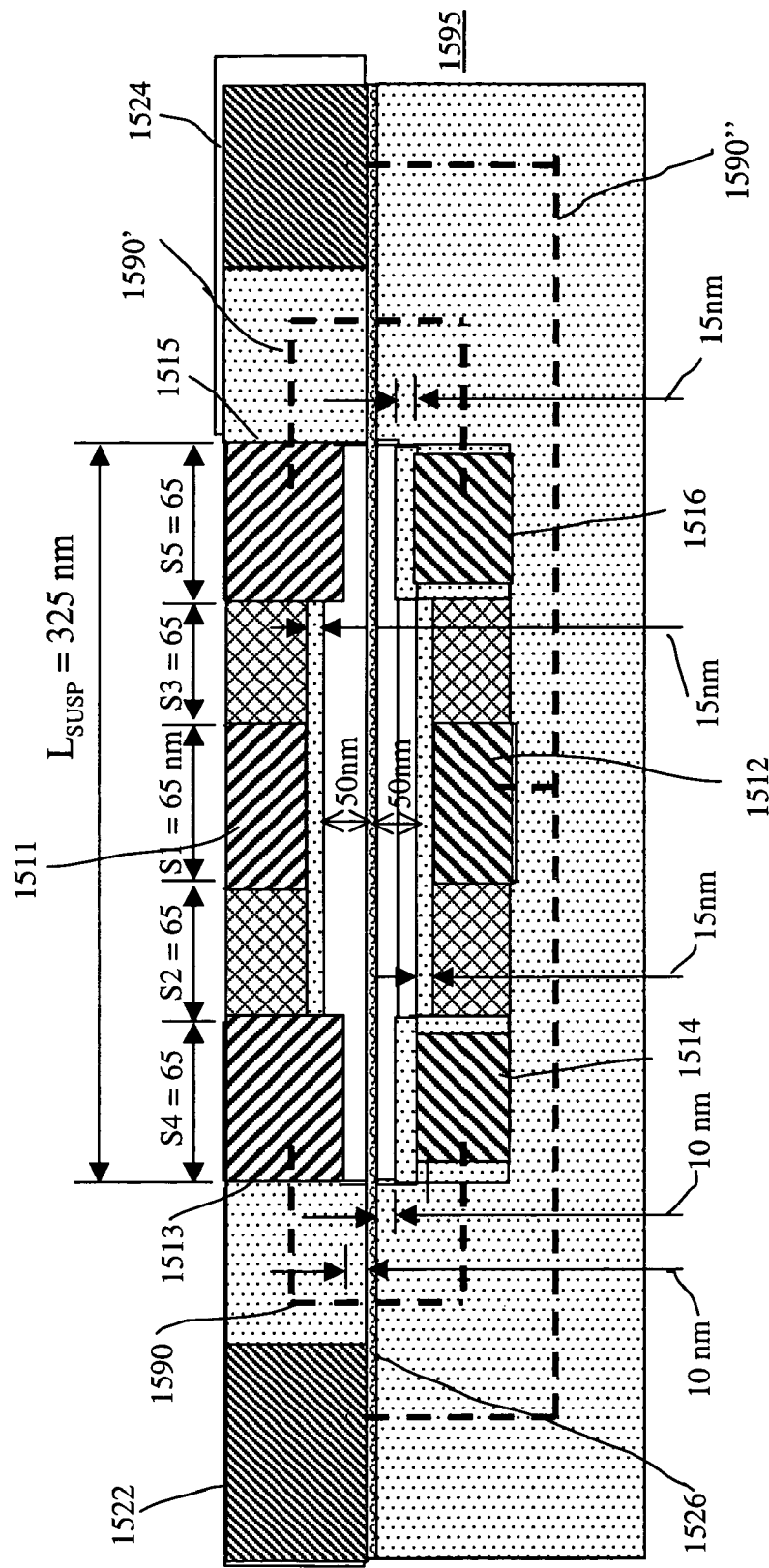
FIG. 15A illustrates a cross section of a volatile nanotube protective device with typical dimensions.

Volatile nanotube protective devices are normally in the OFF position. Unlike nonvolatile nanotube protective devices that are activated (turned-ON) or de-activated (turned-OFF) prior to ESD-induced voltages and currents, volatile nanotube protective devices are normally OFF and are only activated if connected to ESD source such as electrostatic discharge equivalent circuit source 900 in FIG. 9, during handling of an electronic assembly for example. Volatile nanotube protective devices remain activated for the duration of the ESD-induced voltage, prevent the ESD-induced voltage from exceeding a predefined value, such as 5 volts for example, and then return to their normally OFF state. Both nonvolatile and volatile nanotube protective device electrical characteristics are controlled by the geometry of the device as illustrated in FIGS. 4A and 4B. However, whereas the nanotube channel element suspended length ($L_{SUSP}$)-to-gap ratio for nonvolatile operation is approximately 10/1 as illustrated in FIG. 7E, the nanotube channel element suspended length-to-gap ratio for volatile operation is approximately 5/1 for volatile nanotube protective device structure 1595 as illustrated in FIG. 15A. A 5/1 nanotube channel element suspended length-to-gap ratio is achieved by increasing nanotube channel element-to-insulated input (and insulated release) electrode gap spacing from 25 nm for nonvolatile nanotube protective device 795 illustrated in FIG. 7E to 50 nm nanotube channel element-to-insulated input (and insulated release) electrode gap spacing in FIG. 15A. Signal electrodes 1522 and 1524 illustrated in FIG. 15A correspond to signal electrodes 422 and 424 respectively, illustrated in FIGS. 4A, 4B, and 7E; input electrode 1511 corresponds to input electrode 411; release electrode 1512 corresponds to release electrode 412; output electrodes 1513 and 1515 correspond to output electrodes 413 and 415, respectively, and opposing electrodes 1514 and 1516 correspond to opposing electrodes 414 and 416, respectively. Nanotube channel element 1526 corresponds to nanotube channel element 426. Nanotube channel element 1526 is in electrical contact with signal electrodes 1522 and 1524 corresponding to nanotube channel element 426 electrical contact with signal electrodes 422 and 424. Output electrode 1513 is connected to opposing electrode 1514 as shown schematically by connection 1590; output electrode 1515 is connected to opposing electrode 1516 as shown schematically by connection 1590'. Also, for volatile operation, release electrode 1512 is electrically connected to signal electrodes 1522 and 1524 as illustrated schematically by connection 1590", such that the voltage between nanotube channel element 1526 and release electrode 1512 is zero volts. Volatile operation of nanotube-only devices are described in U.S. patent application Ser. No. 11/033,215, entitled "Nonvolatile Carbon Nanotube Logic (NLOGIC) Receiver Circuit," filed Jan. 10, 2005, which is incorporated by reference in its entirety.

Figure 15B:
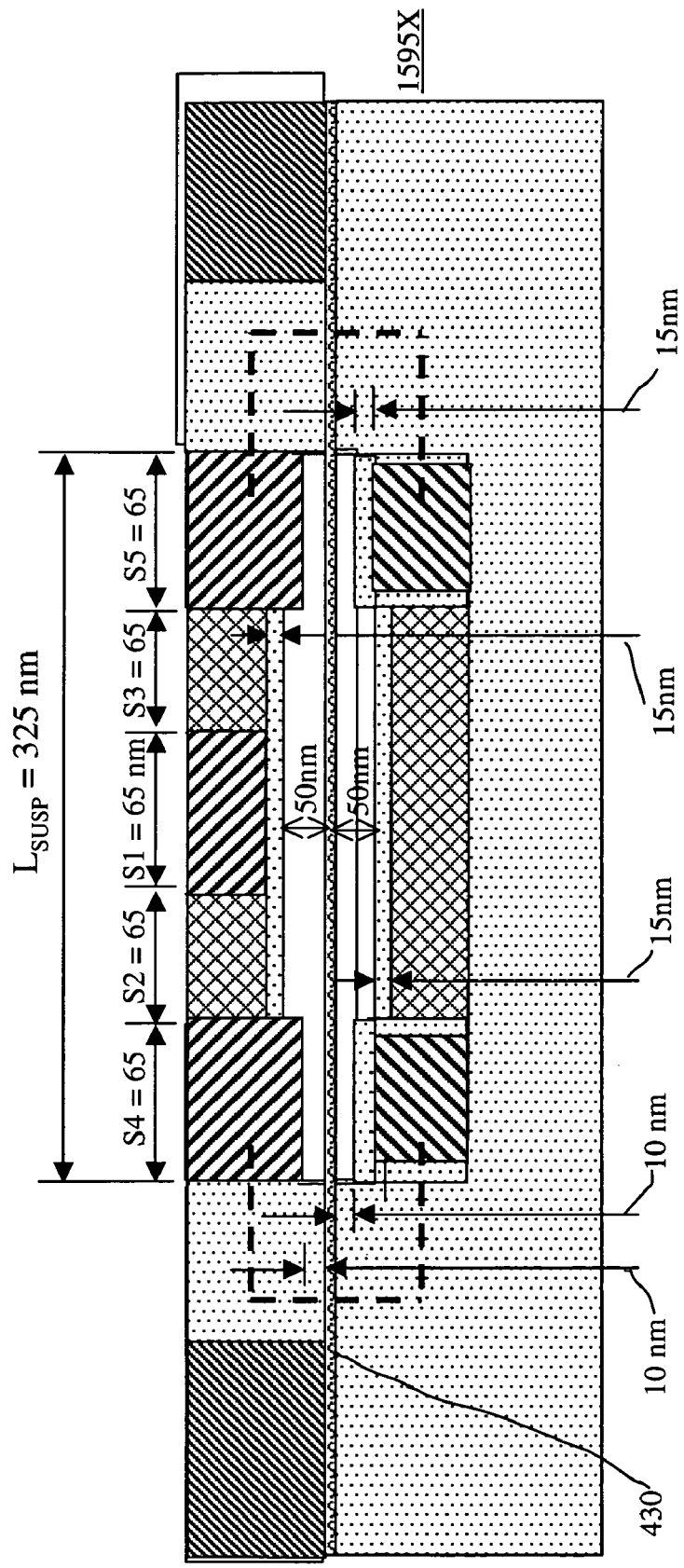
FIG. 15B illustrates a cross section of a volatile nanotube protective device similar to FIG. 15A, but without a release electrode.

Volatile nanotube protective device 1595X is illustrated in FIG. 15B. FIG. 15B is geometrically the same as FIG. 15A, except that release electrode 1512 has been omitted. Release electrode 1512 may be omitted because in volatile operation, the voltage difference between nanotube channel element 1526 and release electrode 1512 in FIG. 15A is zero. It will be understood that volatile nanotube protective device 1595X electrical structure may be used instead of volatile nanotube protective device 1595. Volatile operation of similar nanotube-only devices without release gates is described in U.S. patent application Ser. No. 10/917,794, entitled "Nanotube-Based Switching Elements," filed Aug. 13, 2004.

Integrating Nanotube-only Volatile Nanotube Protective Devices in Conventional Semiconductor, Hybrid Semiconductor/Nanotube, or Nanotube-only Chip Designs Multiple nonvolatile protective device structures 1595, illustrated in FIG. 15A, and corresponding to FIGS. 4A and 4B, may be used to provide electrostatic ESD protection to devices and circuits in electronic assemblies. Volatile protective device structure 1595 may be added at the chip, and/or substrate, and/or card, and/or board level of assembly as described further below. Volatile nanotube protective devices are activated by an ESD-induced voltage during an ESD-discharge event, and are not activated or de-activated before an ESD-discharge event as is the case with nonvolatile nanotube protective devices described further above with respect to FIG. 7, therefore volatile nanotube protective devices are integrated differently into electronic assemblies as described further below. Also, since ESD-induced voltages activate volatile nanotube protective devices, their threshold voltages are designed to be higher than the electronic assembly operating voltage. For example, a volatile nanotube protective device activation threshold may be set at 5 volts, but operating voltages may be 3 volts, for example.

Figure 16A:
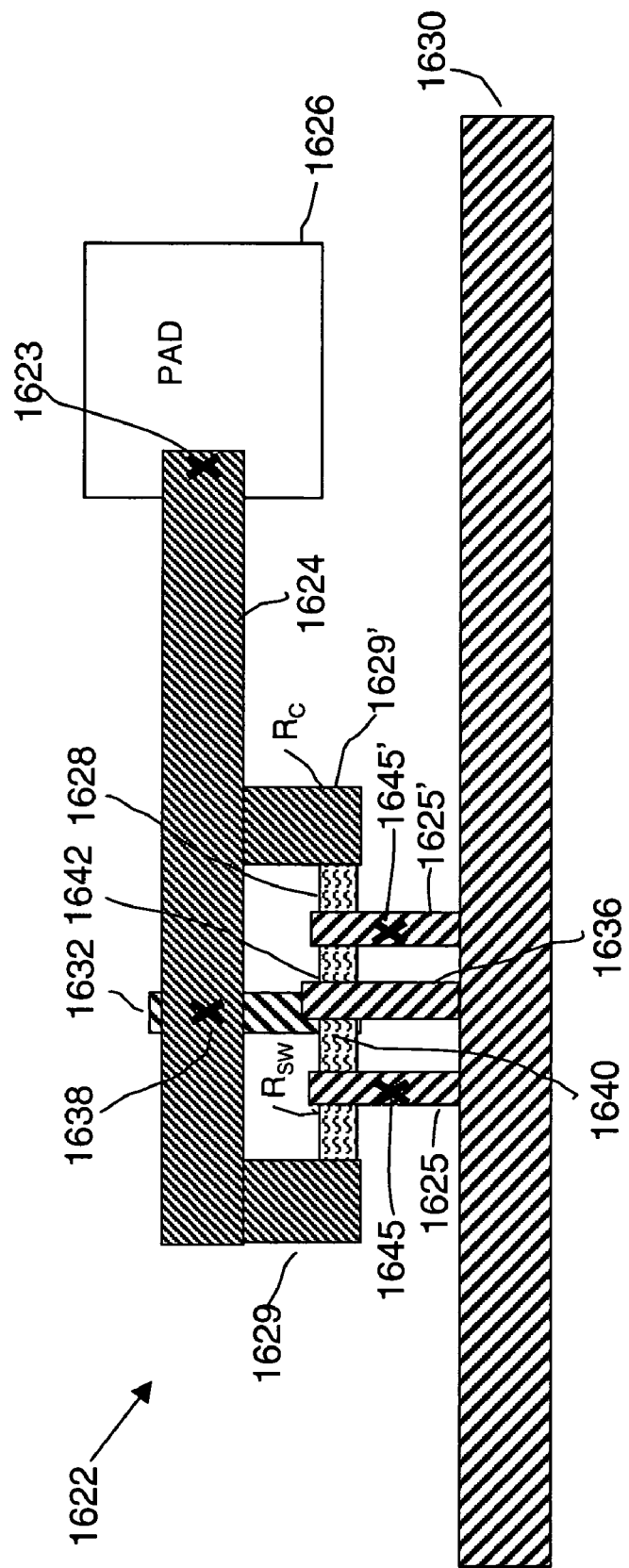
FIG. 16A illustrates a plan view of the volatile nanotube protective device illustrated in FIG. 15A integrated into an electronic assembly, contacting a pad and a common electrode.

FIG. 16A illustrates volatile nanotube protective device 1622 which corresponds to volatile nanotube protective device 1595 illustrated in FIG. 15A, which also corresponds to FIGS. 4A and 4B except for a larger nanotube channel element-to-insulated input (and insulated release) electrode gap spacing, integrated into an electronic assembly at the chip, substrate, card, or board level. Volatile protective device 1622 is connected to pad 1626 and shared conductor 1630. Pad 1626, shared conductor 1630, and all other conductors used for interconnections, and conductors used as electrodes in volatile nanotube protective device 1595 may have a thickness in the range of 5 to 500 nm, with well controlled thickness using known preferred conductor deposition methods, and may be composed of metals such as Ru, Ti, Cr, Al, Au, Pd, Ni, W, Cu, Mo, Ag, In, Ir, Pb, Sn, as well as other suitable metals, and combinations of these. Metal alloys such TiAu, TiCu, TiPd, PbIn, and TiW, and other suitable conductors, including CNTs themselves (singled walled, multiwalled, and/or double walled, for example) or conductive nitrides, oxides, or silicides such as RuN, RuO, TiN, TaN, $CoSi_x$ and $TiSi_x$ may be used. Other kinds of conductor, or semiconductor, materials can also be used. Preferred methods of patterning conductors may use well known photolithographic techniques and well known etching techniques, such as wet etch and reactive ion etching (RIE).

Volatile nanotube protective device 1622 output electrodes 1625 and 1625' are connected in parallel by common conductor 1630, which is also typically connected to ground. Contacts 1645 and 1645' electrically connect outputs electrodes 1625 and 1625', respectively, to their corresponding opposing electrodes (not shown). Signal electrodes 1629 and 1629', in contact with nanotube channel element 1628, are connected in parallel by conductor 1624, which is also connected to pad (terminal) 1626 by contact 1623. Release electrode 1640 is also connected to signal electrodes 1629 and 1629' by conductor 1632, contact 1638, and conductor 1624. Input electrode 1642 is connected to common conductor 1630 by conductor 1636. Volatile nanotube protective device 1622 is normally in the de-activated (OFF) state illustrated in FIG. 15A. If an ESD-induced voltage of positive or negative polarity is applied to pad 1626 with respect to common conductor 1630, then nanotube channel element will switch from a de-activated (OFF) state to an activated (ON) state in which nanotube channel element 1628 comes in contact with output electrodes 1625 and 1625', connecting pad 1626 to common conductor 1630. Contact resistance $R_{SW}$ between output electrode 1625 or 1625' and an individual SWNT in nanotube channel element 1628 is typically 10,000 Ohms. Nanotube channel element 1628 is formed using multiple individual SWNTs in parallel. Volatile nanotube protective device 1622 remains in the activated (ON) state until the ESD-induced voltage is below 5 volts. Volatile operation of similar nanotube-only devices without release gates is described in U.S. patent application Ser. No. 10/917,794, entitled "Nanotube-Based Switching Elements," filed Aug. 13, 2004.

Figure 16B:
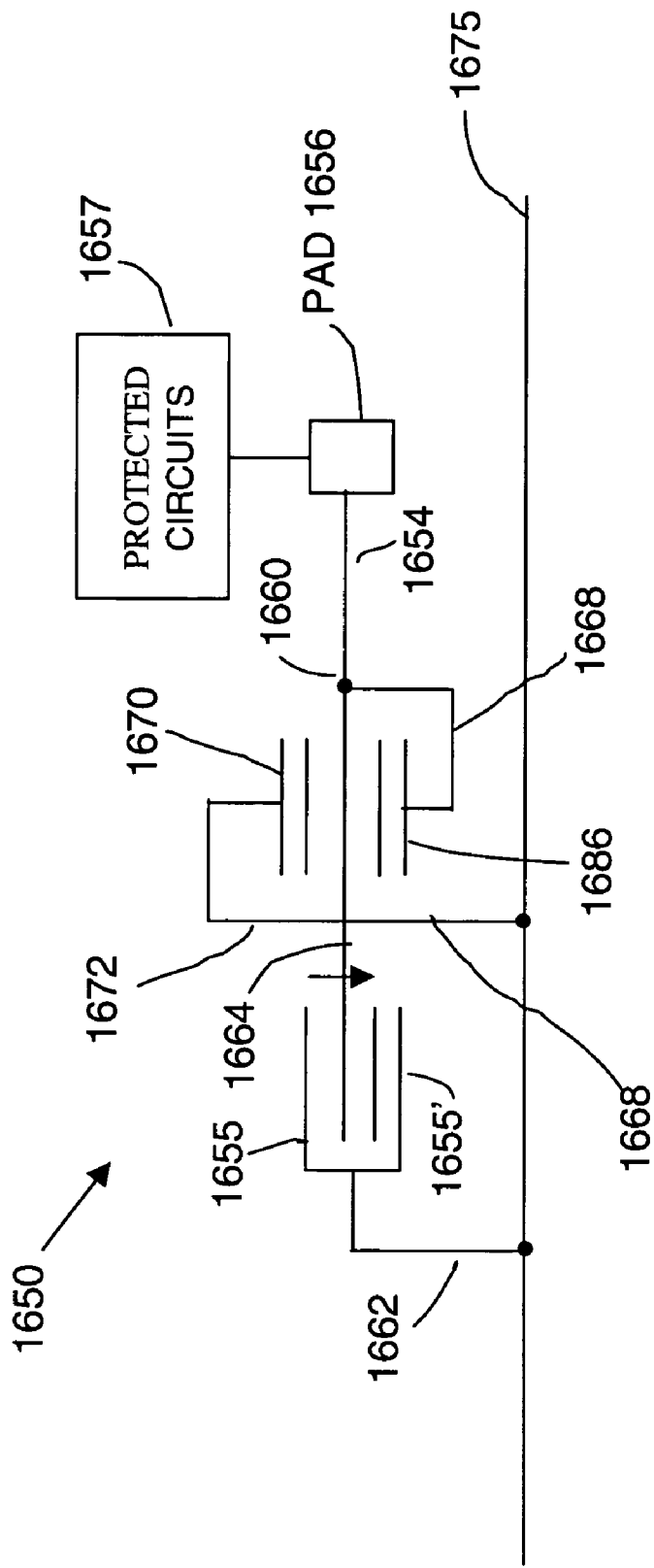
FIG. 16B shows a schematic representation of FIG. 16A.

FIG. 16B is a schematic representation of volatile nanotube protective device 1650, including connections to pad and common conductor, corresponding to volatile nanotube protective device 1622 and connections illustrated in FIG. 16A. Volatile nanotube protective device 1622 illustrated in FIG. 16A corresponds to volatile nanotube protective device 1595 illustrated in FIG. 15A and volatile nanotube protective device 1650 in schematic form illustrated in FIG. 16B. Nanotube channel element 1664 corresponds to nanotube channel element 1628. An arrow orthogonal to nanotube channel element 1664 is used to indicate volatile operation, and points in the direction of a mechanical restoring force. Output electrode 1655 electrically connected to opposing electrode 1655' illustrated in FIG. 16B corresponds to the parallel combination of output electrodes 1625 and 1625' and associated opposing electrodes (not shown) illustrated in FIG. 16A; signal electrode 1660 corresponds to the parallel combination of two parallel signal electrodes 1629 and 1629'; insulated input electrode 1670 corresponds to insulated input electrode 1642; insulated release electrode 1686 corresponds to insulated release electrode 1640. Output electrode 1655 is connected to common conductor 1675 by connection 1662, which corresponds to extensions of output electrodes 1625 and 1625'; protected circuits 1657 are connected to pad 1656 and signal electrode 1660 is connected to pad 1656 by connector 1654, corresponding to signal electrodes 1629 and 1629', conductor 1624, and contact 1623 of volatile nanotube protective device 1622 illustrated in FIG. 7A. Conductor element 1668 connects electrode 1686 and common node

1660. Element 1670 is an input electrode. Element 1660 is a common node which is connected to 1668 and 1654, where release electrode 1686 is connected to nanotube 1664 in order to ensure no electric field between 1686 and 1664 to ensure volatile operation.

Common connector 1675 in FIG. 16B corresponds to common conductor 1630 in FIG. 16A. The term conductor refers to conductive structures shown in cross section and plan view illustrations, while the term connector refers to wired interconnections shown in schematic drawings that correspond to conductors.

Figure 16C:
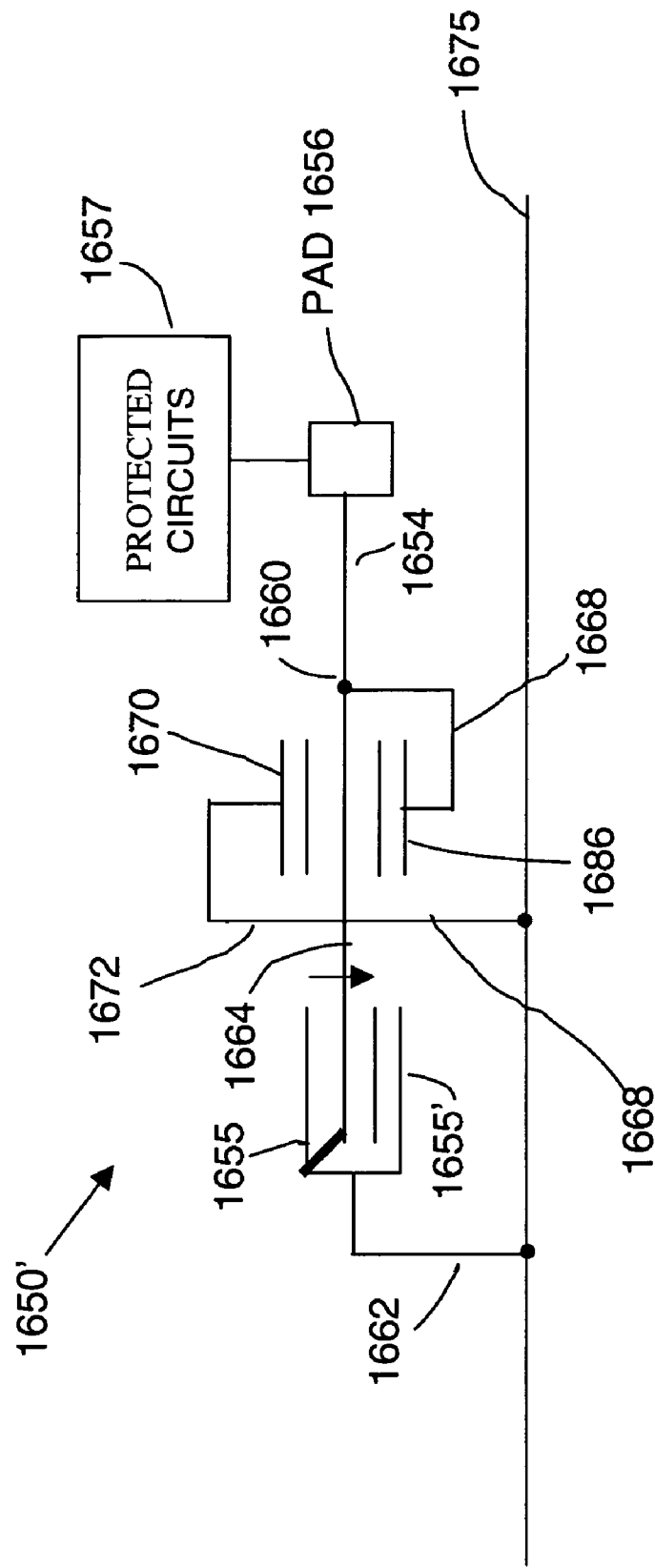
FIG. 16C shows a schematic representation of FIG. 16B in the activated (ON) state.

FIG. 16C illustrates an activated (ON) volatile nanotube protective device 1650' in schematic form, with ESD protection activated (ON) by ESD-induced voltage between pad 1656 and common connector 1675, such that nanotube channel element 1664 is in contact with output electrode 1655 and common electrode 1675 by conductor 1662. Electrostatic charge applied to pad 1656 is discharged through conductor 1654 to signal electrode 1660, to nanotube channel element 1664, to output electrode 1655, and conductor 1662 to common connector 1675. Activated (ON) volatile nanotube protective device 1650' returns to de-activated (OFF) volatile nanotube protective device 1650 after pad 1656 has been discharged.

Figure 17:
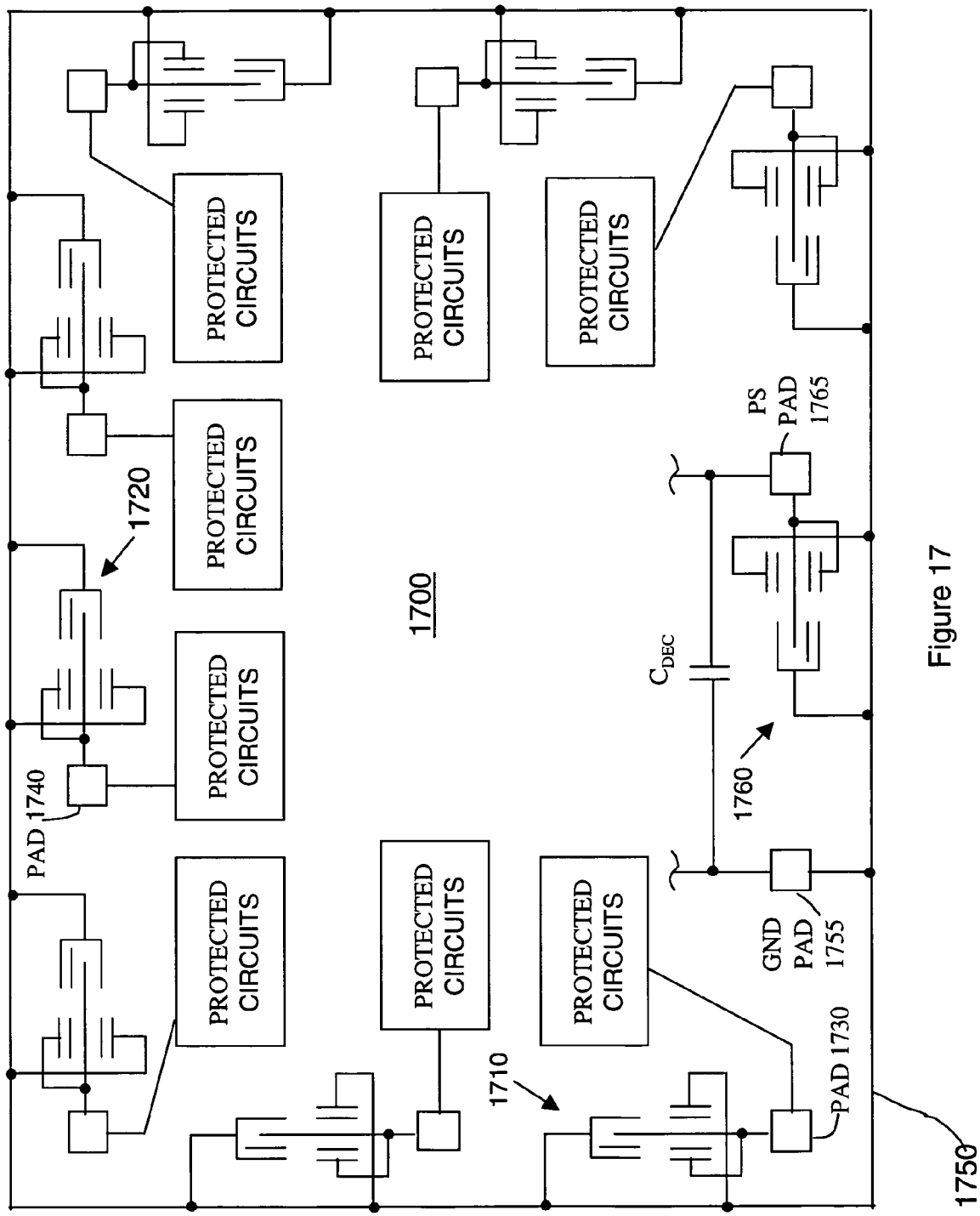
FIG. 17 shows a schematic of volatile nanotube protective devices integrated into a chip or package.

FIG. 17 illustrates chip 1700 with peripheral pads, although area array pads may also be used. Chip 1700 may be a semiconductor chip, or a hybrid chip with semiconductor and nanotube devices, or a nanotube-only chip. The term pad means signal pad unless otherwise indicated, for example representative pads 1730 and 1740, may be input pads, output pads, or both input/output pads. Each individual pad has a volatile nanotube protective device. For example, pad 1730 is ESD-protected by representative volatile nanotube protective device 1710, pad 1740 is ESD-protected by representative volatile nanotube protective device 1720. Each pad is connected to a signal electrode of a volatile nanotube protective device, and the output electrodes of volatile nanotube protective devices are connected to common connector 1750 as illustrated in FIG. 17. Volatile nanotube protective devices 1710 and 1720 correspond to volatile nanotube protective device 1650 illustrated in FIG. 16B, and 1622 illustrated in FIG. 16A. The operation of volatile protective devices 1710 and 1720 correspond to the operation described further above with respect to FIG. 16, and also further described in U.S. patent application Ser. No. 11/033,215, entitled "Nonvolatile Carbon Nanotube Logic (NLOGIC) Receiver Circuit."

Power supply pad 1765 uses volatile nanotube protective device 1760, the same type of ESD-protection as representative volatile nanotube protective devices 1710 and 1720 used for other pads 1730 and 1740 used as signal pads.

Volatile Nanotube Protective Device Characteristics Required to Handle Discharge Currents Based on a NASA ESD Model The ESD equivalent circuit NASA human body model (HBM) 900 is described in FIG. 900. A discharge current 930 flows from circuit 900 to terminals such as pads, pins, and bumps on electronic assemblies.

FIG. 17 illustrates a schematic representation of a chip 1700 in which volatile nanotube protective devices, such as volatile nanotube protective devices 1710 and 1720 are in a normally de-activated (OFF) state, corresponding to volatile nanotube protective device 1650 illustrated in FIG. 16B. In this example, the voltage induced by ESD on pad 1656 and applied to protected circuits 1657 is assumed to be limited to a maximum allowed voltage of 5 volts by the volatile nanotube protective device which transitions from the OFF state illustrated in FIG. 16B to the ON state illustrated in FIG. 16C. The ESD current path is from pad 1656, through conductor (wire) 1654, to signal electrode 1660, through nanotube channel element 1664, to output electrode 1655, through conductor (wire) 1662, to common conductor 1675. The path resistance of individual SWNTs is primarily conductor-to-SWNT contact resistance $R_{SW}/2$ in series with conductor-to-SWNT contact resistance $R_C/2$, because the resistance of other contacts are much smaller, milliohms for example, and the resistance of individual SWNTs are also small compared with the contact resistance $R_{SW}$ and $R_C$ between conductors and SWNTs. Activated (ON) nonvolatile nanotube protective device resistance is a function of the number N of individual SWNTs in parallel and may be expressed as $(R_{SW}/2+R_C/2)/N$.

ESD pulses may be applied to chips in a variety of ways. For example, pad-to-pad, pad-to-ground, and other ways described further below. An ESD-induced voltage occurs when an ESD pulse is applied between two pads, pads 1730 and 1740 illustrated schematically in FIG. 17, for example, because current flows through two activated volatile nanotube protective devices, such as protective devices 1710 and 1720 in series. Thus, the total resistance between pads 1730 and 1740 is $2\times(R_{SW}/2+R/2)/N$ or $(R_{SW}+R_C)/N$ as illustrated schematically by equivalent circuit 1800 in FIG. 18A, while the total resistance between either pad 1730 or 1740 to common connector 1750, for example, is $(R_{SW}/2+R_C/2)/N$. Since common connector 1750 is connected to a large capacitor $C_{DEC}$ that can divert ESD current flow, the maximum induced pad voltage may be less than the estimated maximum voltage. Equivalent circuit 1800 shown in FIG. 18A corresponds to ESD equivalent circuit source 900 applied between two pads (pad-to-pad) as described further above. ESD electrostatic discharge equivalent circuit source 900 outputs 910 and 920 are connected to pad 1730 and pad 1740, respectively, as represented schematically in FIGS. 17 and 18A.

Figure 18A:
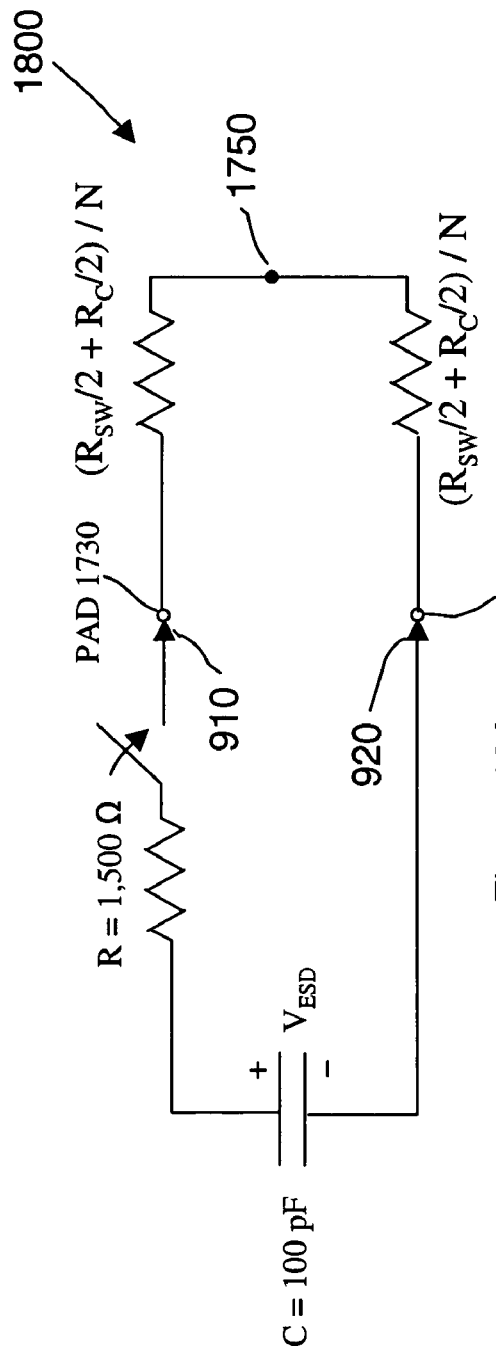
FIG. 18A shows an equivalent circuit schematic of an ESD source connected between two pads (terminals), typically input, output, or input/output signal pads (terminals) of an activated volatile nanotube protective device.

Equivalent circuit 1800 shown in FIG. 18A corresponds to ESD equivalent circuit source 900 output terminals 910 and 920 shown in FIG. 9 connected to pads 1730 and 1740, resulting in discharge current 930 shown in FIG. 9, as a volatile nanotube protective device such as 1710 or 1720 is activated (turned-ON) in response to an ESD-induced voltage. Resistance value $(R_{SW}/2+R_C/2)/N$ represents the activated (ON) state of volatile nanotube protective devices 1710 and 1720, after switching from the OFF state to ON state Volatile nanotube protective devices 1710 and 1720 typically switch at sub-nanosecond speed, faster than the 10 ns rise time to peak current of ESD-induced current 930 illustrated in FIG. 9B. The volatile nanotube protective device activated (ON) state equivalent circuit 1800 (FIG. 18A) is the same as the nonvolatile nanotube protective device activated (ON) equivalent circuit 1000 (FIG. 10A), resulting in the same nanotube-only device requirements. Therefore, as discussed further above with respect to FIG. 10A, the volatile nanotube protective device value of $(R_{SW}+R_C)/N$ is adjusted to 5 ohms so that at $I_{MAX}=1$ Ampere, ESD-induced voltage does not exceed 5 volts. If for example, $R_{SW}=R_C=10,000$ Ohms, then N=4,000 individual SWNTs with a channel element width $W_{NT}=87$ um; if $R_{SW}=R_C=20,000$ Ohms, then N=8,000 individual SWNTs with a channel element width $W_{NT}=174$ um. Volatile nanotube protective devices are relatively large devices that are placed adjacent to pads and over circuits such as off-chip-drivers (OCDs).

Figure 18B:
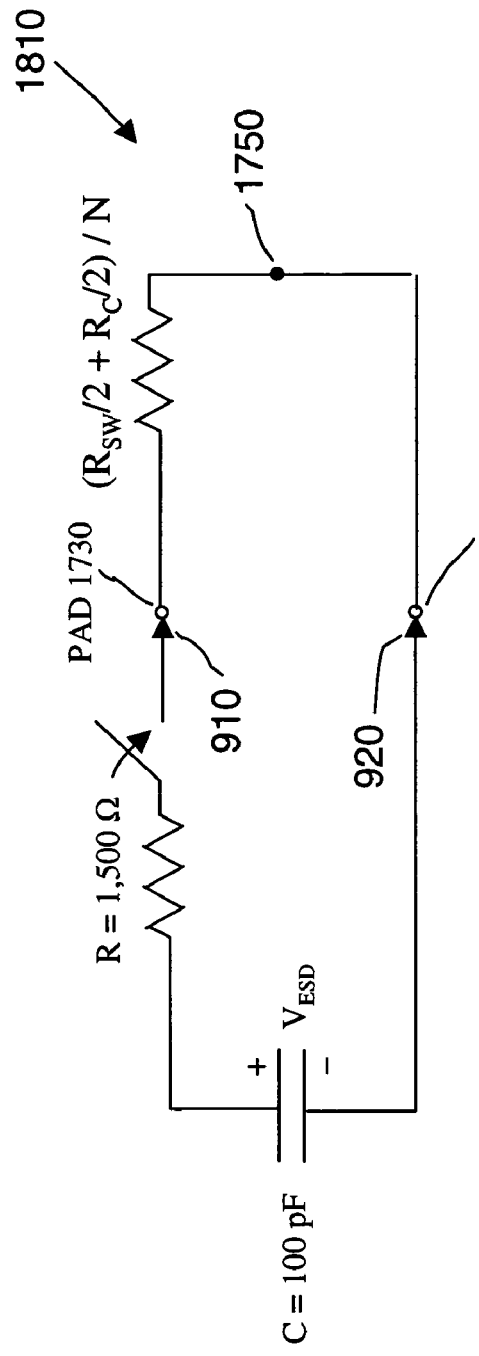
FIG. 18B shows an equivalent circuit schematic of an ESD source connected between a pads (signal pad, for example) and a ground pad of an activated volatile nanotube protective device.

Equivalent circuit 1810 shown in FIG. 18B corresponds to ESD equivalent circuit source 900 output terminals 910 and 920 connected to pad 1730 and ground pad 1755 resulting in discharge current 930. Discharge current 930 flows through activated (ON) volatile nanotube protective device 1710 represented by resistance $(R_{SW}/2+R_C/2)/N$ (2.5 Ohms in this example) located between pad 1730 and common conductor 1750, which is connected to ground pad 1755 as also shown in FIG. 17. The maximum ESD-induced voltage on pad 1730 with respect to ground pad 1755 is 2.5 volts, half the pad-to-pad maximum voltage of equivalent circuit 1800. Equivalent circuit 1810 of FIG. 18B is the same as equivalent circuit 1010 of FIG. 10B, where both volatile and nonvolatile nanotube protective devices, respectively, are in the activated (ON) state.

Equivalent circuit 1820 shown in FIG. 18C corresponds to ESD equivalent circuit source 900 output terminals 910 and 920 connected to power supply pad 1765 and ground pad 1755 resulting in discharge current 930. Discharge current 930 flows through an activated (ON) volatile nanotube protective device 1760 represented by resistance $(R_{SW}/2+R_C/2)/N$ (2.5 Ohms in this example), located between power supply pad 1765 and common conductor 1750, which is connected to ground pad 1755 as also shown in FIG. 17. The maximum ESD-induced voltage on power supply pad 1765 with respect to ground pad 1755 for $I_{MAX}=1$ Ampere is 2.5 volts, the same as induced on pad 1730 in equivalent circuit 1810. The maximum ESD-induced voltage on power supply pad 1765 will be less than 2.5 volts because decoupling capacitor $C_{DEC}$ will divert a portion of ESD-induced current 930.

Equivalent circuit 1840 shown in FIG. 18D corresponds to ESD equivalent circuit source 900 output terminals 910 and 920 connected to power supply pad 1765 and pad 1730 resulting in discharge current 930. Discharge current 930 flows through an activated (ON) volatile nanotube protective device 1760 represented by resistance $(R_{SW}/2+R_C/2)/N$ (2.5 Ohms in this example) located between power supply pad 1765 and common conductor 1750, which is connected to ground pad 1755, and to volatile nanotube protective device 1710 in an activated (ON) state represented by resistance $(R_{SW}/2+R_C/2)/N$ (2.5 Ohms in this example), which is connected to pad 1730. The maximum ESD-induced voltage on power supply pad 1765 will be 5 volts, $I_{MAX}=1$ Ampere flowing through 5 ohms. However, decoupling capacitor $C_{DEC}$ between power supply pad 1765 and ground pad 1755 will divert some of the ESD-induced discharge current 930 reducing the maximum voltage below a maximum of 5 volts.

Volatile Nanotube Protective Device Capacitance During Chip Operation

Volatile nanotube protective devices such as 1710, 1720, and 1760 shown in FIG. 17, corresponding to volatile nanotube protective device 1650 shown in FIGS. 16B and 1622 in FIG. 16A, are in a de-activated (OFF) state during chip operation. Volatile nanotube protective device 1622 (FIG. 16A) capacitance in the de-activated (OFF) state is no more than for nonvolatile nanotube protective device 722 (FIG. 7A) in the de-activated (OFF) state, which has been estimated as less than 50 fF as described above. This is because the volatile nanotube protective device structure uses the same dimensions as the nonvolatile nanotube protective device structure, but with a bigger gap region which may reduce capacitance.

Volatile nanotube protective devices add less than 50 fF to the capacitance load of the circuits they protect. By contrast, conventional protective diodes may add 1.5 pF, or 1,500 fF as described in Bertin et al. U.S. Pat. No. 6,141,245. Volatile nanotube protective devices do not use semiconductor diodes (or transistors) and may therefore be placed on any level of electronic assembly such as chip, chip carrier, card, or board. Several volatile nanotube protective devices may be used in parallel on one input of an electronic assembly because they add less that 1/10 the capacitance of conventional protective devices, thereby increasing ESD protection of electronic assemblies.

Integrating Nanotube-only Volatile Nanotube Protective Devices at Various Levels of Electronic Assembly FIGS. 11B-11J illustrate nonvolatile nanotube protective devices integrated at various levels of electronic assembly from chip-level to board-level. Nonvolatile nanotube protective devices similar to nonvolatile nanotube protective device 722 illustrated in FIG. 7A are used. The following nonvolatile nanotube protective devices are used in FIGS. 11B-11J: nonvolatile nanotube protective devices 1112 in FIG. 11B; 1122 in FIG. 11C; 1133 in FIG. 11D, 1142 in FIGS. 11E, F and G; 1168 in FIG. 11H; 1184 in FIG. 11I; and 1195 and 1195' in FIG. 11J.

Nonvolatile nanotube protective devices used in FIGS. 11B-11J are activated prior to an ESD event, and de-activated prior to electronic assembly operation using preferred methods 1200, 1300, and 1400 illustrated in FIGS. 12, 13, and 14, respectively.

Volatile nanotube protective devices similar to volatile nanotube protective device 1622 in FIG. 16A may be used instead to replace nonvolatile nanotube protective devices 1112, 1122, 1133, 1142, 1168, 1184, 1195 and 1195'.

Volatile nanotube protective devices that replace nonvolatile protective devices 1112, 1122, 1133, 1142, 1168, 1184, 1195 and 1195' in FIGS. 11B-11J are activated by ESD-induced voltage and do not require activation and de-activated using preferred methods 1200, 1300, and 1400 illustrated in FIGS. 12, 13, and 14, respectively.

Integrating Nanotube-only Volatile and Nonvolatile Nanotube Protective Devices at Various Levels of Electronic Assembly Volatile and nonvolatile nanotube protective devices may be used together (mixed) to provide broader coverage, combining the best characteristics of both. Volatile and nonvolatile nanotube protective devices may be placed on the same electronic assembly level, or different electronic assembly levels.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the diagrams.

Figure 19:
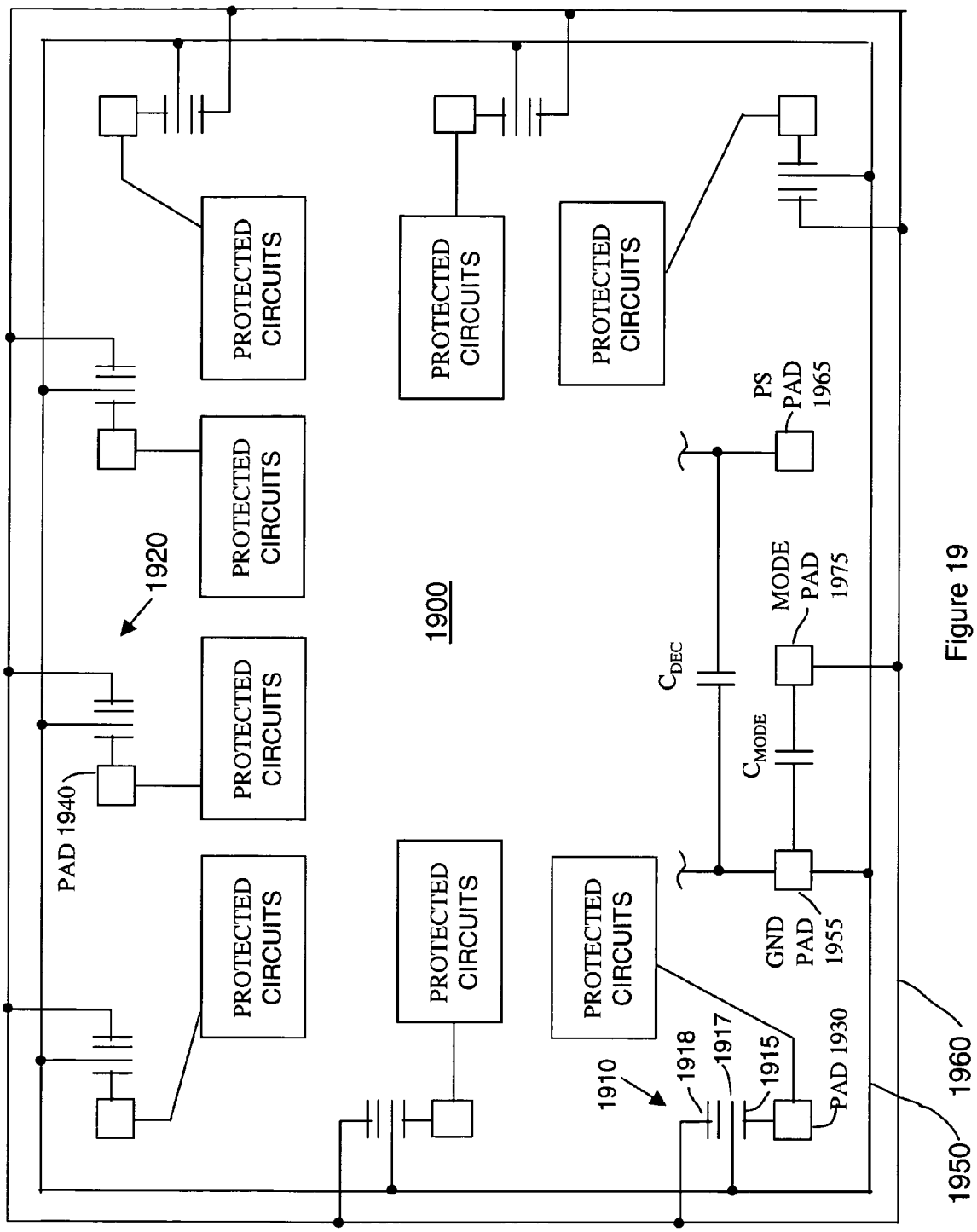
FIG. 19 shows a schematic of simplified nonvolatile nanotube protective devices integrated into a chip or package.

Integrating Nanotube-only Simplified Nonvolatile Nanotube Protective Devices in Conventional Semiconductor, Hybrid Semiconductor/Nanotube, Nanotube-only Chips, and/or Higher Levels of Assembly such as Module, Card, and Board Multiple simplified nonvolatile protective device structures 1910 and 1920 illustrated in FIG. 19 may be used to provide electrostatic discharge (ESD) discharge protection to devices and circuits in electronic assemblies such as chip 1900 in FIG. 19. Simplified nonvolatile protective device structures 1910 and 1920 may be added at the chip, and/or substrate, and/or card, and/or board level of assembly as described further above. Simplified nonvolatile nanotube protective devices are activated and de-activated prior to ESD-induced voltages and current as described further above with respect to FIGS. 12 and 13. Simplified nonvolatile protective device structures 1910 and 1920 are described further below and are similar to nonvolatile device structures illustrated in U.S. patent application Ser. No. 10/864,186 entitled "Non-volatile Electromechanical Field Effect Devices and Circuits Using Same and Methods of Forming Same," filed Jun. 9, 2004 and in U.S. Prov. Pat. Appln. No. 60/624,297 entitled "Enhanced CNT Switching Operation," filed Nov. 2, 2004, both of which are hereby incorporated by reference in their entirety. A control electrode 1915 is electrically connected to pads such as exemplary pad 1930 requiring ESD protection; nanotube element 1917 is connected common ground connector 1950 which is connected to ground pad 1955; and release electrode 1918 is connected common mode connector 1960 connected to mode pad 1975. Simplified protective structures 1910 and 1920 are designed such that switching voltage V is sufficiently higher than the operating voltage of the electronic assembly so as not to activate exemplary simplified nonvolatile nanotube protective devices 1910 or 1920. Methods of calculating switching voltage V is explained further below.

FIG. 19 illustrates chip 1900 with peripheral pads, although area array pads may also be used. The term pad means signal pad unless otherwise indicated, for example representative pads 1930 and 1940, may be input pads, output pads, or both input/output pads. Each individual pad has a simplified nonvolatile protective device. For example, pad 1930 is ESD-protected by representative simplified nonvolatile nanotube protective device 1910 and pad 1940 is ESD-protected by representative simplified nonvolatile nanotube protective device 1920. Simplified nonvolatile nanotube protective devices 1910 and 1920 are described further below. Power supply pad 1965 and mode pad 1975 use other structures for ESD protection such as illustrated further above with respect to FIG. 8B', for example.

Power supply pad 1965 connects to numerous on-chip circuits (not shown). Ground pad 1955 connects to numerous on-chip circuits (not shown) and is also connected to common ground connector 1950. Mode control pad 1975 is connected to common mode connector 1960 connecting to insulated release plates of all simplified nonvolatile nanotube protective devices such devices 1910 and 1920.

During chip operation, simplified nonvolatile nanotube protective devices such as simplified nonvolatile nanotube protective devices 1910 and 1920 must be in the de-activated (OFF) state as explained further above. Simplified nonvolatile nanotube protective devices may be de-activated (turned-OFF) by applying a voltage (positive or negative) to common connector 1960 relative to common connector 1950, with control electrodes such control electrode 1915 held at ground.

Integrating Nanotube-only Simplified Volatile Nanotube Protective Devices in Conventional Semiconductor, Hybrid Semiconductor/Nanotube, Nanotube-only Chips, and/or Higher Levels of Assembly such as Module, Card, and Board Multiple simplified volatile protective device structures 2010 and 2020 illustrated in FIG. 20 may be used to provide electrostatic discharge (ESD) discharge protection to devices and circuits in electronic assemblies such as chip 2000 in FIG. 20. Simplified volatile protective device structures 2010 and 2020 may be added at the chip, and/or substrate, and/or card, and/or board level of assembly as described further above. Simplified volatile protective devices are activated by ESD-induced surges, but are not activated prior to chip handling as is done for simplified nonvolatile nanotube protective devices described further above. Simplified volatile nanotube protective devices 2010 and 2020 are similar to nonvolatile device structures illustrated in U.S. patent application Ser. No. 10/864,186 entitled "Non-volatile Electromechanical Field Effect Devices and Circuits Using Same and Methods of Forming Same," filed Jun. 9, 2004 and in U.S. Prov. Pat. Appln. No. 60/624,297 entitled "Enhanced CNT Switching Operation," filed Nov. 2, 2004, but with insulated release electrodes omitted as described further below.

FIG. 20 illustrates chip 2000 with peripheral pads, although area array pads may also be used. The term pad means signal pad unless otherwise indicated, for example representative pads 2030 and 2040, may be input pads, output pads, or both input/output pads. Each individual pad has a simplified volatile nanotube protective device. For example, pad 2030 is ESD-protected by representative simplified volatile nanotube protective device 2010, and pad 2040 is ESD-protected by representative simplified volatile nanotube protective device 2020. Nanotube element 2017 forms part of PD 2010. Each pad is connected to a control electrode 2015 of a simplified volatile nanotube protective device, and the nanotube elements of simplified volatile nanotube protective devices are connected to common ground connector 2050 connected to ground pad 2055 as illustrated in FIG. 20.

Power supply pad 2065 uses simplified volatile nanotube protective device 2060, the same type of ESD-protection as representative simplified volatile nanotube protective devices 2010 and 2020 used for signal pads 2030 and 2040.

Device Design Methods for Nonvolatile and Volatile Nanotube Protective Devices that use Electromechanical and Atomic-Level Forces Four types of nanotube protective devices applied to chip, and/or module, and/or card, and/or board levels of electronic assemblies for ESD protection have been described further above. Structures and methods for electromechanical and atomic-level design optimization for these four nanotube protective devices are described further below with respect to four corresponding nanotube switches. Design optimization is based on applying structures and methods, and extensions of structures and methods, described in U.S. Prov. Pat. Appln. No. 60/624,297 entitled "Enhanced CNT Switching Operation," filed Nov. 2, 2004. These nanotube switches may be applied to the nanotube protective devices described further above, and also to nanotube-based memory and logic devices illustrated in U.S. patent application Ser. No. 10/864,186 entitled "Non-volatile Electromechanical Field Effect Devices and Circuits Using Same and Methods of Forming Same," filed Jun. 9, 2004, U.S. patent application Ser. No. 10/917,794, entitled "Nanotube-Based Switching Elements," filed Aug. 13, 2004, U.S. patent application Ser. No. 10/918,085, entitled "Nanotube-Based Switching Elements with Multiple Controls," filed Aug. 13, 2004 and in U.S. patent application Ser. No. 10/918,181, entitled "Nanotube Device Structure and Methods of Fabrication," filed Aug. 13, 2004.

Simplified nonvolatile nanotube protective devices 1910 and 1920 shown in FIG. 19 correspond to first nonvolatile nanotube switches described further below; simplified volatile nanotube protective devices 2010, 2020, and 2060 shown in FIG. 20 correspond to first volatile nanotube switches described further below; nonvolatile nanotube protective devices 810 and 820 shown in FIG. 8A correspond to second nonvolatile nanotube switches described further below; and volatile nanotube protective devices 1710, 1720, and 1760 shown in FIG. 17 correspond to second volatile nanotube switches described further below.

Nanotube switch electrical characteristics such as nonvolatile or volatile nanotube switch operation and corresponding switching voltages, for example, are designed using methods described further below based on controlling electromechanical forces such as elastic force $F_{ELAS}$ and electrical force $F_{ELEC}$, and atomic-level van der Waals force expressed in terms of a Lennard-Jones force $F_{LJ}$, $F_{ELAS}$, $F_{ELEC}$, and atomic-level $F_{LJ}$ forces are estimated based on nanotube switch structures, materials, dimensions, individual SWNT length control and orientation, and other significant parameters described further below.

Device Design Methods for First Nonvolatile and Volatile Nanotube Switches Using Electromechanical and Atomic-Level Forces FIG. 21 illustrates a simplified cross sectional representation of a prior art first nonvolatile nanotube switch 2100 as illustrated in U.S. patent application Ser. No. 10/864,186 entitled "Non-volatile Electromechanical Field Effect Devices and Circuits Using Same and Methods of Forming Same," filed Jun. 9, 2004 and in U.S. Prov. Pat. Appln. No. 60/624,297 entitled "Enhanced CNT Switching Operation," filed Nov. 2, 2004. In this example, first nonvolatile nanotube switch 2100 has two individual SWNTs, NT1 and NT2, each separated from insulator 2150 on release electrode 2145 by gap 2, and each separated from control electrode 2140 by gap 1, where gap 1 and gap 2 illustrate separation distances corresponding to non-elongated individual SWNTs NT1 and NT2. In this example, individual SWNTs NT1 and NT2 form SWNT fabric 2155. NT1 and NT2 may be elongated to position A, illustrated as NT1-A and NT2-A in contact with insulator 2150 as illustrated in prior art FIGS. 21A and 21F; or elongated to position B, illustrated as NT1-B and NT2-B in contact with control electrode 2140 as illustrated in prior art FIGS. 21C and 21D. Nanotubes NT1 and NT2 are both in contact with signal electrodes 2160 and 2160'. Only one electrical contact 2160 or 2160' is required, however, two contacts in parallel reduce contact resistance between signal electrodes and individual SWNTs. Nanotubes NT1 and NT2 are pinned (fixed) at each end (a pinned-pinned nanotube element suspended structure), and may be referred to as a suspended nanotube beam structures. Dielectric 2170 and 2170' form part of the SWNT pinning (support) structure. Insulator 2150 may be placed on electrodes above or below the SWNT layer, such that control electrodes may instead be above the SWNT layer (not shown), and insulated release electrodes may be below the SWNT layer (not shown). U.S. patent application Ser. No. 10/864,186 entitled "Non-volatile Electromechanical Field Effect Devices and Circuits Using Same and Methods of Forming Same," filed Jun. 9, 2004 and in U.S. Prov. Pat. Appln. No. 60/624,297 entitled "Enhanced CNT Switching Operation," filed Nov. 2, 2004 illustrate nonvolatile nanotube switches corresponding to first nonvolatile nanotube switch 2100 in ON and OFF states, or in transition between states In this example, FIGS. 21A-21C illustrate first nonvolatile nanotube switch 2100 switching from an OFF state 2100-1, a "0" logic state, for example, to an ON state 2100-3, a "1" logic state, for example. FIGS. 21D-21F illustrate first nonvolatile nanotube switch 2100 switching from ON state 2100-3, a "1" logic state, for example, to an OFF state 2100-1, a "0" logic state, for example.

Prior art FIG. 21A illustrates first nonvolatile nanotube switch 2100 in OFF position 2100-1, with no conducting path between signal electrodes 2160, 2160', and control electrode 2140. Elongated individual SWNTs NT1-A and NT2-A are in contact with insulator 2150.

Alternatively, individual SWNTs NT1 and NT2 may be in a non-elongated OFF ("0" logic) state (not shown) in the gap region formed by gap 1 and gap2 between insulated release and control electrodes. Examples of non-elongated OFF state devices are illustrated in U.S. Prov. Pat. Appln. No. 60/624, 297 entitled "Enhanced CNT Switching Operation," filed Nov. 2, 2004 and in U.S. patent application Ser. No. 10/864, 186 entitled "Non-volatile Electromechanical Field Effect Devices and Circuits Using Same and Methods of Forming Same," filed Jun. 9, 2004.

Prior art FIG. 21B illustrates first nonvolatile nanotube switch 2100 in transient partially switched position 2100-2, switching from an OFF state to an ON state, with voltage V applied to control electrode 2140 with respect to signal electrodes 2160, 2160', and release electrode 2145, both at zero (ground) voltage as shown in U.S. Prov. Pat. Appln. No. 60/624,297 entitled "Enhanced CNT Switching Operation," filed Nov. 2, 2004. Applied voltage V creates an electrostatic force $F_{ELEC}$ (not shown) described further below that attracts both NT1-A and NT2-A illustrated in FIG. 21A toward control electrode 2140. Partially switched position 2100-2 illustrates transient switching in which NT1 has transitioned from position NT1-A to position NT1-B in contact with control electrode 2140, while NT2 has not yet transitioned, and remains in position NT2-A. In this example, NT1 transitions before NT2 because NT1 has a lower threshold voltage than NT2 which may occur as a consequence of geometrical differences. Since gap dimensions are essentially the same, differences in threshold voltage may be due to individual SWNT length variations, with NT1 having a greater length than NT2.

Prior art FIG. 21C illustrates first nonvolatile nanotube switch 2100 in ON state 2100-3 with NT1 in the NT1-B position and NT2 in the NT2-B position. Individual SWNTs NT1 in position NT1-B and NT2 in position NT2-B are both in contact with control electrode 2140, forming two parallel electrical paths between signal electrodes 2160, 2160', and control electrode 2140. Switch 2100 in ON state 2100-3 stores a "1" state, for example.

Prior art FIG. 21D illustrates first nonvolatile nanotube switch 2100 in ON state 2100-3, corresponding to FIG. 21C, with NT1 in the NT1-B position and NT2 in the NT2-B position. Individual SWNTs NT1 in position NT1-B and NT2 in position NT2-B are both in contact with control electrode 2140, forming two parallel electrical paths between signal electrodes 2160, 2160', and control electrode 2140. Switch 2100 in ON state 2100-3 stores a "1" state, for example.

Prior art FIG. 21E illustrates first nonvolatile nanotube switch 2100 in transient partially switched position 2100-2', switching from an ON state to an OFF state, with voltage V applied to release electrode 2145 with respect to signal electrodes 2160, 2160' and control electrode 2140, both at zero (ground) voltage as shown in U.S. Prov. Pat. Appln. No. 60/624,297 entitled "Enhanced CNT Switching Operation," filed Nov. 2, 2004. Applied voltage V creates an electrostatic force $F_{ELEC}$ (not shown) described further below that attracts both NT1-B and NT2-B illustrated in FIG. 21D toward release electrode 2145. Partially switched position 2100-2' illustrates transient switching in which NT1 has transitioned from position NT1-B to position NT1-A in contact with insulator 2150 on release electrode 2145, while NT2 has not yet transitioned, and remains in position NT2-B. In this example, NT1 transitions before NT2 because NT1 has a lower threshold voltage than NT2 which may occur as a consequence of geometrical differences. Since gap dimensions are essentially the same, differences in threshold voltage may be due to individual SWNT length variations, with NT1 having a greater length than NT2.

Prior art FIG. 21F, corresponding to FIG. 21A, illustrates switch 2100 in OFF position 2100-1, with no conducting path between signal electrodes 2160, 2160' and control electrode 2140. Elongated individual SWNTs NT1-A and NT2-A are in contact with insulator 2150.

Alternatively, individual SWNTs NT1 and NT2 may be in a non-elongated OFF state (not shown) in the gap region formed by gap 1 and gap2 between insulated release electrode and control electrodes. Switch 2100 in OFF state 2100-1 stores a "0" logic state, for example. Examples of non-elongated OFF state devices are illustrated in U.S. Prov. Pat. Appln. No. 60/624,297 entitled "Enhanced CNT Switching Operation," filed Nov. 2, 2004 and in U.S. patent application Ser. No. 10/864,186 entitled "Non-volatile Electromechanical Field Effect Devices and Circuits Using Same and Methods of Forming Same," filed Jun. 9, 2004.

FIG. 22A illustrates prior art cross section 2200 as illustrated in U.S. Prov. Pat. Appln. No. 60/624,297 entitled "Enhanced CNT Switching Operation," filed Nov. 2, 2004. Three independent terminal device cross section 2200 corresponds to cross section of switch 2100 in FIG. 21, where nanotube element 2255 corresponds to nanotube element 2155; nanotube signal contacts 2260 and 2260' correspond to nanotube signal contacts 2160 and 2160', respectively; control electrode 2240 corresponds to control electrode 2140; release electrode 2245 with insulator 2250 corresponds to release electrode 2145 with insulator 2150. Nanotube element 2255 may be a nanofabric of randomly oriented individual SWNTs as illustrated in U.S. Pat. No. 6,942,921, entitled Nanotube Films and Articles, or nanotube element 2255 may be a nanofabric of essentially parallel individual SWNTs as illustrated in U.S. Prov. Pat. Appln. No. 60/624,297 entitled "Enhanced CNT Switching Operation," filed Nov. 2, 2004. Suspended nanotube element 2255 in structure 2200 of FIG. 22A is shown after the removal of sacrificial layers to form gap1 and gap2 as described in U.S. patent application Ser. No. 10/864,186 entitled "Non-volatile Electromechanical Field Effect Devices and Circuits using same and Methods of Forming Same," filed Jun. 9, 2004. Alternatively, cross section 2200 may be along an individual nanotube, for example, illustrating an individual SWNT element 2255 in an OFF state. An individual SWNT element 2255 in an ON state would be in contact with control electrode 2240 (not shown). The ends of SWNT 2255 are pinned at each end and suspended over a length $L_{SUSP}$ with gap 1 below and gap 2 above. The SWNT element 2255 suspended length $L_{SUSP}$, gap 1 and gap 2 separation, insulator 2250 insulator thickness and relative dielectric constant, contact electrode 2240 and release electrode 2245 lengths, conductor properties, and other features of cross section 2200 structure determine the operating voltage of three independent terminal device illustrated in cross section 2200, and forming a first nonvolatile nanotube device.

Conductors may include Ru, Ti, Cr, Al, Au, Pd, Ni, W, Cu, Mo, Ag, In, Ir, Pb, Sn, TiPd, PbIn, TiW, TiAu, TiCu, CrCuAu, RuN, RuO, TiN, TaN, $CoSi_x$ and $TiSi_x$, for example. Insulators may include $SiO_2$, $Si_xN_y$, and $Al_2O_3$, for example. Nanotube element may include individual SWNTs of random orientation, or individual SWNTs of essentially parallel orientation, of diameters ranging from 0.6 to 2 nm, and of suspended lengths from 20 nm to 400 nm, for example. Gap regions may be in the range of 2 to 50 nm, for example. The inventors envision that similar forms can be generated using double-walled or multiwalled nanotubes with lengths and gap heights adjusted accordingly to maximize performance.

A key device design parameter is the ratio of suspended length to gap dimensions, $L_{SUSP}$/gap1 for example, as illustrated in FIG. 22A, because the elastic force of elongated individual SWNTs is a function of suspended length and displacement (resulting in individual SWNT elongation), where the maximum displacement (and elongation) is determined by gap size. For the same maximum displacement (elongation), corresponding to the same sized gaps, elastic force increases as nanotube element suspended length $L_{SUSP}$ is reduced as described in the following articles. Reference 1, Rueckes, T et al., *Carbon Nanotube-Based Nonvolatile Random Access Memory for Molecular Computing*, Science, Vol. 289, Jul. 7, 2000, pp. 94-97; reference 2, Dequesnes, M. et al., *Calculation of pull-in voltages for carbon-nanotube-based nanoelectromechanical switches*, Nanotechnology, 13, 2002, pp. 120-131; and reference 3, Dequesnes, M. et. al., *Static and Dynamic Analysis of Carbon Nanotube-Based Switches*, Transactions of the ASME, Vol. 126, July 2004, pp. 230-237. FIG. 22B illustrates prior art cross section 2000' as illustrated in U.S. Prov. Pat. Appln. No. 60/624,297 entitled "Enhanced CNT Switching Operation," filed Nov. 2, 2004. Gap 1 and gap 2 shown in FIG. 22B after the removal of sacrificial layers to form gap1 and gap2 as described in U.S. patent application Ser. No. 10/864,186 entitled "Non-volatile Electromechanical Field Effect Devices and Circuits Using Same and Methods of Forming Same," filed Jun. 9, 2004, the same as those in FIG. 22A, however, suspended length $L_{SUSP}'$ in FIG. 22B has been reduced in length with respect to $L_{SUSP}$ in FIG. 22A by using reduced signal electrode spacing 2260'' and 2260''' and extending insulator region 2270 by adding insulator 2275 and extending insulator region 2270' by adding insulator 2275'. Release electrode 2245' with insulator 2250' has been reduced in length to fit in the smaller opening between signal electrodes 2260'' and 2260'''. Control electrode 2240 has been left unchanged in cross section 2200'; however, control electrode 2240 may be reduced in length as well.

The ratio of nanotube suspended length to gap ratio is an important device (switch) design parameter that determines the magnitude of nanotube element restoring elastic force $F_{ELAS}$. Another important device design parameter is an opposing atomic-level Lennard-Jones restraining force. The difference in these forces, $F_{ELAS}-F_{LJ}$, determines whether device operation will be volatile or nonvolatile. If $F_{ELAS}>F_{LJ}$, then the switch is volatile; if $F_{LJ}>F_{ELAS}$, then the switch is nonvolatile. Volatile devices are in a normally OFF state and transition from the OFF-to-ON state when sufficient voltage is applied, but return to the normally OFF state when voltage is removed. Nonvolatile devices may be in OFF state or in the ON state. Nonvolatile devices remain in the OFF state or the ON state when voltage is removed. Nonvolatile nanotube devices typically have larger nanotube suspended length to gap ratios, 10 or more for example, as illustrated further below. Volatile nanotube devices typically have smaller nanotube suspended length to gap ratios, 5 or less, for example, as illustrated further below.

The suspended length of individual SWNTs illustrated in cross sections 2200 and 2200' may vary even for the same signal electrode separation for nanotube elements having randomly oriented individual SWNTs as described further below. Such variation when using randomly oriented individual SWNTs may be reduced using enhanced layout and design methods as illustrated in U.S. Prov. Pat. Appln. No. 60/624,297 entitled "Enhanced CNT Switching Operation," filed Nov. 2, 2004 and as described further below. However, for nanotube elements having essentially parallel individual SWNTs, suspended length will be essentially the same as illustrated in U.S. Prov. Pat. Appln. No. 60/624,297 entitled "Enhanced CNT Switching Operation," filed Nov. 2, 2004 and as described further below.

For volatile nanotube switches, such as first volatile nanotube switch 2300 illustrated in FIG. 23A and first volatile nanotube switch 2300' illustrated in FIG. 23B, release electrode 2245 with insulator 2250, and release electrode 2245' with insulator 2250' may be omitted. This is because first volatile nanotube switches 2300 and 2300' return to an OFF state when voltage is removed, and therefore do not require a release electrode.

First volatile nanotube switch 2300 illustrated in FIG. 23A has two independent terminals, control electrode 2340 and signal electrodes 2360 and 2360' connected to suspended nanotube element 2355 having a suspended length $L_{SUSP}$, with gap1 separating nanotube element 2355 from control electrode 2340. Insulator 2370 and conductor 2360 are used to pin suspended nanotube element 2355 on one end, and insulator 2370' and conductor 2360' are used to pin suspended nanotube element 2355 on the opposite end.

In operation, a voltage V may be applied to control electrode 2340 with ground (zero) volts applied to signal electrodes 2360 and 2360'. Alternatively, a voltage V may be applied to signal electrodes 2360 and 2360' and ground applied to control electrode 2340. Although two signal electrodes 2360 and 2360' are shown, only one of the signal electrodes 2360 or 2360' are required.

First volatile nanotube switch 2300' illustrated in FIG. 23B is similar to nanotube 2300, except that the suspended length portion of nanotube element 2355 has been reduced in length to $L_{SUSP}'$ with respect to $L_{SUSP}$ in FIG. 22A by using reduced signal electrode spacing 2360" and 2360'" and extending insulator region 2370" by adding insulator 2375 and extending insulator region 2370'" by adding insulator 2375'. Control electrode 2340 has been left unchanged in cross section 2300'; however control electrode 2340 may be reduced in length as well.

First volatile nanotube switch 2300' shown in FIG. 23B operation is as described with respect to first volatile nanotube switch 2300 shown FIG. 23A.

Figure 24:
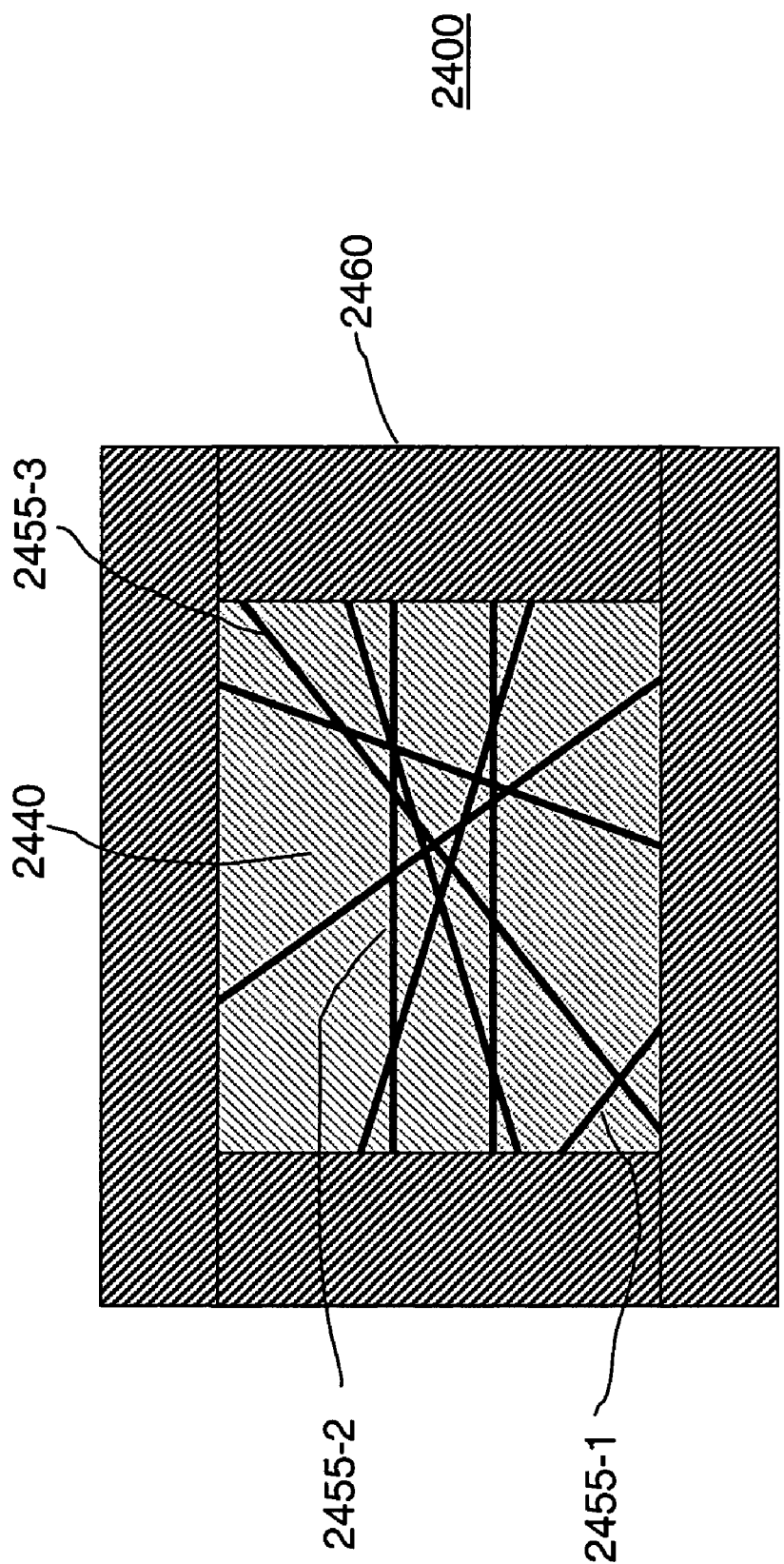
FIG. 24 shows a prior art plan view of a conductive picture frame device structure.

Layout Structures and Methods for Designing First Nonvolatile and Volatile Nanotube Switches FIG. 24 illustrates a prior art plan view 2400 of a conductive picture frame signal electrode structure in contact with individual SWNTs of random orientation that correspond to cross section 2200 in FIG. 22A prior to forming release electrode 2245 with insulator 2250. Conducting signal electrode structures and methods of fabrication are illustrated in U.S. patent application Ser. No. 10/864,186 entitled "Non-volatile Electromechanical Field Effect Devices and Circuits Using Same and Methods of Forming Same," filed Jun. 9, 2004 and in U.S. Prov. Pat. Appln. No. 60/624,297 entitled "Enhanced CNT Switching Operation," filed Nov. 2, 2004. Prior art control electrode 2440 illustrated in plan view 2400 corresponds to control electrode 2240 illustrated in prior art cross section 2200 illustrated in FIG. 22A; conductive picture frame signal electrode 2460 in electrical contact with both pinned ends of individual nanotubes elements 2455-1, 2455-2, 2455-3, and other individual nanotube elements, and corresponds to signal electrodes 2260 and 2260' in prior art cross section 2200 illustrated in FIG. 22A. Plan view 2400 illustrates individual SWNT suspended length variation due to the random orientation of individual SWNTs. Individual SWNT 2455-1 has the shortest suspended length of the illustrated individual SWNTs. Horizontal SWNT 2455-2 is more than 100% longer than nanotube 2455-1, and SWNT 2455-3 is at least 40% longer than nanotube 2455-2. The length variations of individual SWNTs will cause variations in device characteristics such as switching voltages and performance. Note that a sacrificial layer between individual SWNTs and control electrode 2440 is not shown in FIG. 24.

Figure 25A:
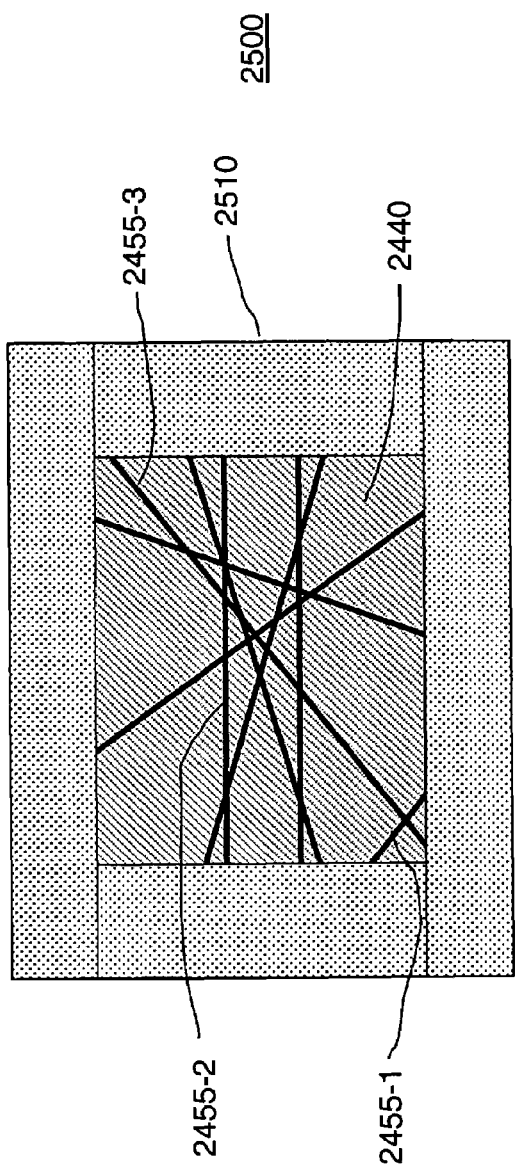
FIGS. 25A-C show a modified prior art picture frame device structure that reduces the suspended length variation of selected randomly oriented individual single-walled nanotubes (SWNTs) in a nanotube element.

Modifying plan view 2400 to limit the number of individual SWNT in contact with conductive picture frame signal electrode 2460 reduces length variation as illustrated in U.S. Prov. Pat. Appln. No. 60/624,297 entitled "Enhanced CNT Switching Operation," filed Nov. 2, 2004. Prior art plan view 2500 in FIG. 25A illustrates insulator picture frame 2510 as part of the nanotube pinning structure. After preferred process steps of insulator deposition and patterning using known industry techniques, all individual SWNTs are electrically isolated. Note that a sacrificial layer between individual SWNTs and control electrode 2440 is not shown in FIG. 25.

Figure 25B:
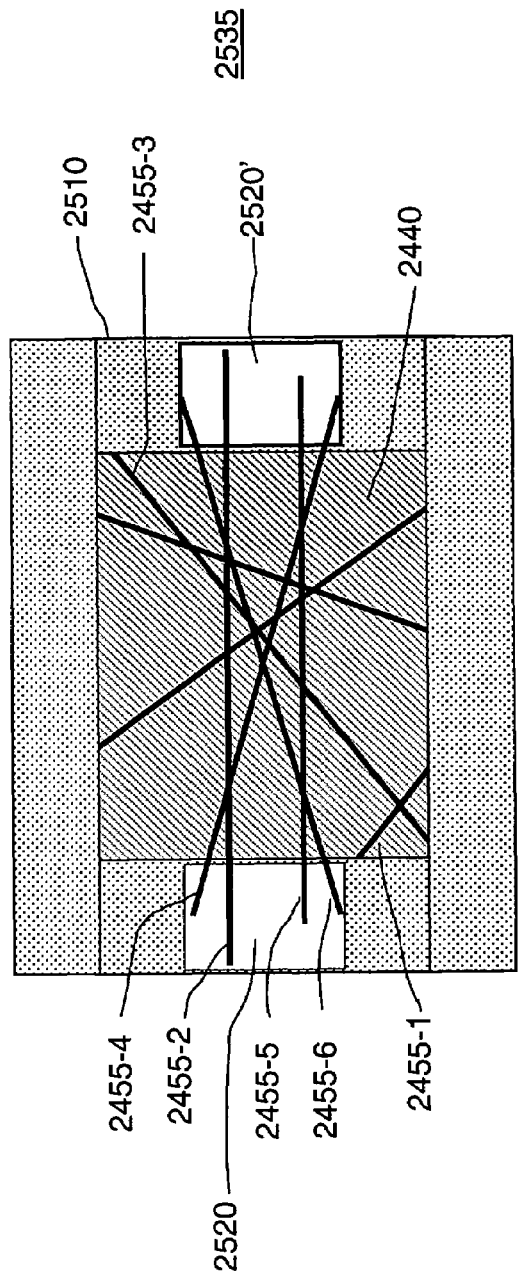

Next, preferred methods pattern and etch (remove) insulator 2510 forming openings 2520 and 2520' using preferred nanotube processing methods as described in incorporated references, exposing the ends of selected individual SWNTs. Plan view 2535 illustrated in FIG. 25B shows selected nanotubes with exposed end regions of selected individual SWNTs 2455-2, 2455-4, 2455-5, and 2455-6 for purposes of electrical contact. Additional individual SWNTs such as 2455-1, 2455-3, and other individual SWNTs have insulated end regions to prevent electrical contact.

Figure 25C:
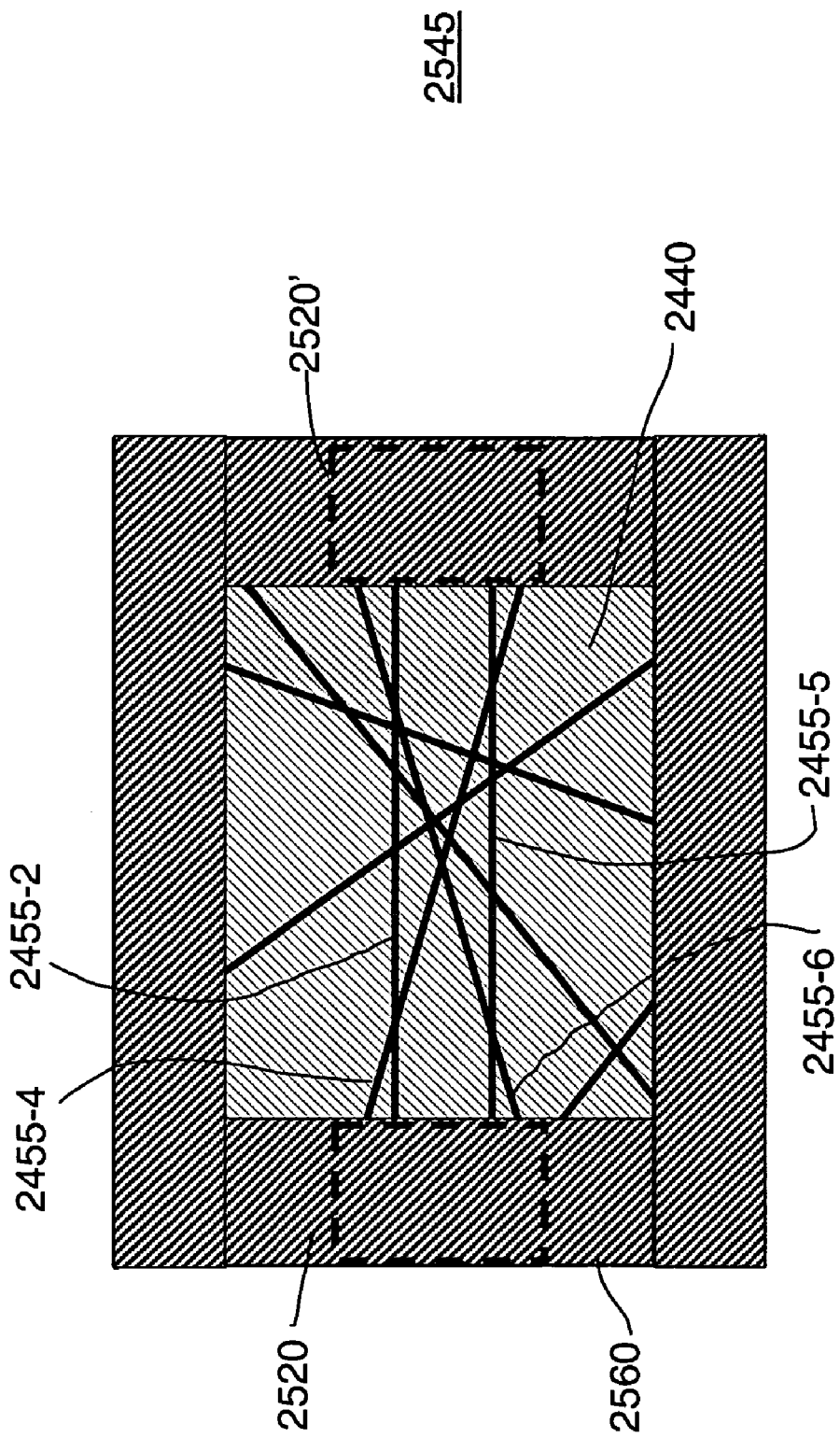

Next, preferred methods deposit and pattern a conductor layer using preferred nanotube processing methods as described in incorporated references. Plan view 2545 illustrated in FIG. 25C shows conductive picture frame signal electrode 2560 electrically contacting and pinning individual SWNTs 2455-2, 2455-4, 2455-5, and 2455-6. Other individual SWNTs such as 2455-1, 2455-3, and other individual SWNTs have insulated end regions that prevent electrical contact with conductive picture frame signal electrode 2560.

Then, preferred methods (not shown) described in U.S. patent application Ser. No. 10/864,186 entitled "Non-volatile Electromechanical Field Effect Devices and Circuits using same and Methods of Forming Same," filed Jun. 9, 2004 complete a switch structure corresponding to cross section 2200 in FIG. 22A with nanotube element 2255 formed of individual SWNTs including 2455-2, 2455-4, 2455-5, and 2455-6. Note that FIG. 25 corresponds to either FIG. 22A or FIG. 22B.

Modifying plan view 2500 in FIG. 25A by replacing randomly oriented individual SWNTs with essentially parallel individual SWNTs 2655-1, 2655-2, 2655-3, 2655-4, and 2655-5 shown in U.S. Prov. Pat. Appln. No. 60/624,297 entitled "Enhanced CNT Switching Operation," filed Nov. 2, 2004, plan view 2600 illustrated in FIG. 26A eliminates suspended length variations caused by random orientation of individual SWNTs. Prior art plan view 2600 includes insulator picture frame 2610 as part of the nanotube pinning structure. After preferred process steps of insulator deposition and patterning using known industry techniques, all individual SWNTs are electrically isolated. Note that a sacrificial layer between individual SWNTs and control electrode 2440 is not shown in FIG. 26. Also, note that FIG. 26 corresponds to either FIG. 22A or FIG. 22B.

Next, preferred methods etch (remove) regions of insulator 2610 forming openings 2620 and 2620' using preferred nanotube processing methods as described in incorporated references, exposing the ends of selected individual SWNTs. Plan view 2635 illustrated in FIG. 26B shows selected nanotubes with exposed end regions of selected individual nanotubes 2655-2, 2655-3, and 2655-4. Additional individual SWNTs such as 2655-1 and 2655-5 have insulated end regions to prevent electrical contact.

Next, preferred methods deposit and pattern a conductor layer using preferred nanotube processing methods as described in incorporated references. Plan view 2645 illustrated in FIG. 26C shows conductive picture frame signal electrode 2660 electrically contacting and pinning individual SWNTs 2655-2, 2655-3, and 2655-4. Other individual SWNTs such as 2655-1, 2655-5 have insulated end regions that prevent electrical contact with conductive picture frame signal electrode 2660. Structure 2645 is used to select a subset of essentially physically and electrically parallel individual SWNTs to determine electrical characteristics such as resistance between picture frame signal electrode 2660 and control electrode 2440. Structure 2645 is not used primarily to reduce suspended individual nanotube variations because essentially parallel individual SWNTs minimize or eliminate suspended length variations.

Then, preferred methods (not shown) described in U.S. patent application Ser. No. 10/864,186 entitled "Non-volatile Electromechanical Field Effect Devices and Circuits Using Same and Methods of Forming Same," complete a switch structure corresponding to cross section 2200 in FIG. 22A with nanotube element 2255 formed of individual SWNTs including 2655-2, 2655-3, and 2655-4.

Plan view 2645 shown in FIG. 26C illustrate essentially parallel individual SWNTs that are essentially perpendicular to picture frame signal electrode 2660. However, individual SWNTs are not required to be essentially perpendicular to picture frame signal electrode 2660 in order to control suspended length variation of essentially parallel SWNTs.

Structure 2645 may be modified to reduce openings 2620 and 2620' to 2620" and 2620''' illustrated by plan view 2650 illustrated in FIG. 26D. Plan view 2650 illustrated in FIG. 26D shows conductive picture frame signal electrode 2660 electrically contacting and pinning an individual SWNT 2655-3. Other individual SWNTs such as 2655-1, 2655-2, 2655-4, and 2655-5 have insulated end regions that prevent electrical contact with conductive picture frame signal electrode 2660.

FIG. 27A illustrates a plan view 2700 of a signal electrode structure in contact with individual SWNTs of essentially parallel orientation, where preferred methods deposit essentially parallel SWNTs 2655-1, 2655-2, 2655-3, 2655-4, and 2655-5 on lower pinning structures 2725 and 2725' that correspond to lower pinning structures 2270 and 2270', respectively, of cross section 2200 in FIG. 22A, prior to forming release electrode 2245 with insulator 2250. Note that a sacrificial layer between individual SWNTs and control electrode 2710 is not shown.

Next, preferred methods pattern and etch (remove) individual SWNTs 2655-1 and 2655-5 using preferred nanotube processing methods described in incorporated references, and known industry methods are used to define a corresponding portion of lower pinning structures 2725 and 2725' and control electrode 2710, resulting in lower pinning structures 2725" and 2725''' and control electrode 2710' of reduced width as illustrated in plan view 2735 of FIG. 27B.

Next, preferred methods deposit, pattern, and etch signal electrodes 2750 and 2750' in contact with essentially parallel SWNTs using preferred nanotube processing methods described in incorporated references.

Then, preferred methods (not shown) described in U.S. patent application Ser. No. 10/864,186 entitled "Non-volatile Electromechanical Field Effect Devices and Circuits Using Same and Methods of Forming Same," filed Jun. 9, 2004, complete a switch structure corresponding to cross section 2200 in FIG. 22A with nanotube element 2255 formed of individual SWNTs 2655-2, 2655-3, and 2655-4. Note that FIG. 27 corresponds to either FIG. 22A or FIG. 22B.

Figure 28A:
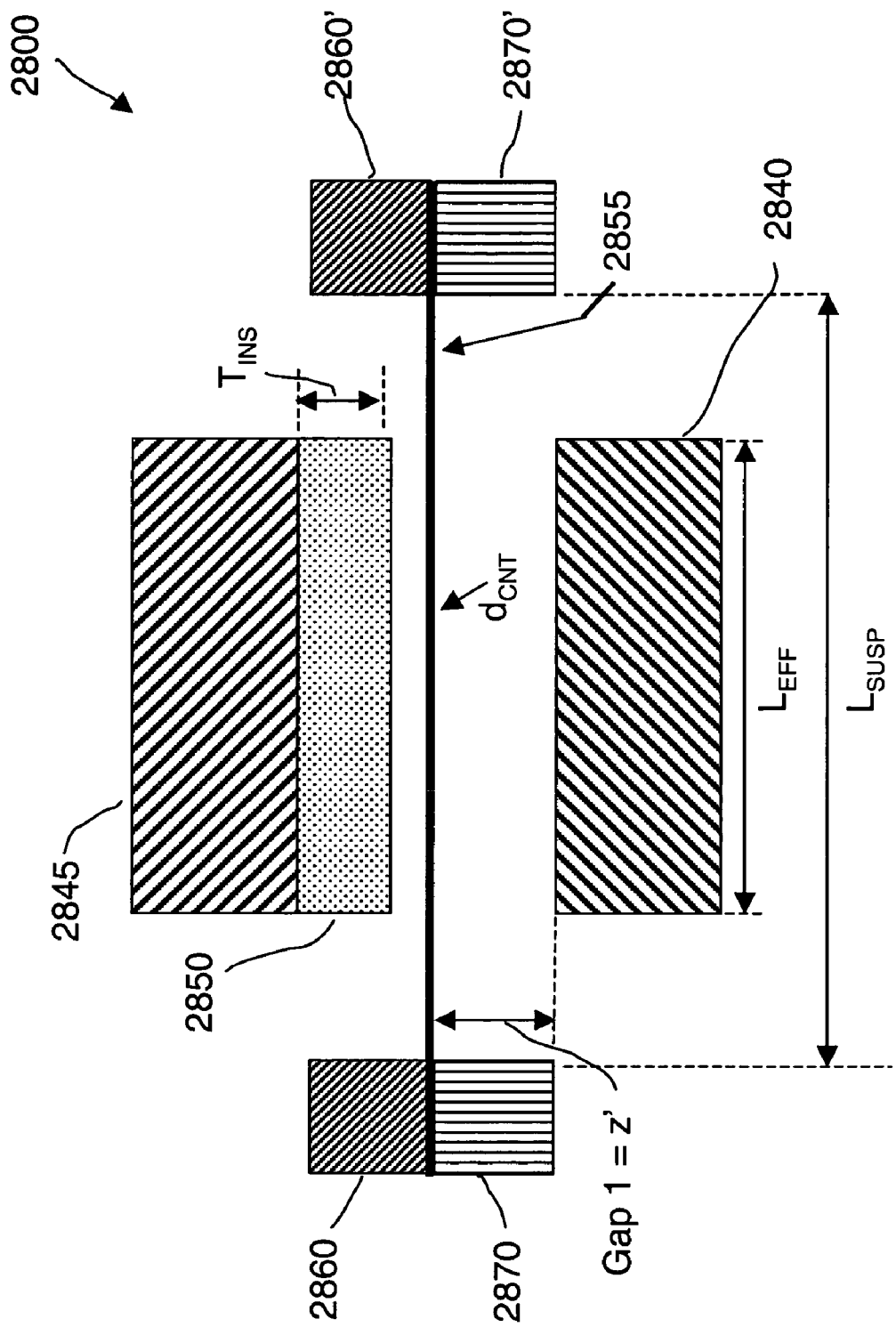
FIGS. 28A-D show a first nonvolatile nanotube switch structure in OFF and ON states, with associated elastic, electrical, and atomic-level Lennard-Jones forces.

Device Design Methods for First Nonvolatile
Nanotube Switches to Set Switch Operating Voltages
by Controlling Electromechanical and Atomic-Level
Forces Using Selected Structures, Dimensions, and
Materials FIG. 28A, corresponding to FIG. 22, illustrates a simplified cross section of three independent terminal first nonvolatile nanotube switch 2800 in an OFF state with suspended nanotube element 2855 in a non-elongated state of length $L_{SUSP}$. Nanotube element 2855 is composed of individual SWNTs of diameter $d_{CNT}$. Signal terminals 2860 and 2860' correspond to signal terminals 2260 and 2260', respectively, in FIG. 22A, and are at the same voltage and form one terminal of three independent terminal first nonvolatile nanotube switch 2800. Nanotube element 2855 is pinned on two ends (a pinned-pinned nanotube element suspended structure) by signal electrode 2860 and corresponding insulator 2870 on one end, and signal electrode 2860' and corresponding insulator 2870' on the other end. Nanotube element 2855 corresponds to nanotube element 2255 illustrated in FIG. 22A. Nanotube element 2855 may be composed, for example, of randomly oriented SWNTs such as SWNTs 2455-2, 2455-4, 2455-5, and 2455-6 illustrated in FIG. 25C, or of essentially parallel SWNTs such as SWNTs 2655-2, 2655-3, and 2655-4 illustrated in FIG. 27B.

Control electrode 2840 of length $L_{EFF}$ in FIG. 28A corresponds to control electrode 2240 in FIG. 22A. In the OFF state, control electrode 2840 is separated from nanotube element 2855 by gap1 of size z'. In the ON state, control electrode 2840 comes in contact with nanotube element 2855 as illustrated further below.

Release electrode 2845 with insulator 2850 of thickness $T_{INS}$ in FIG. 28A corresponds to release electrode 2245 with insulator 2250 illustrated in FIG. 22A. Note that FIG. 28A corresponds to either FIG. 22A or 22B.

Off-to-On State Transition for a First Nonvolatile
Nanotube Switch

Figure 28B:
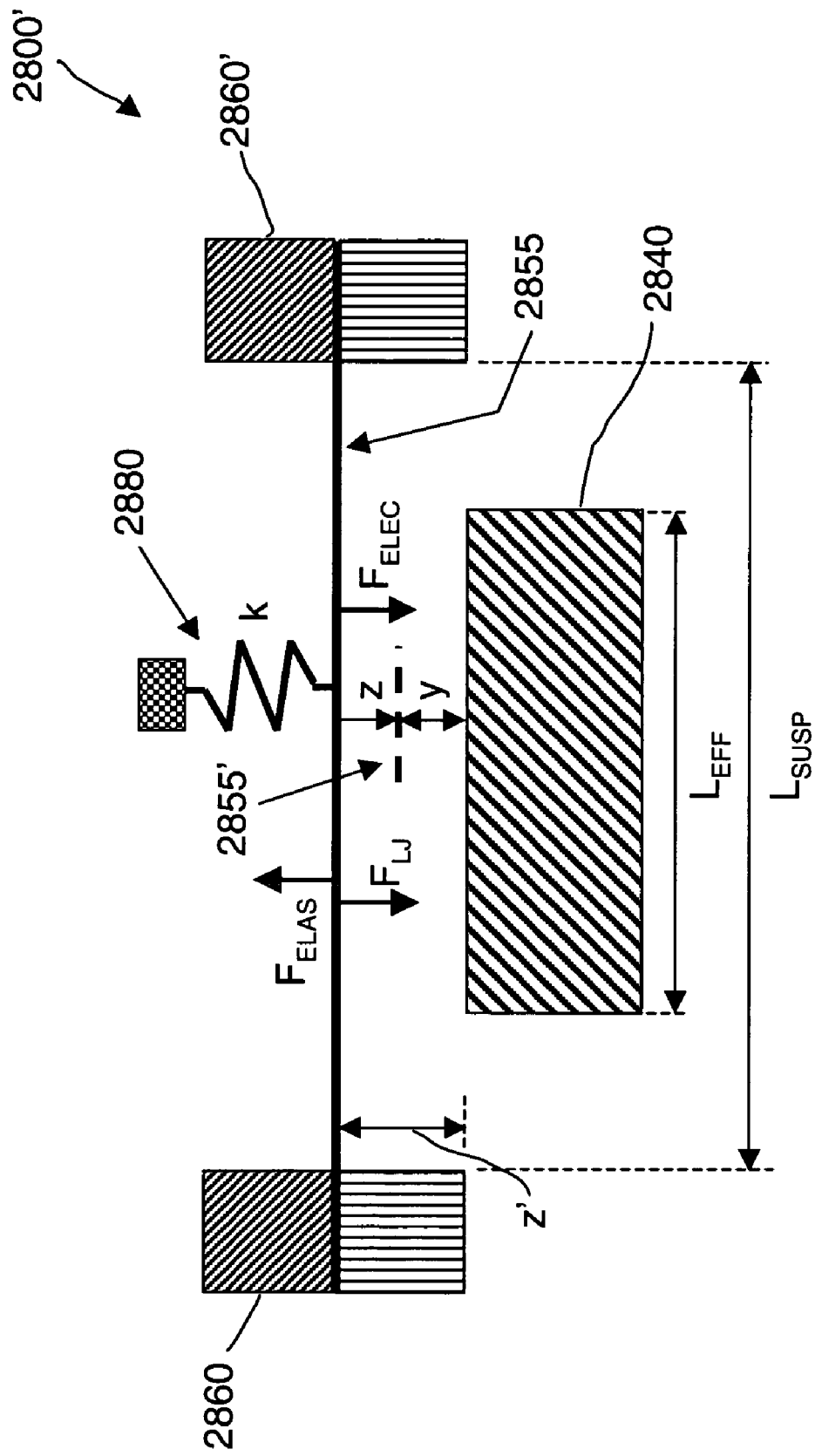

In operation, switch force schematic 2800' illustrated in FIG. 28B, corresponding to first nonvolatile nanotube switch 2800 in FIG. 28A, responds to elastic forces $F_{ELAS}$ from the displacement (elongation) of nanotube element 2855; electrostatic forces $F_{ELEC}$ due to an electric field between control electrode 2840 and nanotube element 2855; and atomic-level Lennard-Jones forces $F_{LJ}$ due to van der Waals interactions at the atomic-level between nanotube element 2855 and control electrode as described in references 1-3 given further above. $F_{ELAS}$ is represented schematically by spring and corresponding support 2880 having spring constant k as described further below. During OFF-to-ON state transition, $F_{LJ}$ is negligible because of separation distance, and only $F_{ELEC}$ and $F_{ELAS}$ are involved, with nanotube element 2855 of diameter $d_{CNT}$ having $F_{ELAS}$ proportional to displacement (deflection distance) z and electrostatic force $F_{ELEC}$ determined by separation distance y as illustrated in FIG. 28B. For this example, individual SWNT diameter $d_{CNT}=1$. Forces $F_{ELAS}$, $F_{ELEC}$, and $F_{LJ}$ are calculated using one-dimensional approximation models given in references 1-3, for example, and a force multiplier constant of 10 estimated from OFF-to-ON state switching voltages in references 1-3 as explained further below.

One-dimensional approximation models are summarized in table 1 for $F_{ELAS}$, table 2 for $F_{ELEC}$, and table 3 for atomic-level $F_{LJ}$ for individual SWNTs. Using the formula for $F_{ELAS}$ in table 1 for nanotube pinned-pinned switch force schematic 2800', including individual SWNTs with diameter $d_{CNT}=1$ nm, for a nanotube element 2855 displacement $z=z'=20$ nm, and a suspended length of 200 nm, $F_{ELAS}=0.56\times10^{-10}$ Newtons. Using the formula for $F_{ELEC}$ in table 2 for nanotube pinned-pinned switch force schematic 2800', including individual SWNTs with diameter $d_{CNT}=1$, a relative dielectric constant $\in_R=1$ for gap 1, and a separation $y=20$ nm, $F_{ELEC}=37\times10^{-12}$ $V^2$ Newtons, where V is a voltage applied to control electrode 2840 with respect to ground (zero volts), which is applied to electrodes 2860 and 2860'. Release electrode 2845 is also at ground. Using a factor 10 as a force multiplier, for example, then $F_{ELEC}=10$ $F_{ELAS}$, and V=3.9 volts, which is consistent with switching voltages for individual SWNTs in fixed-fixed suspension first nonvolatile nanotube switch 2800' structure and a ratio of $L_{SUSP}/z' \approx 10/1$ as described in references 1-3 further above. OFF-to-ON transition is completed when nanotube element 2855 is in the ON position illustrated in FIG. 28C.

TABLE 1 k = 384 EI/L³
$F_{ELAS}$ = kz = (384 EI/L³) z
For CNTs:
E ≈ 1.2 TPa
I = (π/64) ($D_O^4 - D_I^4$)
For individual SWNTs of 1 nm diameter:
E = 1.2 TPa
$D_O = d_{CNT} = 1$ nm
$D_I = 0$
L = $L_{SUSP}$
z = displacement from non-elongated position
$F_{ELAS}$ = -22.3 × 10⁻²⁴ z/($L_{SUSP}$)³ Newtons

TABLE 2

For cylindrical diameter d & separation y:
$U_{ELEC}$ = (1/2) C V²
C ≈ 2 π $\epsilon_R\epsilon_0$L/ln (y/d), for y > 2d
$F_{ELEC}$ = -d ($U_{ELEC}$)/dy
$F_{ELEC}$ = π $\epsilon_R\epsilon_0$LV²/[y ln (y/d)²]
$\epsilon_0$ = 8.85 × 10⁻¹² F/m
For individual SWNTs of 1 nm diameter:
$\epsilon_R$ = material & geometry dependent
L = $L_{EFF}$ effective length for electrostatic force
y = separation between individual SWNTs & electrode
d = $d_{CNT}$ = 1 nm individual SWNT diameter
V = applied voltage
$F_{ELEC}$ = 27.8 × 10⁻¹² $\epsilon_R$ $L_{EFF}$ V²/[y ln (y/$d_{CNT}$)²] Newtons

TABLE 3

$U_{LJ}$ = $\epsilon$[(σ/y)¹² - (σ/y)⁶]N
$F_{LJ}$ = -d($U_{LJ}$)/dr = 6($\epsilon$/σ)[2(σ/y)¹³ - (σ/y)⁷]N
For carbon-to-carbon atoms atomic-level force:
σ = 0.35 × 10⁻⁹ m = 0.35 nm
$\epsilon$ = 4.6 × 10⁻²² Joules
N = # atoms = $N_{ATOMS}$
$F_{LJ}$ = (6 × 4.6 × 10⁻²²/3.5 × 10⁻¹⁰)
[2(0.35/y)¹³ - (0.35/y)⁷] $N_{ATOMS}$
For y = $r_{F-MAX}$ = 0.45 nm maximum force separation for carbon atoms
$F_{LJ}$ = (6 × 4.6 × 10⁻²²/3.5 × 10⁻¹⁰)

TABLE 3-continued

Figure 28C:
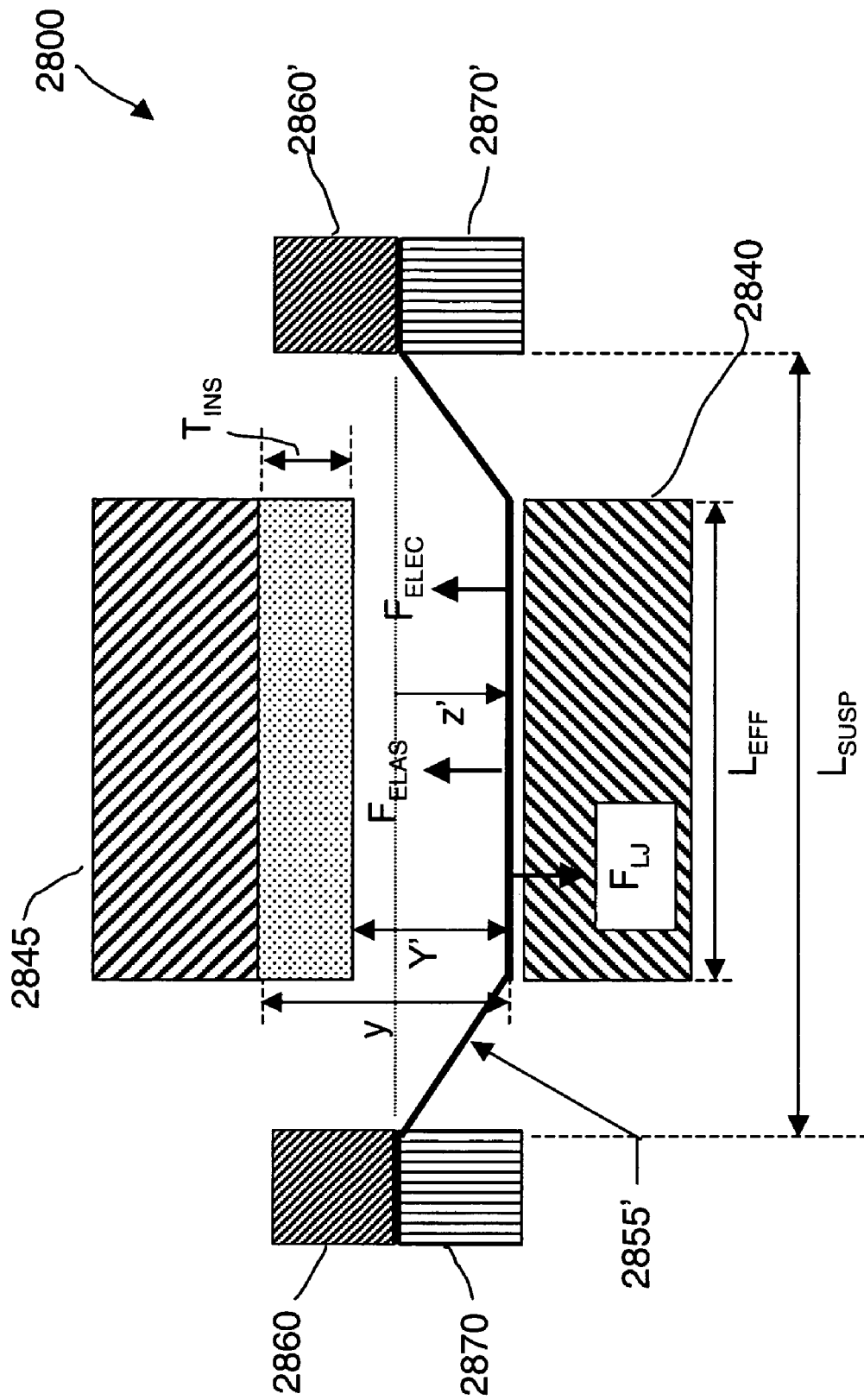

[2(0.35/0.45)¹³ - (0.35/0.45)⁷]
$N_{ATOMS}$
$F_{LJ}$ = 0.76 × 10⁻¹² $N_{ATOMS}$ Newtons A Nonvolatile State for a First Nonvolatile Nanotube Switch In order for first nonvolatile nanotube switch 2800 to operate in a nonvolatile mode, that is remain in the ON state illustrated in FIG. 28C when voltage is removed and $F_{ELEC}=0$, then the sum of atomic-level forces $F_{LJ}$ in the $L_{EFF}$ length portion of elongated nanotube element 2855' must be greater than the restoring elastic force $F_{ELAS}$. Force comparisons may be made on individual SWNTs contained in nanotube element 2855'. The Lennard-Jones form of atomic-level van der Waals interaction force $F_{LJ}$ is determined by atomic-level forces between elongated nanotube element 2855' and control electrode 2840 in the $L_{EFF}$ region. $F_{LJ}$ will vary depending on the material used as a conductor or semiconductor for control electrode 2840. Atomic level forces between any pairs of atoms for atoms of different materials may be estimated using complex and time-consuming atomic/molecular-level computer simulations. In this example, a graphite ground plane is assumed in order to perform a relatively simple calculation based on carbon-to-carbon atomic forces using the $F_{LJ}$ force formula in table 3 in order to evaluate the ability of first nonvolatile nanotube switch 2800 to retain information in a nonvolatile state shown in FIG. 28C, with nanotube element 2855' in contact with control electrode 2840.

A formula for $F_{LJ}$ is given in table 3, including parameter values specific to carbon atoms. Assuming individual SWNTs with a chirality of (10,10) and a diameter of 1 nm, then nanotube helical periodicity is approximately 1.8 nm, and the number of carbon atoms $N_{ATOMS}$ contributing to $F_{LJ}$ may be estimated as follows. For an $L_{EFF}$=160 nm, there are 88 locations where 6 carbon atoms in individual SWNTs are coupled to 6 carbon atoms in the graphite substrate, for example, so $N_{ATOMS}$=530 (530 carbon-to-carbon pairs). The corresponding atomic-level Lennard-Jones force for 530 carbon atoms is calculated to be $F_{LJ}$=4×10⁻¹⁰ Newtons. With $F_{ELEC}$=0, the net force on individual SWNTs in the ON position illustrated in FIG. 28C is $F_{LJ}-F_{ELAS}$=4×10⁻¹⁰-0.5×10⁻¹⁰=3.5×10⁻¹⁰ Newtons. Since $F_{LJ}>F_{ELAS}$, the device is nonvolatile.

On-to-Off State Transition for a First Nonvolatile Nanotube Switch

Figure 28D:
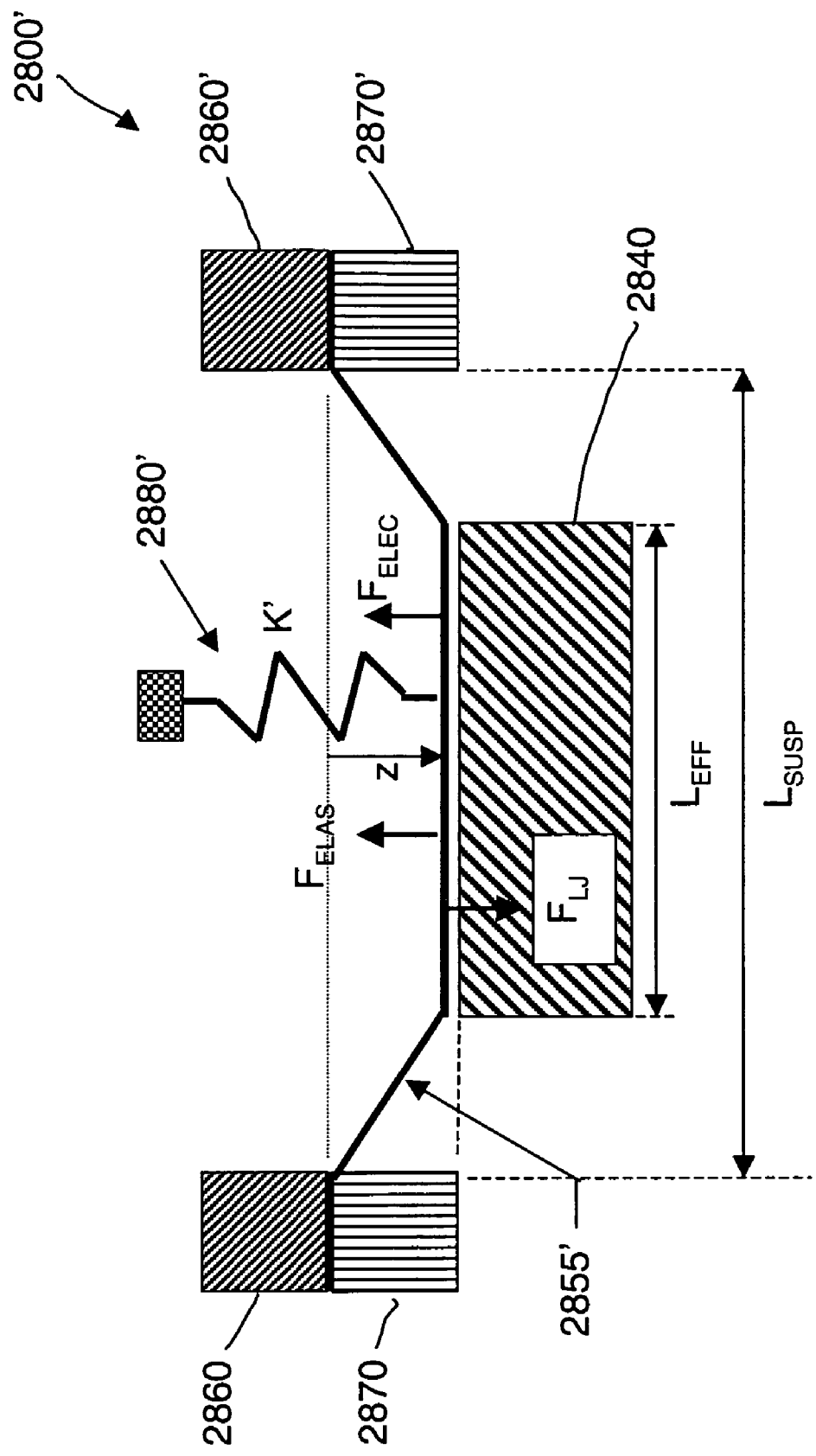

In operation, switch force schematic 2800' illustrated in FIG. 28D corresponding to first nonvolatile nanotube switch 2800 shown in the ON position in FIG. 28C, shows electrostatic force $F_{ELEC}$ applied to elongated nanotube element 2855' to overcome the atomic-level Lennard-Jones force $F_{LJ}$ of 530 pairs of carbon atoms, with the assistance of elastic force $F_{ELAS}$ represented schematically by elongated spring and support 2880', where spring k is displaced to position k'. Using the force multiplier constant of 10 used further above to estimate OFF-to-On switch transition voltage, $F_{ELEC}$=10 ($F_{LJ}-F_{ELAS}$) for an ON-to-OFF transition.

Electrostatic force $F_{ELEC}$ is generated by applying a voltage V to release electrode 2845 and ground (zero volts) to signal electrodes 2860 and 2860', and ground to control electrode 2840. In order to calculate $F_{ELEC}$, an effective dielectric constant for the combined dielectric and air-gap structure 2800' is first calculated. Using two series capacitors of equal areas, the effective dielectric constant for distance y between nanotube element 2855' and release electrode 2845 may be calculated as follows:

$$y/\in_R = T_{INS}/\in_{INS} + y'/1$$

For y=40 nm, insulator 2850 material $SiO_2$ with insulator relative dielectric constant of $\in_{INS}=4$ and $T_{INS}=15$ nm, and y'=25 nm, $\in_R=1.4$ for y=40 nm. Using the formula for $F_{ELEC}$ in table 2, $F_{ELEC}=30\times10^{-12}$ $V^2=10$ $(F_{LJ}-F_{ELAS})=36\times10^{-10}$ Newtons, and ON-to-OFF switching voltage may be V=11 volts, for example.

A switching voltage of V=11 volts to achieve sufficient electrostatic force $F_{ELEC}$ is based on a graphite plane control electrode 2840. However, control electrode 2840 may be a metal such as Ru, Ti, Cr, Al, Au, Pd, Ni, W, Cu, Mo, Ag, In, Ir, Pb, Sn as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or suicides such as RuN, RuO, TiN, TaN, $CoSi_x$ and $TiSi_x$ may be used. Other kinds of conductor, or semiconductor materials can also be used. Semiconductors such as Si, Ge, GaN, GaAs and others may also be used. Atomic-level forces between individual SWNTs and atoms of control electrode 2840 may result in switching voltages greater than 11 volts, for example. Also, changes in control electrode material that may be used by different methods of fabrication may result in changes in first nonvolatile nanotube switch 2800 switching voltage V.

Figure 29:
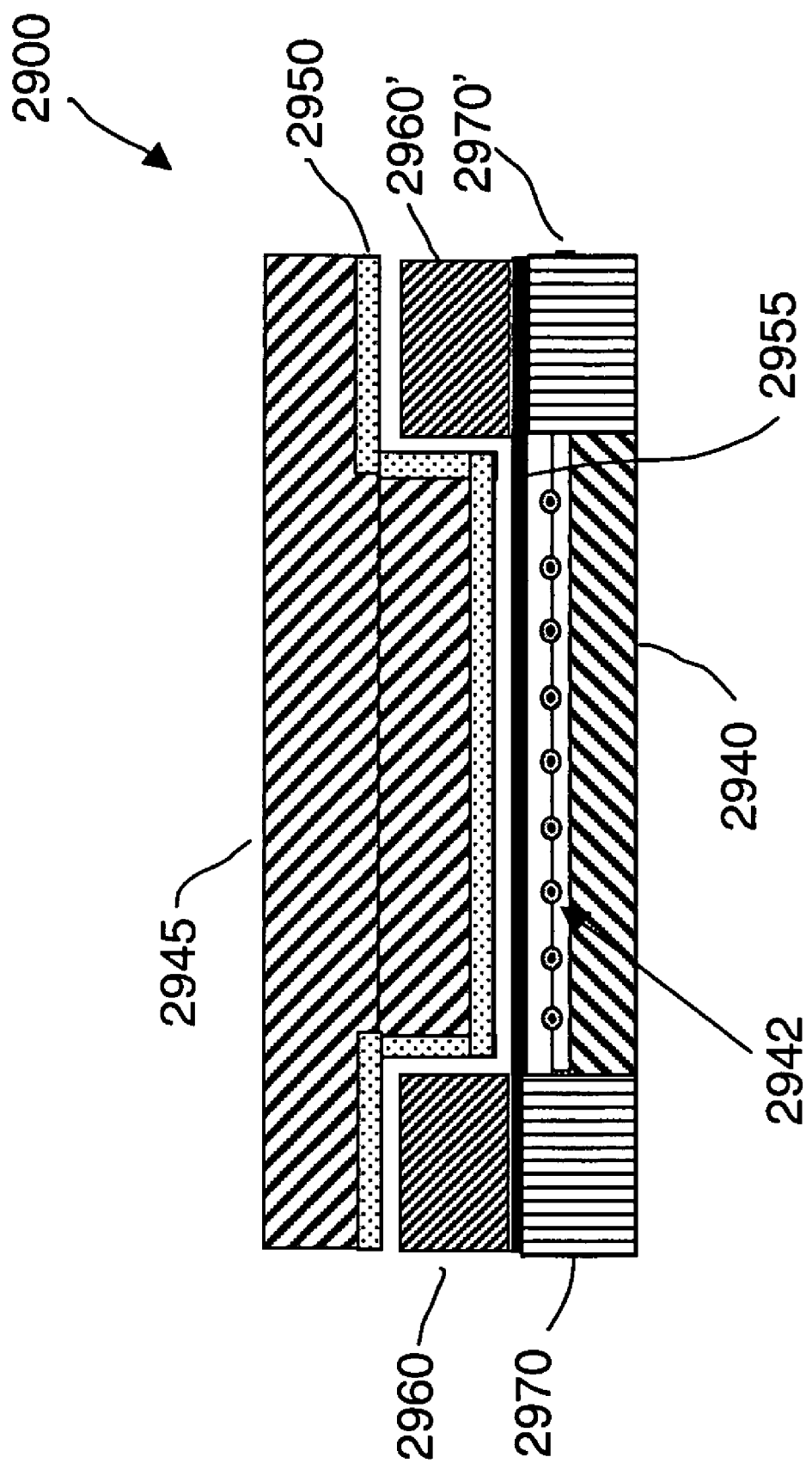
FIG. 29 shows a modified prior art FIG. 22 three terminal nonvolatile device structure with essentially parallel individual SWNTs added to a control electrode such that atomic-level Lennard-Jones forces are determined independently of the control electrode material.

Control of Lennard-Jones Atomic-Level Forces on a First Nonvolatile Nanotube Switch by Adding an Atomic-Level Layer on a Control Electrode First nonvolatile nanotube switch 2900 illustrated in FIG. 29, corresponding to first nonvolatile nanotube switch 2200 illustrated in FIG. 22A, shows a structure that changes atomic-level Lennard-Jones $(F_{LJ})$ force at the atomic level in order to make switching voltage independent of control electrode material. One method of modifying first nonvolatile nanotube switch 2900 structure illustrated in FIG. 29 at the atomic level uses a modification of switch structure 2200 where essentially parallel individual SWNTs 2942 are added in proximity to control electrode 2940, which corresponds to control electrode 2240 illustrated in FIG. 22A. Essentially parallel SWNTs 2942 are shown in a cross sectional view and correspond to a nanotube fabric layer formed of individual SWNTs such as nanotubes 2655-2, 2655-3, and 2655-4 illustrated in FIG. 27B. At an atomic level, parallel SWNTs 2942 can be in "proximity" (less than 0.5 nm, for example) of control electrode 2240 and also be in electrical contact with control electrode 2940. At less than 0.5 nm distance, electron orbits overlap so conduction occurs at close "proximity" and therefore they are in electrical "contact". The space shown between parallel individual SWNTs 2942 and control electrode 2940 in FIG. 29 is not to scale, and is meant to represent an atomic level spacing.

Nanotube element 2955 is pinned on two ends (a pinned-pinned nanotube element suspended structure), where signal electrode 2960 and insulator 2970 in FIG. 29 form a pinning structure corresponding to signal electrode 2260 and insulator 2270, respectively, in FIG. 22A, and where signal electrode 2960' and insulator 2970' form another pinning structure corresponding to signal electrodes 2260' and insulator 2270', respectively, in FIG. 22A. Release electrode 2945 with insulator 2950 illustrated in FIG. 29 correspond to release electrode 2245 with insulator 2250, respectively, in FIG. 22A.

Figure 30A:
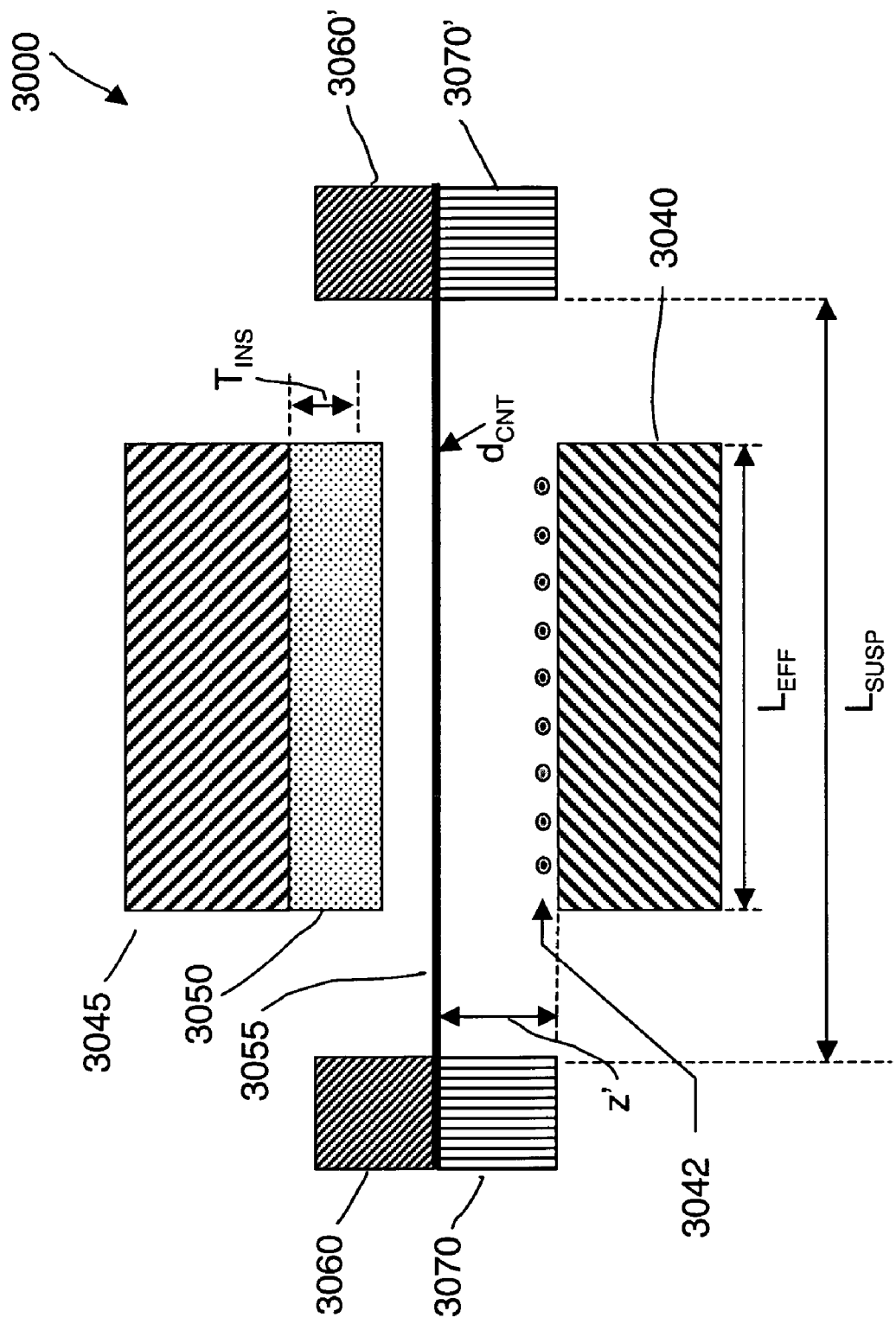
FIGS. 30A-B show a first nonvolatile nanotube switch FIG. 28 structure in OFF and ON states, with the addition of essentially parallel SWNTs on a control electrode such that atomic-level Lennard-Jones forces are determined independently of the control electrode material.

FIG. 30A illustrates a simplified cross section of first nonvolatile nanotube switch 3000, with three independent terminals, corresponding to first nonvolatile nanotube switch 2900 in an OFF state with suspended nanotube element 3055 in a non-elongated state of length $L_{SUSP}$. Nanotube element 3055 is composed of individual SWNTs of diameter $d_{CNT}$. Signal terminals 3060 and 3060' correspond to signal terminals 2960 and 2960', respectively, in FIG. 29, and are at the same voltage and form one terminal of the three terminal first nonvolatile nanotube switch 2900. Insulator 3070 and 3070' illustrated in FIG. 30A correspond to insulator terminals 2970 and 2970' illustrated in FIG. 29. Nanotube element 3055 is pinned on two ends (a pinned-pinned nanotube element suspended structure) by signal electrode 3060 and corresponding insulator 3070 on one end, and signal electrode 3060' and corresponding insulator 3070' on the other end. Nanotube element 3055 corresponds to nanotube element 2955 illustrated in FIG. 29. Nanotube element 3055 may be composed, for example, of randomly oriented SWNTs such as SWNTs 2455-2, 2455-4, 2455-5, and 2455-6 illustrated in FIG. 25C, or of essentially parallel SWNTs such as SWNTs 2655-2, 2655-3, and 2655-4 illustrated in FIG. 27B.

Control electrode 3040 of length $L_{EFF}$ in FIG. 30A corresponds to control electrode 2940 in FIG. 29. In the OFF state, control electrode 3040 is separated from nanotube element 3055 by gap 1 of size z'. In the ON state, nanotube element 3055 is in contact with essentially parallel SWNTs 3042 forming an atomic-level van der Waals force control layer, which is in turn in contact with control electrode 3040.

Release electrode 3045 with insulator 3050 of thickness $T_{INS}$ in FIG. 30A corresponds to release electrode 2945 with insulator 2950 illustrated in FIG. 29.

Off-to-On Transition for a First Nonvolatile Nanotube Switch with an Atomic-Level Layer on a Control Electrode In operation, an electrostatic force $F_{ELEC}$ of sufficient magnitude is applied to first nonvolatile nanotube switch 3000 structure illustrated in FIG. 30A to overcome $F_{ELAS}$ and switch device 3000 from the OFF to the ON state. Added nanotube element 3042 is sufficiently porous that $F_{ELEC}$ is essentially the same as calculated for first nonvolatile nanotube switch 2800 structure illustrated in FIG. 28A. Lennard-Jones atomic level forces are negligible because of separation distances. Therefore, applied voltage V=3.9 volts is the same as calculated for FIG. 28A.

Figure 30B:
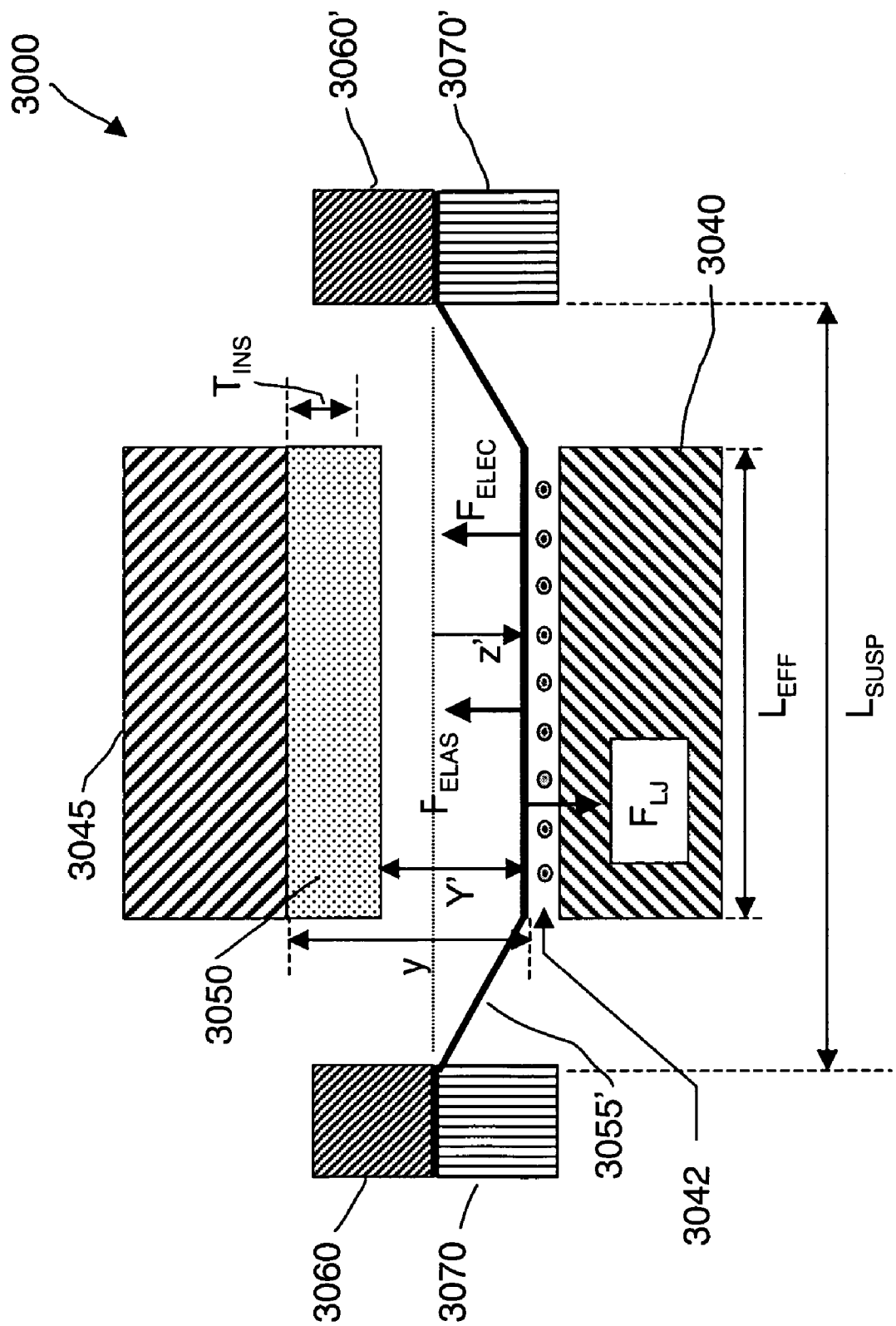

A Nonvolatile State for a First Nonvolatile Nanotube Switch with an Atomic-Level Layer on a Control Electrode In order for first nonvolatile nanotube switch 3000 in the ON state shown in FIG. 30B to operate in a nonvolatile mode, that is remain in the ON state illustrated in FIG. 30B when voltage is removed and $F_{ELEC}=0$, then the sum of atomic-level forces $F_{LJ}$ in the $L_{EFF}$ length portion of elongated nanotube element 3055' must be greater than restoring elastic force $F_{ELAS}$. Force comparison may be made on individual SWNTs contained in nanotube element 3055'. The Lennard-Jones form of atomic-level van der Waals interaction force $F_{LJ}$ is determined by atomic-level forces between elongated nanotube element 3055' and essentially parallel SWNTs 3042 forming an atomic-level Lennard-Jones (van der Waals) force control layer. $F_{LJ}$ forces between nanotube element 3055' and control electrode 3040 are negligible because of additional separation as illustrated further below, and are essentially independent of the choice of conductor or semiconductor material for control element 3040.

A formula for $F_{LJ}$ is given in table 3, including parameter values specific to carbon atoms. Assuming that essentially parallel SWNTs 3042 forming an atomic-level $F_{LJ}$ force control layer has a periodicity of 5 nm, for example, then for $L_{EFF}$=160 nm, there are 32 locations where 6 carbon atoms in individual SWNTs 3042 are coupled to 6 carbon atoms in individual nanotube element 3055', for example, for a total of $N_{ATOMS}$=192 carbon-bond pairs. The corresponding atomic-level SWNT-to-SWNT Lennard-Jones force for 192 carbon atom pairs is calculated to be $F_{LJ}$=1.5×10$^{-10}$ Newtons. With $F_{ELEC}$=0, the net force on individual SWNTs in the ON position illustrated in FIG. 27B is $F_{LJ}$−$F_{ELAS}$=1.5×10$^{-10}$−0.5×10$^{-10}$=1.0×10$^{-10}$ Newtons. Since $F_{LJ}$>$F_{ELAS}$, first nonvolatile nanotube switch 3000 is nonvolatile and remains in the ON state when voltage V is removed ($F_{ELEC}$=0).

The presence of essentially parallel individual SWNTs 3042 results in an increased spacing between SWNT element 3055' and control electrode 3040. Assuming for purposes of calculation that control element 3040 is graphite, that the carbon atom pair separation is 1.9 nm (2×0.45 nm carbon-carbon separation+1.0 nm SWNT diameter), that the number of carbon atoms is 532−192=340 atoms, and using the formula in table 3, $F_{LJ}$ between SWNT 3055' and graphite control element 3040 is approximately $F_{LJ}$=1.9×10$^{-14}$ Newtons. Introducing the layer of essentially parallel individual SWNTs 3042 has reduced $F_{LJ}$ between SWNT element 3055' and a graphite control electrode 3040 by more than 5,000 times (1.0×10$^{-10}$/1.9×10$^{-14}$). This greater than three orders of magnitude reduction in $F_{LJ}$ indicates that the material used for control electrode 3040 may be changed to various conductors or semiconductors for various fabrication methods with no significant change in first nonvolatile nanotube switch 3000 operation.

On-to-Off Transition for a First Nonvolatile Nanotube Switch with an Atomic-Level Layer on a Control Electrode In operation, FIG. 30B shows electrostatic force $F_{ELEC}$ applied to elongated nanotube element 3055' to overcome the atomic-level Lennard-Jones force $F_{LJ}$ of 192 pairs of carbon atoms, with the assistance of elastic force $F_{ELAS}$. Using the force multiplier constant of 10 used further above to estimate OFF-to-ON switch transition voltage, $F_{ELEC}$=10 ($F_{LJ}$−$F_{ELAS}$) for ON-to-OFF transition.

Electrostatic force $F_{ELEC}$ is generated by applying voltage V to release electrode 3045 and ground (zero volts) to signal electrode 3060 and 3060', and ground to control electrode 3040. In order to calculate $F_{ELEC}$, a dielectric constant for the combined dielectric and air-gap structure 3000 is first calculated. Using two series capacitors of equal areas, the effective dielectric constant for distance y between nanotube element 3055' and release electrode 3045 may be calculated as follows:

$$y/\epsilon_R = T_{INS}/\epsilon_{INS} + y'/1$$

For nanotube element 3055' with a diameter of 1 nm, and with spacing of approximately 2 nm from control electrode 3040, y=37.5 nm. For insulator material SiO$_2$ with $\epsilon_{INS}$=4 and $T_{INS}$=15 nm, y'=22.5 nm, and $\epsilon_R$=1.43 for y=37.5. Using the formula for $F_{ELEC}$ in table 2, $F_{ELEC}$=24×10$^{-12}$ V$^2$=10 ($F_{LJ}$−$F_{ELAS}$)=10×10$^{-10}$ Newtons, where $F_{LJ}$ and $F_{ELAS}$ are calculated further above with respect to first nonvolatile nanotube switch nonvolatile state stability.

The estimated ON-to-OFF switching voltage to achieve sufficient electrostatic force $F_{ELEC}$ to overcome SWNT-to-SWNT-based $F_{LJ}$ minus $F_{ELAS}$ is V=6.3 volts. By introducing essentially parallel SWNTs 3042, switching voltage V=6.3 volts has been reduced from an estimate of 11 volts without essentially parallel SWNTs 3042, and is independent of the material selected for control electrode 3040.

Conductive material for control electrode 3040 may be as listed further above. In addition to conductive material properties, material for control electrode 3040 may also be selected such that $F_{LJ}$ atomic-level forces between essentially parallel SWNTs 3042 and control electrode are greater than $F_{LJ}$ atomic-level SWNT-to-SWNT forces between SWNTs 3042 and nanotube element 3055' to ensure that the position of SWNTs 3042 is not changed during switch 3000' operation.

Device Design Methods for First Volatile Nanotube Switches to Set Switch Operating Voltages by Controlling Electromechanical and Atomic-Level Forces Using Selected Structures, Dimensions, Materials, and Adding an Atomic-Level Layer on a Control Electrode FIG. 31A, corresponding to FIG. 23A with an atomic-level layer added to control electrode 2340, illustrates a simplified cross section of first volatile nanotube switch 3100 in an OFF state with suspended nanotube element 3155 in a non-elongated state of length $L_{SUSP}$. Nanotube element 3155 is composed of individual SWNTs of diameter $d_{CNT}$. Signal terminals 3160 and 3160' correspond to signal terminals 2360 and 2360', respectively, in FIG. 23A, and are at the same voltage and form one terminal of the two terminal switch 3100. Nanotube element 3155 is pinned on two ends (a pinned-pinned nanotube element suspended structure) by signal electrode 3160 and corresponding insulator 3170 on one end, and signal electrode 3160' and corresponding insulator 3170' on the other end. Nanotube element 3155 corresponds to nanotube element 2355 illustrated in FIG. 23A. Nanotube element 3155 may be composed, for example, of randomly oriented SWNTs such as SWNTs 2455-2, 2455-4, 2455-5, and 2455-6 illustrated in FIG. 25C, or of essentially parallel SWNTs such as SWNTs 2655-2, 2655-3, and 2655-4 illustrated in FIG. 27B.

Figure 31B:
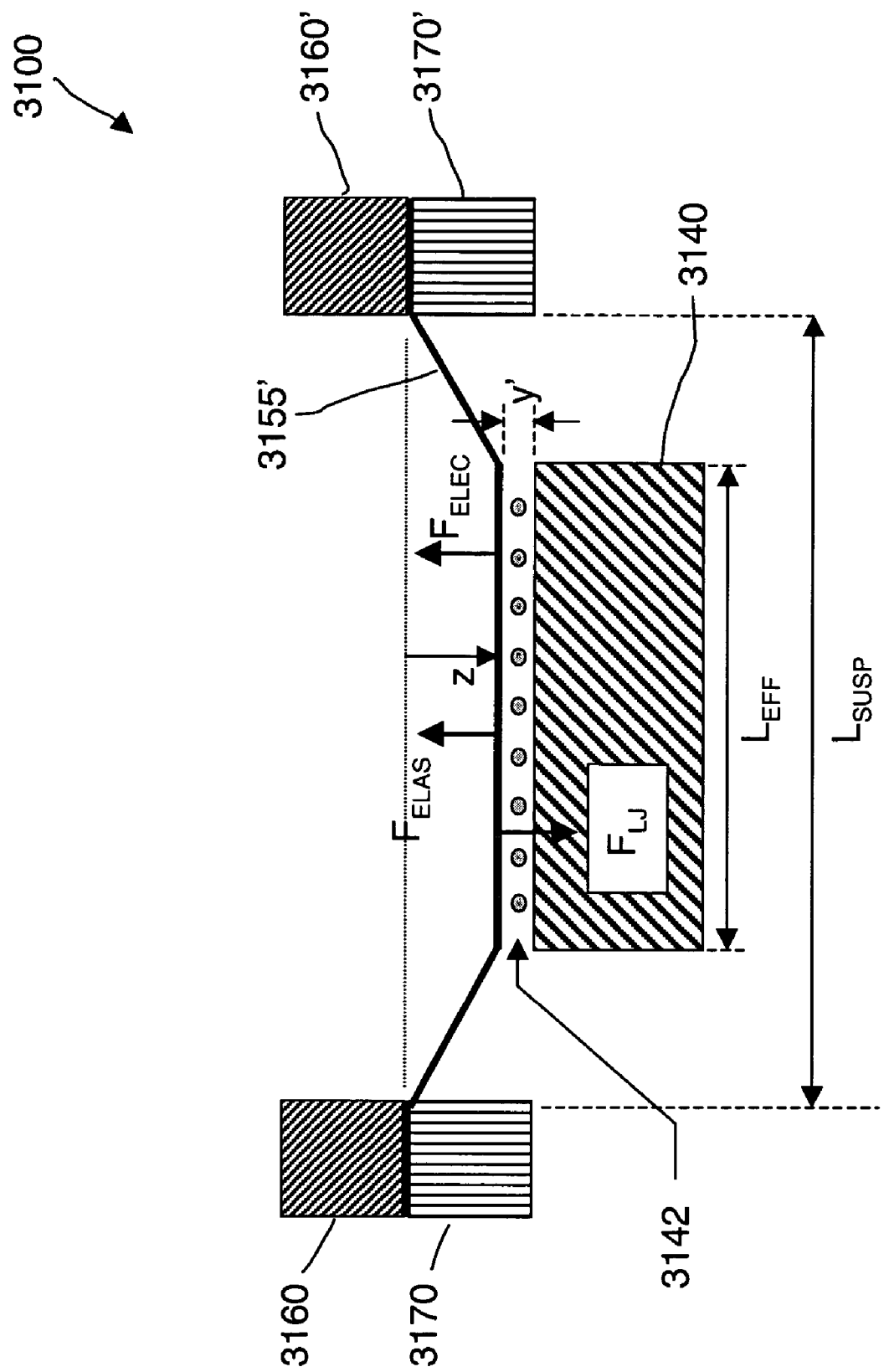

Control electrode 3140 of length $L_{EFF}$ in FIG. 31A corresponds to control electrode 2340 in FIG. 23A. Volatile nanotube switch 3100 also includes essentially parallel individual SWNTs 3142 on control electrode 3140 (not included in FIG. 23A) for atomic-level control of Lennard-Jones ($F_{LJ}$) forces when switch 3100 switches to the ON position illustrated in FIG. 31B.

Off-to-On State Transition for a First Volatile Nanotube Switch with an Atomic-Level Layer on a Control Electrode In operation, voltage V is applied to control electrode 3140, and ground (zero volts) is applied to signal electrodes 3160 and 3160' and transmitted to nanotube element 3155 separated by distance y from control electrode 3140 as illustrated in FIG. 31A. During OFF-to-ON transition, nanotube element 3155 is elongated and displaced by a distance z, for example, and nanotube element 3155 separation from control electrode 3140 is y' illustrated in FIG. 31B. One dimensional approximation models are summarized in table 1 for $F_{ELAS}$, table 2 for $F_{ELEC}$, and table 3 for atomic-level $F_{LJ}$. $F_{LJ}$ is negligible because of separation distance, and only $F_{ELEC}$ and $F_{ELAS}$ are involved, with nanotube element 3155 of diameter $d_{CNT}$ having $F_{ELAS}$ proportional to displacement distance z and electrostatic force $F_{ELEC}$ determined by separation distance y' as illustrated in FIG. 31B. For this example, individual SWNT diameter $d_{CNT}$=1. Forces $F_{ELAS}$, $F_{ELEC}$, and $F_{LJ}$ are calculated using one-dimensional approximation models given in references 1-3, for example, and a force multiplier constant of 10 estimated from OFF-to-ON state switching voltages in references 1-3 as explained further below.

In this example, first volatile nanotube switch 3100 has $L_{SUSP}$=200 nm, $L_{EFF}$=160 nm, and z'=40 nm. Since essentially parallel SWNTs 3142 layer is porous and approximately the same voltage as control electrode 3140, $F_{ELEC}$ is unchanged. In this example, using calculations based on first volatile nanotube switch 3100 dimensions and formulas in tables 1 and 2, $F_{ELAS}$=1×10$^{-10}$ Newtons and $F_{ELEC}$=15×10$^{-12}$ V$^2$ Newtons. Using a 10 times multiplier as explained further above, $F_{ELEC}$=10 $F_{ELAS}$, therefore, V=8.2 volts to produce an OFF-to-ON transition.

A Volatile State for a First Volatile Nanotube Switch with an Atomic-Level Layer on a Control Electrode In order for first volatile nanotube switch 3100 to operate in a volatile mode, that is not remain in the ON state illustrated in FIG. 31B when voltage is removed and $F_{ELEC}$=0 but return instead to the OFF state illustrated in FIG. 31A, then the sum of atomic-level forces $F_{LJ}$ applied to elongated nanotube element 3155' must be less than restoring elastic force $F_{ELAS}$. Force comparison may be made on individual SWNTs contained in nanotube element 3155'. The Lennard-Jones form of atomic-level van der Waals interaction force $F_{LJ}$ is determined by atomic-level forces between elongated nanotube element 3155' and essentially parallel SWNTs 3142 forming an atomic-level Lennard-Jones force control layer. $F_{LJ}$ forces between nanotube element 3155' and control electrode 3040 are negligible because of additional separation as illustrated further above, and are essentially independent of the choice of conductor or semiconductor material for control element 3140.

A formula for $F_{LJ}$ is given in table 3, including parameter values specific to carbon atoms. Assuming that essentially parallel SWNTs 3142 forming an atomic-level van der Waals force control layer has a periodicity of 10 nm, for example, then for $L_{EFF}$=160 nm, there are a total of $N_{ATOMS}$=96 carbon-bond pairs. The corresponding atomic-level SWNT-to-SWNT Lennard-Jones force for 96 carbon atom pairs is calculated to be $F_{LJ}$=0.7×10$^{-10}$ Newtons. With $F_{ELEC}$=0, and since $F_{ELAS}$=1.0×10$^{-10}$ Newtons as calculated further above, the net force on individual SWNTs in the ON position illustrated in FIG. 27B is $F_{ELAS}$−$F_{LJ}$=1.0×10$^{-10}$−0.7×10$^{-10}$=0.3×10$^{-10}$ Newtons. Since $F_{ELAS}$>$F_{LJ}$, first nonvolatile nanotube switch 3100 is volatile. There is no $F_{LJ}$ contribution between nanotube element 3155' and control electrode 3140 because of additional spacing as discussed further above.

On-to-Off Transition for a First Volatile Nanotube Switch with an Atomic-Level Layer on a Control Electrode ON-to-OFF state transition takes place when V is reduced to zero and $F_{ELEC}$=0 because $F_{ELAS}$>$F_{LJ}$ as described further above.

Device Design Methods for Second Nonvolatile Nanotube Switches to Set Switch Operating Voltages by Controlling Electromechanical and Atomic-Level Forces Using Selected Structures, Dimensions, Materials, and Adding an Atomic-Level Layer on Insulated Input Electrodes and Output Electrodes Second nonvolatile nanotube switches with four independent terminals operating in a nonvolatile mode may be used for nanotube protective devices as described further above. Such four terminal switches may also be used for nanotube-only logic operations as described in U.S. patent application Ser. No. 10/918,085, entitled "Nanotube-Based Switching Elements with Multiple Controls," filed Aug. 13, 2004, and whose fabrication is described in U.S. patent application Ser. No. 10/918,181, entitled "Nanotube Device Structure and Methods of Fabrication," filed Aug. 13, 2004. Four terminal devices may have an output in the center of the switch and input and release electrodes positioned between output and signal electrodes, with signal electrodes connected to a nanotube channel element that is switched into contact with the output electrode in the ON state, and switched out of contact with the output electrode in the OFF state. Also, four terminal devices may have input and release electrodes in the center of the switch and outputs positioned between input and release electrodes and signal electrodes, with signal electrodes connected to a nanotube channel element that is switched into contact with the output electrodes in the ON state, and switched out of contact with the output electrodes in the OFF state. Second nonvolatile switch operation is determined by a four independent terminal switch design that includes atomic-level van der Waals forces calculated using Lennard-Jones force ($F_{LJ}$) equations in table 3. Input electrodes and output electrodes (terminals) may be above or below the suspended channel element, and release electrodes may be below or above the suspended channel element, and signal electrodes contact at least one end of a nanotube channel element. In the OFF state, the nanotube channel element may be in a non-elongated state, or may be elongated and in contact with insulators on release and opposing electrode structures that are used with output electrodes to balance electrical forces associated with voltages on output terminals.

Figure 32A:
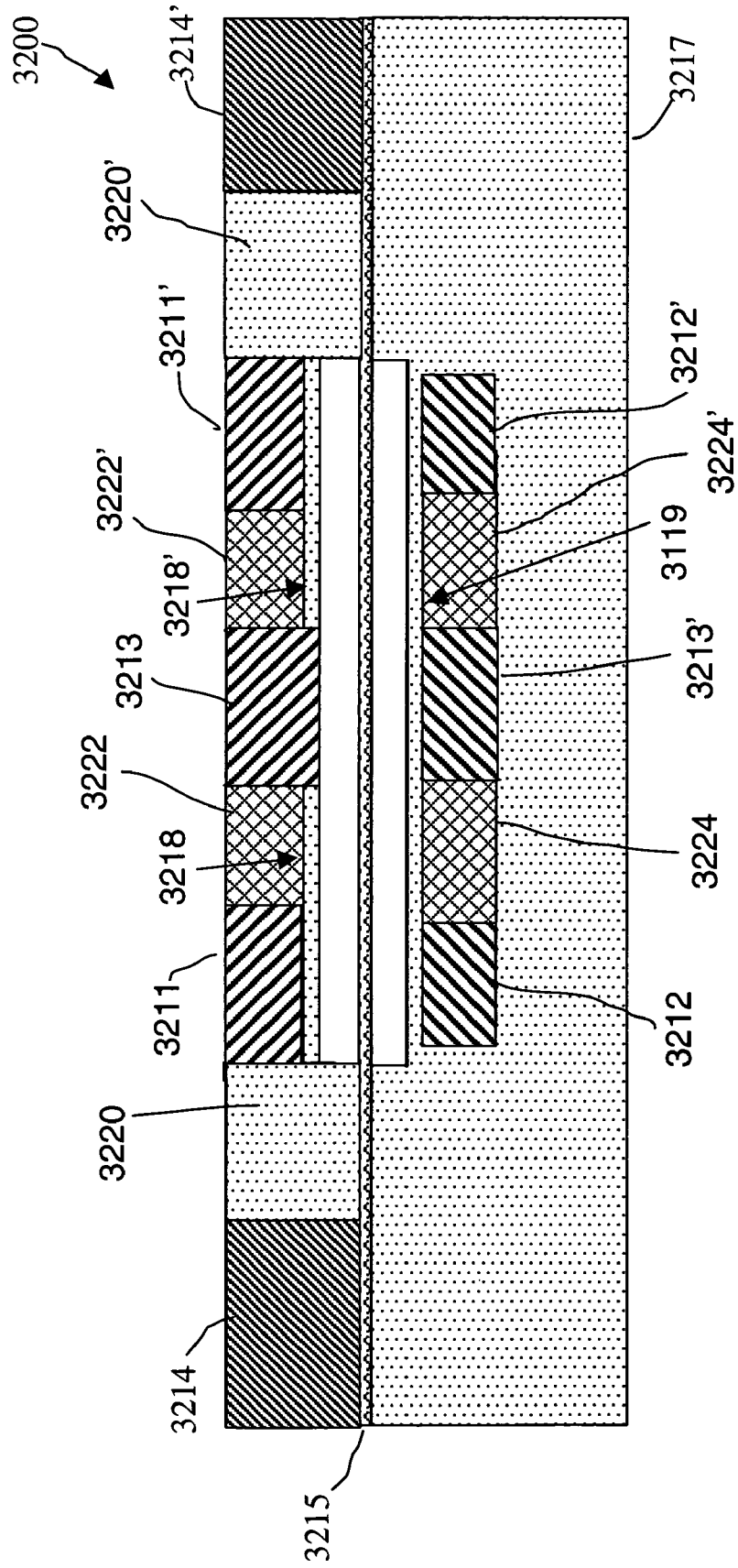
FIGS. 32A-D show a second nonvolatile nanotube switch structure with OFF and ON states with the addition of essentially parallel SWNTs insulated input electrodes and output electrodes such that atomic-level Lennard-Jones Forces are determined independently of the insulated input electrode and output electrode materials.

FIG. 32A illustrates a cross section of second nonvolatile switch 3200 of a four terminal switch structure with output electrode 3213 and corresponding insulated opposing electrode 3213' in the middle of switch 3200, and located above and below nanotube channel element 3215, respectively. Insulated input electrodes 3211 and 3211' and insulated release electrodes 3212 and 3212' are on opposite sides of nanotube channel element 3215 which are used to apply electrostatic forces to channel element 3215 by applying a voltage V between insulated input electrodes 3211 and 3211' and signal electrodes 3214 and 3214'; or between insulated release electrodes 3212 and 3212' and signal electrodes 3214 and 3214'. Signal electrodes 3214 and 3214' are connected to nanotube channel element 3215 as illustrated in FIG. 32A. Switch 3200 is embedded in part in dielectric 3217. Input electrode 3211 is insulated by dielectric 3218 and input electrode 3211' is insulated by dielectric 3218', and separated from nanotube channel element 3215 by a gap; release electrodes 3212, 3212' and opposing electrode 3213' are insulated by dielectric 3219, and separated from nanotube channel element 3215 by another gap. Insulator 3220 and insulator 3217 form one nanotube channel element 3215 pinning structure, and insulator 3220' and insulator 3217 forms the other. Input electrode 3211 is separated from output electrode 3213 by insulator 3222; input electrode 3211' is separated from output electrode 3213 by insulator 3222'. Release electrode 3212 is separated from opposing electrode 3213' by insulator 3224; release electrode 3212' is separated from opposing electrode 3213' by insulator 3224'.

Figure 32B:
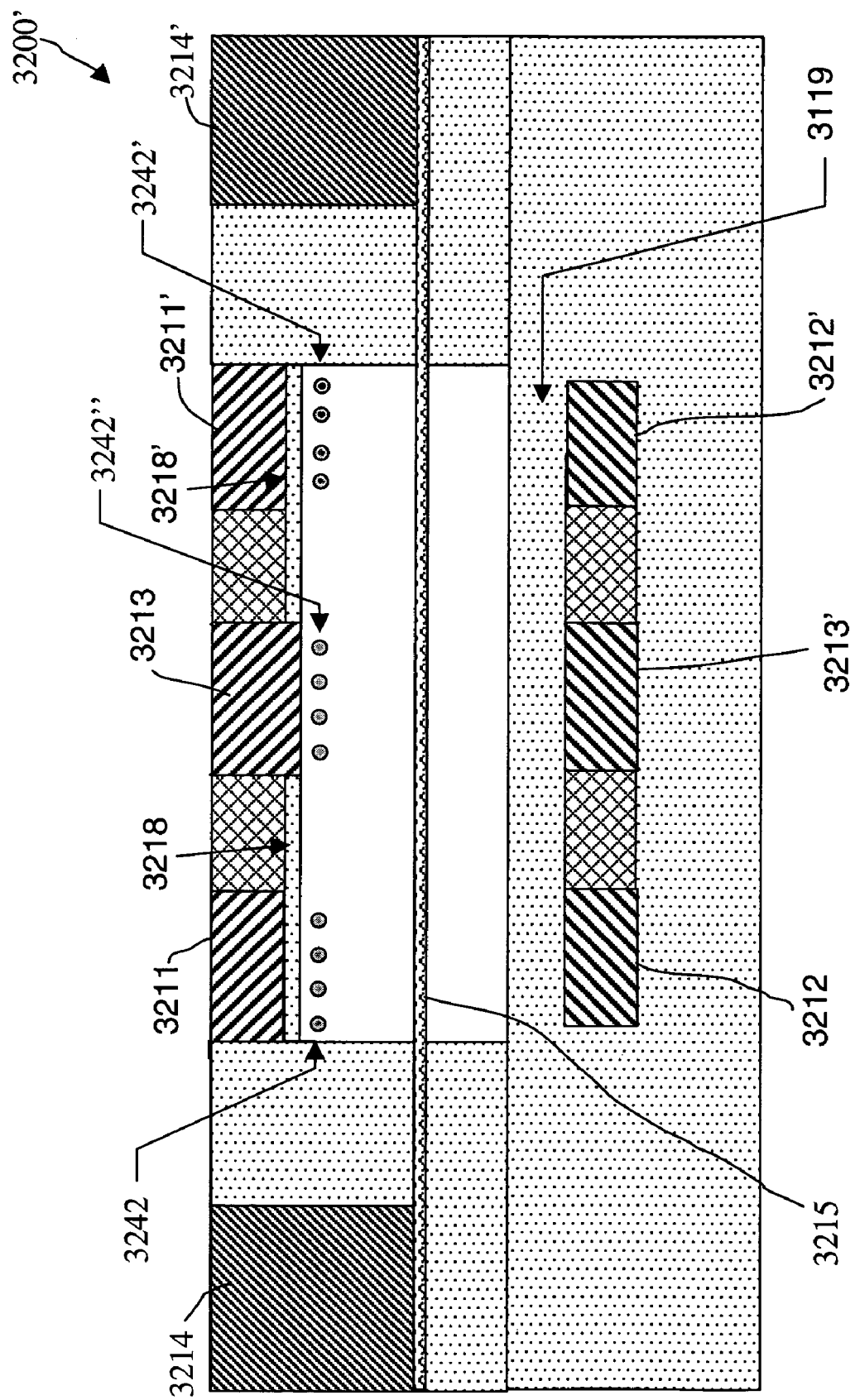

FIG. 32B illustrates second nonvolatile switch 3200' with essentially parallel SWNT layer 3242 and 3242' in coulombic contact to insulators 3218 and 3218', respectively, and layer 3242" in coulombic contact to output electrode 3213. Essentially parallel SWNT layers 3242, 3242', and 3242" are used to control atomic-level Lennard-Jones forces in the ON state as described further below, using methods similar to those used in FIG. 29. In this example, the length of input electrodes 3211 and 3211', release electrodes 3212 and 3212', output electrode 3213, and opposing electrodes 3213' are all 65 nm. Intervening insulators such as 3222, 3222', 3224, and 3224' are all 65 nm. The corresponding suspended length $L_{SUSP}$ of nanotube channel element 3215 is 325 nm.

Off-to-On Transition for a Second Nonvolatile Nanotube Switch with an Atomic-Level Layer on Insulated Input Electrodes and Output Electrodes In operation, output electrode 3213 and opposing electrode 3213' are in electrical contact (not shown) resulting in opposing electrostatic forces on suspended nanotube channel element 3215 and are not a factor in a transition from the OFF-to-ON state. Input electrodes 3211 and 3211' are at voltage V, signal electrodes 3214 and 3214' are at ground (zero volts) so that nanotube channel element 3215 is also at zero volts, and release electrodes 3212 and 3212' are also at zero volts. Assuming a separation between input electrodes 3211 and 3211' and nanotube channel element 3215 of 20 nm (gap plus oxide), an insulator oxide 3218 and 3218' of 3 nm, essentially parallel SWNTs 3242 and 3242' of 1 nm diameter, displacement z'≈15 nm, then elastic force $F_{ELAS}$=0.1×10$^{-10}$ Newtons. $F_{ELAS}$ is calculated using elastic force formulas in table 1 for the pinned-pinned nanotube channel element suspended structure 3215 of suspended length of 325 nm shown in second nonvolatile switch 3200' illustrated in FIG. 32B.

Using the formula for $F_{ELEC}$ in table 2, a separation between input electrodes 3211 and 3211' and nanotube channel element 3215 of approximately 20 nm, a nanotube channel element 3215 with individual SWNT diameter $d_{CNT}$=1 nm, $\in_R$=1, input electrode 3211 and 3211' each of 65 nm length, electrostatic force $F_{ELEC}$=30×10$^{-12}$ V$^2$. Note that essentially parallel SWNT layers are porous and do not significantly modify electrical fields and corresponding electrical forces $F_{ELEC}$. Using $F_{ELEC}$=10 $F_{ELAS}$=1.0×10$^{-10}$, V=1.85 volts. Atomic-level Lennard-Jones forces $F_{LJ}$ are not a factor in an OFF-to-ON transition because separation distances are too great. Atomic-level Lennard-Jones forces apply at separations on the order of 1 nm.

Figure 32C:
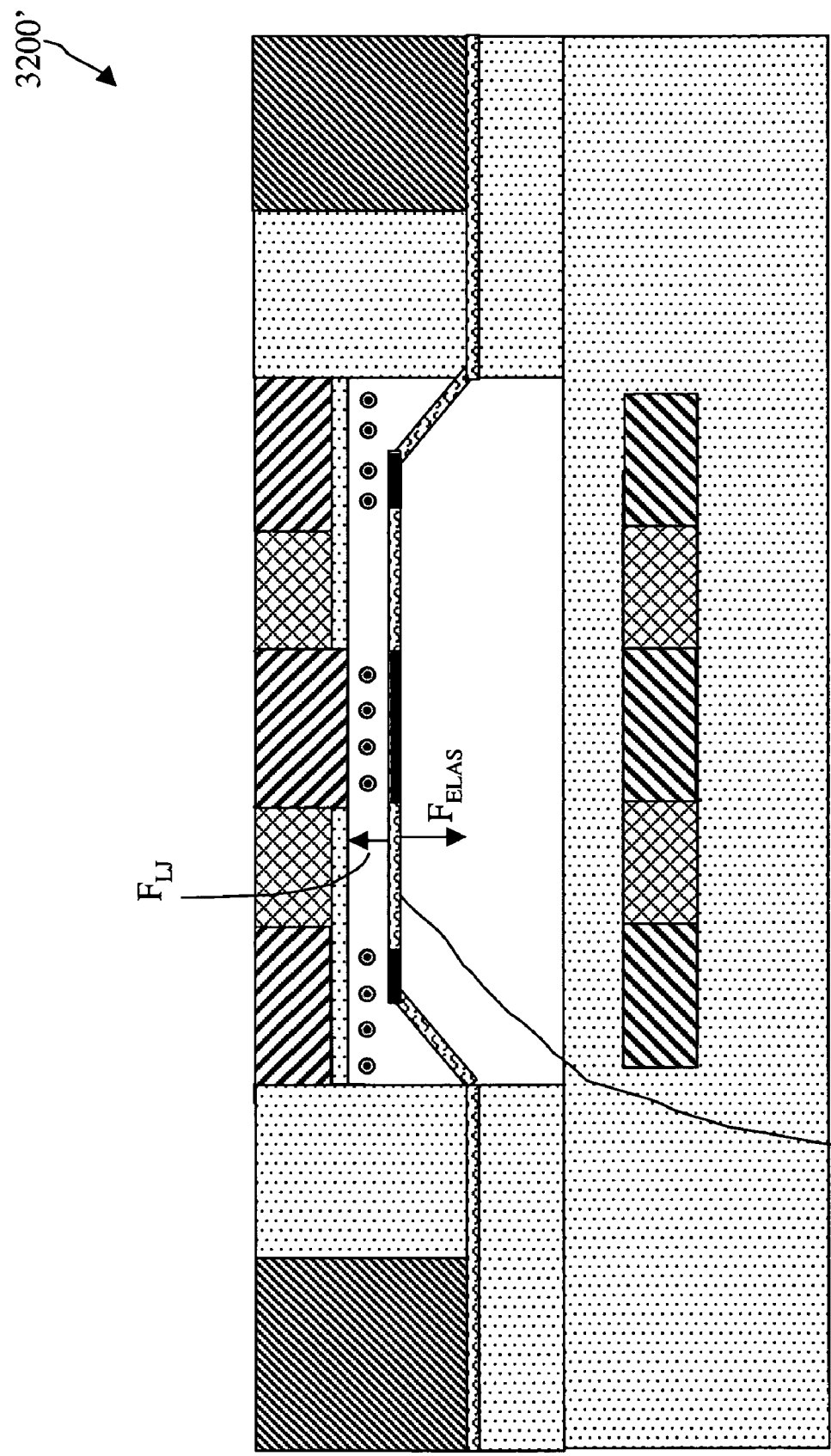

Nonvolatile Device State for a Second Nonvolatile Nanotube Switch with an Atomic-Level Layer on Insulated Input Electrodes and Output Electrodes In order for second nonvolatile switch 3200' to operate in a nonvolatile mode, that is remain in the ON state illustrated in FIG. 32C when voltage V is removed and $F_{ELEC}$=0, then the sum of atomic-level forces $F_{LJ}$ on elongated nanotube channel element 3215' must be greater than restoring elastic force $F_{ELAS}$. Force comparisons may be made on individual SWNTs contained in nanotube element 3215'. The Lennard-Jones form of atomic-level van der Waals interaction force $F_{LJ}$ is determined by atomic-level forces between elongated nanotube element 3215' and that portion of input electrodes 3211 and 3211' and output electrode 3213 that contribute to atomic-level $F_{LJ}$. Typically, atomic-level $F_{LJ}$ forces occur between a portion (referred to as $L_{EFF-LJ}$) of elongated nanotube element 3215' and essentially parallel SWNTs 3242, 3242', and 3242" where separation is less than 1 nm. Lennard-Jones atomic-level force regions of elongated nanotube element 3215' shown in FIG. 32C have been darkened for illustrative purposes. In this example $L_{EFF-LJ}$=65/2+65+65/2=130 nm. For a pitch of 5 nm for essentially parallel SWNT layers 3242, 3242', and 3242", the number of carbon atom pairs contributing to $F_{LJ}$ may be estimated as follows. For $L_{EFF-LJ}$=130 nm and an essentially parallel SWNT pitch of 5 nm, there are 26 locations with 6 carbon atoms in close proximity in each of the SWNTs shown in second nonvolatile switch 3200' illustrated in FIG. 32C, or $N_{ATOMS}$=156 carbon atom pairs. Using formulas in table 3, $F_{LJ}$=1.2×10$^{-10}$ Newtons. With $F_{ELEC}$=0, the net force on individual SWNTs in the ON position illustrated in FIG. 32C is $F_{LJ}$–$F_{ELAS}$=1.2× 10$^{-10}$–0.1×10$^{-10}$=1.1×10$^{-10}$ Newtons. Since $F_{LJ}$>$F_{ELAS}$, second nonvolatile switch 3200' is a nonvolatile switch.

On-to-Off Transition for a Second Nonvolatile Nanotube Switch with an Atomic-Level Layer on Input and Output Electrodes In operation, for ON-to-OFF transition of second nonvolatile switch 3200', electrostatic force $F_{ELEC}$ in combination with elastic restoring force $F_{ELAS}$ must overcome atomic-level Lennard-Jones force $F_{LJ}$. Using the same force multiplier constant of 10 used further above to estimate OFF-to-ON switch transition voltage, $F_{ELEC}$=10 ($F_{LJ}$–$F_{ELAS}$) is required for an ON-to-OFF transition. In this example, $F_{LJ}$–$F_{ELAS}$=1.1×10$^{-10}$ Newtons as illustrated further above, therefore, $F_{ELEC}$=11×10$^{-10}$ Newtons is needed to switch from an ON-to-OFF state.

Figure 32D:
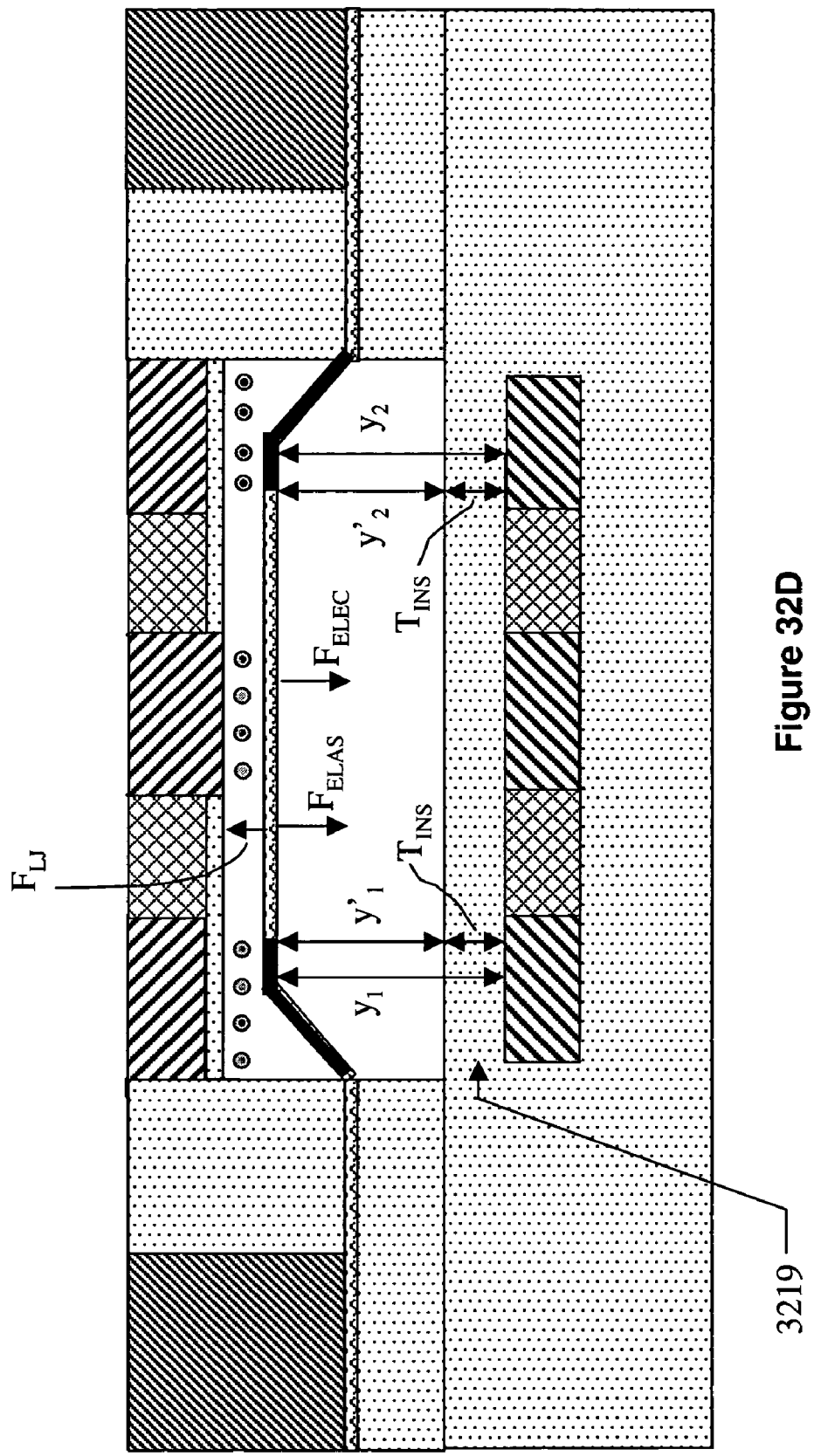

Electrostatic force $F_{ELEC}$ may be generated by applying a voltage V to release electrodes 3212 and 3212'; ground (zero) volts to signal electrodes 3214 and 3214' in contact with nanotube element 3215' which also becomes zero volts, and ground to input electrodes 3211 and 3211' as illustrated in FIG. 32D. FIG. 32D is the same as FIG. 32C, except that electrostatic force regions of elongated nanotube element 3215' have been darkened for illustrative purposes. Output electrode 3213, in contact with nanotube element 3215' at zero volts, is also at zero volts. Since output electrode 3213 and opposing electrode 3213' are electrically connected (not shown), opposing electrode 3213' is also at zero volts. $F_{ELEC}$ force calculations may be done in two parts, one for nanotube element 3215' regions parallel to input electrodes 3211 and 3211' referred to as $F_{ELEC-1}$, and the other for nanotube element 3215' nonparallel regions referred to as $F_{ELEC-2}$, such that $F_{ELEC}$=$F_{ELEC-1}$+$F_{ELEC-2}$.

In order to calculate $F_{ELEC-1}$, a relative dielectric constant $\in_{R1}$ for separation $y_1$ corresponding to combined dielectric 3219 of thickness $T_{INS}$ and air-gap-to-dielectric 3219 separation $y_1'$ may be calculated assuming two series capacitors of equal areas as follows:

$$y1/\in_{R1} = T_{INS}/\in_{INS} + y_1'/1$$

For $y_1$=35 nm, insulator 3219 material SiO$_2$ with $\in_{INS}$=4 and $T_{INS}$=15 nm, and $y_1'$=20, $\in_{R1}$=1.47 for y=35 nm.

In order to calculate $F_{ELEC-2}$, a relative dielectric constant $\in_{R2}$ for separation $y_2$ corresponding to combined dielectric 3219 of thickness $T_{INS}$ and air-gap-to-dielectric 3219 separation $y_2'$ may be calculated assuming two series capacitors of equal areas as follows.

$$y_2/\in_{R2}=T_{INS}/\in_{INS}+y_2'/1$$

For $y_2$=27.5 nm, insulator 3219 material $SiO_2$ with $\in_{INS}$=4 and $T_{INS}$=15 nm, and $y_2'$=12.5, $\in_{R2}$=1.69 for y2=27.5 nm.

Using relative dielectric constants and dimensions for second nonvolatile switch 3200' in the ON state and formula for $F_{ELEC}$ from table 2 to calculate $F_{ELEC}$ components $F_{ELEC-1}$ and $F_{ELEC-2}$, $F_{ELEC-1}$=10.8×10$^{-12}$ V$^2$ and $F_{ELEC-2}$=17.2×10$^{-12}$ V$^2$, therefore $F_{ELEC}$=28×10$^{-12}$ V$^2$. Since an electrostatic force of $F_{ELEC}$=11×10$^{-10}$ Newtons is needed to transition from ON-to-OFF state as illustrated further above, then $F_{ELEC}$=28×10$^{-12}$ V$^2$=11×10$^{-10}$ Newtons, and V=6.3 volts.

Figure 33A:
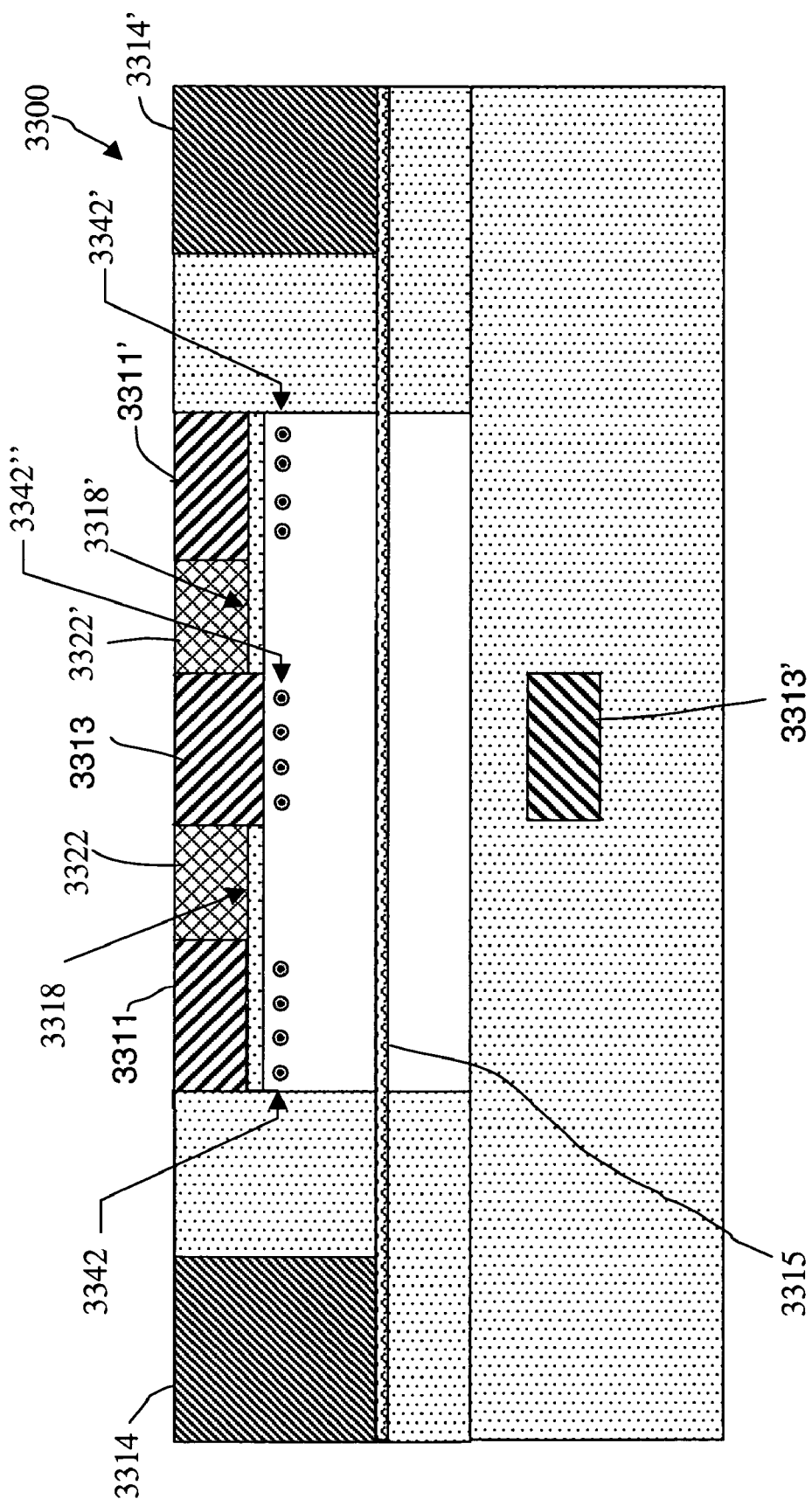
FIGS. 33A-B show a second volatile nanotube switch structure with OFF and ON states with the addition of essentially parallel SWNTs insulated input electrodes and output electrodes such that atomic-level Lennard-Jones Forces are determined independently of the insulated input electrode and output electrode materials.

Device Design Methods for Second Volatile Nanotube Switches to Set Switch Operating Voltages by Controlling Electromechanical and Atomic-Level Forces Using Selected Structures, Dimensions, Materials, and Adding an Atomic-Level Layer on Insulated Input Electrodes and Output Electrodes FIG. 33A illustrates second volatile switch 3300 structure with essentially parallel SWNT layer 3342 and 3342' in proximity to insulators 3318 and 3318', respectively, and layer 3342" in proximity to output electrode 3313. Essentially parallel SWNT layers 3342, 3342', and 3342" are used to control atomic-level Lennard-Jones forces $F_{LJ}$ in the ON state as described further below, using methods similar to those used in FIG. 32. In this example, the length of input electrodes 3311 and 3311', output electrode 3313, and opposing electrodes 3313' are all 50 nm. Intervening oxides such as 3322 and 3322' are all 50 nm. The corresponding suspended length $L_{SUSP}$ of nanotube channel element 3215 is 250 nm.

FIG. 33A illustrates second volatile switch 3300 without release electrodes such as 3212 and 3212' in FIG. 32 because second volatile nanotube switch 3300 transitions from ON-to-OFF state when voltage V is removed and does not require release electrodes.

An alternative way of achieving second volatile switch operation is to use FIG. 32 and to electrically connect release electrodes 3212 and 3212' to nanotube element 3215 through signal electrodes 3214 and 3214' (not shown). This ensures a voltage difference of zero between nanotube channel element 3215 and release electrodes 3212 and 3212' and enables second volatile nanotube switch operation when combined with dimensions and materials consistent with volatile operation.

Off-to-On Transition for a Second Volatile Nanotube Switch with an Atomic-Level Layer on Insulated Input Electrodes and Output Electrodes In operation, output electrode 3313 and opposing electrode 3313' are in electrical contact (not shown) resulting in opposing electrostatic forces on suspended nanotube channel element 3315 and are not a factor in a transition from the OFF-to-ON state. Input electrodes 3311 and 3311' are at voltage V, signal electrodes 3314 and 3314' are at ground (zero volts) so that nanotube channel element 3315 is also at zero volts. Assuming a separation between input electrodes 3311 and 3311' and nanotube channel element 3315 of 50 nm (gap plus oxide), an insulator oxide 3318 and 3318' of 3 nm, essentially parallel SWNTs 3342 and 3342' of 1 nm diameter, displacement z'≈15 nm, then elastic force $F_{ELAS}$=0.7×10$^{-10}$ Newtons calculated for pinned-pinned structure 3300 using elastic force formulas in table 1.

Using the formula for $F_{ELEC}$ in table 2, a separation between input electrodes 3311 and 3311' and nanotube channel element 3315 of approximately 50 nm, a nanotube channel element 3315 diameter $d_{CNT}$=1 nm, $\in_R$=1, input electrode 3311 and 3311' each of 50 nm length, electrostatic force $F_{ELEC}$=7.2×10$^{-12}$ V$^2$. Using $F_{ELEC}$=10 $F_{ELAS}$=7×10$^{-10}$, V=9.85 volts. Atomic-level Lennard-Jones forces $F_{LJ}$ are not a factor in an OFF-to-ON transition because separation distances are too great. Atomic-level Lennard-Jones forces apply at separations on the order of 1 nm.

Figure 33B:
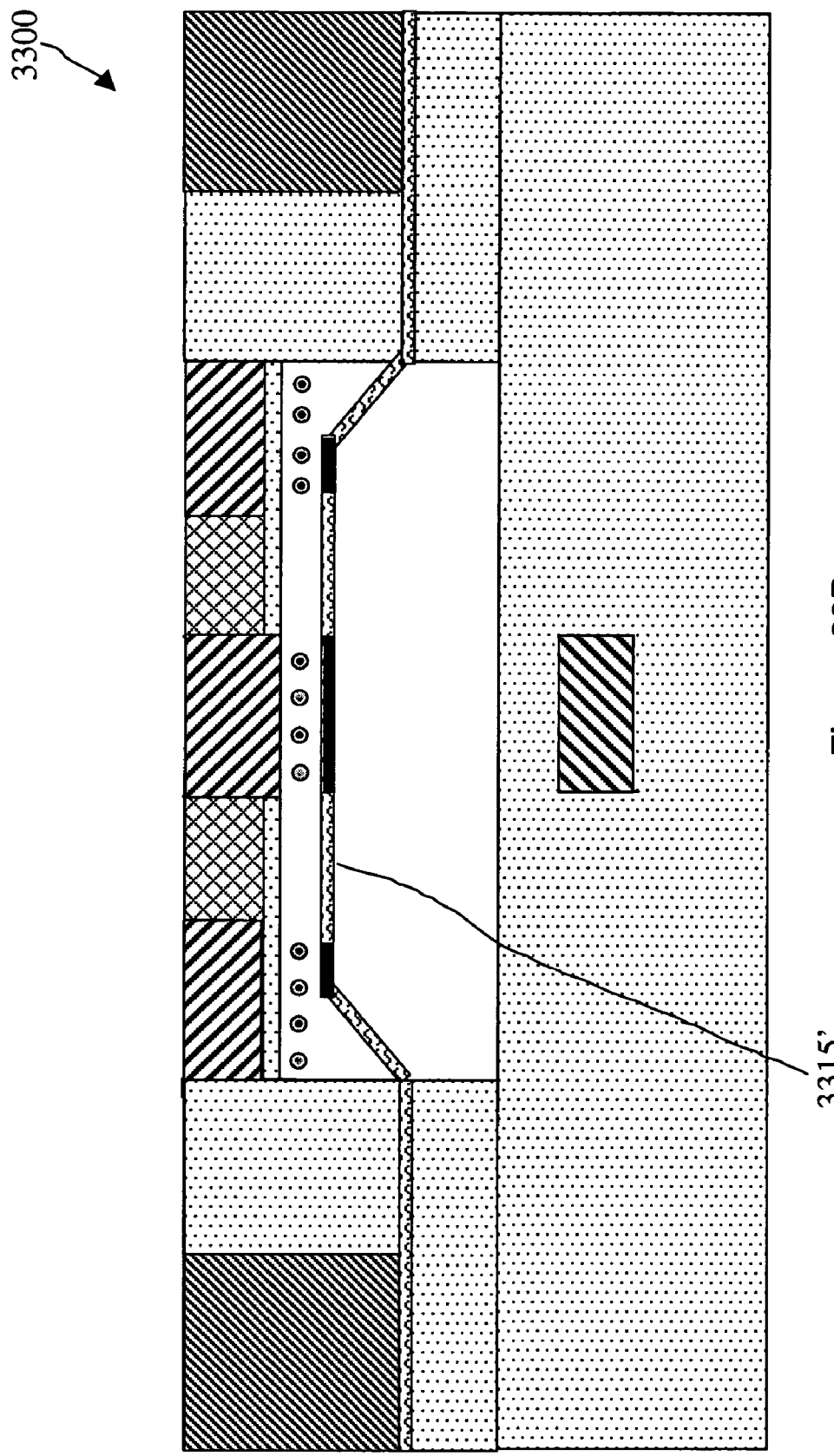
Figure 34:
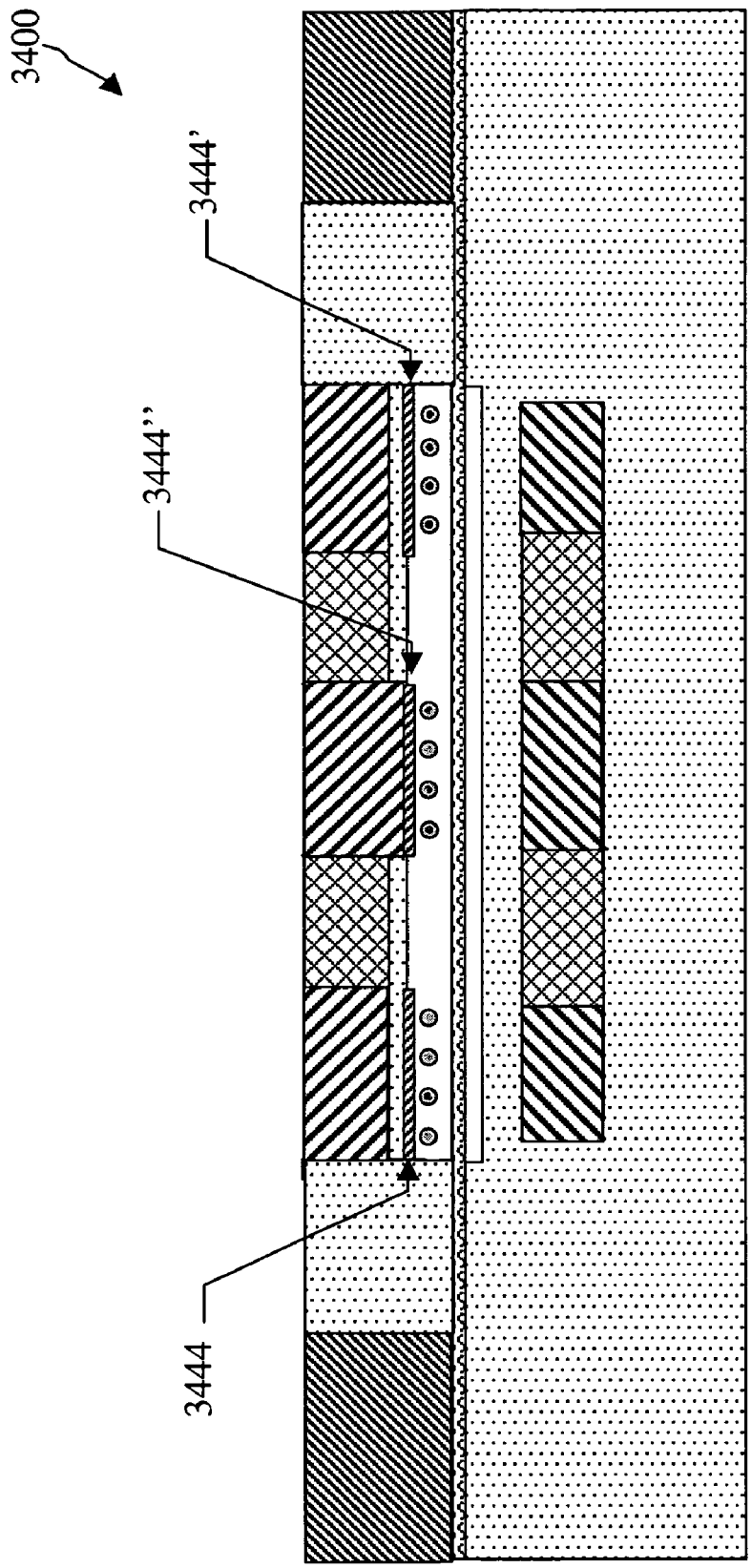
FIG. 34 is similar to FIG. 32 except that an atomic layer has been added to enhance essentially parallel SWNT adhesion to insulated input electrodes and output electrodes.

Volatile Device State for a Second Volatile Nanotube Switch with an Atomic-Level Layer on Input and Output Electrodes In order for second volatile nanotube switch 3300 to operate in a volatile mode, that is not remain in the ON state illustrated in FIG. 33B when voltage is removed and $F_{ELEC}$=0 but return instead to the OFF state illustrated in FIG. 33A, then the sum of atomic-level forces $F_{LJ}$ applied to elongated nanotube channel element 3315' must be less than restoring elastic force $F_{ELAS}$. Force comparisons may be made on individual SWNTs contained in nanotube channel element 3315'. The Lennard-Jones form of atomic-level van der Waals interaction force $F_{LJ}$ is determined by atomic-level forces between elongated nanotube element 3315' and the portion of insulated input electrodes 3311 and 3311' and output electrode 3313 that can contribute to atomic-level $F_{LJ}$. Typically, atomic-level $F_{LJ}$ forces occur between a portion (referred to as $L_{EFF-LJ}$) of elongated nanotube element 3315' and essentially parallel SWNTs 3342, 3342', and 3342" where separation is less than 1 nm. Lennard-Jones atomic-level force regions of elongated nanotube element 3315' shown in FIG. 33B have been darkened for illustrative purposes. In this example $L_{EFF-LJ}$=50/2+50+50/2=100 nm. For a pitch of 10 nm for essentially parallel SWNT layers 3342, 3342', and 3342", the number of carbon atom pairs contributing to $F_{LJ}$ are $N_{ATOMS}$=60. Using formulas in table 3, $F_{LJ}$=0.5×10$^{-10}$ Newtons. With $F_{ELEC}$=0, the net force on individual SWNTs in the ON position illustrated in FIG. 33B is $F_{ELAS}$-$F_{LJ}$=0.7×10$^{-10}$-0.5×10$^{-10}$=0.2×10$^{-10}$ Newtons. Since $F_{ELAS}$>$F_{LJ}$, second volatile nanotube switch 3300 is a volatile switch.

On-to-Off Transition for a Second Nonvolatile Nanotube Switch with an Atomic-Level Layer on Input and Output Electrodes ON-to-OFF state transition takes place when V is reduced to zero and $F_{ELEC}$=0 because $F_{ELAS}$>$F_{LJ}$ as described further above.

Additional Methods Of Controlling Lennard-Jones Atomic-Level Van Der Waals Forces on Swnts Forming Nanotube (Channel) Elements FIG. 34A, (structure 3400) is similar to FIG. 32B except that atomic layer 3444 has been added to insulated input electrode 3411, atomic layer 3444' has been added to insulated input electrode 3411', and atomic layer 3444" has been added to output 3413. These atomic layers are added to ensure that atomic-level Lennard-Jones ($F_{LJ}$) forces between elongated nanotube channel element 3415' and essentially parallel SWNTs 3442, 3442', and 3442" do not exceed $F_{LJ}$ between essentially parallel SWNTs 3442, 3442', and 3442" and supporting insulator or conductor material.

Essentially parallel nanowires (nanorods) of various materials may be used instead of essentially parallel SWNTs 2942 shown in FIG. 29 and essentially parallel SWNTs 3242, 3242', and 3242" shown in FIG. 32B to vary atomic-level Lennard-Jones force $F_{LJ}$. Examples of nanowire (nanorod) materials are alumina, bismuth, cadmium, selenide, gallium nitride, gold, gallium phosphide, germanium, silicon, indium phosphide, magnesium oxide, manganese oxide, nickel, palladium, silicon carbide, titanium, zinc oxide and additional mixed nanowires such as silicon germanium or other types which are coated.

Alternatively, essentially parallel nanowires may be used as masks. For example, calcium fluoride nanowires deposited on silicon may be used as a mask, etching trenches in a silicon electrode with nanometer pitch and nanometer depths to modulate atomic-level Lennard-Jones forces.

Alternatively, metal sacrificial layers may be lithographically formed to create nano-trenches. For example, a metal sacrificial layer may be deposition on top of a sacrificial layer to be removed later that creates a switching gap. Layer 3414 is then deposited on top of metal sacrificial layer. The metal sacrificial layer is then removed by an etch process to modulate the atomic level Lennard-Jones forces at the 3415'-3413 interface.

Figure 35A:
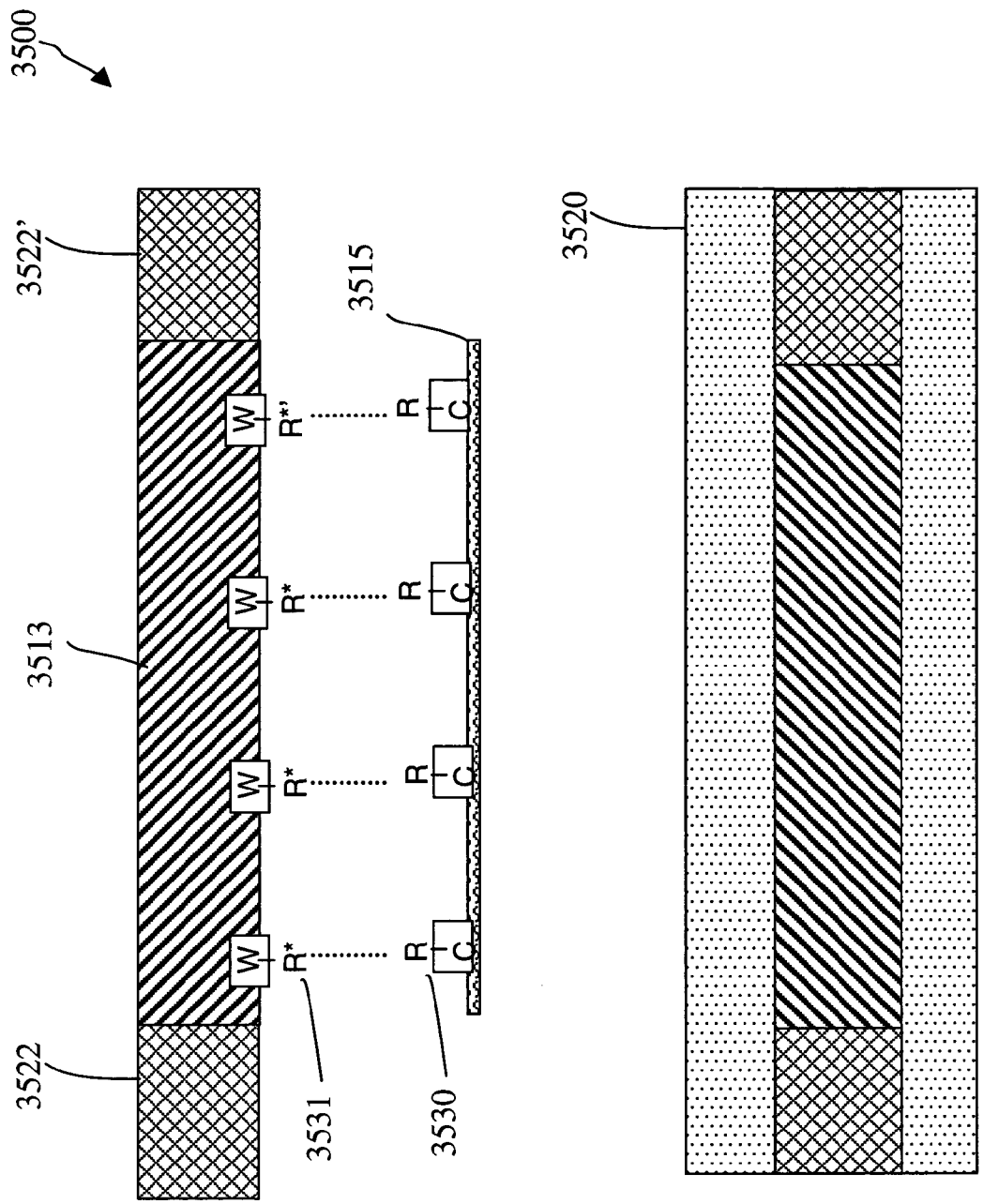
FIGS. 35A-D show a structure where an atomic layer has been derivitized (denoted as R*) and nanotubes have been functionalized (denoted as R) which results in altered van der Waal's interactions shown with the dashed line.

As is shown in FIG. 35A (structure 3500): Atomic-level $F_{LJ}$ between nanotube (channel) element 3515 and an output electrode 3513, in this case tungsten, without using an essentially parallel individual SWNT layer are illustrated. The nanotubes can be derivitized covalently or non-covalently to generate a modified surface (R) 3530. The tungsten surface can also be surface modified covalently or non-covalently with derivitization molecule or atomic layer (R*) 3531 to alter the van der Waal's interactions with the nanotubes. Layers 3520, 3522 and 3522' are insulating layers. As an example, during deflection of nanotube element 3515 a weak Lennard-Jones potential is formed between 3530 and 3531. Upon separation, the weak Lennard-Jones potential is broken between 3530 and 3531. As another example, functional molecule or atomic layer 3530 and 3531 forms a chemical bond to a W atom in output electrode 3513 and to a carbon atom in 3515. For this case, the separation and Lennard-Jones force is determined by the length of molecule or thickness of atomic layer 3530-3531.

Figure 35B:
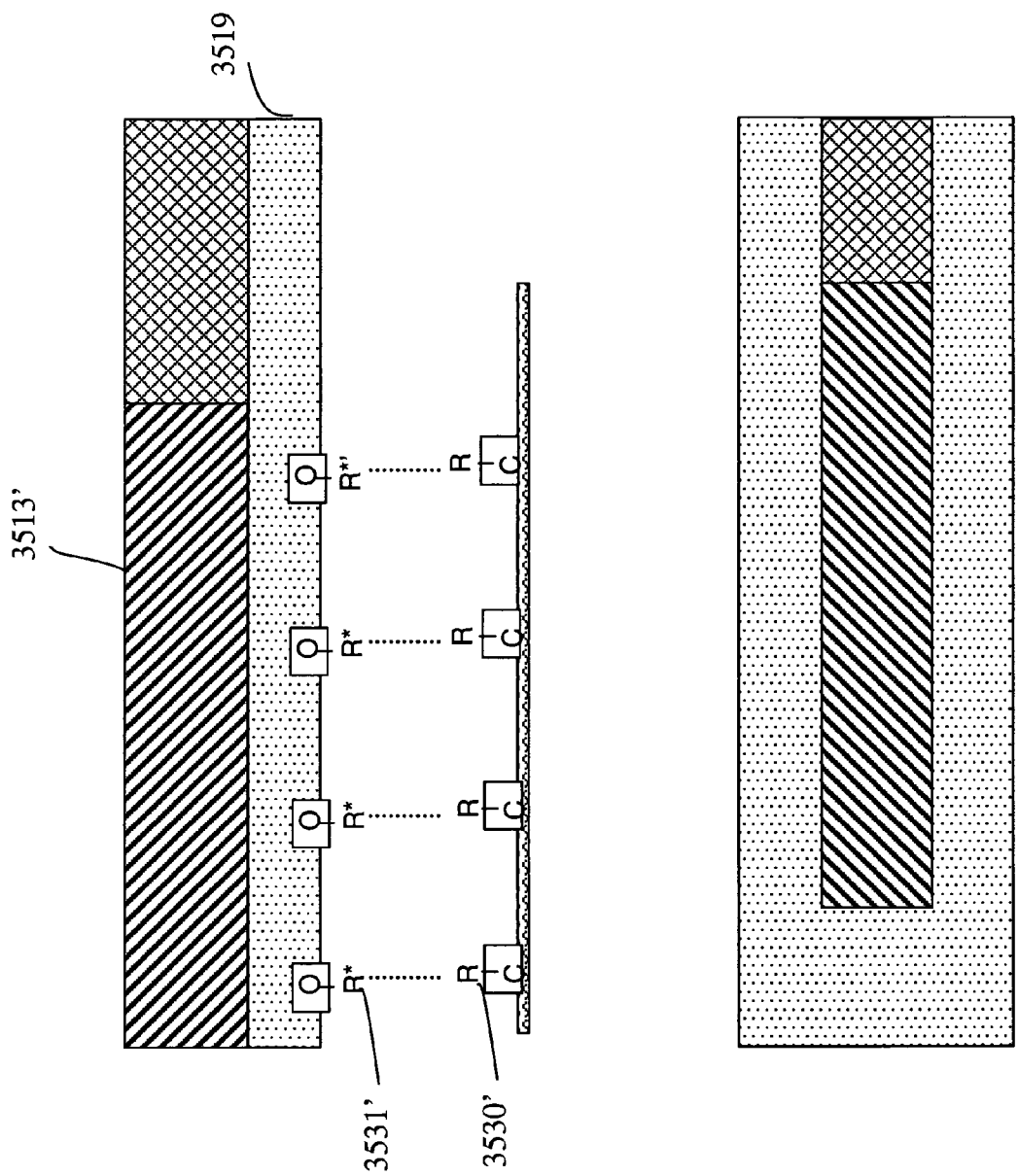

FIG. 35B illustrates the same interaction as 35A except tungsten output electrode 3513 has been replaced with an input electrode 3513' that is insulated with dielectric 3519. In this case the surface functionalization is effected using standard chemical surface modification techniques known to those skilled in the art. In this example the separation between 3515 and input electrode 3513' is kept constant by the combined molecules or atomic layers (R*) of 3530' and 3531'.

Figure 35C:
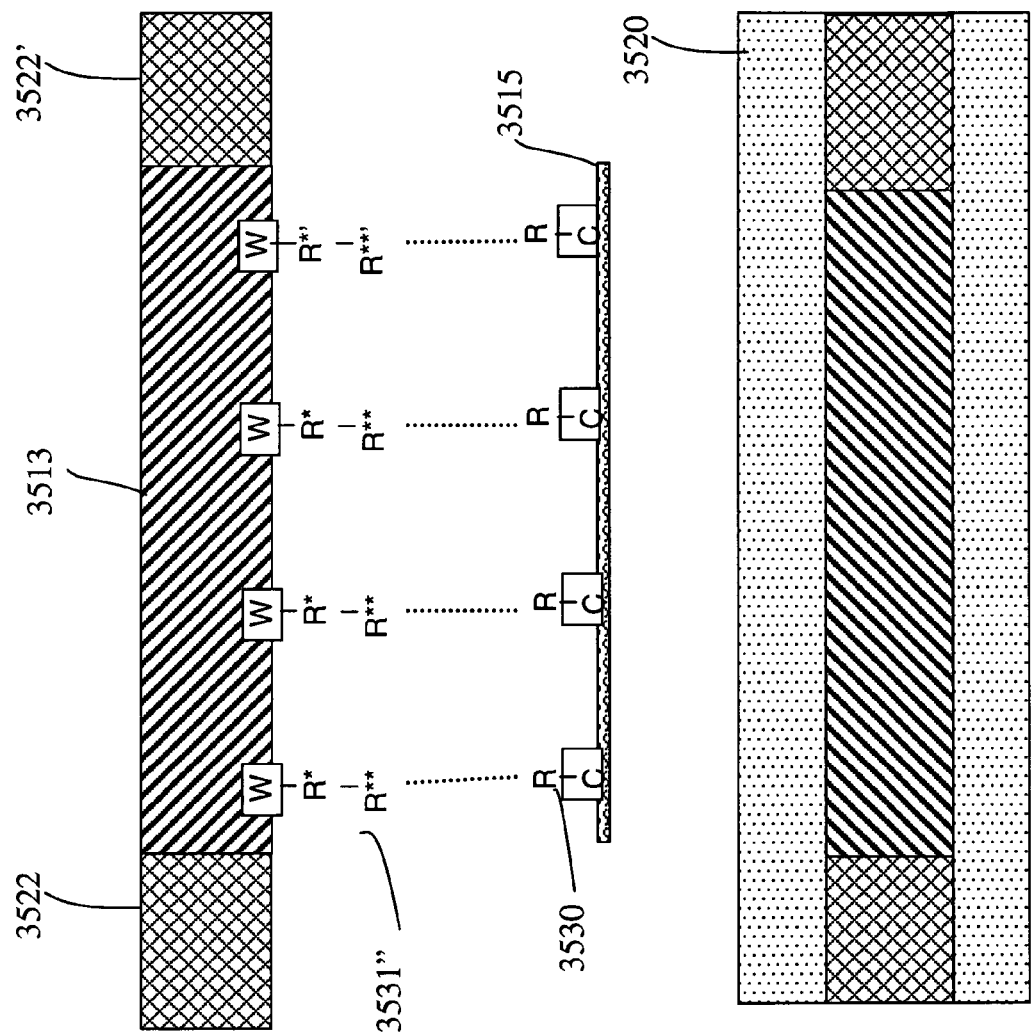

FIG. 35C shows the same interaction as 35A except another atomic layer (R**) 3531" is added to increase separation between nanotube (channel) element 3515 and tungsten output electrode 3513.

Figure 35D:
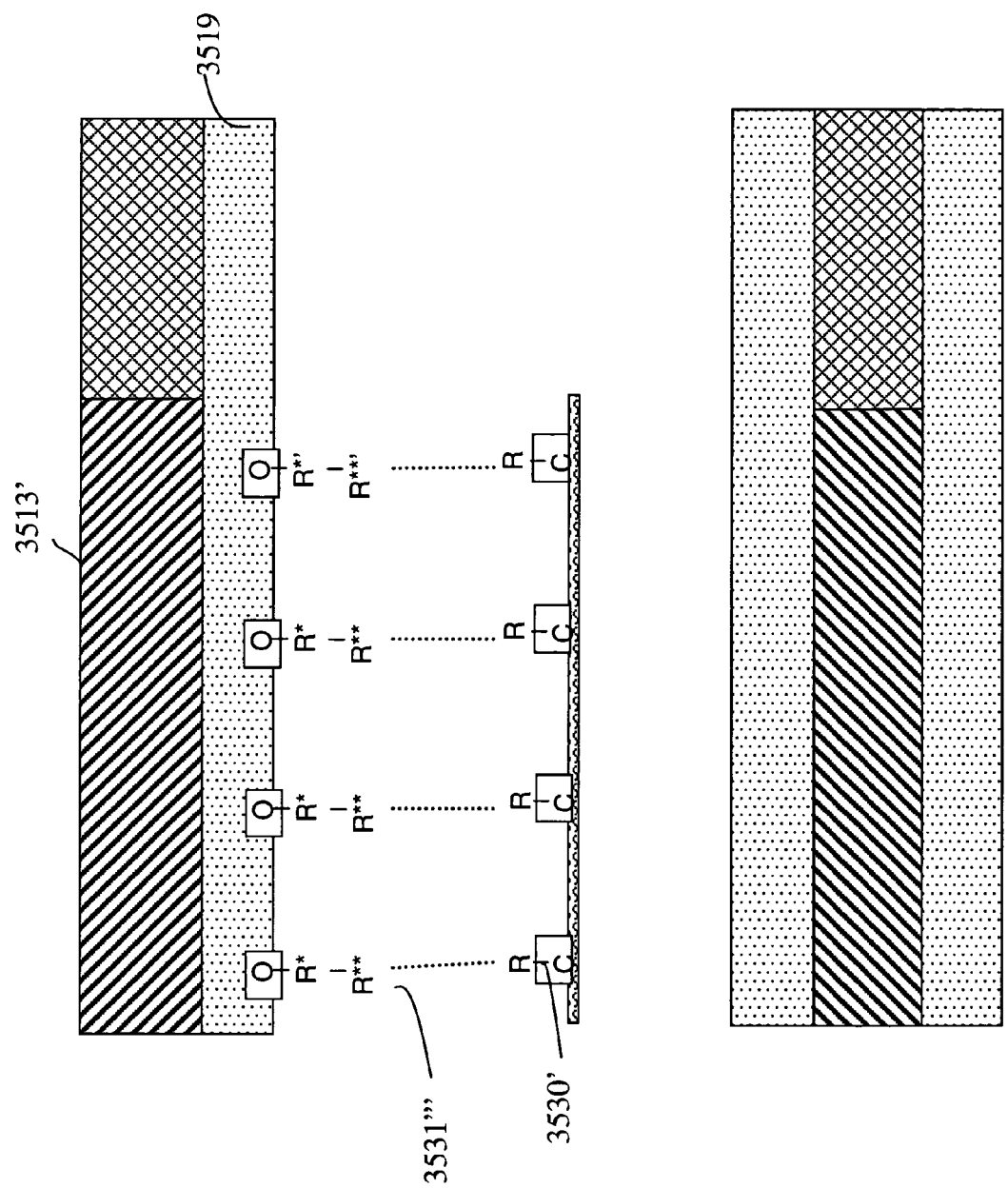

FIG. 35D shows the same interaction 35B except another atomic layer (R**) 3535'" is added to increase separation between nanotube (channel) element 3515 and insulated input electrode 3513'.

Figure 36:
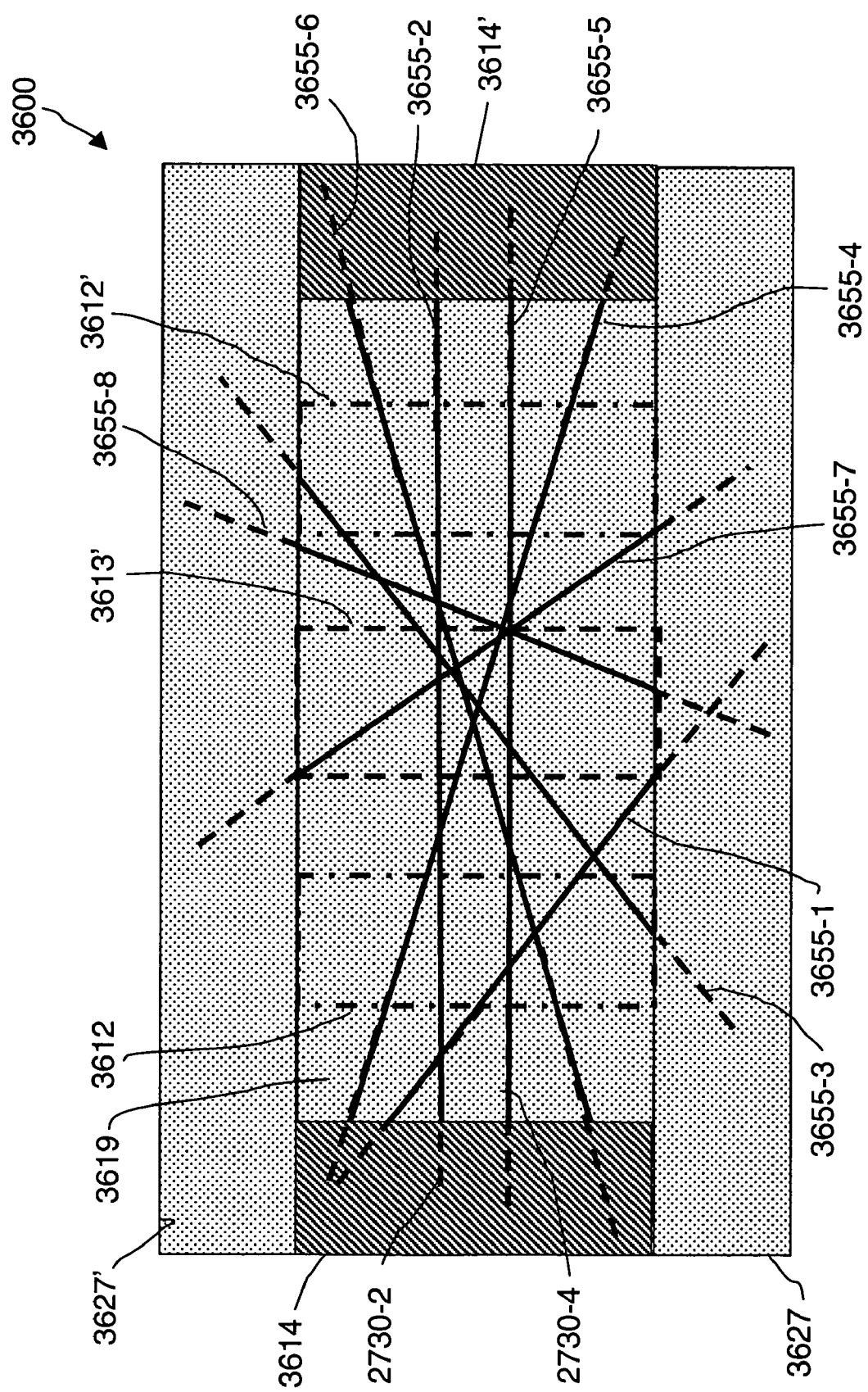
FIG. 36 shows a structure that reduces the suspended length variation of selected randomly oriented individual SWNTs in a nanotube channel element.

Layout Structures and Methods for Optimizing Second Nonvolatile and Volatile Nanotube Switches FIG. 36 illustrates a plan view 3600 of a cross section taken above nanotube channel element 3215 and parallel to release electrodes 3212 and 3212' and opposing electrode 3213' of second nonvolatile nanotube switch 3200' insulated by insulator 3219 as illustrated in FIG. 32B. Plan view 3600 illustrates a method of reducing randomly oriented individual SWNT length variation by limiting the number of individual SWNTs in nanotube channel element 3215 in contact with signal electrodes 3614 and 3614', which correspond to signal electrodes 3214 and 3214', respectively. Insulator 3619 corresponds to insulator 3219 in FIG. 32D. Opposing electrode 3613' corresponds to opposing electrode 3213' shown in cross section in FIG. 32B.

Preferred methods of fabricating plan view 3600 are similar to preferred methods of fabricating structure 2545 described further above with respect to FIG. 25. Preferred methods expose the ends of selected randomly oriented individual SWNTs for contact with signal electrodes 3614 and 3614' thereby reducing length variation that can result in corresponding variation of elastic force $F_{ELAS}$, electrostatic force $F_{ELEC}$, and atomic-level force $F_{LJ}$ described further above and in tables 1, 2, and 3 respectively. Reducing force variations caused by dimensional variation results in better control of switch operating characteristics such as operating voltage V.

Plan view 3600 illustrated in FIG. 36 shows exposed ends of individual SWNTs 3655-2, 2655-4, 3655-5, and 3655-6 in electrical and physical contact with both signal electrode 3614 and 3614' and contribute to the switching characteristic of second nonvolatile nanotube switch 3200' illustrated in FIG. 32B Additional individual SWNTs such as 3655-1, 3655-3, 3655-7, and 3655-8 have both ends, or at least one end, in contact with pinning insulators 3627 and 3627' and do not contribute to the switching characteristics such as operating voltage V of second nonvolatile nanotube switch 3200'.

The electrical performance of volatile nanotube switch 3300 illustrated in FIG. 33A may also be enhanced by using similar preferred methods described further above with respect to FIG. 36 of reducing randomly oriented individual SWNT length variation by limiting the number of individual SWNTs in nanotube channel element 3315 in contact with signal electrodes 3314 and 3314'. Preferred methods described with respect to fabricating FIG. 36 may be used to enhance switching characteristics such as operating voltage V when applied to volatile nanotube switch 3300 illustrated in FIG. 33A. These preferred methods may be applied to structure 3600 with release electrodes 3612 and 3612' omitted (not shown).

Figure 37:
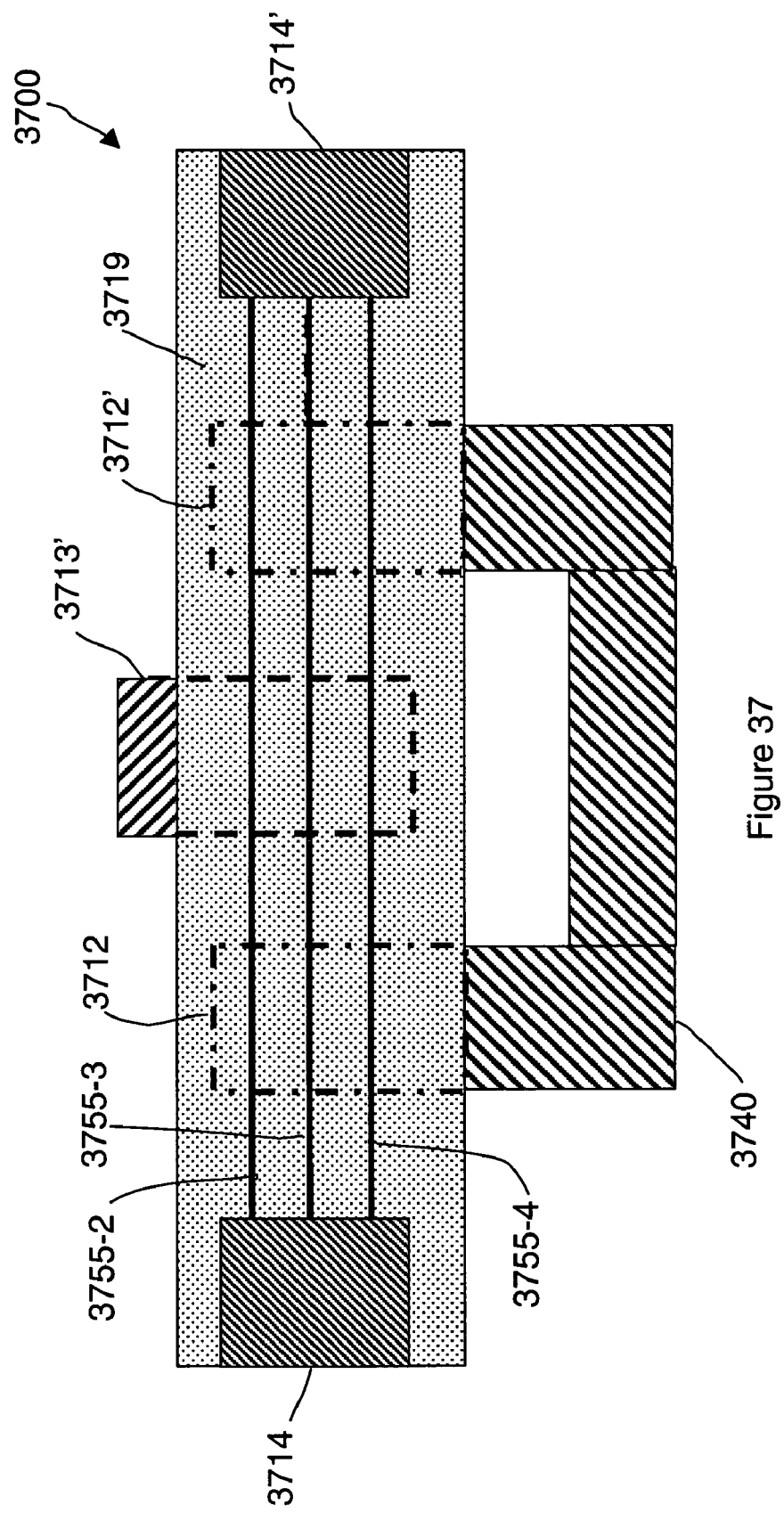
FIG. 37 shows a structure that reduces the suspended length variation of selected essentially parallel individual SWNTs in a nanotube channel element.

FIG. 37 illustrates a plan view 3700 of a cross section taken above nanotube channel element 3215 and parallel to release electrodes 3212 and 3212' and opposing electrode 3213' of second nonvolatile nanotube switch 3200' insulated by insulator 3219 as illustrated in FIG. 32B. Plan view 3700 illustrates a method of using essentially parallel individual SWNT to eliminate length variation of individual SWNTs in nanotube channel element 3215 in contact with signal electrodes 3714 and 3714', which correspond to signal electrodes 3214 and 3214', respectively. Signal electrodes 3714 and 3714' are electrically connected to form one signal electrode 3740. Insulator 3719 corresponds to insulator 3219 in FIG. 32D and also similar to insulator 3619 in FIG. 36. Opposing electrode 3713' corresponds to opposing electrode 3213' shown in cross section in FIG. 32B, and also similar to opposing electrode 3613' in FIG. 36.

Preferred methods of fabricating plan view 3700 are similar to preferred methods of fabricating structure 2735 described further above with respect to FIG. 27. Preferred methods expose the ends of selected essentially parallel individual SWNTs for contact with signal electrodes 3714 and 3714' controlling the number of individual SWNTs contributing to elastic force $F_{ELAS}$, electrostatic force $F_{ELEC}$, and atomic-level force $F_{LJ}$ described further above and in tables 1, 2, and 3 respectively. Reducing force variations results in better control of switch operating characteristics such as operating voltage V.

Plan view 3700 illustrated in FIG. 37 shows exposed ends of individual SWNTs 3755-2, 3755-3, and 3755-4 in electrical and physical contact with both signal electrode 3714 and 3714' and contribute to the switching characteristics of second nonvolatile nanotube switch 3200' illustrated in FIG. 32B The electrical performance of volatile nanotube switch 3300 illustrated in FIG. 33A may also be enhanced using similar preferred methods of selecting the number of essentially parallel individual SWNT in contact with signal electrodes 3314 and 3314' thereby controlling the number of individual SWNTs contributing to the electrical characteristics of volatile nanotube switch 3300. Preferred methods described with respect to FIG. 36 may be used to enhance switching characteristics such as operating voltage V when applied to structure 3700 with release electrodes 3712, 3712', and 3740 omitted (not shown).

The following applications are assigned to the assignee of the present application and are hereby incorporated by reference herein:

U.S. Ser. No. 09/915,093, Electromechanical Memory Array Using Nanotube Ribbons and Method for Making Same, filed Jul. 25, 2001, now U.S. Pat. No. 6,919,592;

U.S. Ser. No. 10/850,100 Electromechanical Memory Array Using Nanotube Ribbons and Method for Making Same, filed May 20, 2004;

U.S. Ser. No. 10/852,880, Electromechanical Memory Array Using Nanotube Ribbons and Method for Making Same, filed May 25, 2004;

U.S. Ser. No. 09/915,173, Electromechanical Memory Having Cell Selection Circuitry Constructed with Nanotube Technology, filed Jul. 25, 2001, now U.S. Pat. No. 6,643,165;

U.S. Ser. No. 10/693,241, Device Selection Circuitry Constructed with Nanotube Technology, filed Oct. 24, 2003;

U.S. Ser. No. 09/915,095, Hybrid Circuit Having Nanotube Electromechanical Memory, filed Jul. 25, 2001, now U.S. Pat. No. 6,574,130;

U.S. Ser. No. 10/379,973, Hybrid Circuit Having Nanotube Electromechanical Memory, filed Mar. 5, 2003, now U.S. Pat. No. 6,836,424;

U.S. Ser. No. 10/964,150, Hybrid Circuit Having Nanotube Electromechanical Memory, filed Oct. 13, 2004;

U.S. Ser. No. 10/128,118, Nanotube Films and Articles, filed Apr. 23, 2002, now U.S. Pat. No. 6,706,402;

U.S. Ser. No. 10/774,682, Nanotube Films and Articles, filed Feb. 9, 2004;

U.S. Ser. No. 10/776,573, Nanotube Films and Articles, filed Feb. 11, 2004, now U.S. Pat. No. 6,942,921;

U.S. Ser. No. 10/128,117, Methods of Nanotube Films and Articles, filed Apr. 23, 2002, now U.S. Pat. No. 6,835,591;

U.S. Ser. No. 10/864,186, Non-Volatile Electromechanical Field Effect Devices and Circuits Using Same and Methods of Forming Same, filed Jun. 9, 2004;

U.S. Ser. No. 10/341,005, Methods of Making Carbon Nanotube Films, Layers, Fabrics, Ribbons, Elements and Articles, filed Jan. 13, 2003;

U.S. Ser. No. 10/341,055, Methods of Using Thin Metal Layers To Make Carbon Nanotube Films, Layers, Fabrics, Ribbons, Elements and Articles, filed Jan. 13, 2003;

U.S. Ser. No. 10/341,054, Methods of Using Pre-formed Nanotube Films, Layers, Fabrics, Ribbons, Elements and Articles, filed Jan. 13, 2003;

U.S. Ser. No. 10/341,130, Carbon Nanotube Films, Layers, Fabrics, Ribbons, Elements and Articles, filed Jan. 13, 2003;

U.S. Ser. No. 10/917,794, Nanotube-Based Switching Elements, filed Aug. 13, 2004;

U.S. Ser. No. 10/918,085, Nanotube-Based Switching Elements With Multiple Controls, filed Aug. 13, 2004;

U.S. Ser. No. 10/918,181, Nanotube Device Structure and Methods of Fabrication, filed Aug. 13, 2004;

U.S. Ser. No. 60/581,075, Non-Volatile Carbon Nanotube Logic (NLOGIC) Receiver Circuit, filed Jun. 18, 2004;

U.S. patent application Ser. No. 11/033,216, Non-Volatile Carbon Nanotube Logic (NLOGIC) Off Chip Driver, filed Jun. 18, 2004;

U.S. Ser. No. 11/032,983, Non-Volatile Carbon Nanotube Logic (NLOGIC) Master-Slave Latches, filed Jan. 10, 2005; and U.S. Ser. No. 11/032,823, Non-Volatile Carbon Nanotube Logic (NLOGIC) Tristate Circuit, filed Jan. 10, 2005.

It will be appreciated that the scope of the present invention is not limited to the above described embodiments, but rather is defined by the appended claims; and that these claims will encompass modifications of and improvements to what has been described.

What is claimed is:

1. An electrostatic discharge (ESD) protection circuit for protecting a protected circuit coupled to an input pad from an ESD-induced voltage of positive or negative polarity, comprising:
   a nanotube switch having at least two terminals coupled to the protected circuit and to a single discharge path;
   wherein the nanotube switch, in response to the ESD-induced voltage, switches between a de-activated state and an activated state;
   wherein the activated state creates a current path in either direction between the at least two terminals, so that a signal on the input pad flows to or from the single discharge path to cause the signal at the input pad to remain within a predefined operable range for the protected circuit,
   wherein the nanotube switch returns to the de-activated state after the duration of the ESD-induced voltage.

2. The ESD protection circuit of claim 1 wherein the nanotube switch, the input pad, and the protected circuit are on a semiconductor chip.

3. The ESD protection circuit of claim 1 wherein the nanotube switch is on a chip carrier.

4. The ESD protection circuit of claim 1 wherein the deactivated and activated states are volatile states.

5. The ESD protection circuit of claim 1 wherein the nanotube switch is a three terminal device, with a first terminal coupled to the input pad, a second terminal coupled to the single discharge path, and a third terminal coupled to a control signal.

6. The ESD protection circuit of claim 5 wherein the deactivated and activated states are non-volatile states.

7. The ESD protection circuit of claim 1 wherein the ESD circuit may be repeatedly programmed between the activated and deactivated states so as to repeatedly activate and deactivate ESD protection of the protected circuit.

8. The ESD protection circuit of claim 1 wherein the nanotube switch provides protection based on the magnitude of the signal on the input pad.

9. The ESD protection circuit of claim 1 wherein the nanotube switch is a two terminal switch with one terminal coupled to the input pad and another terminal coupled to the single discharge path, and wherein the nanotube switch includes a nanotube element that is in communication with the one terminal and is activatable into communication with the other terminal.

10. An electrostatic discharge (ESD) protection circuit coupled to an input pad for protecting from an ESD-induced voltage of positive or negative polarity a protected circuit also coupled to the input pad, said ESD protection circuit comprising:

a nanotube switch having at least two terminals and an electrical control, a first of the at least two terminals being electrically coupled to the input pad and protected circuit and a second of the at least two terminals being coupled to a single discharge path;

wherein the nanotube switch is controllable, in response to electrical stimulation of the control, between a de-activated state and an activated state;

wherein the de-activated state presents a relatively high impedance between the first and second terminals of the nanotube switch so that a signal on the input pad passes to the protected circuit substantially unaltered;

wherein the activated state presents a relatively low impedance between the first and second terminals of the nanotube switch creating a current path in either direction between the at least two terminals, so that a signal on the input pad flows to or from the single discharge path coupled to the second terminal;

wherein the nanotube switch includes a nanotube element having a plurality of nanotubes, wherein the nanotube element is sized to produce the relatively low impedance of the nanotube switch in the activated state, said relatively low impedance being sufficient to cause the signal at the input pad to remain within a predefined operable range for the protected circuit.

11. The ESD circuit of claim 10 wherein the nanotube switch, the input pad, and the protected circuit are on a semiconductor chip.

12. The ESD circuit of claim 10 wherein the nanotube switch is on a chip carrier.

13. The ESD circuit of claim 10 wherein the deactivated and activated states are volatile states.

14. The ESD circuit of claim 10 wherein the nanotube switch is an electromechanical switch and wherein the activated and de-activated states correspond to physical positions of an electromechanically-movable nanotube element.

15. The ESD circuit of claim 14 wherein the control of the nanotube switch includes a release electrode which in response to electrical stimulation electrostatically attracts the nanotube element into contact with the second terminal of the nanotube switch.

16. The ESD circuit of claim 14 wherein the control is in electrical communication with the input pad so that a signal on the input pad outside of the predefined operable range causes the control to activate the nanotube switch to create a relatively low impedance path to the single discharge path.

17. The ESD circuit of claim 10 wherein the ESD circuit may be repeatedly programmed between the activated and deactivated states so as to repeatedly activate and deactivate ESD protection of the protected circuit.

18. The ESD circuit of claim 10 wherein the nanotube switch provides protection based on the magnitude of the signal on the input pad.

19. The ESD circuit of claim 10 wherein the nanotube switch is a two terminal switch with one terminal coupled to the input pad and another terminal coupled to the single discharge path, and wherein the nanotube switch includes a nanotube element that is in communication with the one terminal and is activatable into communication with the other terminal.

20. An electrostatic discharge (ESD) protection circuit coupled to an input pad for protecting from an ESD-induced voltage of positive or negative polarity a protected circuit also coupled to the input pad, said ESD protection circuit comprising:

a nanotube switch having a nanotube element and a control electrode, the nanotube element being electrically coupled to a single discharge path and the control electrode being electrically coupled to the input pad and protected circuit;

wherein the nanotube switch is controllable, in response to electrical stimulation of the control electrode, between a de-activated state and an activated state;

wherein the nanotube switch, in response to the ESD-induced voltage, switches between a de-activated state and an activated state and returns to the dc-activated state after the duration of the ESD-induced voltage;

wherein the activated state creates a current path in either direction between the input pad and the single discharge path, so that a signal on the input pad flows to or from the single discharge path to cause the signal at the input pad to remain within a predefined operable range for the protected circuit.

21. The ESD protection circuit of claim 20 wherein the nanotube switch, the input pad, and the protected circuit are on a semiconductor chip.

22. The ESD protection circuit of claim 20 wherein the nanotube switch is on a chip carrier.

23. The ESD protection circuit of claim 20 wherein the deactivated and activated states are non-volatile states.

24. The ESD protection circuit of claim 20 wherein the deactivated and activated states are volatile states.

25. The ESD protection circuit of claim 20 wherein the ESD circuit may be repeatedly programmed between the activated and deactivated states so as to repeatedly activate and deactivate ESD protection of the protected circuit.

26. The ESD protection circuit of claim 20 wherein the nanotube switch provides protection based on the magnitude of the signal on the input pad.

27. The ESD protection circuit of claim 20 wherein the nanotube switch further comprises a release electrode electrically coupled to a common mode connector.

28. The ESD protection circuit of claim 20 wherein the nanotube switch is switched to the de-activated state after the duration of the ESD-induced voltage by using electrical stimulus.

29. The ESD protection circuit of claim 20 wherein the nanotube switch is switched to the de-activated state after the duration of the ESD-induced voltage without using electrical stimulus.

* * * * *